US012703710B2

(12) United States Patent
Sim et al.

(10) Patent No.: US 12,703,710 B2
(45) Date of Patent: Aug. 11, 2026

(54) LIGHT-EMITTING DEVICE INCLUDING HETEROCYCLIC COMPOUND, ELECTRONIC APPARATUS INCLUDING THE LIGHT-EMITTING DEVICE, AND THE HETEROCYCLIC COMPOUND

(71) Applicant: Samsung Display Co., Ltd., Yongin-si (KR)

(72) Inventors: Munki Sim, Yongin-si (KR); Taeil Kim, Yongin-si (KR); Sunyoung Pak, Yongin-si (KR); Junha Park, Yongin-si (KR); Jangyeol Baek, Yongin-si (KR); Kyoung Sunwoo, Yongin-si (KR); Chanseok Oh, Yongin-si (KR); Minjung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 987 days.

(21) Appl. No.: 17/648,287

(22) Filed: Jan. 18, 2022

(65) Prior Publication Data

US 2022/0271227 A1 Aug. 25, 2022

(30) Foreign Application Priority Data

Feb. 3, 2021 (KR) ........................ 10-2021-0015661

(51) Int. Cl.

| | |
|---|---|
| ***C07F 5/02*** | (2006.01) |
| ***H10K 50/11*** | (2023.01) |
| ***H10K 85/60*** | (2023.01) |

(52) U.S. Cl.

CPC ......... *C07F 5/027* (2013.01); *H10K 85/6572* (2023.02); *H10K 85/658* (2023.02); *H10K 50/11* (2023.02)

(58) Field of Classification Search

CPC ...... H10K 85/658; H10K 85/322; C07F 5/027

See application file for complete search history.

(56) References Cited

U.S. PATENT DOCUMENTS 12,114,566 B2 * 10/2024 Miyazaki ........... H10K 85/6576
2018/0366647 A1 12/2018 Jun et al.

(Continued)

FOREIGN PATENT DOCUMENTS

CN 109096125 A 12/2018
CN 110662750 A 1/2020

(Continued)

OTHER PUBLICATIONS

Korean Notice of Allowance for KR Application No. 10-2021-0015661, dated Dec. 19, 2025, 21 pages.

*Primary Examiner* — Sean M DeGuire

(74) *Attorney, Agent, or Firm* — Womble Bond Dickinson (US) LLP

(57) ABSTRACT

An electronic apparatus includes a light-emitting device including a heterocyclic compound represented by Formula 1, where $X_5$ is O, S, $N(R_{55})$, or $N(T_{55})$, $T_{55}$ is a group represented by Formula 2B, $Ar_4$ and $Ar_5$ are each a group represented by Formula 3, and when $X_5$ is $N(T_{55})$, $Ar_4$ and $Ar_5$ are identical to or different from each other:

(Continued)

Formula 1

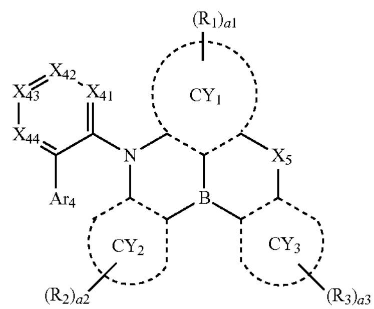

Formula 2B

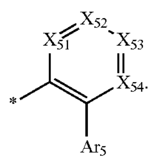

-continued

Formula 3

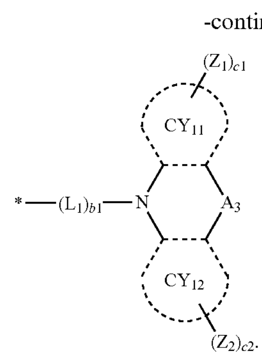

19 Claims, 3 Drawing Sheets

(56) References Cited

U.S. PATENT DOCUMENTS

| | | | |
|---|---|---|---|
| 2019/0058124 A1 | 2/2019 | Hatakeyama et al. | |
| 2019/0341571 A1 | 11/2019 | Liaptsis et al. | |
| 2020/0028084 A1* | 1/2020 | Song | H10K 85/00 |
| 2020/0058874 A1 | 2/2020 | Kim et al. | |
| 2020/0058885 A1 | 2/2020 | Hong et al. | |
| 2020/0144513 A1 | 5/2020 | Hatakeyama et al. | |
| 2020/0176679 A1 | 6/2020 | Jeong et al. | |
| 2020/0207787 A1 | 7/2020 | Hatakeyama et al. | |
| 2021/0066616 A1* | 3/2021 | Fleetham | H10K 85/658 |
| 2022/0093874 A1 | 3/2022 | Miyazaki | |
| 2023/0403934 A1* | 12/2023 | Oh | H10K 85/658 |

FOREIGN PATENT DOCUMENTS

| | | | |
|---|---|---|---|
| KR | 10-2016-0119683 | A | 10/2016 |
| KR | 10-1876763 | B1 | 7/2018 |
| KR | 10-2018-0108604 | A | 10/2018 |
| KR | 10-2018-0122298 | A | 11/2018 |
| KR | 10-2018-0127918 | A | 11/2018 |
| KR | 10-2019-0127581 | A | 11/2019 |
| KR | 10-2020-0011383 | A | 2/2020 |
| KR | 10-2020-0020538 | A | 2/2020 |
| KR | 10-2020-0081269 | A | 7/2020 |
| KR | 10-2020-0129989 | A | 11/2020 |
| KR | 10-2022-0038199 | A | 3/2022 |

* cited by examiner

LIGHT-EMITTING DEVICE INCLUDING HETEROCYCLIC COMPOUND, ELECTRONIC APPARATUS INCLUDING THE LIGHT-EMITTING DEVICE, AND THE HETEROCYCLIC COMPOUND

CROSS-REFERENCE TO RELATED APPLICATION

This application claims priority to and the benefit of Korean Patent Application No. 10-2021-0015661, filed on Feb. 3, 2021 in the Korean Intellectual Property Office, the entire content of which is incorporated herein by reference.

BACKGROUND

1. Field

One or more aspects of embodiments of the present disclosure relate to a light-emitting device including a heterocyclic compound, an electronic apparatus including the light-emitting device, and the heterocyclic compound.

2. Description of the Related Art

Among light-emitting devices, self-emissive devices have wide viewing angles, high contrast ratios, short response times, and/or excellent or suitable characteristics in terms of luminance, driving voltage, and/or response speed.

In an example light-emitting device, a first electrode is located on a substrate, and a hole transport region, an emission layer, an electron transport region, and a second electrode are sequentially arranged on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. The excitons may transition from an excited state to the ground state to thereby generate light.

SUMMARY

One or more aspects of embodiments of the present disclosure are directed toward a light-emitting device including a heterocyclic compound, an electronic apparatus including the light-emitting device, and the heterocyclic compound.

Additional aspects will be set forth in part in the description that follows and, in part, will be apparent from the description, or may be learned by practice of the presented embodiments of the disclosure.

One or more embodiments of the present disclosure provide a light-emitting device including:

a first electrode, a second electrode facing the first electrode, an interlayer between the first electrode and the second electrode and including an emission layer, and a heterocyclic compound represented by Formula 1:

Formula 1

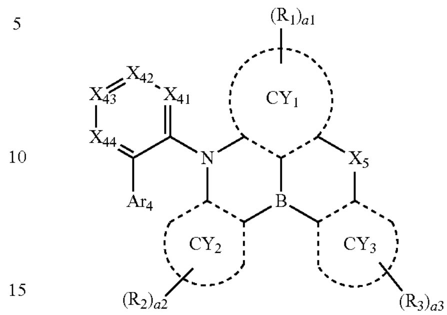

Formula 2B

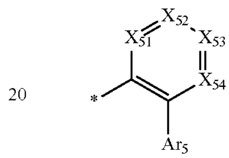

Formula 3

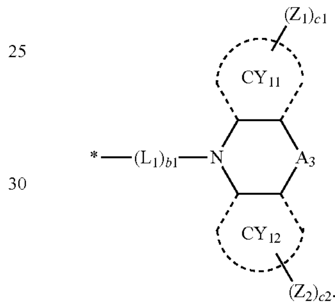

In Formulae 1, 2B, and 3, $X_5$ may be O, S, $N(R_{55})$, or $N(T_{55})$, $T_{55}$ may be a group represented by Formula 2B, and * in Formula 2B may indicate a binding (e.g., bonding) site to N, $Ar_4$ and $Ar_5$ may each be a group represented by Formula 3, and when $X_5$ is $N(T_{55})$, $Ar_4$ and $Ar_5$ may be identical to or different from each other, $CY_1$ to $CY_3$, $CY_{11}$, and $CY_{12}$ may each independently be a $C_3$-$C_{60}$ carbocyclic group or a $C_1$-$C_{60}$ heterocyclic group, $X_{41}$ may be N or $C(R_{41})$, $X_{42}$ may be N or $C(R_{42})$, $X_{43}$ may be N or $C(R_{43})$, $X_{44}$ may be N or $C(R_{44})$, $X_{51}$ may be N or $C(R_{51})$, $X_{52}$ may be N or $C(R_{52})$, $X_{53}$ may be N or $C(R_{53})$, and $X_{54}$ may be N or $C(R_{54})$, $L_1$ may be a single bond, a $C_3$-$C_{60}$ carbocyclic group unsubstituted or substituted with at least one $R_{1a}$, or a $C_1$-$C_{60}$ heterocyclic group unsubstituted or substituted with at least one $R_{1a}$, b1 may be an integer from 1 to 5, $A_3$ may be a single bond, O, S, $N(Z_3)$, $C(Z_3)(Z_4)$, or $Si(Z_3)(Z_4)$, $R_1$ to $R_3$, $R_{41}$ to $R_{44}$, $R_{51}$ to $R_{55}$, and $Z_1$ to $Z_4$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, —Si($Q_1$)($Q_2$)($Q_3$), —N[$(L_{11})_{b11}$-$Q_1$][$(L_{12})_{b12}$-$Q_2$], —B[$(L_{11})_{b11}$-$Q_1$][$(L_{12})_{b12}$-$Q_2$], —C(=O)($Q_1$), —S(=O)$_2$($Q_1$), or —P(=O)($Q_1$)($Q_2$), a1 to a3, c1, and c2 may each independently be an integer from 0 to 10, $L_{11}$ and $L_{12}$ may each independently be the same as described in connection with $L_1$, b11 and b12 may each independently be the same as described in connection with b1,

* in Formula 3 indicates a binding site to a neighboring atom, $R_1a$ may be the same as described in connection with $R_1$, two or more of the a1 $R_1$(s) may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the a2 $R_2$(s) may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the a3 $R_3$(s) may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the c1 $Z_1$(s) may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the c2 $Z_2$(s) may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, and $R_{10}a$ may be:

deuterium (-D), —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ aryl alkyl group, or a $C_2$-$C_{60}$ heteroaryl alkyl group.

One or more embodiments of the present disclosure provide an electronic apparatus including the light-emitting device.

One or more embodiments of the present disclosure provide a heterocyclic compound represented by Formula 1.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
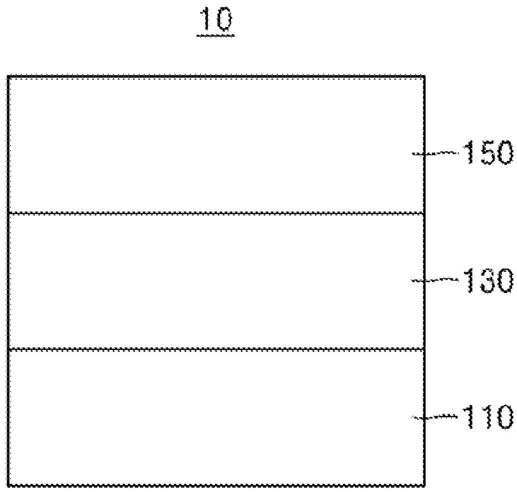
FIG. 1 is a schematic view of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description. As utilized herein, the term "and/or" includes any and all combinations of one or more of the associated listed items. Throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

As used herein, singular forms such as "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof. As used herein, the terms "use," "using," and "used" may be considered synonymous with the terms "utilize," "utilizing," and "utilized," respectively.

As used herein, expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure".

One or more embodiments of the present disclosure provide a light-emitting device (for example, an organic light-emitting device) including: a first electrode; a second electrode facing the first electrode; an interlayer located between the first electrode and the second electrode and including an emission layer; and a heterocyclic compound represented by Formula 1.

First, the heterocyclic compound will be described.

The heterocyclic compound may be represented by Formula 1:

Formula 1

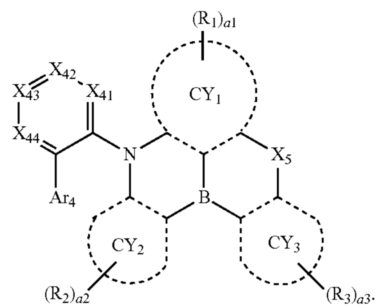

In Formula 1, $X_5$ may be O, S, $N(R_{55})$, or $N(T_{55})$, $T_{55}$ may be a group represented by Formula 2B, and * in Formula 2B may indicate a binding site to N:

Formula 2B

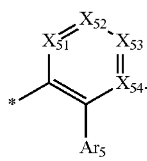

Formula 2B is described in more detail herein.

$Ar_4$ and $Ar_5$ in Formulae 1 and 2B may each be a group represented by Formula 3:

Formula 3

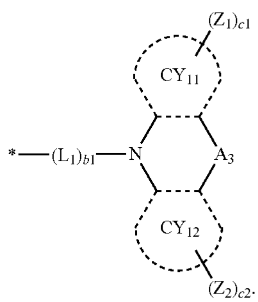

Formula 3 is described in more detail herein.

In an embodiment, $X_5$ in Formula 1 may be O, S, or $N(R_{55})$.

In one or more embodiments, $X_5$ in Formula 1 may be $N(T_{55})$.

In one or more embodiments, in Formula 1, $X_5$ may be $N(T_{55})$, and $Ar_4$ and $Ar_5$ may be identical to each other.

In one or more embodiments, in Formula 1, $X_5$ may be $N(T_{55})$, and $Ar_4$ and $Ar_5$ may be different from each other.

$CY_1$ to CYs, $CY_{11}$, and $CY_{12}$ in Formulae 1 and 3 may each independently be a $C_3$-$C_{60}$ carbocyclic group or a $C_1$-$C_{60}$ heterocyclic group.

In an embodiment, $CY_1$ to $CY_3$, $CY_{11}$, and $CY_{12}$ in Formulae 1 and 3 may each independently be a benzene group, a naphthalene group, an anthracene group, a dibenzofuran group, a dibenzothiophene group, a carbazole group, a fluorene group, or a dibenzosilole group.

In an embodiment, $CY_2$ and $CY_3$ in Formula 1 may be identical to each other.

In one or more embodiments, $CY_2$ and $CY_3$ in Formula 1 may be different from each other.

In one or more embodiments, at least one of $CY_{11}$ and $CY_{12}$ in Formula 3 may be a benzene group.

In one or more embodiments, $CY_{11}$ and $CY_{12}$ in Formula 3 may each be a benzene group.

In Formulae 1 and 2B, $X_{41}$ may be N or $C(R_{41})$, $X_{42}$ may be N or $C(R_{42})$, $X_{43}$ may be N or $C(R_{43})$, $X_{44}$ may be N or $C(R_{44})$, $X_{51}$ may be N or $C(R_{51})$, $X_{52}$ may be N or $C(R_{52})$, $X_{53}$ may be N or $C(R_{53})$, and $X_{54}$ may be N or $C(R_{54})$.

In an embodiment, $X_{41}$ may be $C(R_{41})$, $X_{42}$ may be $C(R_{42})$, $X_{43}$ may be $C(R_{43})$, $X_{44}$ may be $C(R_{44})$, $X_{51}$ may be $C(R_{51})$, $X_{52}$ may be $C(R_{52})$, $X_{53}$ may be $C(R_{53})$, and $X_{54}$ may be $C(R_{54})$.

$L_1$ in Formula 3 may be a single bond, a $C_3$-$C_{60}$ carbocyclic group unsubstituted or substituted with at least one $R_{1a}$, or a $C_1$-$C_{60}$ heterocyclic group unsubstituted or substituted with at least one $R_{1a}$.

In an embodiment, $L_1$ in Formula 3 may be:

a single bond; or a benzene group, a naphthalene group, an anthracene group, a dibenzofuran group, a dibenzothiophene group, a carbazole group, a fluorene group, or a dibenzosilole group, each being unsubstituted or substituted with at least one $R_{1a}$.

b1 in Formula 3 indicates the number of $L_1$(s), and may be an integer from 1 to 5 (for example, 1, 2, or 3). When b1 is 2 or more, two or more Li(s) may be identical to or different from each other.

$A_3$ in Formula 3 may be a single bond, O, S, $N(Z_3)$, $C(Z_3)(Z_4)$, or $Si(Z_3)(Z_4)$.

In an embodiment, $A_3$ may be a single bond or O.

$R_1$ to $R_3$, $R_{41}$ to $R_{44}$, $R_{51}$ to $R_{55}$, and $Z_1$ to $Z_4$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, $—Si(Q_1)(Q_2)(Q_3)$, $—N[(L_{11})_{b11}-Q_1][(L_{12})_{b12}-Q_2]$, $—B[(L_{11})_{b11}-Q_1][(L_{12})_{b12}-Q_2]$, $—C(=O)(Q_1)$, $—S(=O)_2(Q_1)$, or $—P(=O)(Q_1)(Q_2)$. In this regard, $L_{11}$ and $L_{12}$ may each independently be the same as described in connection with $L_1$, b11 and b12 may each independently be the same as described in connection with b1, and $Q_1$ to $Q_3$ may each independently be the same as described in the present specification.

In an embodiment, $R_1$ to $R_3$, $R_{41}$ to $R_{44}$, $R_{51}$ to $R_{55}$, and $Z_1$ to $Z_4$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, a benzosilolyl group, a benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothienyl group, a dibenzosilolyl group, a benzofluorenyl group, a benzocarbazolyl group, a naphthobenzofuranyl group, a naphthobenzothienyl group, a naphthobenzosilolyl group, a dibenzofluorenyl group, a dibenzocarbazolyl group, a dinaphthofuranyl group, a dinaphthothienyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothienyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, a benzosilolyl group, a benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothienyl group, a dibenzosilolyl group, a benzofluorenyl group, a benzocarbazolyl group, a naphthobenzofuranyl group, a naphthobenzothienyl group, a naphthobenzosilolyl group, a dibenzofluorenyl group, a dibenzocarbazolyl group, a dinaphthofuranyl group, a dinaphthothienyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—Si(Q_1)(Q_2)(Q_3)$, $—N[(L_{11})_{b11}-Q_1][(L_{12})_{b12}-Q_2]$, $—B[(L_{11})_{b11}-Q_1][(L_{12})_{b12}-Q_2]$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, $R_1$ to $R_3$, $R_{41}$ to $R_{44}$, $R_{51}$ to $R_{55}$, and $Z_1$ to $Z_4$ may each independently be:

hydrogen, deuterium, —F, a cyano group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —CDs, $—CD_2H$, $—CDH_2$, $—CF_3$, $—CF_2H$, $—CFH_2$, a cyano group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a thienyl group, a furanyl group, an indenyl group, an isoindolyl group, an indolyl group, a carbazolyl group, a benzofuranyl group, a benzothienyl group, a benzosilolyl group, a dibenzofuranyl group, a dibenzothienyl group, a dibenzosilolyl group, a benzofluorenyl group, a benzocarbazolyl group, a naphthobenzofuranyl group, a naphthobenzothienyl group, a naphthobenzosilolyl group, a dibenzofluorenyl group, a dibenzocarbazolyl group, a dinaphthofuranyl group, a dinaphthothienyl group, a dinaphthosilolyl group, an indenocarbazolyl group, an indolocarbazolyl group, a benzofuranocarbazolyl group, a benzothienocarbazolyl group, or a benzosilolocarbazolyl group, each unsubstituted or substituted with deuterium, —F, —CDs, $—CD_2H$, $—CDH_2$, $—CF_3$, $—CF_2H$, $—CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a thienyl group, a furanyl group, an indenyl group, an isoindolyl group, an indolyl group, a carbazolyl group, a benzofuranyl group, a benzothienyl group, a benzosilolyl group, a dibenzofuranyl group, a dibenzothienyl group, a dibenzosilolyl group, a benzofluorenyl group, a benzocarbazolyl group, a naphthobenzofuranyl group, a naphthobenzothienyl group, a naphthobenzosilolyl group, a dibenzofluorenyl group, a dibenzocarbazolyl group, a dinaphthofuranyl group, a dinaphthothienyl group, a dinaphthosilolyl group, an indenocarbazolyl group, an indolocarbazolyl group, a benzofuranocarbazolyl group, a benzothienocarbazolyl group, a benzosilolocarbazolyl group, —N($Q_{31}$)($Q_{32}$), —B($Q_{31}$)($Q_{32}$), or any combination thereof; or —N[$(L_{11})_{b11}$-$Q_1$][$(L_{12})_{b12}$-$Q_2$] or —B[$(L_{11})_{b11}$-$Q_1$][$(L_{12})_{b12}$-$Q_2$].

In one or more embodiments, $R_1$ to $R_3$, $R_{41}$ to $R_{44}$, $R_{51}$ to $R_{55}$, and $Z_1$ to $Z_4$ may each independently be:

hydrogen, deuterium, —F, or a cyano group;

a group represented by —C($Q_{41}$)($Q_{42}$)($Q_{43}$) or —N[$(L_{11})_{b11}$-$Q_1$][$(L_{12})_{b12}$-$Q_2$];

a phenyl group unsubstituted or substituted with deuterium, —F, a cyano group, a $C_1$-$C_{20}$ alkyl group, a phenyl group, a biphenyl group, a $C_1$-$C_{20}$ alkylphenyl group, or any combination thereof; or a group represented by one of Formulae 4(1) to 4(5).

$Q_{41}$ to $Q_{43}$ may each independently be hydrogen, deuterium, or a $C_1$-$C_{20}$ alkyl group unsubstituted or substituted with deuterium.

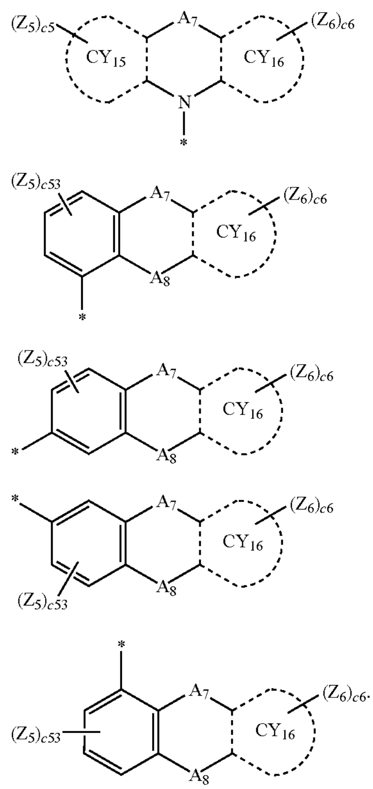

In Formulae 4(1) to 4(5), $CY_{15}$ and $CY_{16}$ may each independently be a $C_3$-$C_{60}$ carbocyclic group or a $C_1$-$C_{60}$ heterocyclic group, $A_7$ may be a single bond, O, S, N($Z_{7a}$), C($Z_{7a}$)($Z_{7b}$), or Si($Z_{7a}$)($Z_{7b}$), $A_8$ may be O, S, N($Z_{8a}$), C($Z_{8a}$)($Z_{8b}$), or Si($Z_{8a}$)($Z_{8b}$), $Z_5$, $Z_6$, $Z_{7a}$, $Z_{7b}$, $Z_{8a}$, and $Z_8b$ may each independently be the same as described in connection with $Z_1$, c5 and c6 may each independently be the same as described in connection with c1, c53 may be an integer from 0 to 3, and

* indicates a binding site to a neighboring atom.

In an embodiment, $Q_{41}$ to $Q_{43}$ may each be a $C_1$-$C_{20}$ alkyl group unsubstituted or substituted with deuterium.

In one or more embodiments, $CY_{15}$ in Formula 4(1) and $CY_{16}$ in Formulae 4(1) to 4(5) may each independently be a benzene group, a naphthalene group, an anthracene group, a dibenzofuran group, a dibenzothiophene group, a carbazole group, a fluorene group, or a dibenzosilole group.

In an embodiment, at least one of $CY_{15}$ and $CY_{16}$ in Formula 4(1) (for example, both (e.g., simultaneously) $CY_{15}$ and $C_{16}$) may be a benzene group.

In one or more embodiments, c5 in Formula 4(1) and c53 in Formulae 4(2) to 4(5) each indicate the number of $Z_5$(s), c6 in Formulae 4(1) to 4(5) indicates the number of $Z_6$(s), and c5, c53, and c6 may each be, for example, 0, 1, 2, or 3. When c5 and c53 are each 2 or more, two or more $Z_5$(s) may be identical to or different from each other, and when c6 is 2 or more, two or more $Z_6$(s) may be identical to or different from each other.

In one or more embodiments, a group represented by one of Formulae 4(1) to 4(5) may be a group represented by one of Formulae 4-1 to 4-12:

4-1

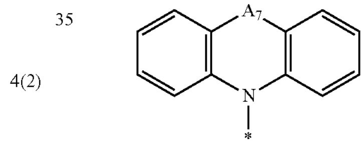

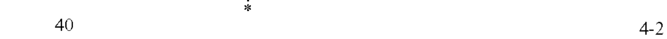

4-2

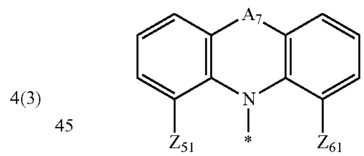

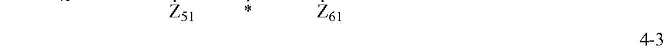

4-3

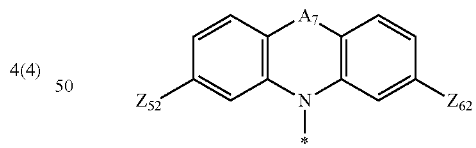

4-4

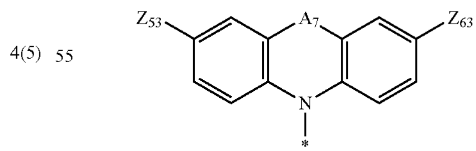

4-5

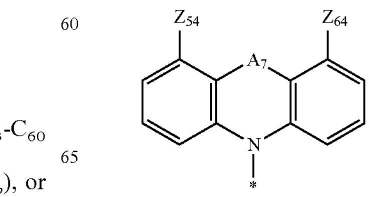

-continued 4-6

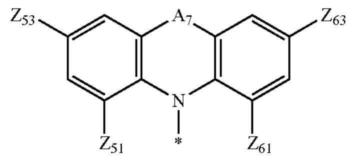

4-7

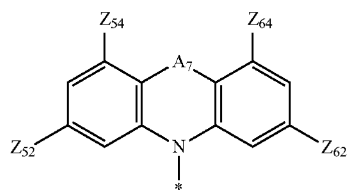

4-8

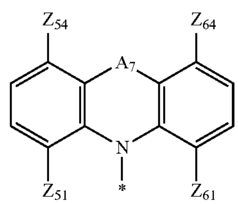

4-9

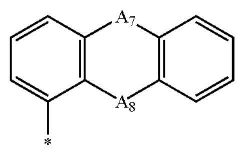

4-10

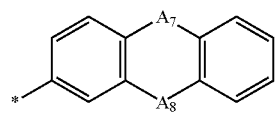

4-11

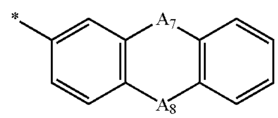

4-12

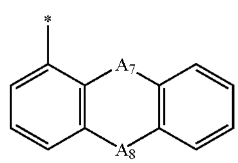

In Formulae 4-1 to 4-12, $A_7$ and $A_8$ may each independently be the same as described in above, $Z_{51}$ to $Z_{54}$ may each independently be the same as described in connection with $Z_5$, and each of $Z_{51}$ to $Z_{54}$ may not be hydrogen, $Z_{61}$ to $Z_{64}$ may each independently be the same as described in connection with $Z_6$, and each of $Z_{61}$ to $Z_{64}$ may not be hydrogen, and

* indicates a binding site to a neighboring atom.

In one or more embodiments, at least one of the a1 $R_1$(s) of Formula 1 may not be hydrogen.

In one or more embodiments, at least one of the a2 $R_2$(s) of Formula 1 may not be hydrogen.

In one or more embodiments, at least one of the a3 $R_3$(s) of Formula 1 may not be hydrogen.

In Formulae 1 and 3, a1 to a3, c1, and c2 respectively indicate the numbers of $R_1$ to $R_3$, $Z_1$, and $Z_2$, and may each independently be an integer from 0 to 10 (for example, 0, 1, or 3). When a1 is 2 or more, two or more $R_1$(s) may be identical to or different from each other, when a2 is 2 or more, two or more $R_2$(s) may be identical to or different from each other, when a3 is 2 or more, two or more $R_3$(s) may be identical to or different from each other, when c1 is 2 or more, two or more $Z_1$(s) may be identical to or different from each other, and when c2 is 2 or more, two or more $Z_2$(s) may be identical to or different from each other.

* in Formula 3 indicates a binding site to a neighboring atom.

$R_1a$ may be the same as described in connection with $R_1$.

In Formulae 1 and 3, i) two or more of the a1 $R_1$(s) may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, ii) two or more of the a2 $R_2$(s) in the may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, iii) two or more of the a3 $R_3$(s) may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, iv) two or more of the c1 $Z_1$(s) may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, and v) two or more the c2 $Z_2$(s) may optionally be linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$.

In an embodiment, the group represented by

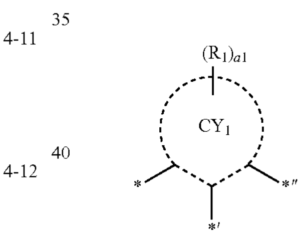

in Formula 1 may be a group represented by one of Formulae CY1-1 to CY1-7:

CY1-1

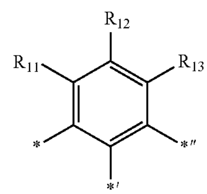

CY1-2

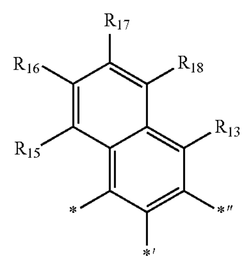

-continued

CY1-3

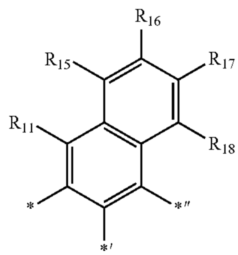

CY1-4

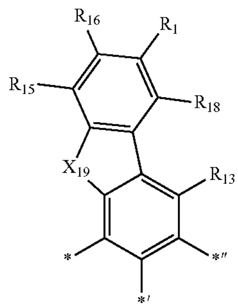

CY1-5

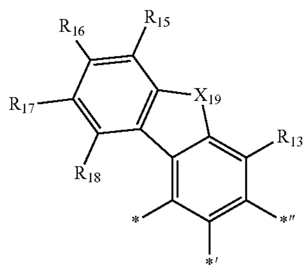

CY1-6

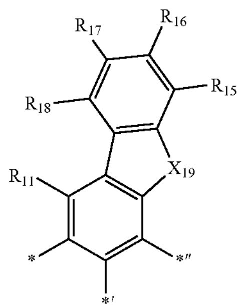

CY1-7

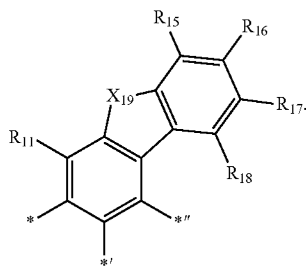

In Formulae CY1-1 to CY1-7, $X_{19}$ may be O, S, $N(R_{19a})$, $C(R_{19a})(R_{19b})$, or $Si(R_{19a})(R_{19b})$, $R_{11}$ to $R_{13}$, $R_{15}$ to $R_{18}$, $R_{19a}$, and $R_{19}b$ may each independently be the same as described in connection with $R_1$,

* indicates a binding site to N in Formula 1,

*' indicates a binding site to B in Formula 1, and

*" indicates a binding site to $X_5$ in Formula 1.

In an embodiment, a group represented by Formula CY1-1 may be a group represented by Formula CY1-1(1):

CY1-1(1)

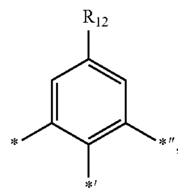

and $R_{12}$ in Formula CY1-1(1) may not be hydrogen.

In an embodiment, $R_{12}$ in Formula CY1-1(1) may be:

deuterium, —F, or a cyano group;

a group represented by $—C(Q_{41})(Q_{42})(Q_{43})$ or $—N[(L_{11})_{b11}-Q_1][(L_{12})_{b12}-Q_2]$;

a phenyl group unsubstituted or substituted with deuterium, —F, a cyano group, a $C_1$-$C_{20}$ alkyl group, a phenyl group, a biphenyl group, a $C_1$-$C_{20}$ alkylphenyl group, or any combination thereof; or a group represented by one of Formulae 4(1) to 4(5).

In one or more embodiments, a group represented by

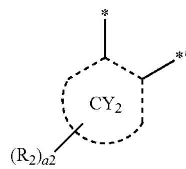

in Formula 1 may be a group represented by one of Formulae CY2-1 to CY2-10:

CY2-1

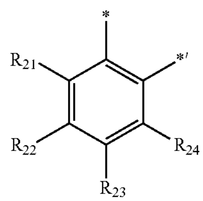

CY2-2

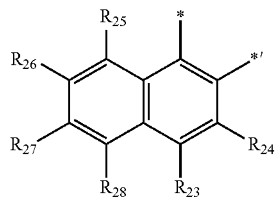

CY2-3

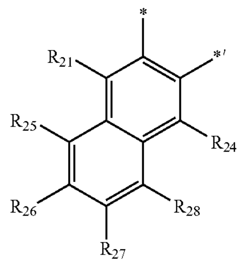

-continued

CY2-4

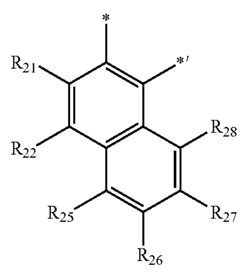

CY2-5

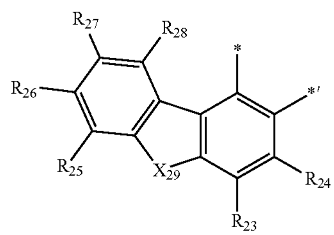

CY2-6

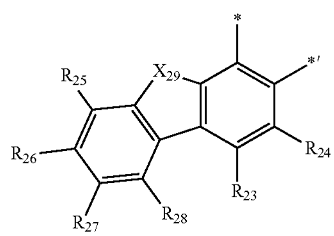

CY2-7

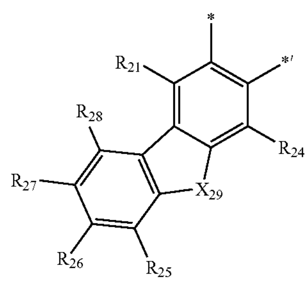

CY2-8

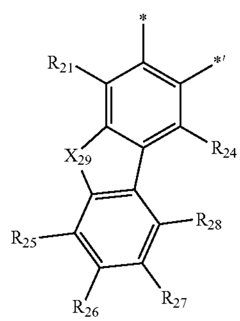

-continued

CY2-9

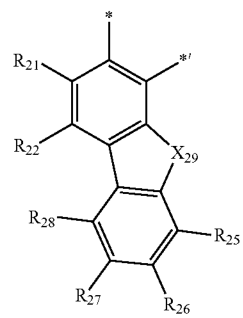

CY2-10

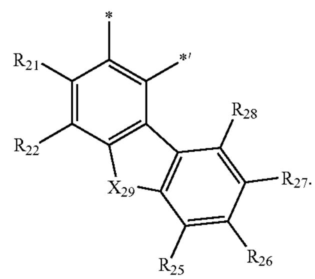

In Formulae CY2-1 to CY2-10, $X_{29}$ may be O, S, $N(R_{29a})$, $C(R_{29a})(R_{29b})$, or $Si(R_{29a})(R_{29b})$, $R_{21}$ to $R_{28}$, $R_{29a}$, and $R_{29}b$ may each independently be the same as described in connection with $R_2$,

* indicates a binding site to N in Formula 1, and

*' indicates a binding site to B in Formula 1.

In an embodiment, a group represented by Formula CY2-1 may be a group represented by one of Formulae CY2-1(1) to CY2-1(3):

CY2-1(1)

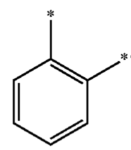

CY2-1(2)

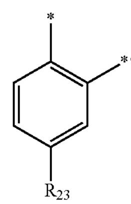

CY2-1(3)

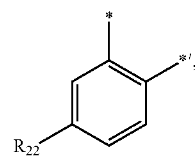

and each of $R_{22}$ and $R_{23}$ in Formulae CY2-1(2) and CY2-1(3) may not be hydrogen.

In an embodiment, $R_{22}$ and $R_{23}$ in Formulae CY2-1(2) and CY2-1(3) may each independently be:

deuterium, —F, or a cyano group;

a group represented by $—C(Q_{41})(Q_{42})(Q_{43})$ or $—N[(L_{11})_{b11}\text{-}Q_1][(L_{12})_{b12}\text{-}Q_2]$;

a phenyl group unsubstituted or substituted with deuterium, —F, a cyano group, a $C_1$-$C_{20}$ alkyl group, a phenyl group, a biphenyl group, a $C_1$-$C_{20}$ alkylphenyl group, or any combination thereof; or a group represented by one of Formulae 4(1) to 4(5).

In one or more embodiments, a group represented by

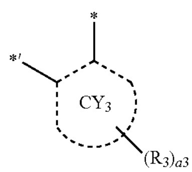

in Formula 1 may be a group represented by one of Formulae CY3-1 to CY3-10:

CY3-1

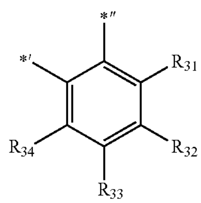

CY3-2

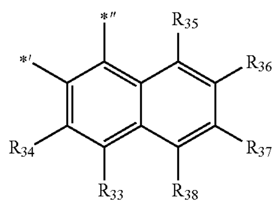

CY3-3

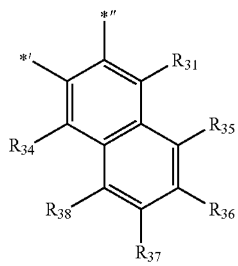

CY3-4

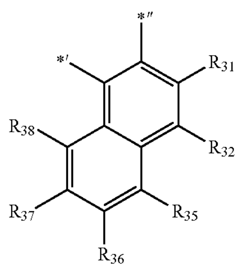

-continued

CY3-5

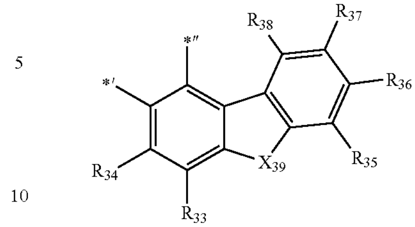

CY3-6

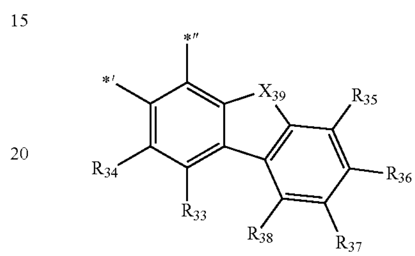

CY3-7

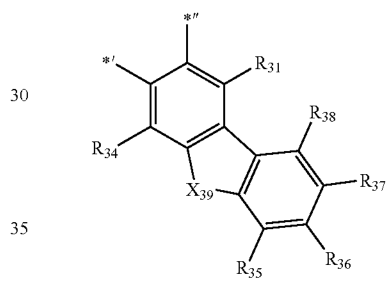

CY3-8

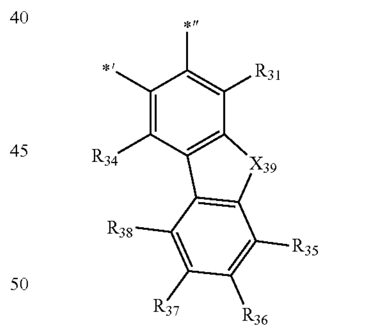

CY3-9

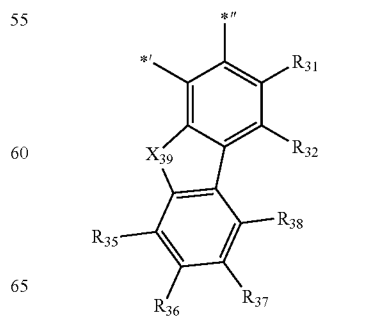

-continued

CY3-10

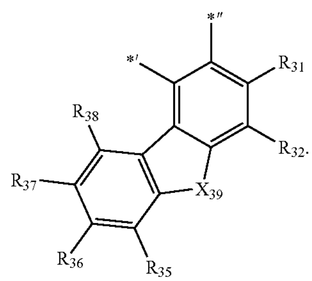

In Formulae CY3-1 to CY3-10, $X_{39}$ may be O, S, $N(R_{39a})$, $C(R_{39a})(R_{39b})$, or $Si(R_{39a})(R_{39b})$, $R_{31}$ to $R_{38}$, $R_{39a}$, and $R_{39}b$ may each independently be the same as described in connection with $R_3$,

*' indicates a binding site to B in Formula 1, and

*" indicates a binding site to $X_5$ in Formula 1.

In an embodiment, a group represented by Formula CY3-1 may be a group represented by one of Formulae CY3-1(1) to CY3-1(3):

CY3-1(1)

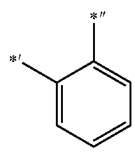

CY3-1(2)

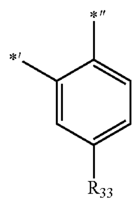

CY3-1(3)

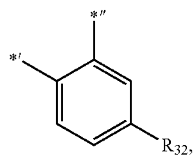

and each of $R_{32}$ and $R_{33}$ in Formulae CY3-1(2) and CY3-1(3) may not be hydrogen.

In an embodiment, $R_{32}$ and $R_{33}$ in Formulae CY3-1(2) and CY3-1(3) may each independently be:

deuterium, —F, or a cyano group;

a group represented by $—C(Q_{41})(Q_{42})(Q_{43})$ or $—N[(L_{11})_{b11}-Q_1][(L_{12})_{b12}-Q_2]$;

a phenyl group unsubstituted or substituted with deuterium, —F, a cyano group, a $C_1$-$C_{20}$ alkyl group, a phenyl group, a biphenyl group, a $C_1$-$C_{20}$ alkylphenyl group, or any combination thereof; or a group represented by one of Formulae 4(1) to 4(5).

In one or more embodiments, a group represented by

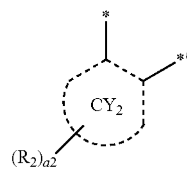

and a group represented by

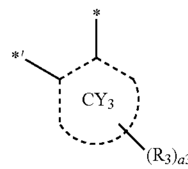

in Formula 1 may be identical to each other.

In one or more embodiments, a group represented by

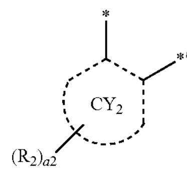

and a group represented by

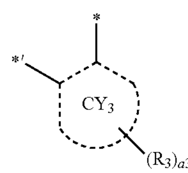

in Formula 1 may be different from each other.

In one or more embodiments, $Ar_4$ and $Ar_5$ may each independently be a group represented by one of Formulae 3-1 to 3-8:

3-1

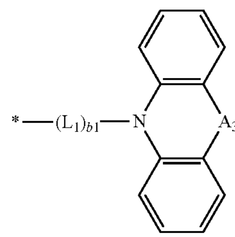

3-2

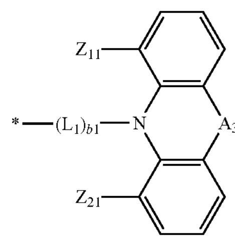

-continued 3-3

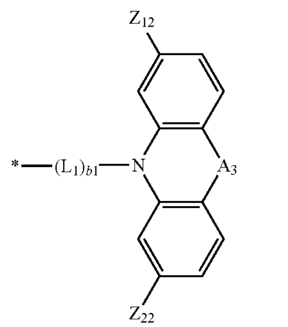

3-4

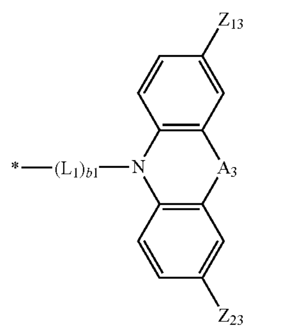

3-5

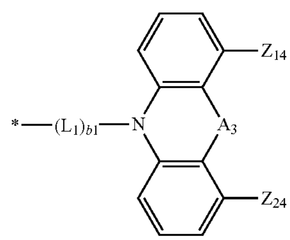

3-6

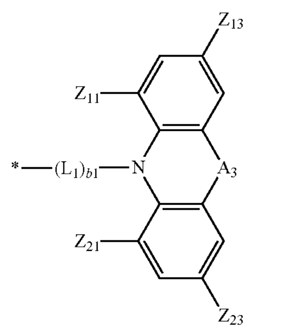

-continued 3-7

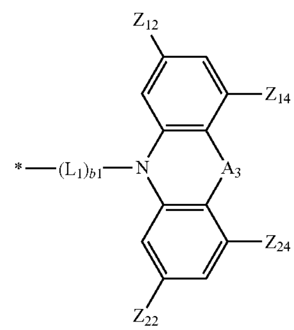

3-8

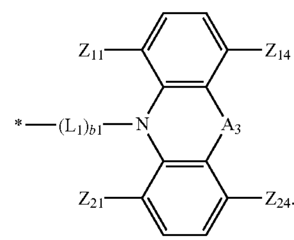

In Formulae 3-1 to 3-8, $L_1$, b1, and $A_3$ may each independently be the same as described above, $Z_{11}$ to $Z_{14}$ may each independently be the same as described in connection with $Z_1$, and each of $Z_{11}$ to $Z_{14}$ may not be hydrogen, $Z_{21}$ to $Z_{24}$ may each independently be the same as described in connection with $Z_2$, and each of $Z_{21}$ to $Z_{24}$ may not be hydrogen, and

* indicates a binding site to a neighboring atom.

The heterocyclic compound represented by Formula 1 may be, for example, one of Compounds 1 to 73:

1

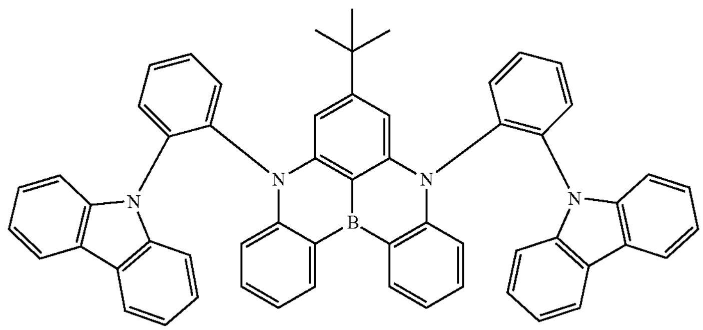

-continued
2
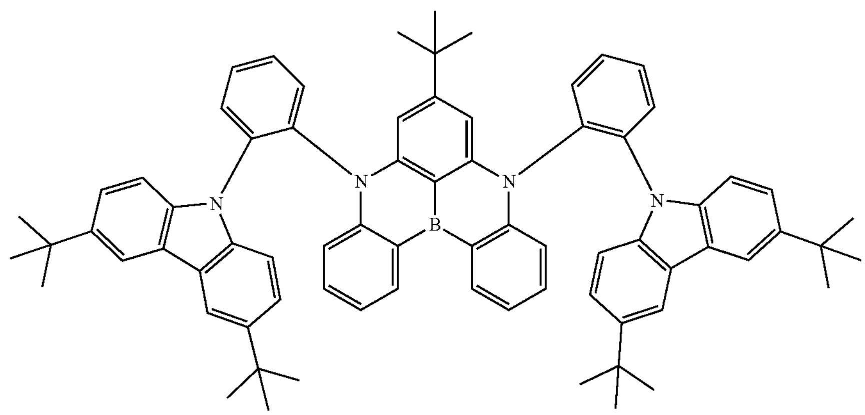
3
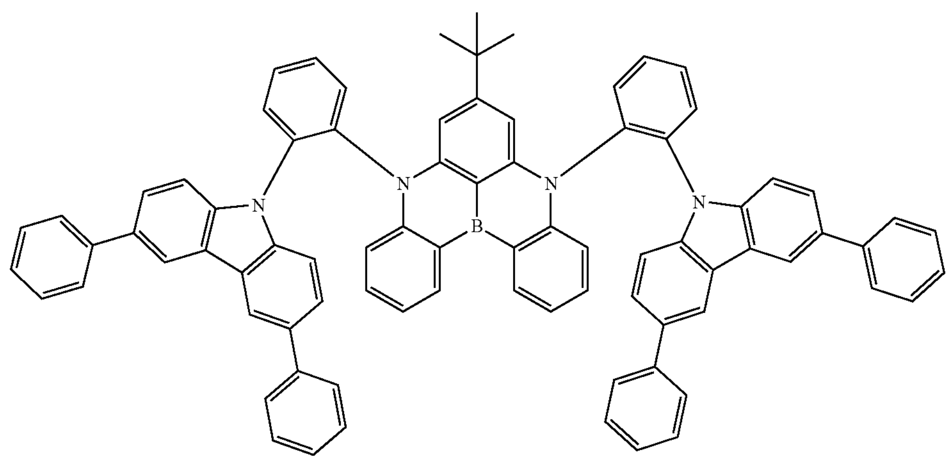
4
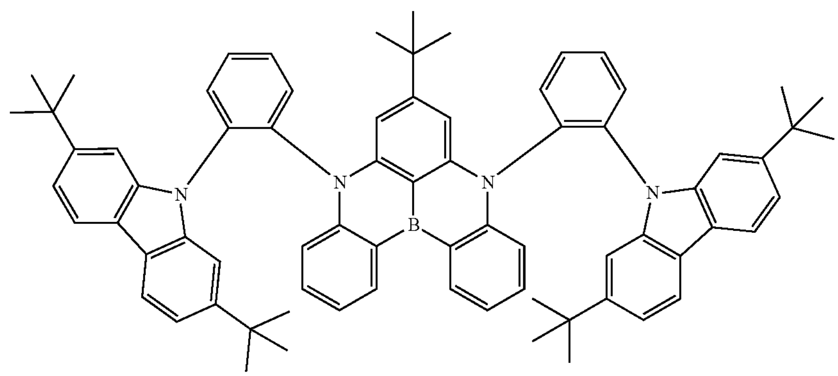
5
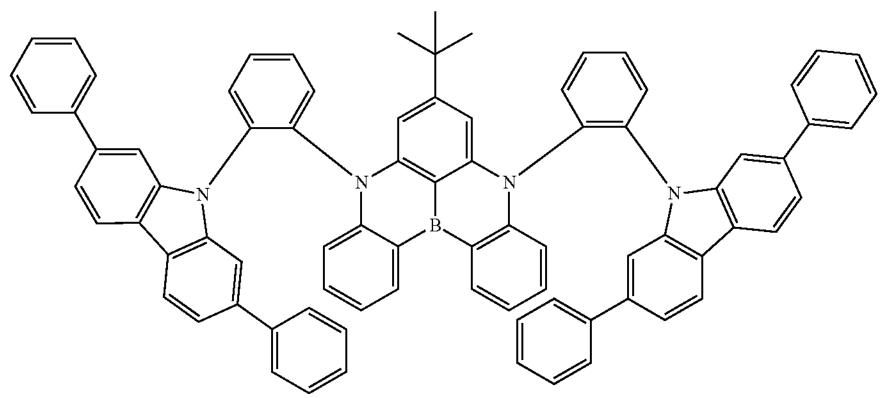

-continued
6
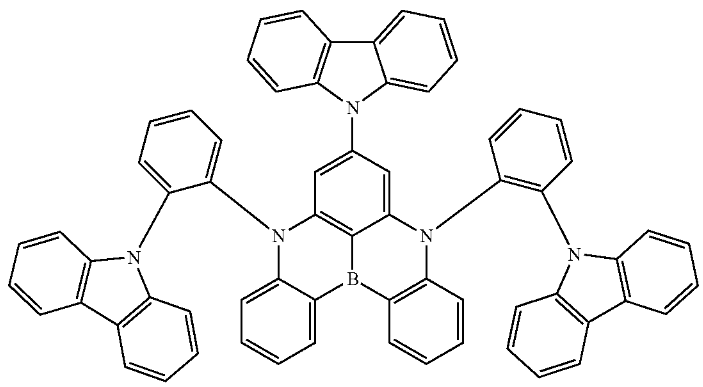
7
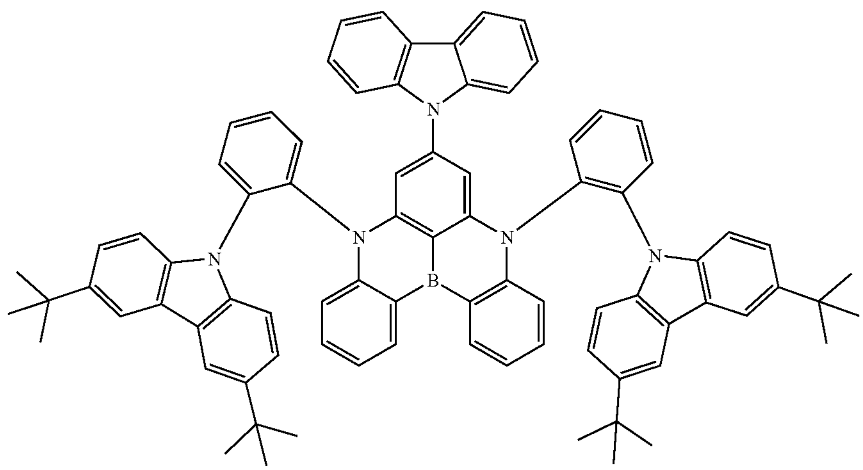
8
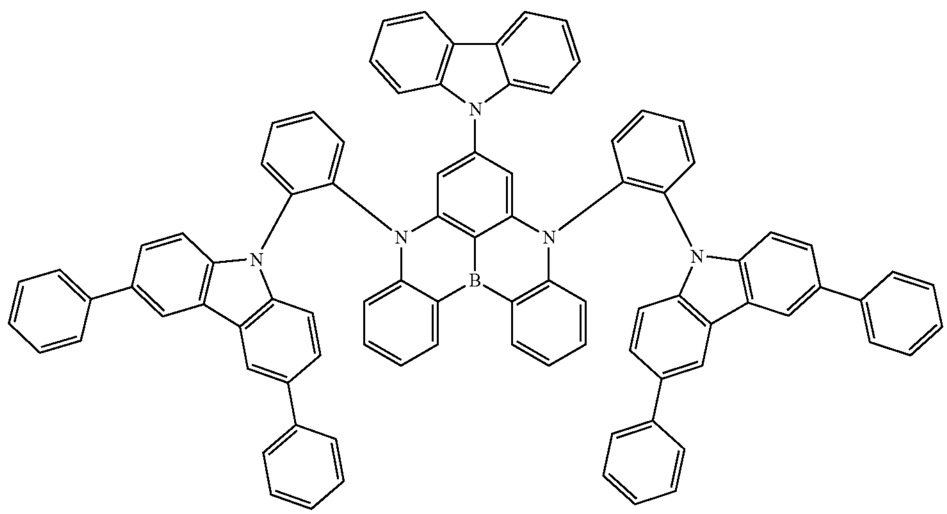

-continued
9
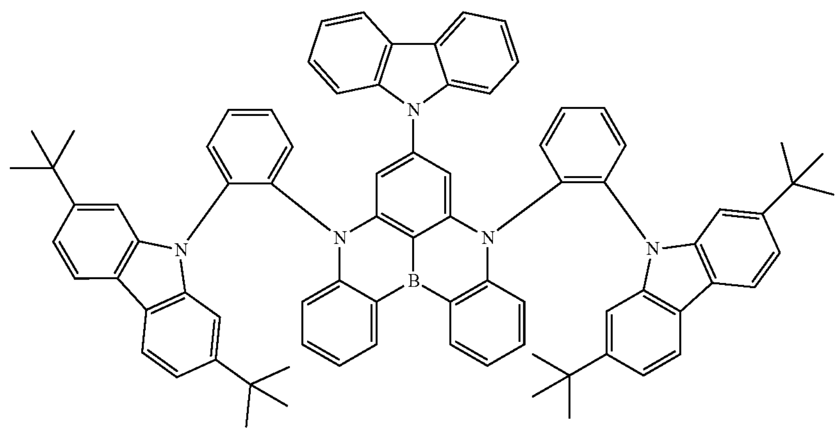
10
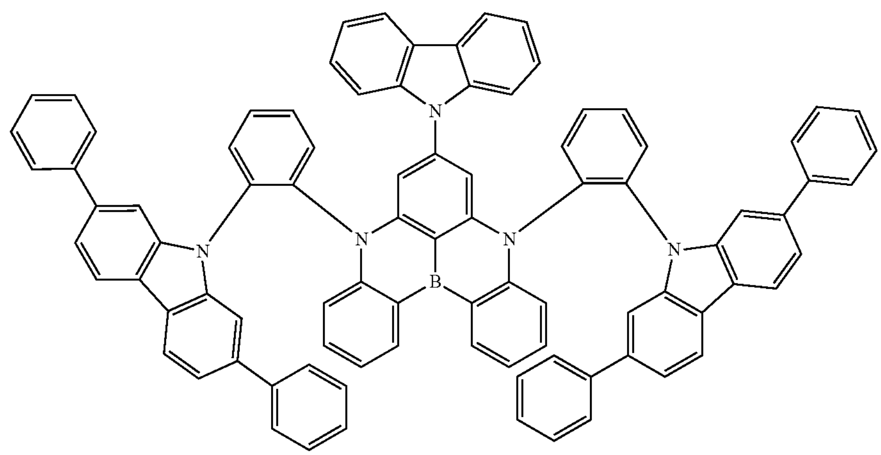
11
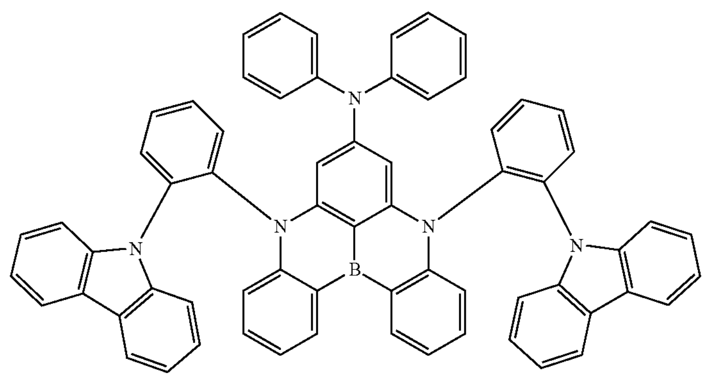

-continued
12
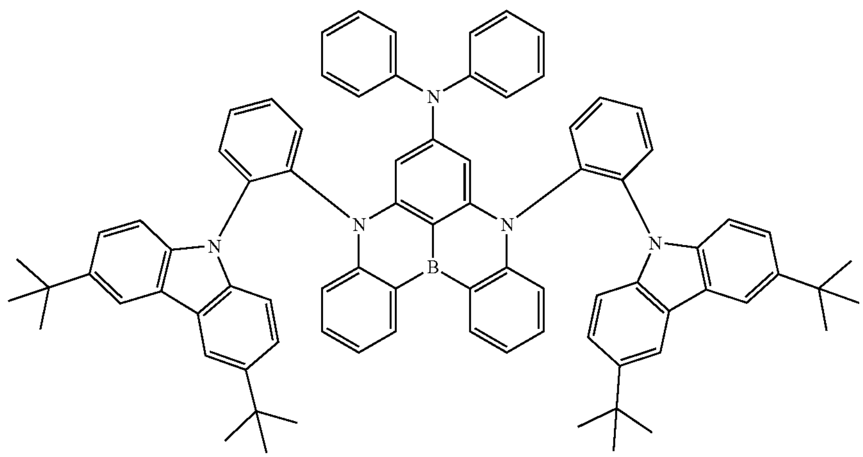
13
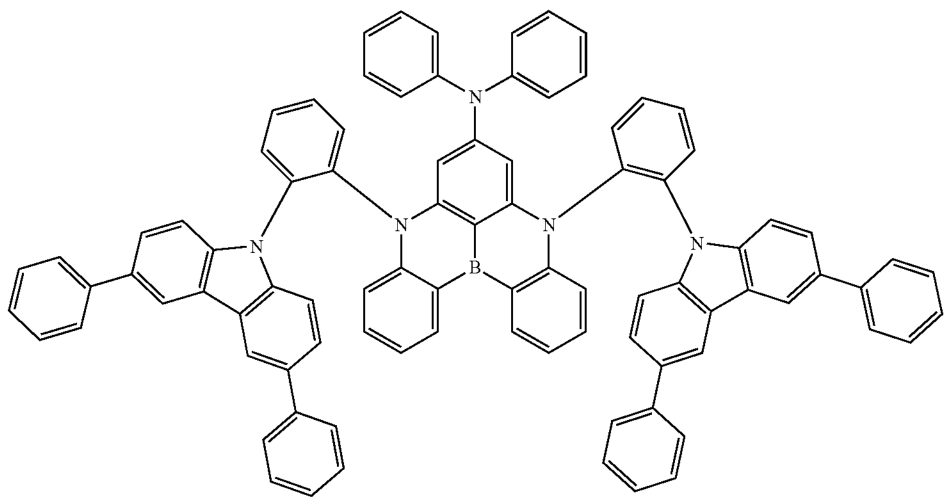
14
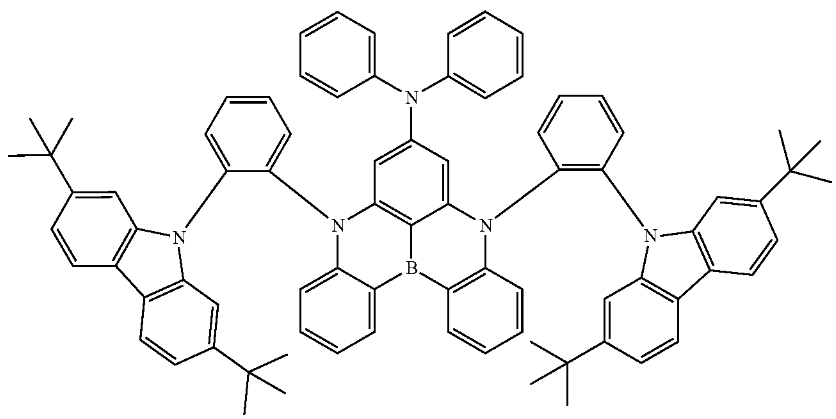

-continued
15
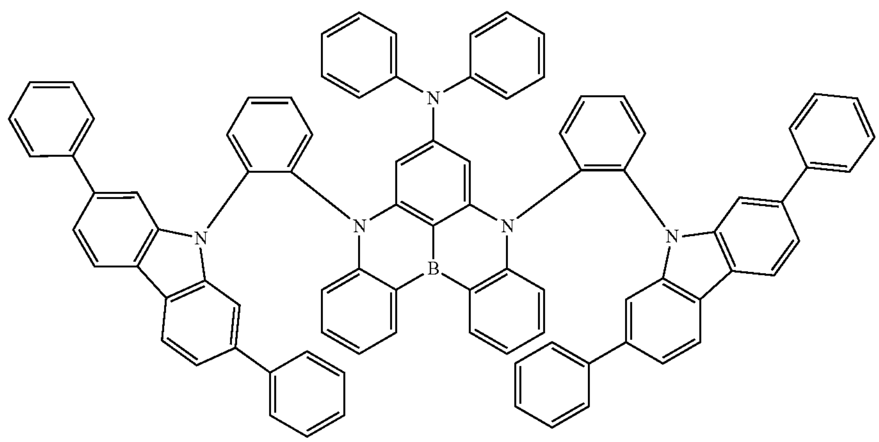
16
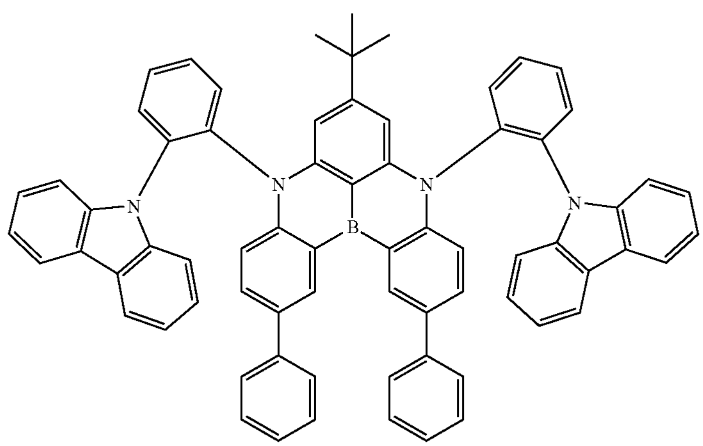
17
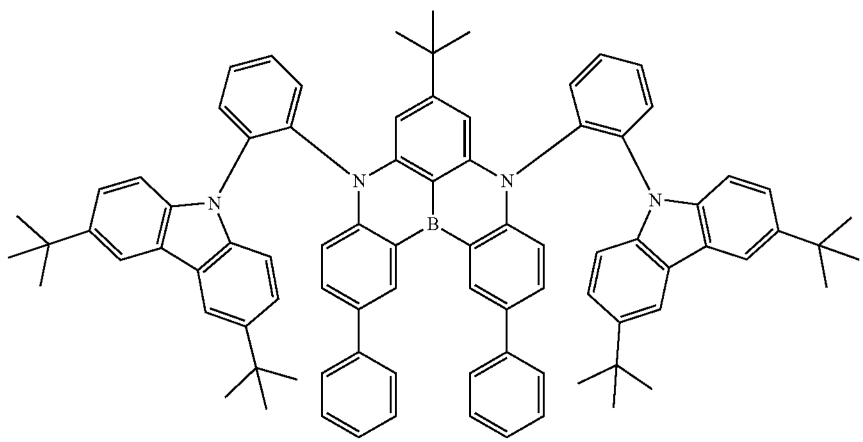

-continued
18
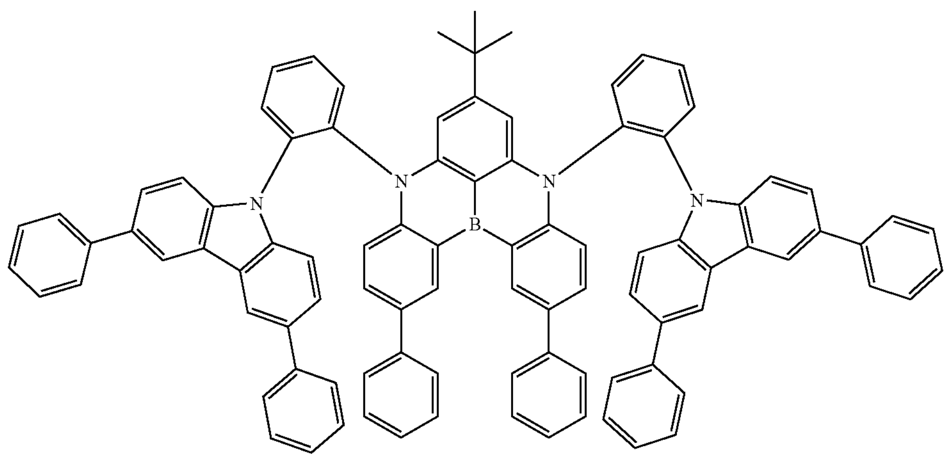
19
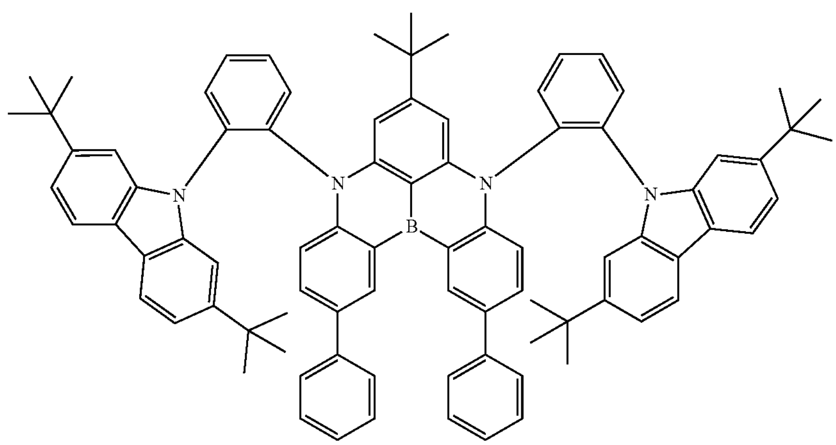
20
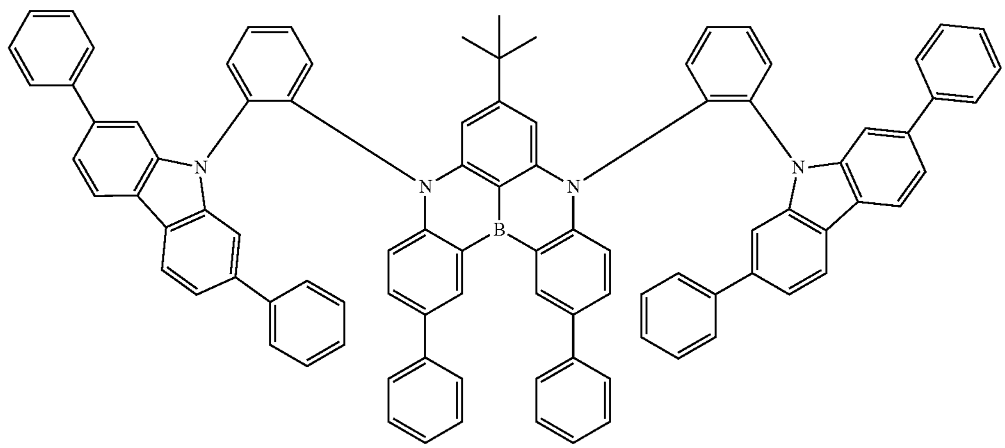

-continued
21
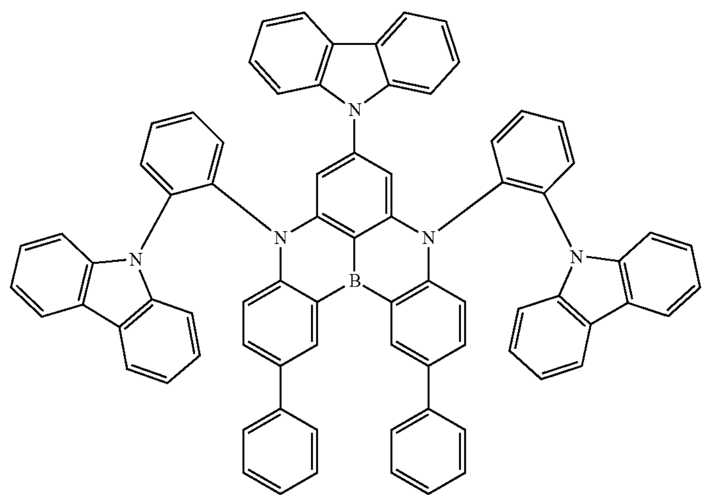
22
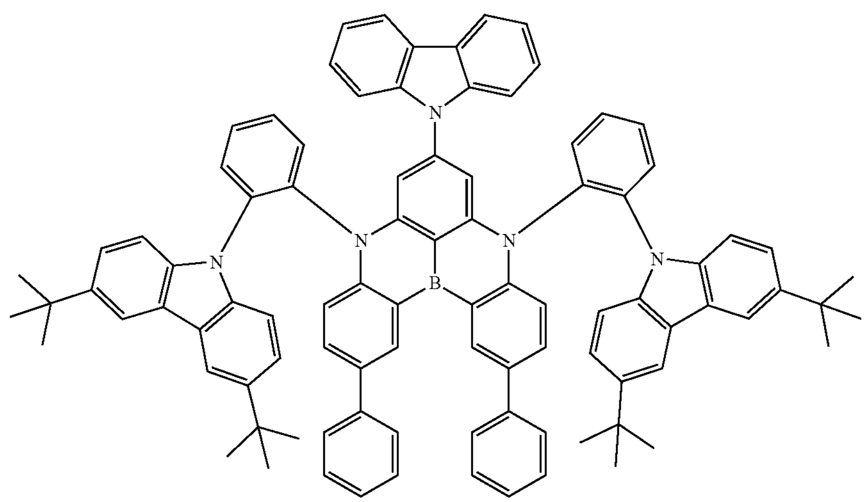
23
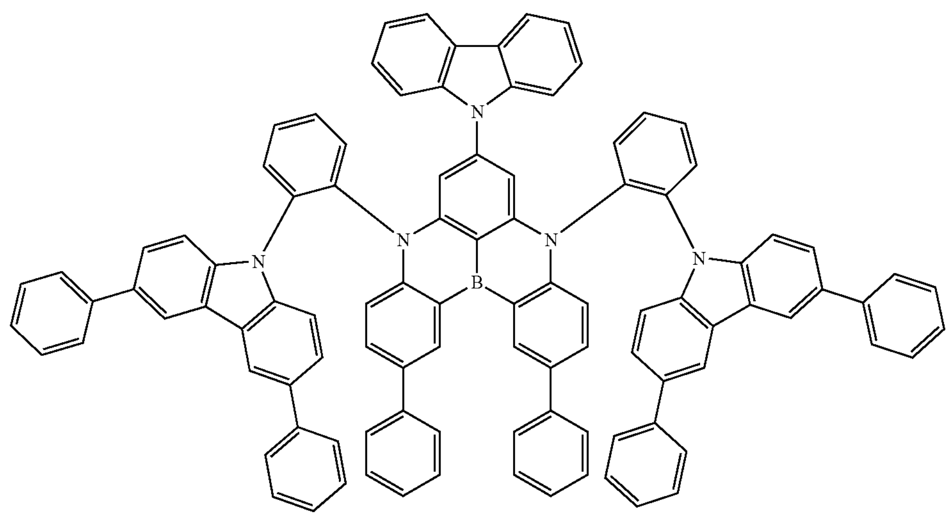

-continued
24
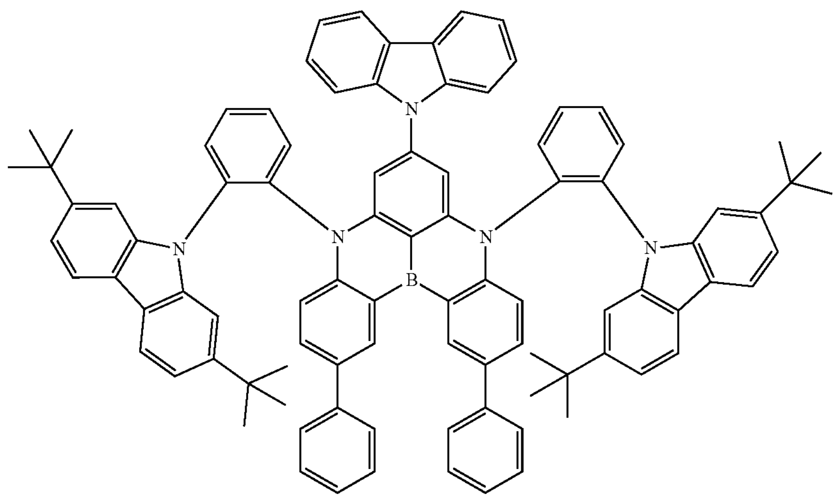
25
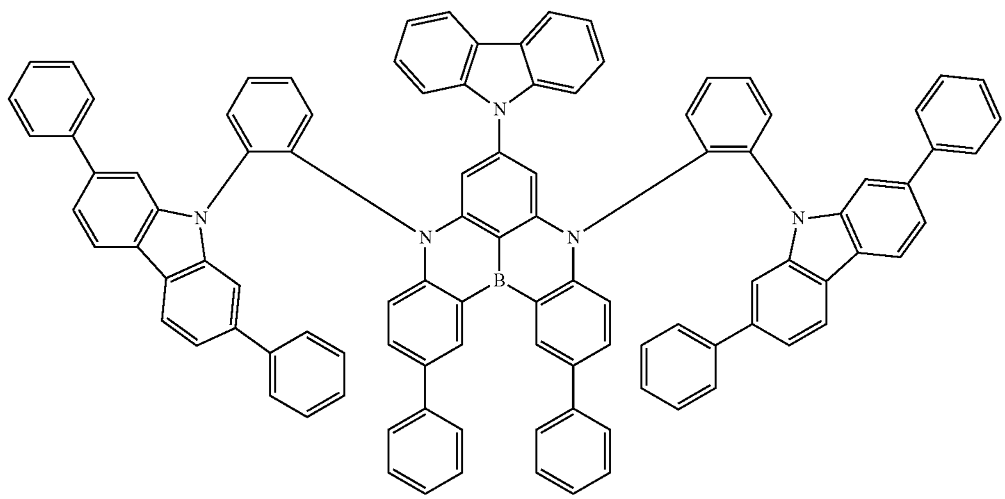
26
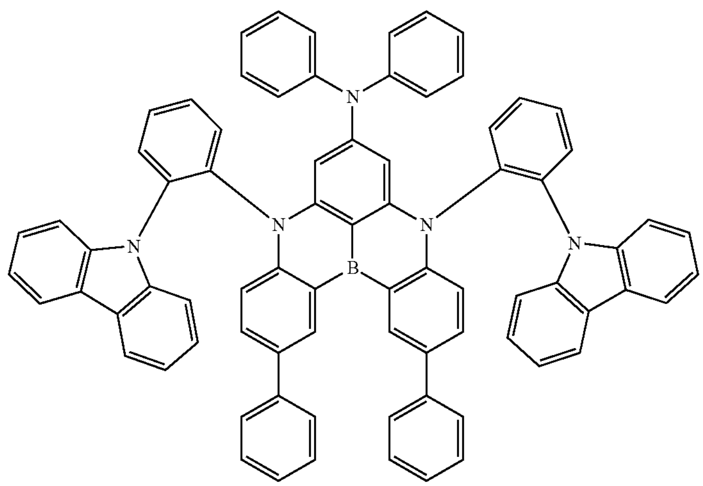

-continued
27
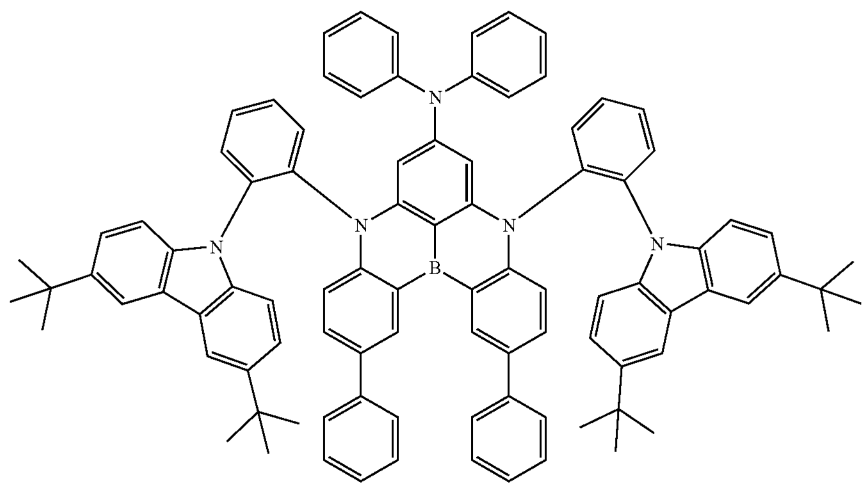
28
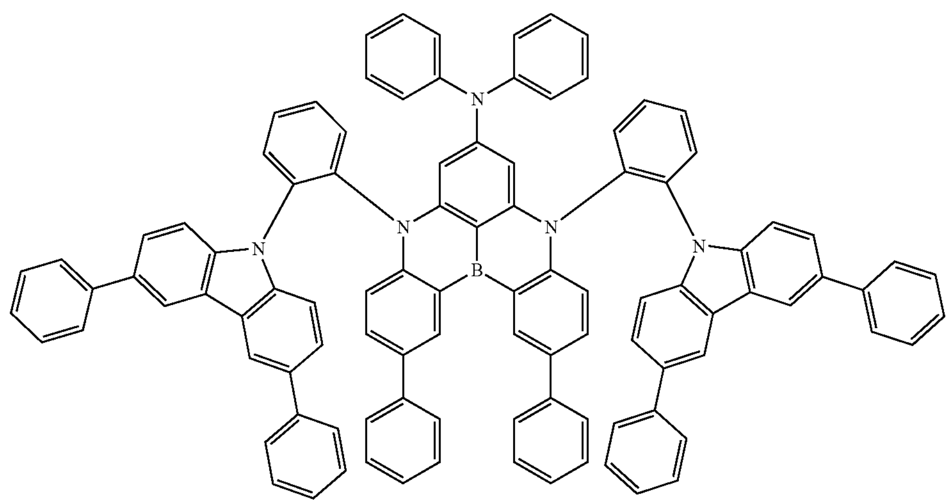
29
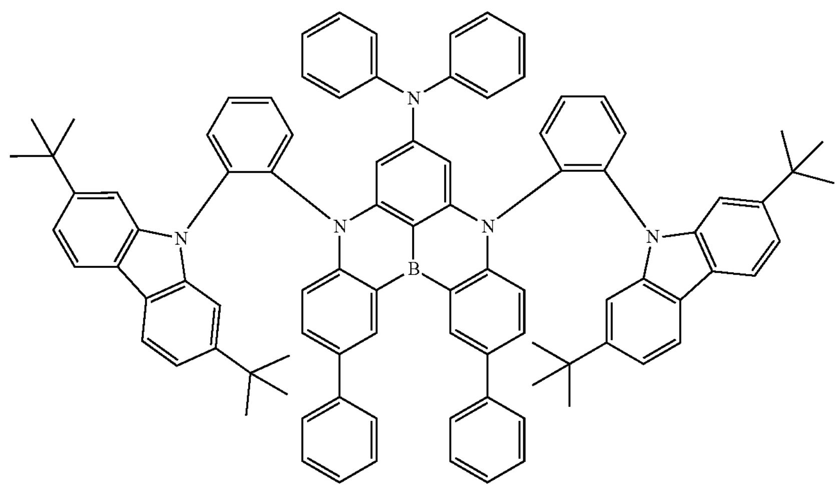

-continued
30
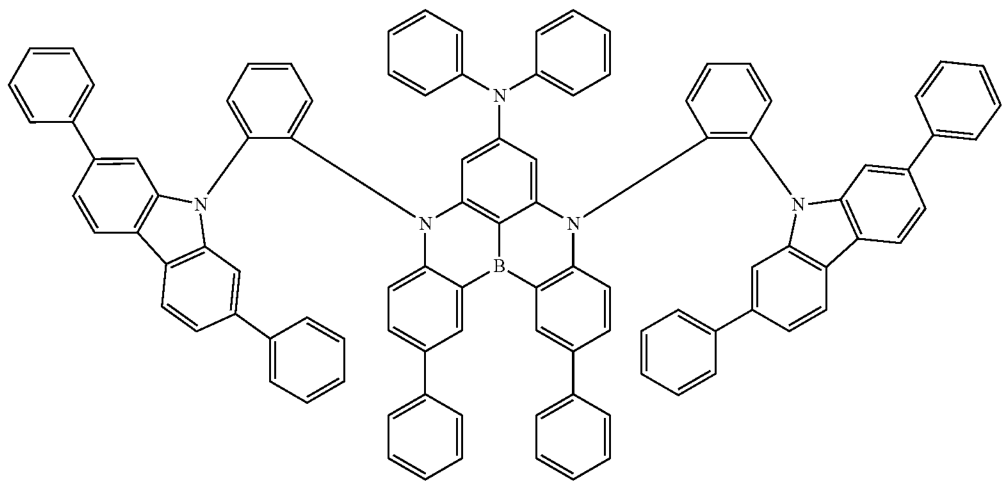
31
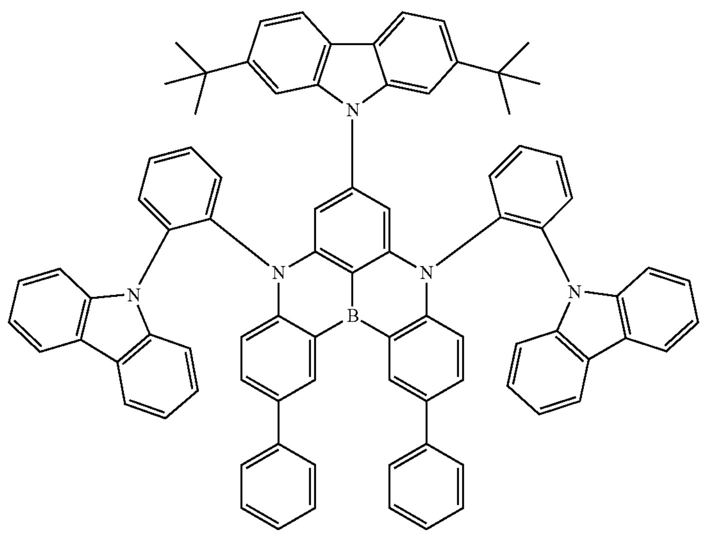
32
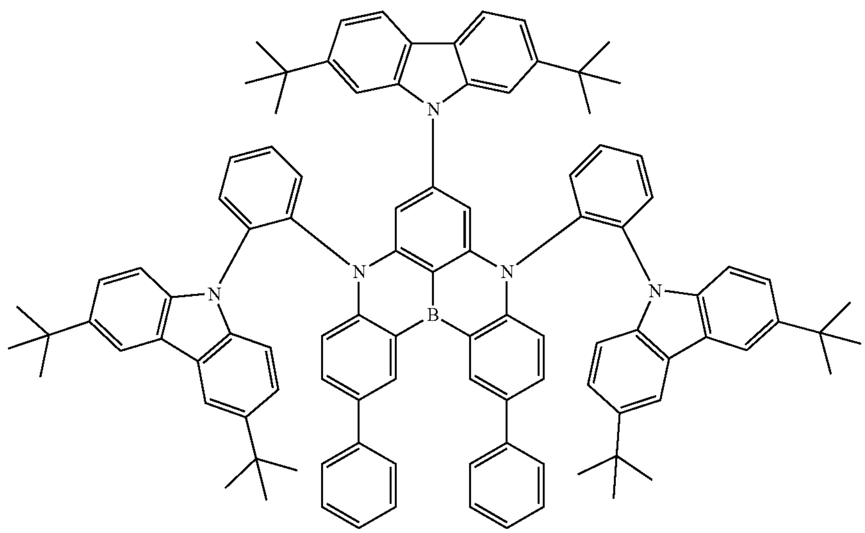

-continued
33
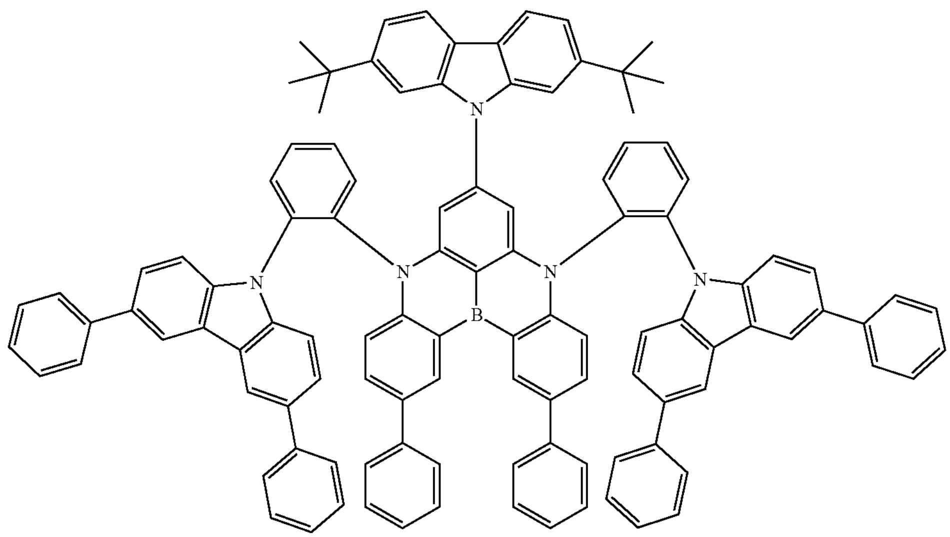
34
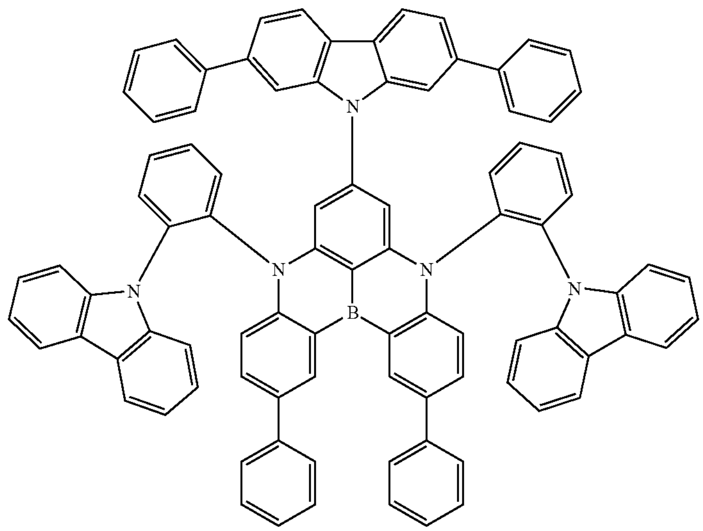
35
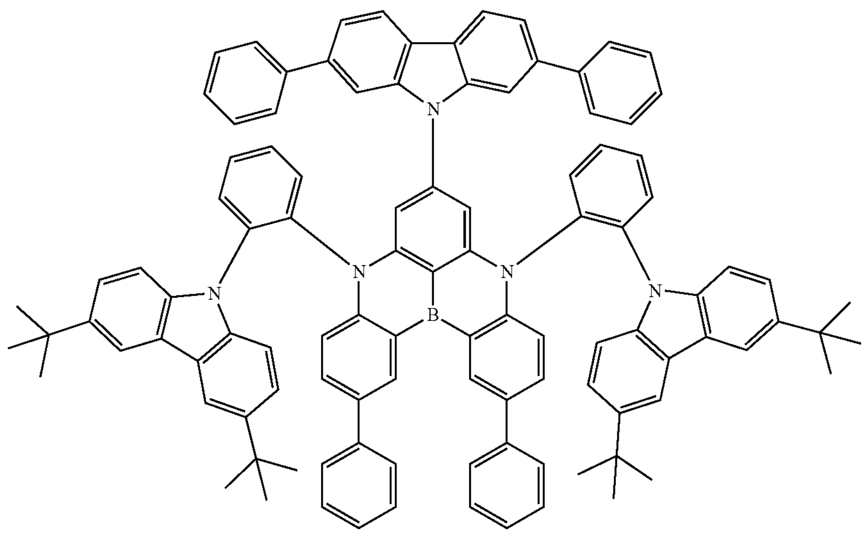

-continued
36
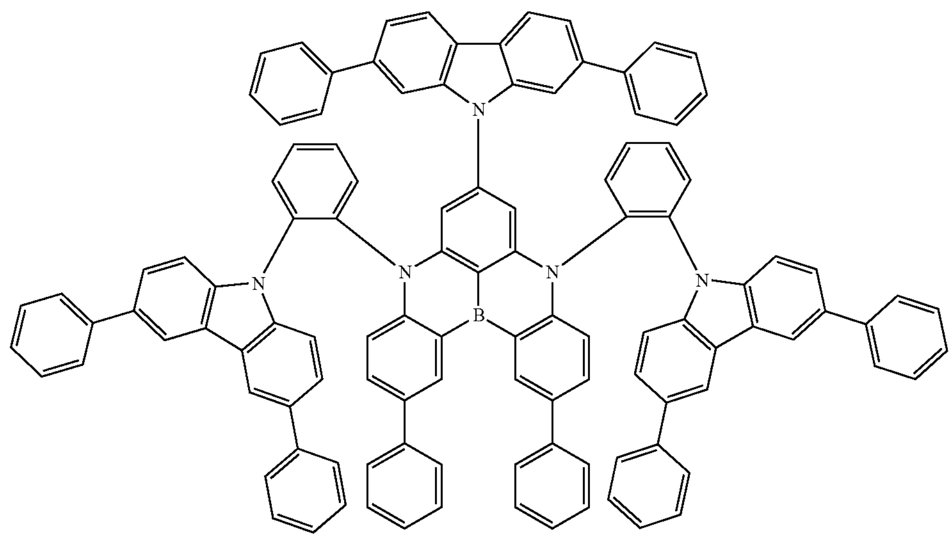
37
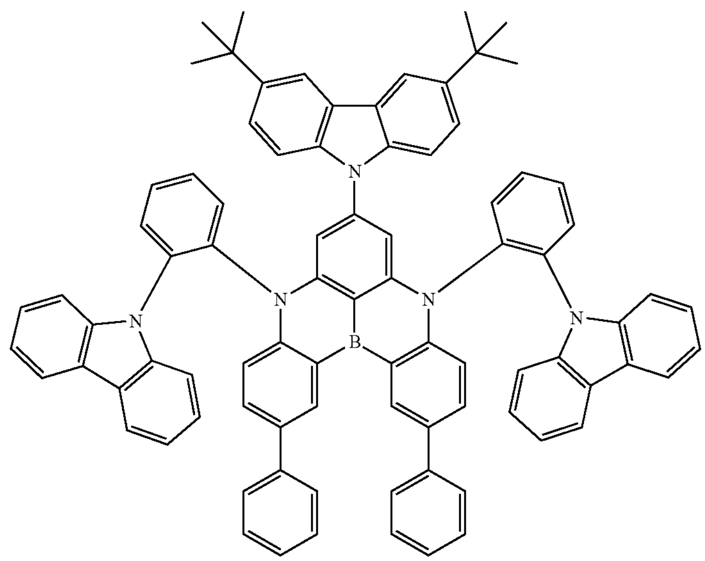
38
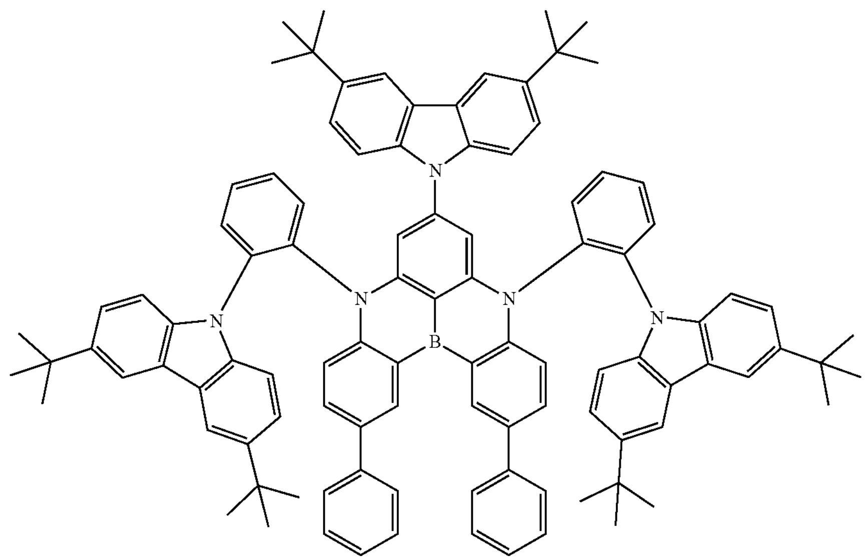

-continued
39
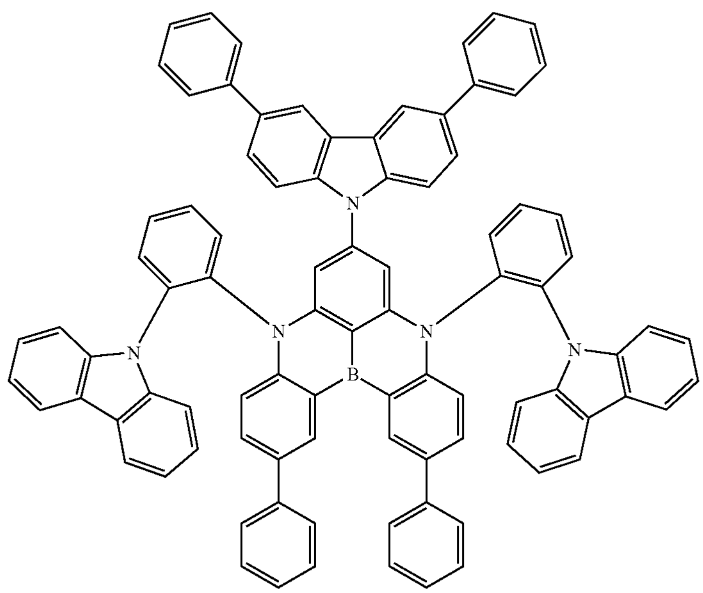
40
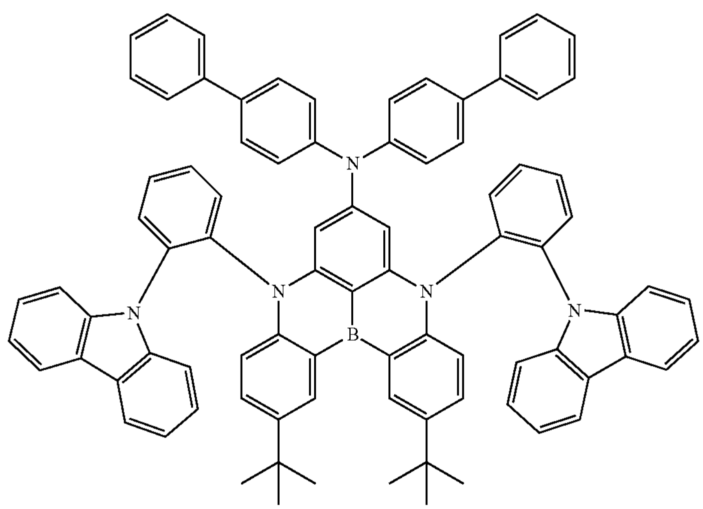
41
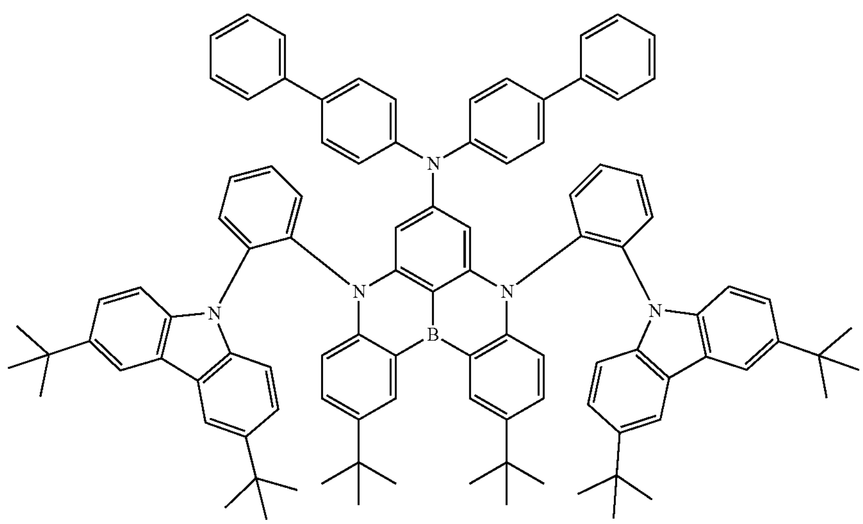

-continued
42
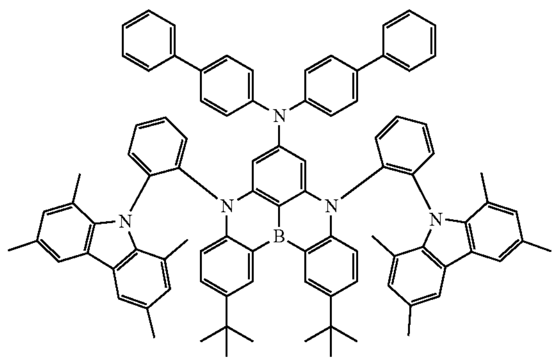
43
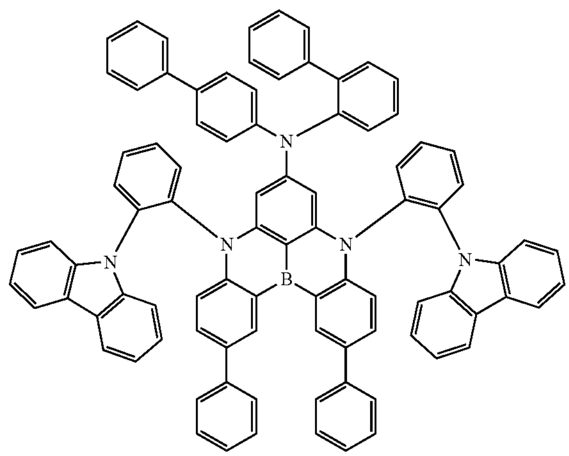
44
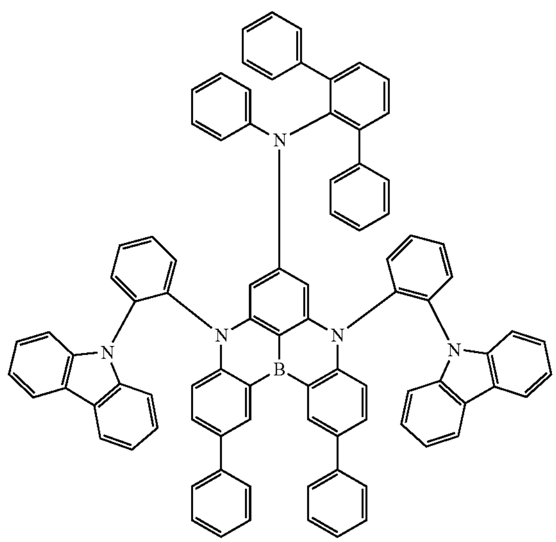
45
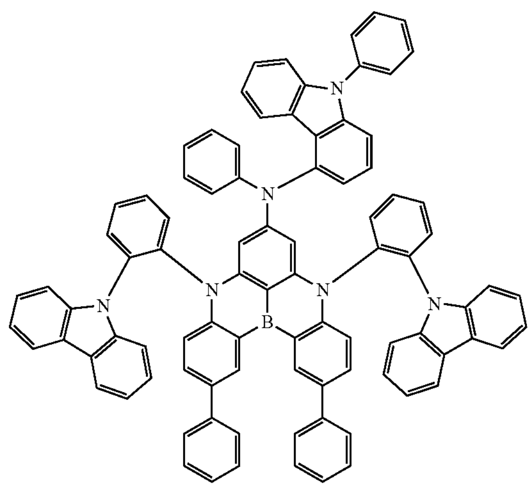
46
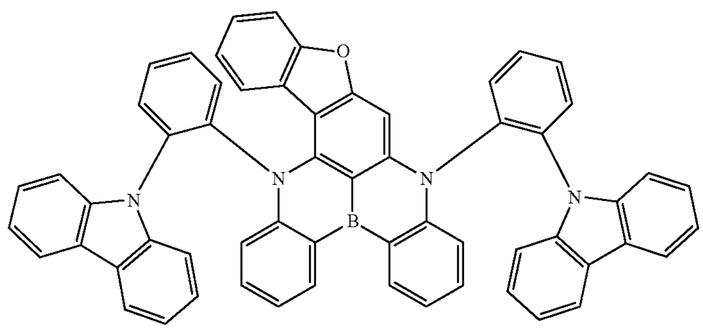

-continued
47
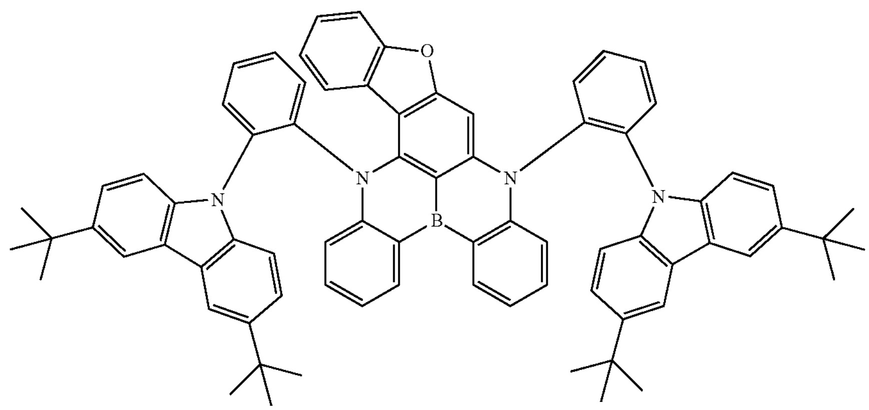
48
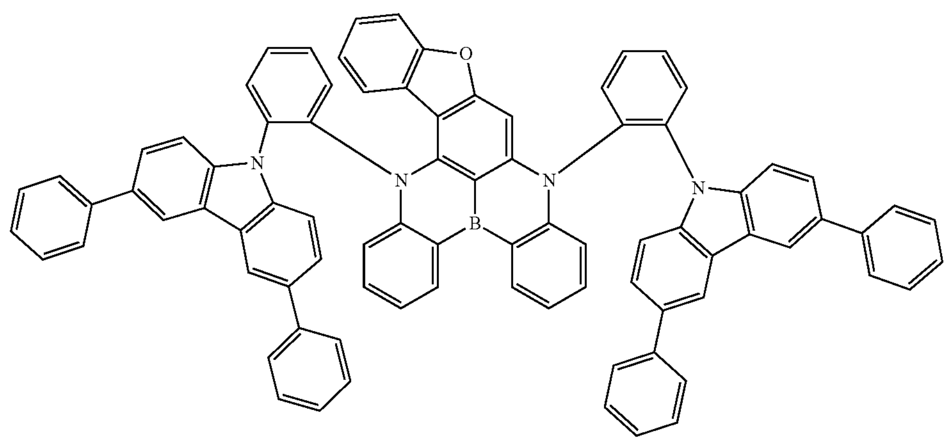
49
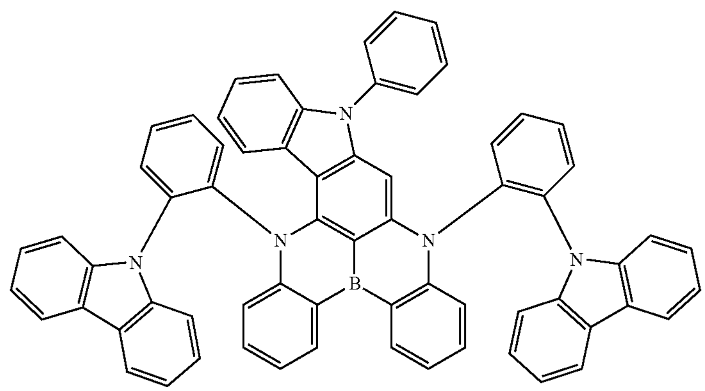

-continued
50
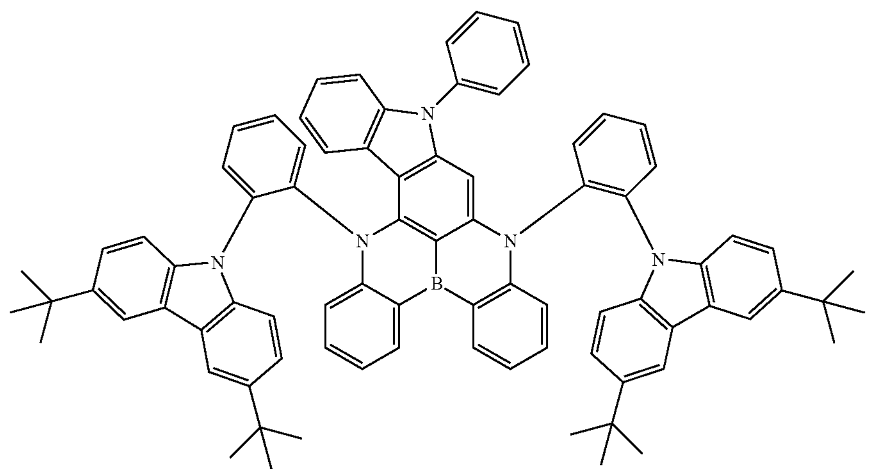
51
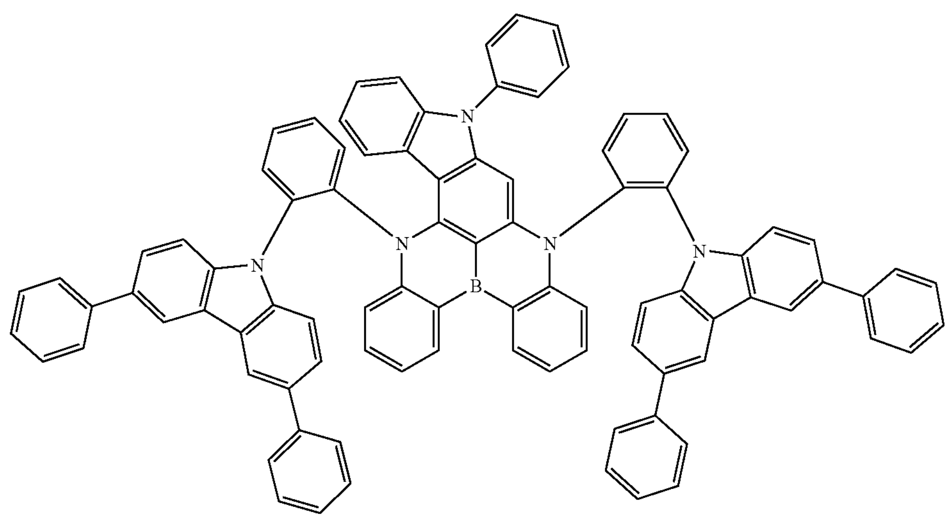
52
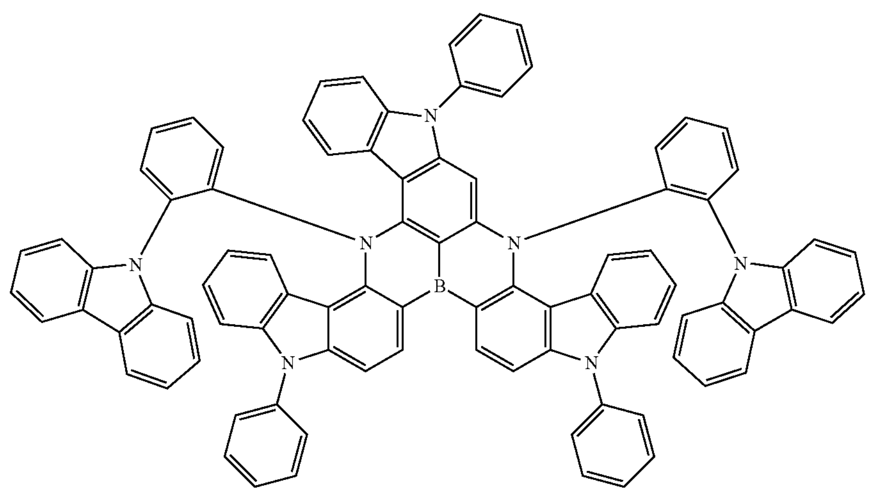

-continued
53
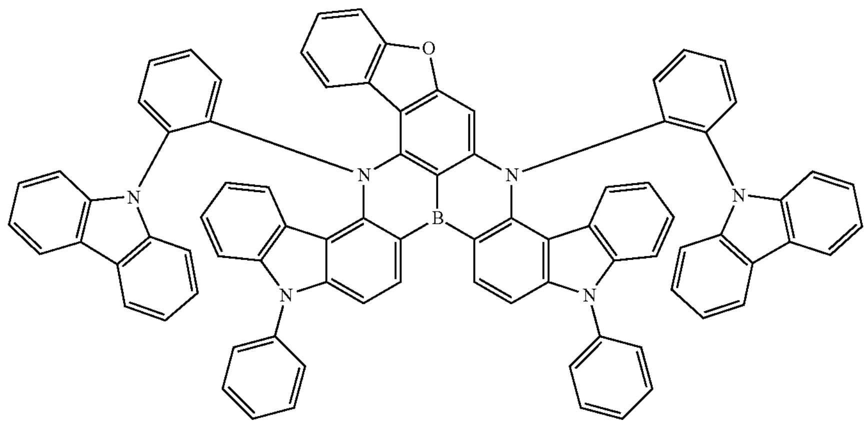
54
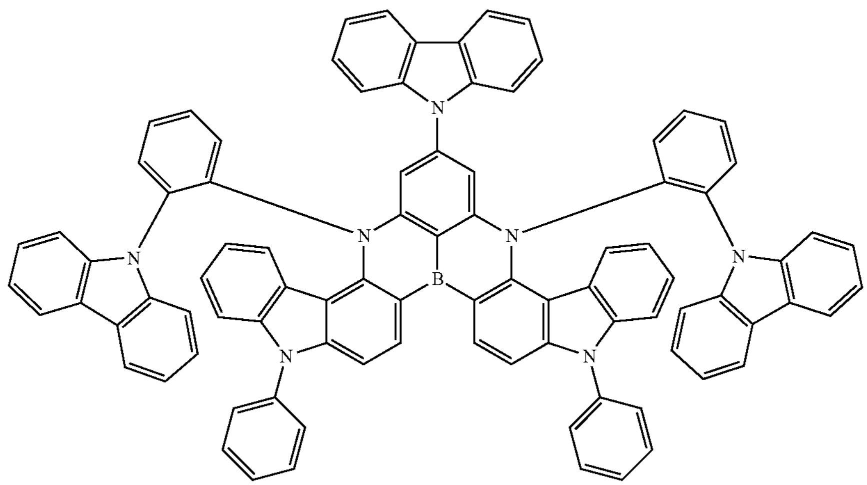
55
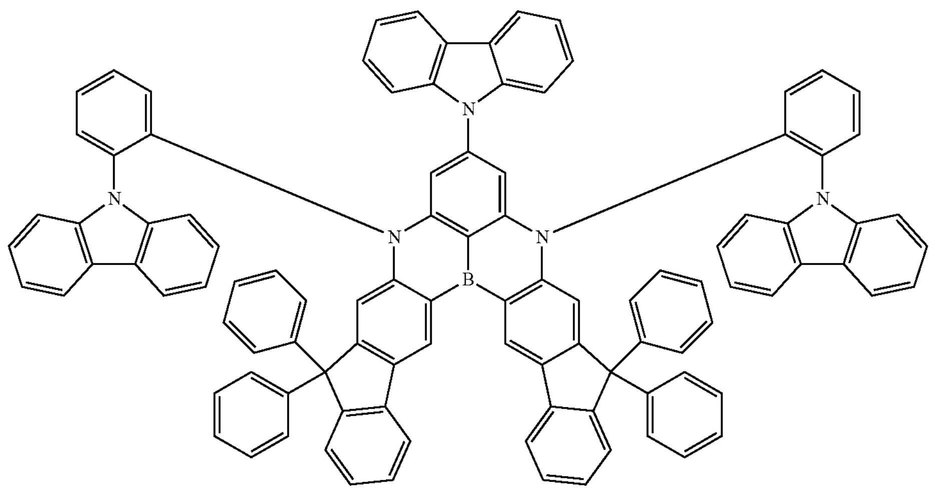

-continued
56
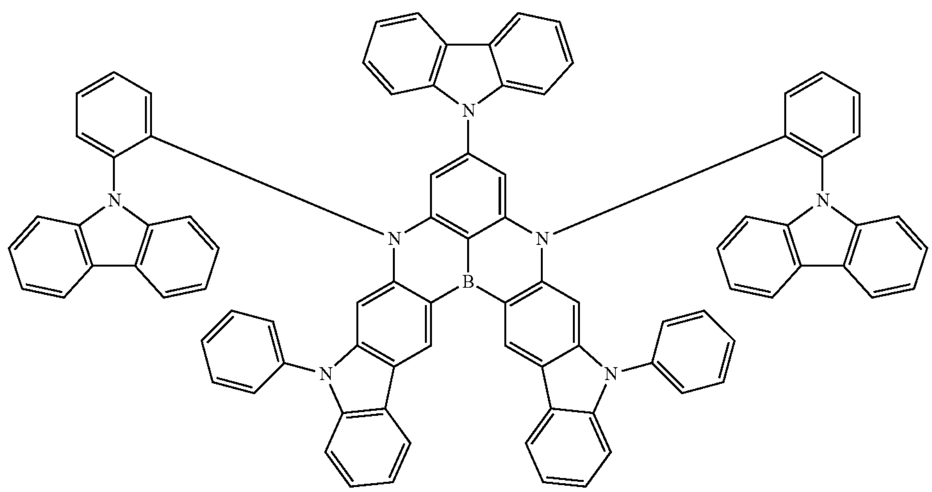
57
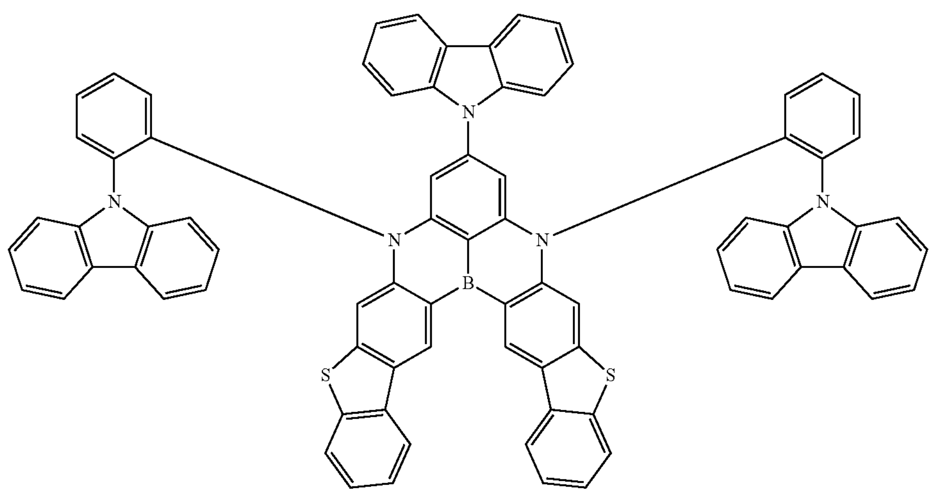
58
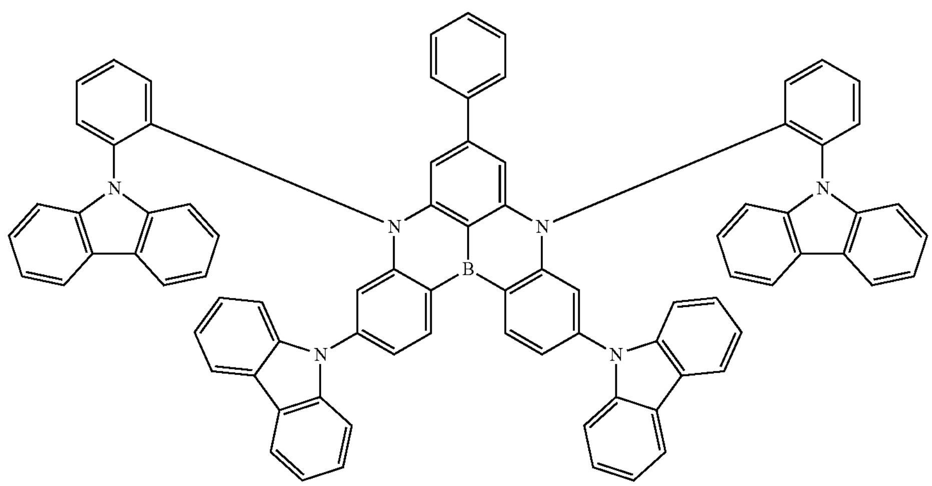

-continued
59
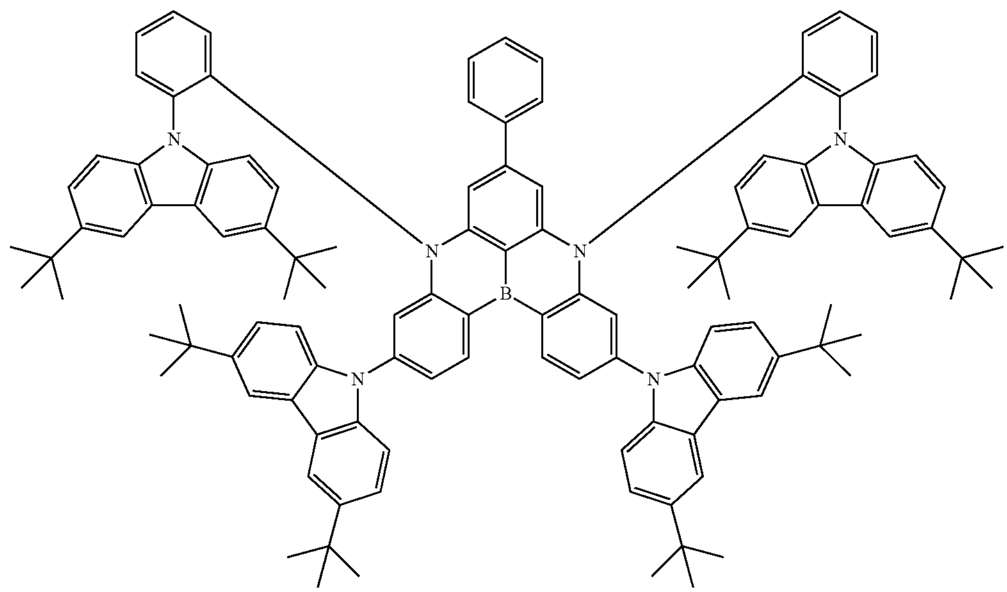
60
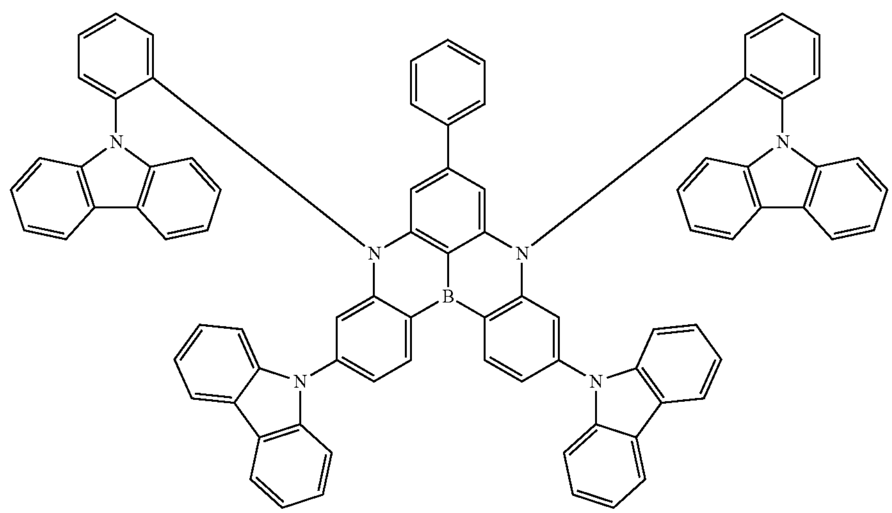

-continued
61
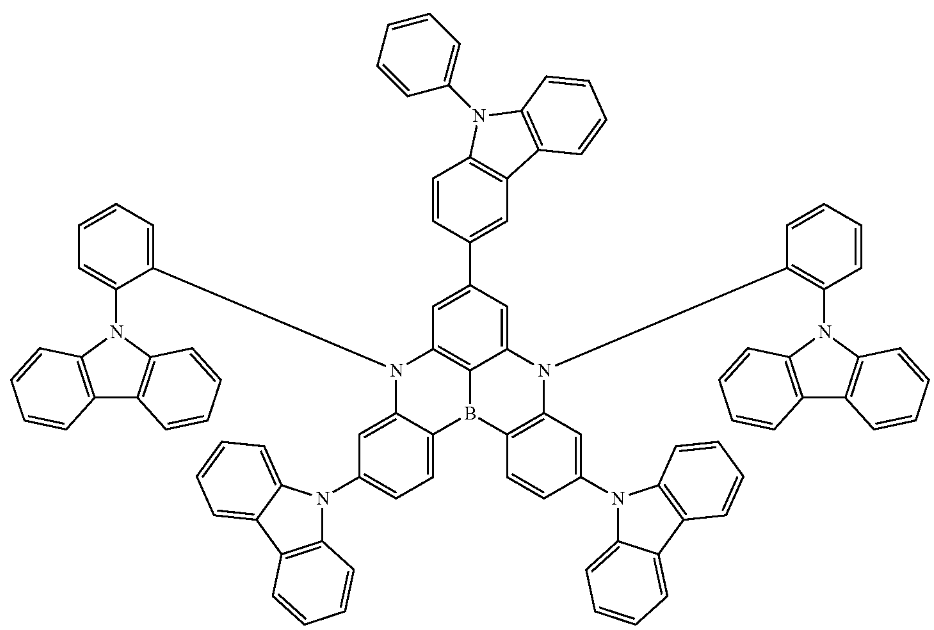
62
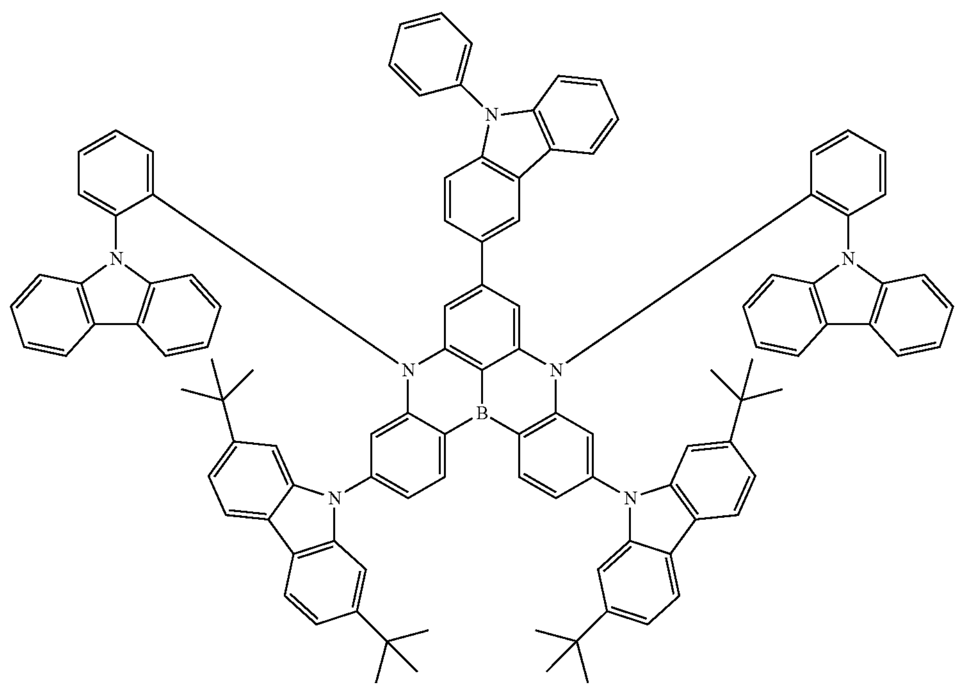

-continued
63
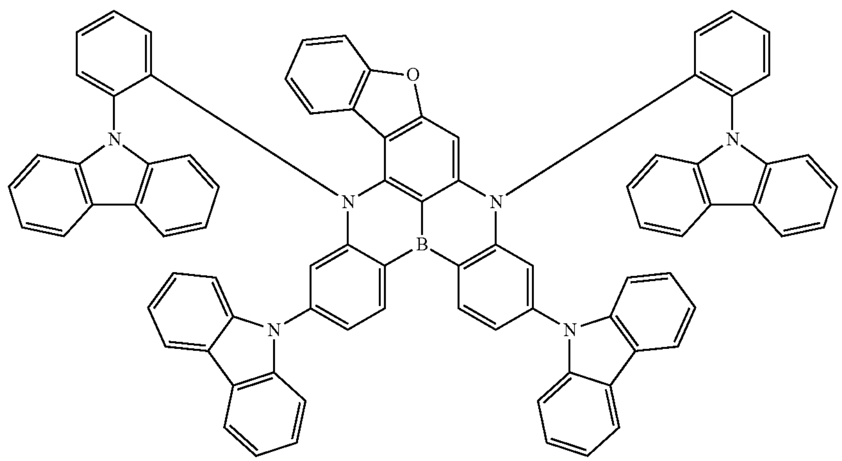
64
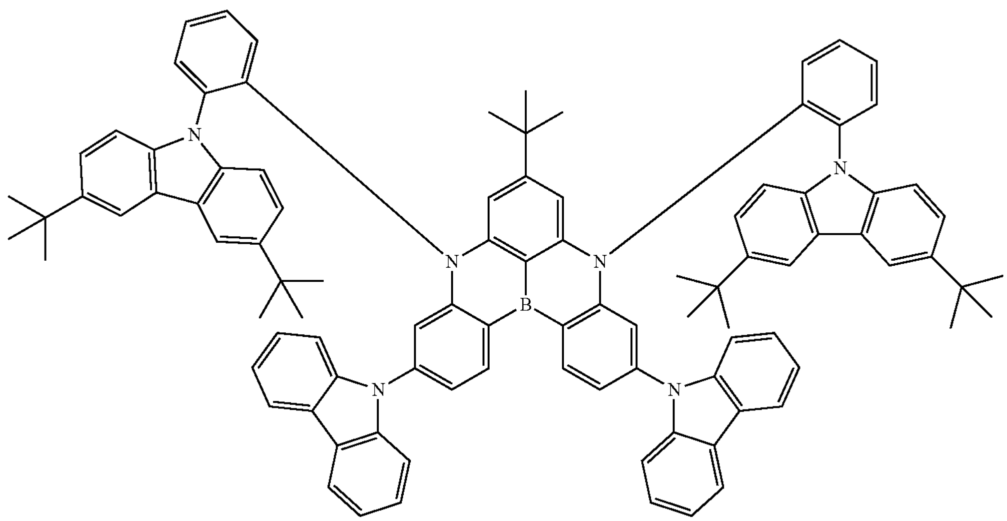
65
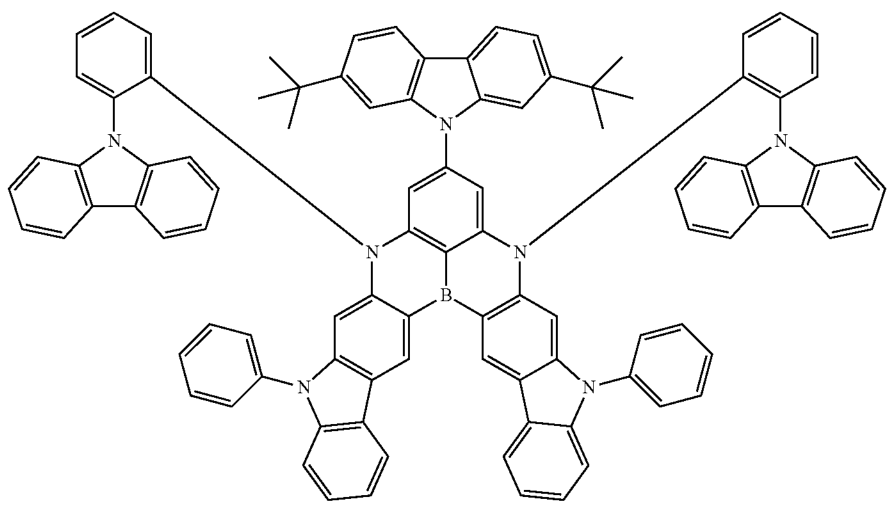

-continued
66
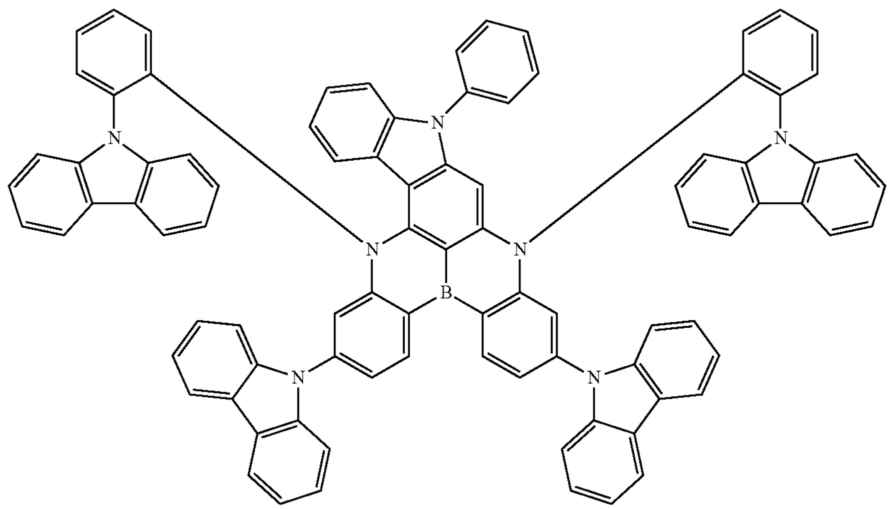
67
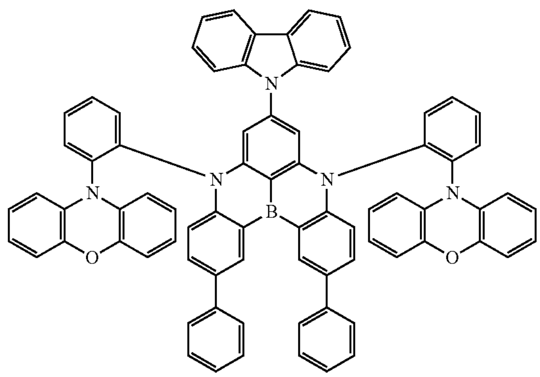
68
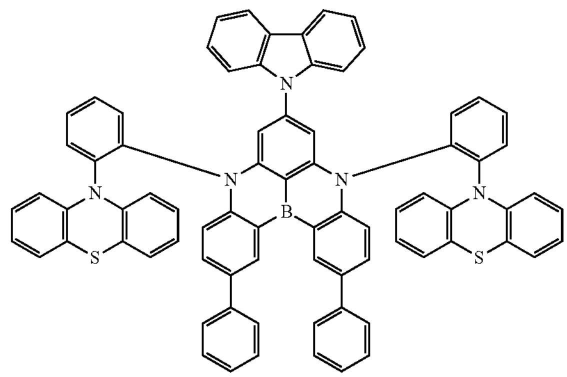
69
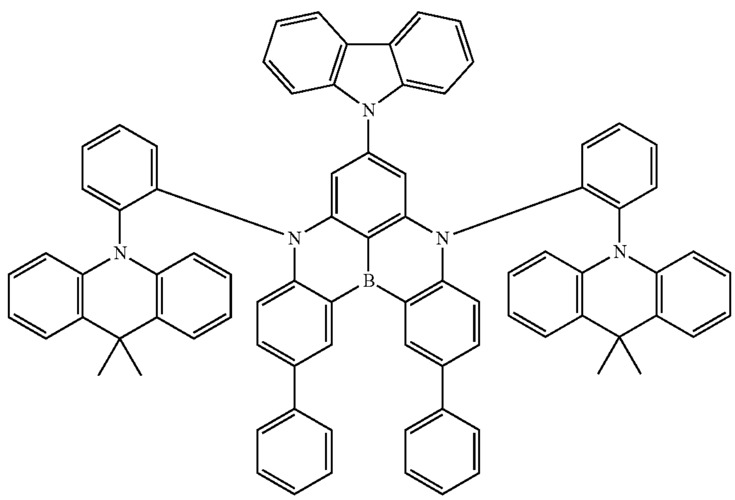

-continued
70
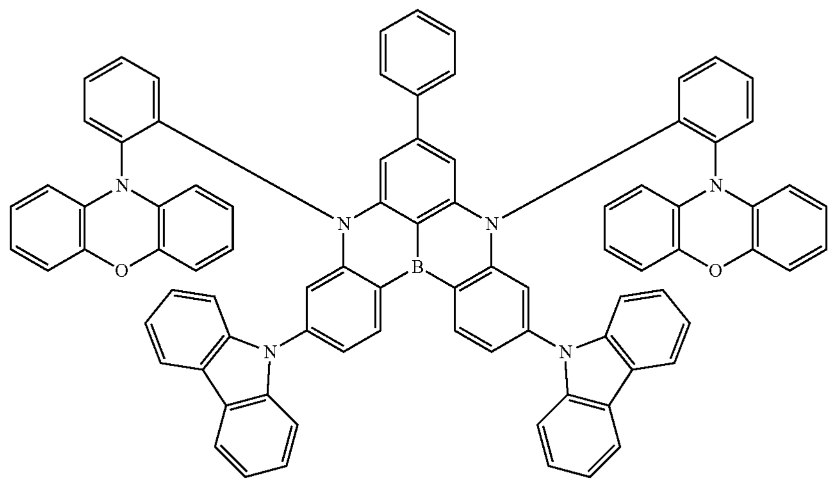
71
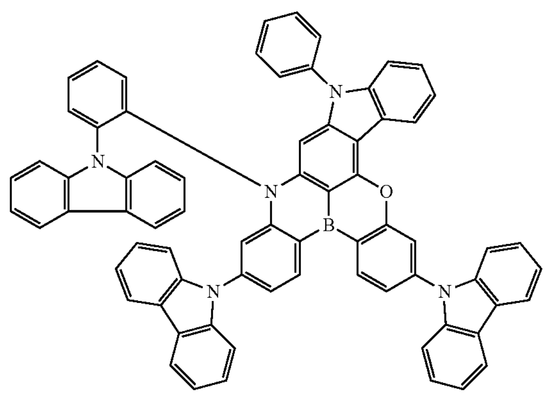
72
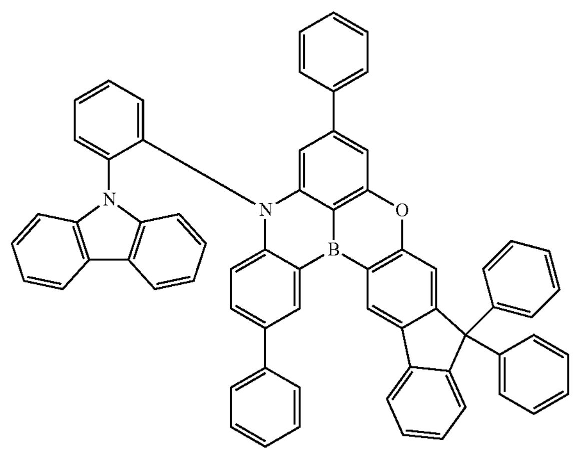
73
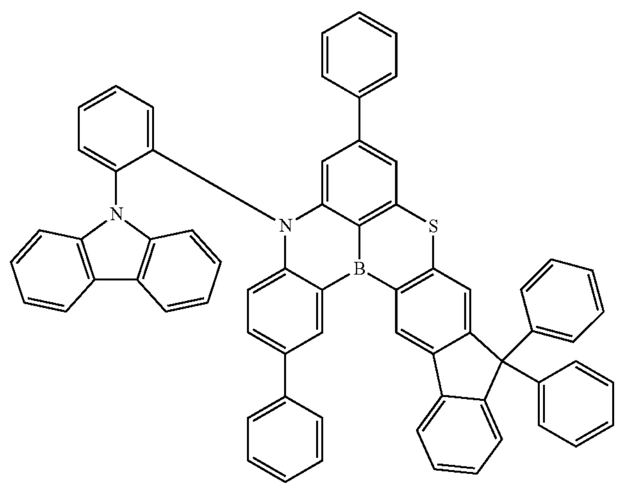
.

The heterocyclic compound represented by Formula 1 may include a group represented by Formula 2A, and $Ar_4$ in Formula 2A may be a group represented by Formula 3:

Formula 2A

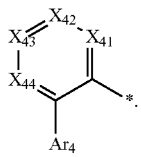

In Formula 2A, $X_{41}$ to $X_{44}$ and $Ar_4$ may each independently be the same as described above, and * indicates a binding site to neighboring N.

Without being limited by a particular theory or explanation, in a comparison compound having substantially the same structure Formula 1 except that the group represented by Formula 2A is not included, the boron (B) atom may have electron-deficient characteristics due to an empty (e.g., unoccupied) p-orbital, and the B atom may thus be linked to a nucleophile. As a result, the trigonal (e.g., trigonal planar) bonding structure of the B atom may be modified (e.g., may distort) into a tetrahedral structure (e.g., with the nucleophile occupying the fourth tetrahedral position), which may result in deterioration of an electronic device employing the virtual compound. However, because the unoccupied p-orbitals of the B atom in Formula 1 are effectively sterically protected by the group represented by Formula 2A as described above (and in an embodiment, a) the group represented by 2A as described above and b) a group represented by 2B when $X_5$ in Formula 1 is $N(T_{55})$), the trigonal (e.g., trigonal planar) bonding structure of the B atom in Formula 1 may be effectively maintained.

Also, because the lone pair of the N atom of Formula 3 and the empty p-orbital of the B atom in Formula 1 may partially overlap in space, in addition to physically shielding the p-orbitals of the B atom as described above, the N atom contained in Formula 3 may provide electrons to the B atom by "inter-space (e.g., through-space) electron donation", thereby reducing the acidity (e.g., electrophilicity) of the B atom. Accordingly, the electron-deficient characteristics of the B atom in Formula 1 may be compensated or reduced, and thus, the heterocyclic compound represented by Formula 1 may be electronically stabilized.

Furthermore, although the heterocyclic compound represented by Formula 1 has a multiple resonance plate-like core (e.g., a plate-like core structure capable of multiple resonance structures), intermolecular distances may be relatively increased by the group represented by Formula 2A as described above (and in an embodiment, a) the group represented by Formula 2A as described above and b) a group represented by Formula 2B when $X_5$ in Formula 1 is $N(T_{55})$), and thus, the occurrence of intermolecular interactions causing a decrease in luminescence efficiency (such as intermolecular aggregation, intermolecular excimer formation, and/or intermolecular exciplex formation) may be relatively reduced. In some embodiments, a binding site of $Ar_4$ (or $Ar_4$ and $Ar_5$) in Formula 1 may contribute to increasing the electron density of the multiple resonance plate-like core of Formula 1.

Therefore, an electronic device (for example, a light-emitting device) including the heterocyclic compound represented by Formula 1 may have improved luminescence efficiency and/or lifespan.

Synthesis methods of the heterocyclic compound represented by Formula 1 may be recognizable by one of ordinary skill in the art by referring to the Synthesis Examples and/or Examples provided below.

In an embodiment, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In one or more embodiments, the heterocyclic compound may be included between the first electrode and the second electrode of the light-emitting device. Accordingly, the heterocyclic compound may be included in the interlayer of the light-emitting device, for example, in the emission layer of the interlayer. The emission layer may be to emit red light, green light, blue light, and/or white light. In an embodiment, the emission layer may be to emit blue light. The blue light may have a maximum emission wavelength of, for example, about 400 nm to about 490 nm. In one or more embodiments, the emission layer may further include a host, and an amount of the host may be greater than an amount of the heterocyclic compound represented by Formula 1.

In one or more embodiments, the light-emitting device may include a capping layer outside the first electrode or outside the second electrode. In an embodiment, the capping layer may include the heterocyclic compound represented by Formula 1.

In an embodiment, the light-emitting device may further include at least one of a first capping layer located outside the first electrode and a second capping layer located outside the second electrode, and the heterocyclic compound represented by Formula 1 may be included in at least one of the first capping layer and the second capping layer. The first capping layer and/or second capping layer may each independently be the same as described below.

In one or more embodiments, the light-emitting device may further include:

a first capping layer located outside the first electrode and including the heterocyclic compound represented by Formula 1;

a second capping layer located outside the second electrode and including the heterocyclic compound represented by Formula 1; or the first capping layer and the second capping layer, each independently including the heterocyclic compound represented by Formula 1.

The expression "(an interlayer and/or a capping layer) includes at least one heterocyclic compound" as utilized herein may include a case in which "(an interlayer and/or a capping layer) includes identical (e.g., one single) heterocyclic compounds represented by Formula 1" and a case in which "(an organic layer) includes two or more different heterocyclic compounds represented by Formula 1."

For example, the interlayer and/or the capping layer(s) may include only Compound 1 as the heterocyclic compound. For example, Compound 1 may exist in the emission layer of the light-emitting device. In one or more embodiments, the interlayer may include, as the heterocyclic compound, Compound 1 and Compound 2. In this regard, Compound 1 and Compound 2 may exist in an identical (e.g., the same) layer (for example, Compound 1 and Compound 2 may all exist in an emission layer), or different layers (for example, Compound 1 may exist in an emission layer and Compound 2 may exist in an electron transport region).

The term "interlayer" as utilized herein may refer to a single layer or all of a plurality of layers located between a first electrode and a second electrode of a light-emitting device.

One or more embodiments of the present disclosure provide an electronic apparatus including the light-emitting device. The electronic apparatus may further include a thin-film transistor. In an embodiment, the electronic apparatus may further include a thin-film transistor including a source electrode and a drain electrode, and the first electrode of the light-emitting device may be electrically connected to one of the source electrode or the drain electrode. In one or more embodiments, the electronic apparatus may further include a color filter, a color conversion layer, a touch screen layer, a polarizing layer, or any combination thereof. More details on the electronic apparatus are as described in the present specification.

One or more embodiments of the present disclosure provide a heterocyclic compound represented by Formula 1. The detailed description of Formula 1 is the same as described in the present specification.

Description of FIG. 1

FIG. 1 is a schematic cross-sectional view of a light-emitting device 10 according to an embodiment of the present disclosure. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

First Electrode 110

In FIG. 1, a substrate may be additionally located under the first electrode 110 and/or above the second electrode 150. As the substrate, a glass substrate and/or a plastic substrate may be utilized. In one or more embodiments, the substrate may be a flexible substrate, and may include plastics with excellent or suitable heat resistance and durability (such as polyimide, polyethylene terephthalate (PET), polycarbonate, polyethylene naphthalate, polyarylate (PAR), polyetherimide, or any combination thereof).

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combinations thereof.

The first electrode 110 may have a single-layered structure including (e.g., consisting of) a single layer or a multi-layered structure including a plurality of layers. For example, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region located between the first electrode 110 and the emission layer, and/or an electron transport region located between the emission layer and the second electrode 150.

The interlayer 130 may further include, in addition to one or more suitable organic materials, metal-containing compounds (such as organometallic compounds), inorganic materials (such as quantum dots), and/or the like.

In one or more embodiments, the interlayer 130 may include, i) two or more light-emitting units sequentially stacked between the first electrode 110 and the second electrode 150, and ii) a charge generation layer located between the two emitting units. When the interlayer 130 includes the emitting unit and the charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer consisting of a plurality of different materials, or iii) a multi-layered structure including a plurality of layers including different materials.

The hole transport region may include a hole injection layer, a hole transport layer, an emission auxiliary layer, an electron blocking layer, or any combination thereof.

In an embodiment, the hole transport region may have a multi-layered structure including a hole injection layer/hole transport layer, a hole injection layer/hole transport layer/emission auxiliary layer, a hole injection layer/emission auxiliary layer, a hole transport layer/emission auxiliary layer, or a hole injection layer/hole transport layer/electron blocking layer, wherein the constituting layers of each structure are stacked sequentially from the first electrode 110.

The hole transport region may include a compound represented by Formula 201, a compound represented by Formula 202, or any combination thereof:

Formula 201

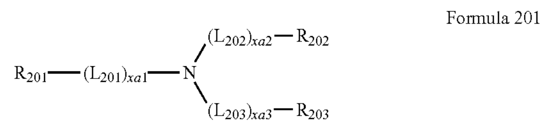

Formula 202

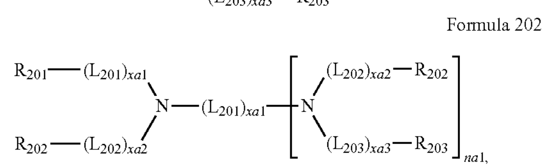

wherein, in Formulae 201 and 202, $L_{201}$ to $L_{204}$ may each independently be a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10}a$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In one or more embodiments, each of Formulae 201 and 202 may include at least one of groups represented by Formulae CY201 to CY217:

CY201

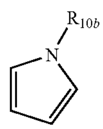

CY202

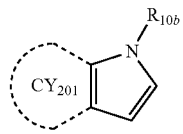

CY203

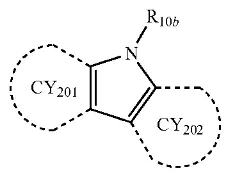

CY204

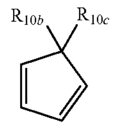

CY205

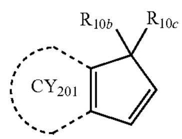

-continued

CY206

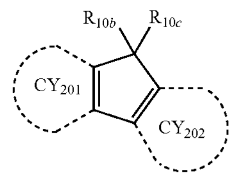

CY207

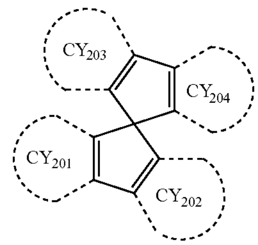

CY208

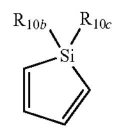

CY209

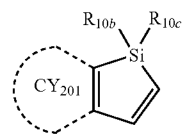

CY210

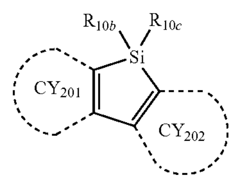

CY211

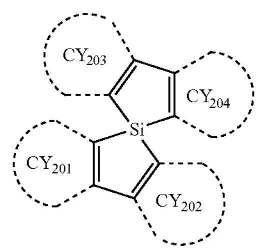

CY212

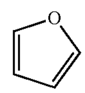

CY213

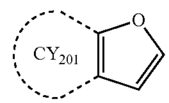

CY214

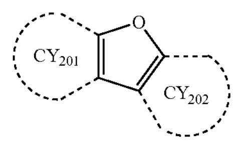

CY215

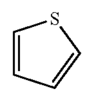

-continued

CY216

CY217

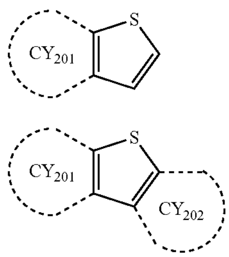

$R_{10}b$ and $R_{10}c$ in Formulae CY201 to CY217 may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, Formulae 201 and 202 may each independently include at least one of groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include (e.g., may exclude) a group represented by one of Formulae CY201 to CY203.

In one or more embodiments, each of Formulae 201 and 202 may not include (e.g., may exclude) a group represented by one of Formulae CY201 to CY203, and may include at least one of groups represented by Formulae CY204 to CY217.

In one or more embodiments, each of Formulae 201 and 202 may not include (e.g., may exclude) a group represented by one of Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate) (PANI/PSS), or any combination thereof:

HT1

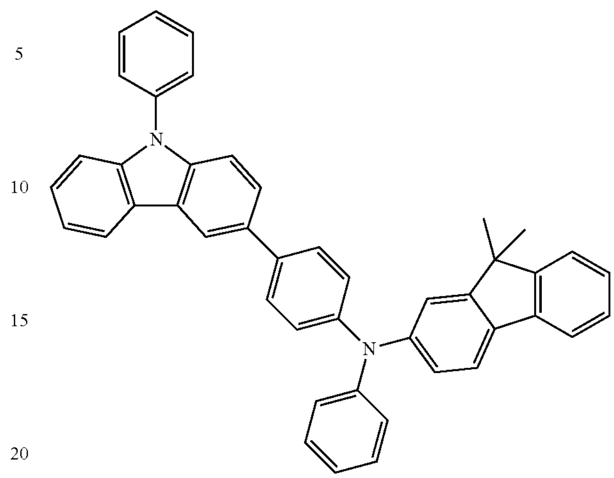

HT2

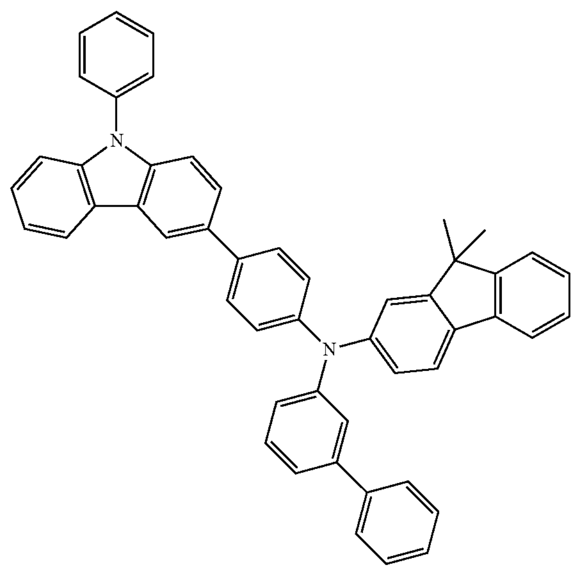

-continued
HT3
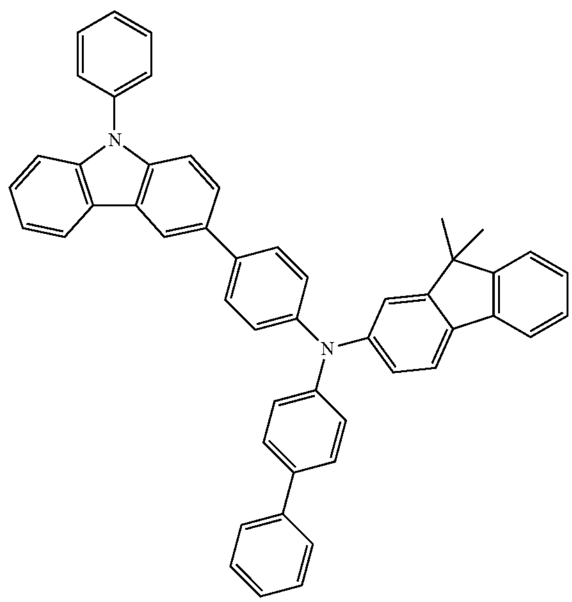
HT4
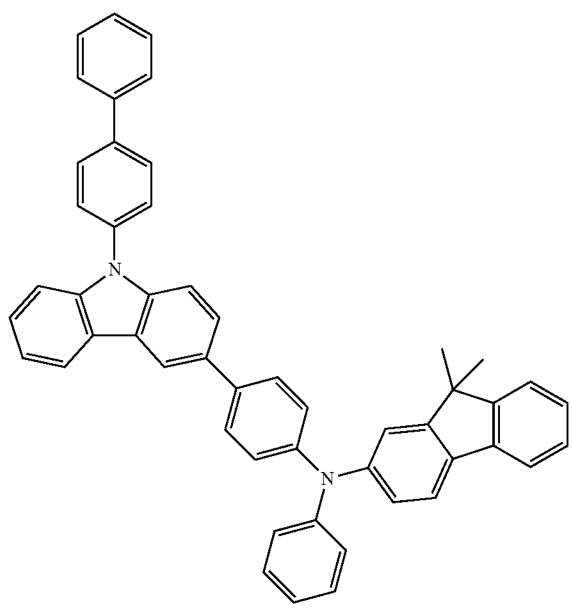
-continued
HT5
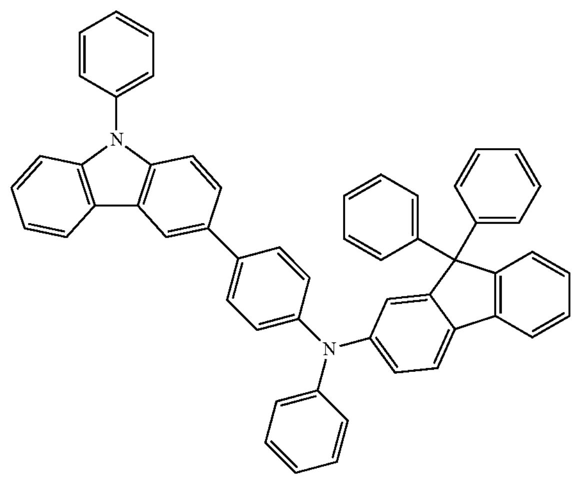
HT6
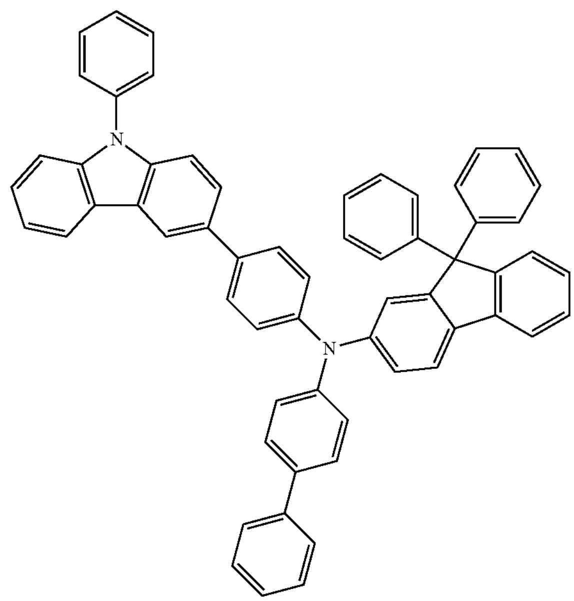

-continued
HT7
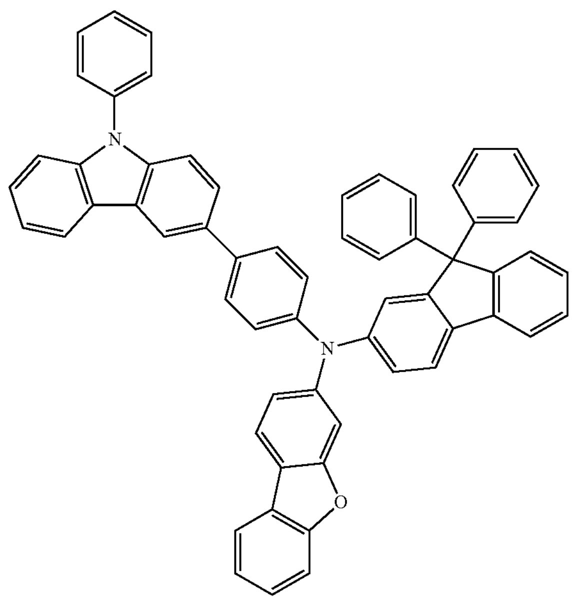
HT8
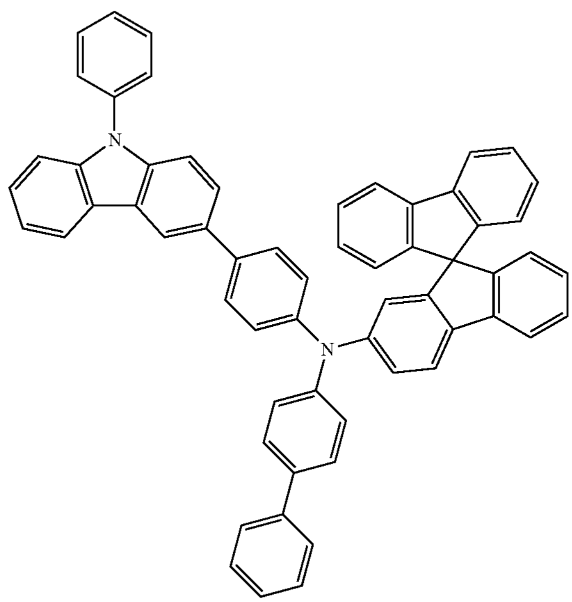
-continued
HT9
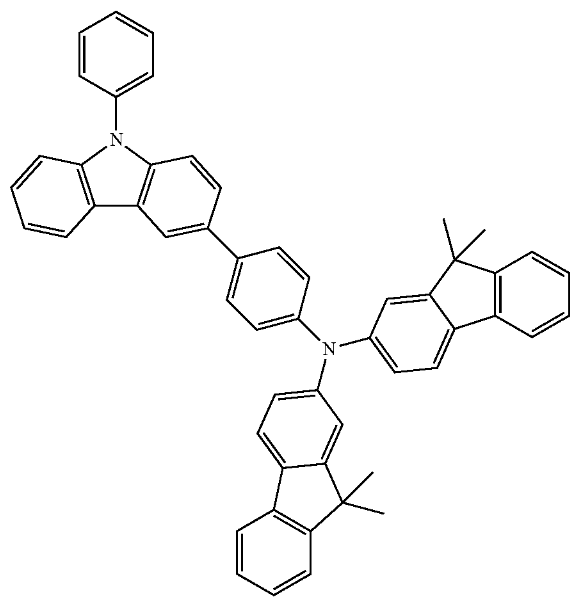
HT10
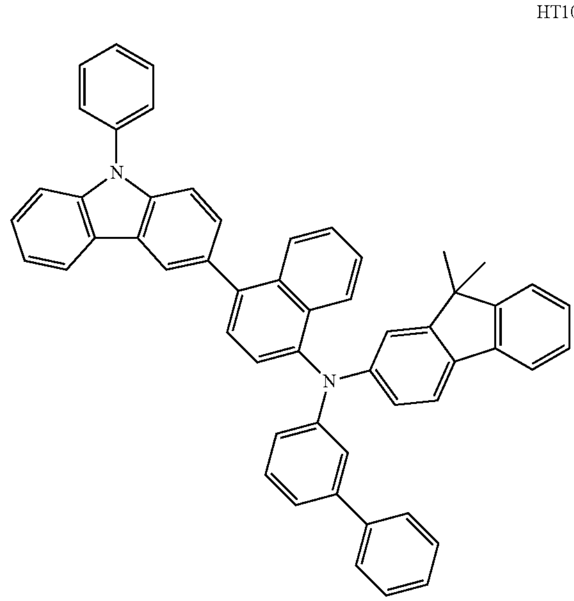

-continued
HT11
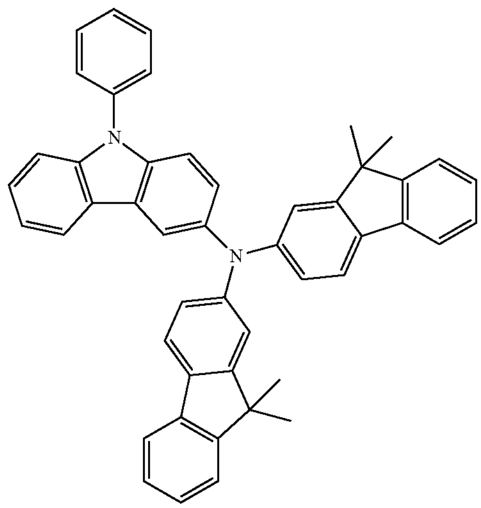
HT12
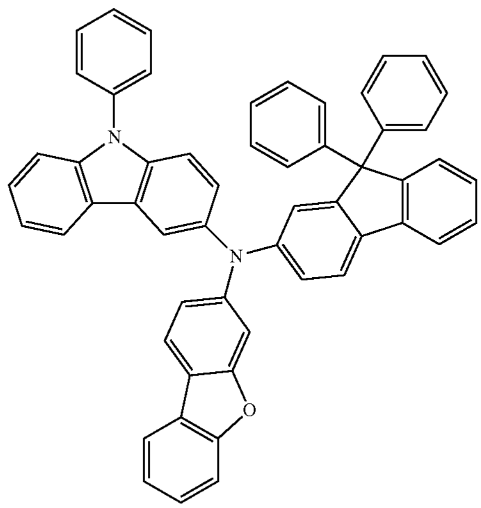
HT13
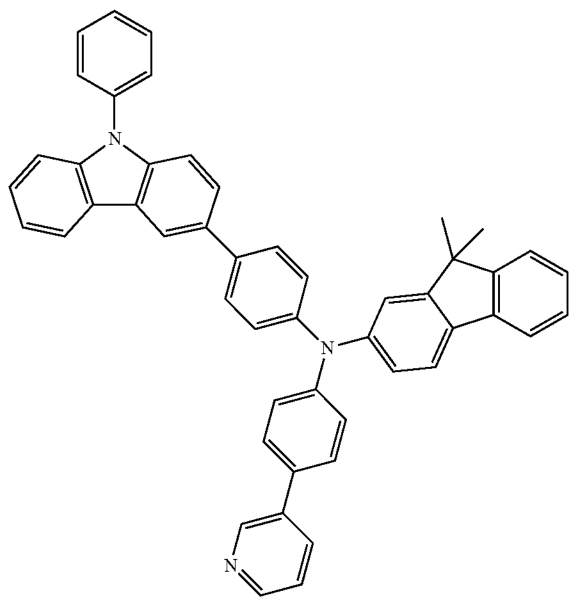
-continued
HT14
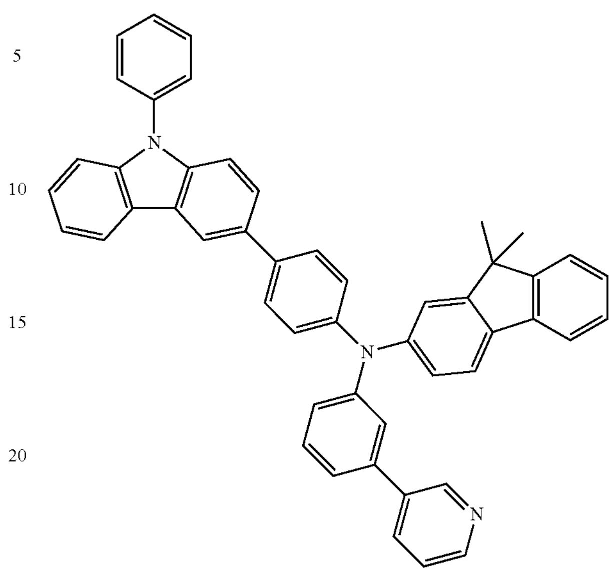
HT15
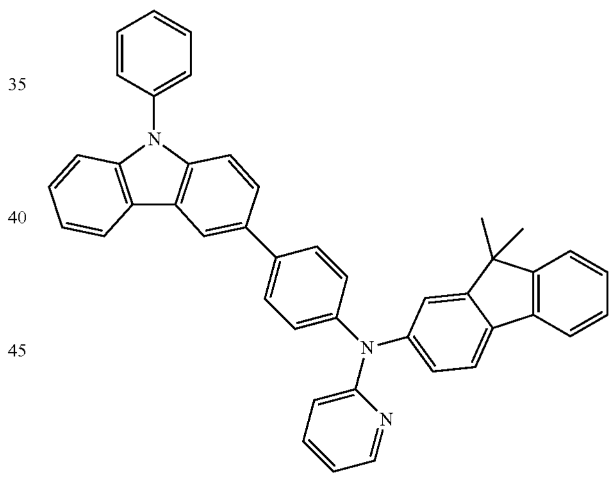
HT16
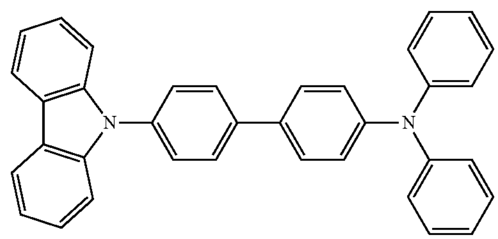

-continued
HT17
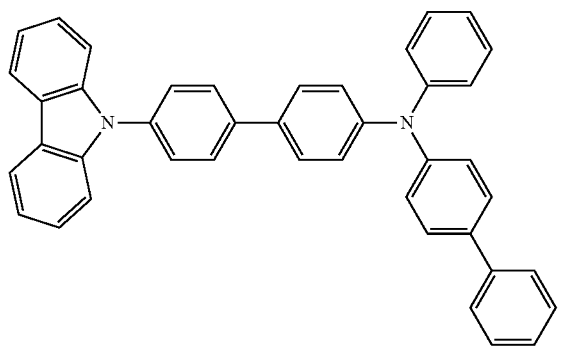
HT18
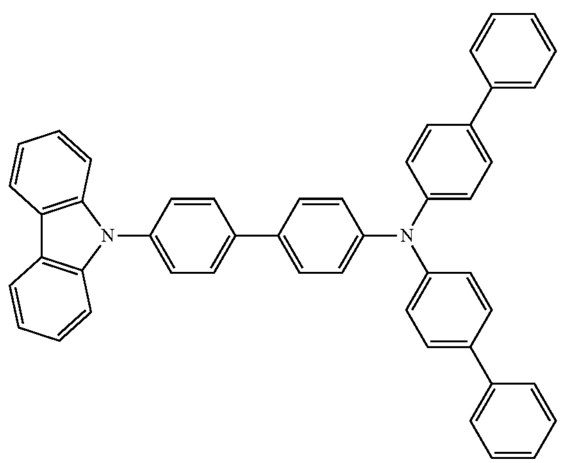
HT19
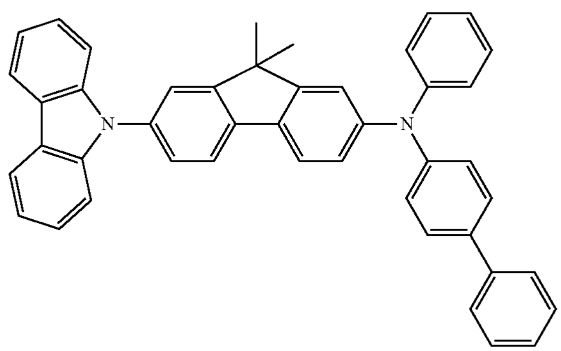
-continued
HT20
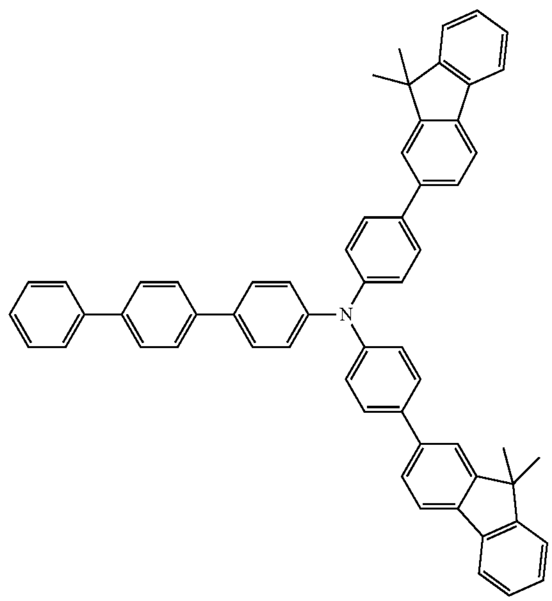
HT21
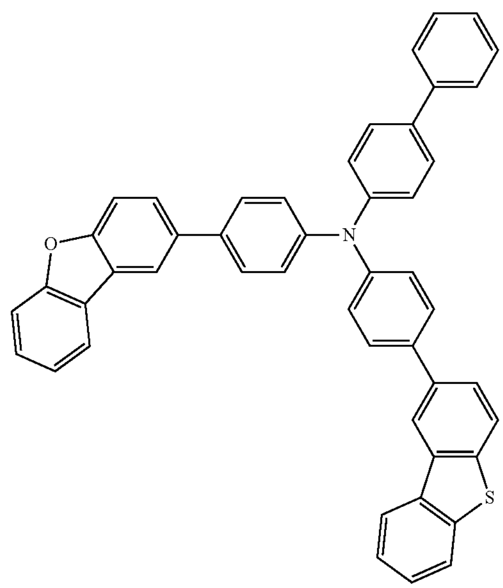
HT22
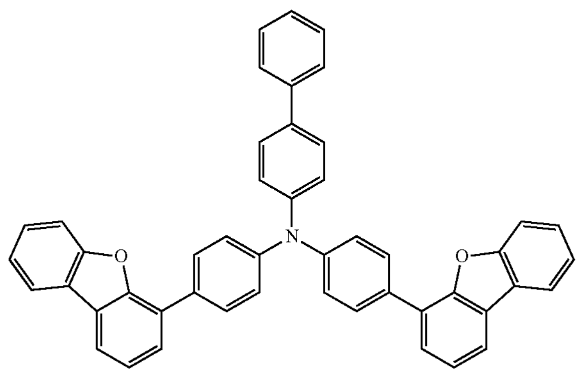

-continued
HT23
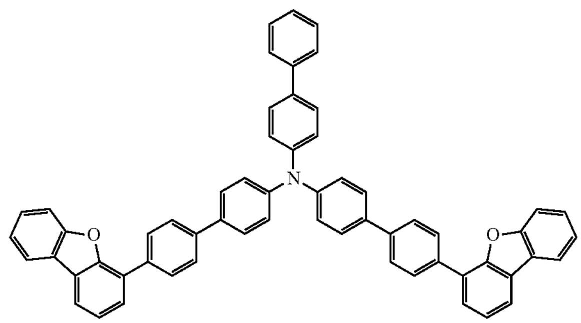
HT24
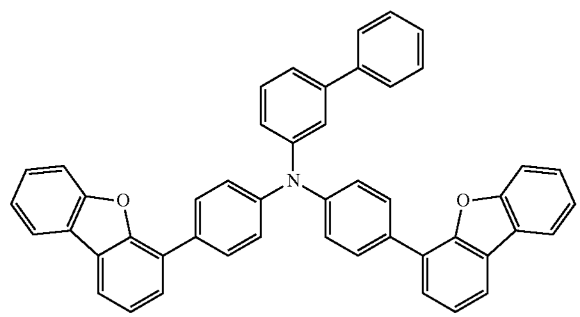
HT25
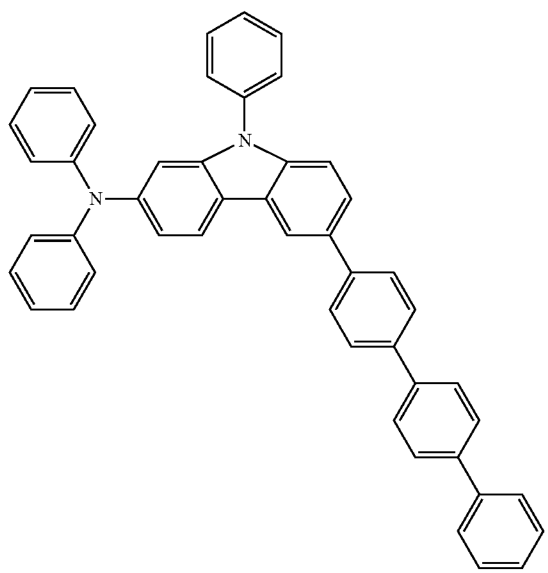
-continued
HT26
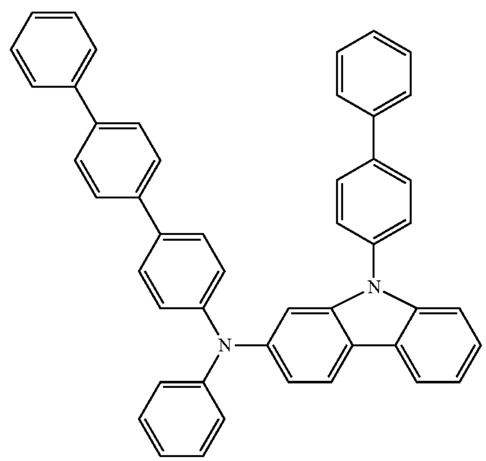
HT27
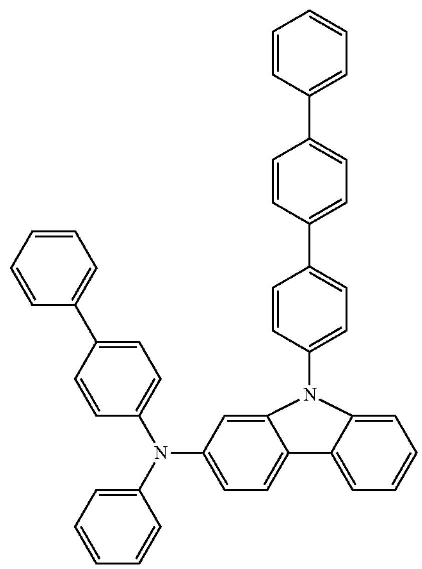
HT28
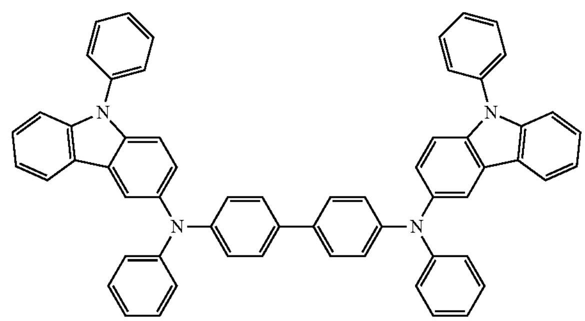

-continued
HT29
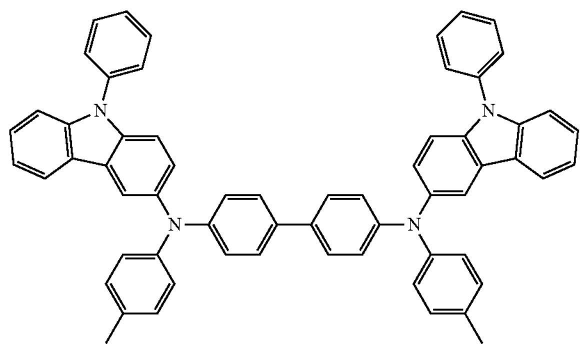
HT30
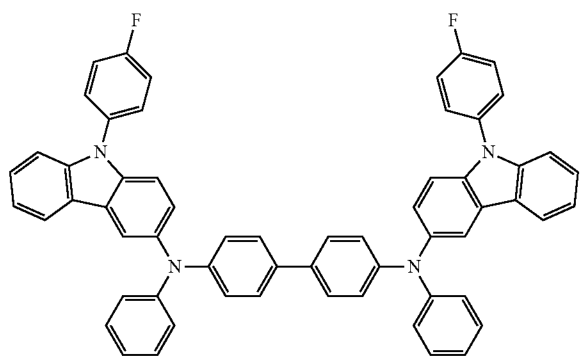
HT31
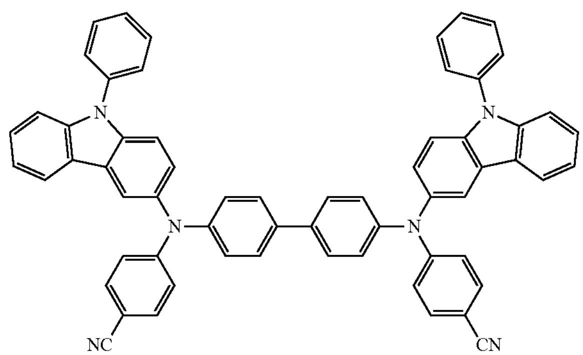
HT32
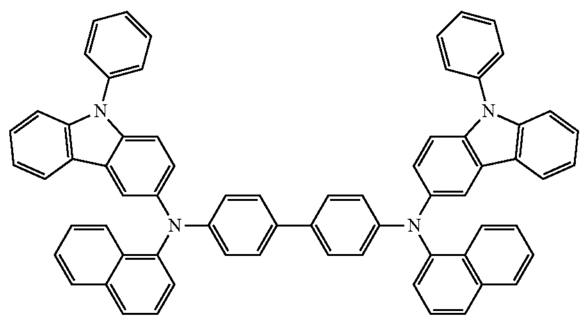
-continued
HT33
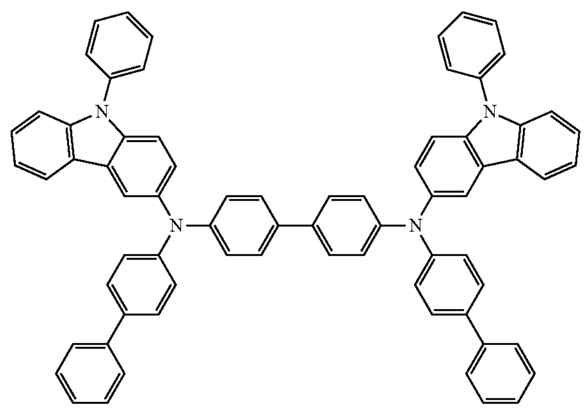
HT34
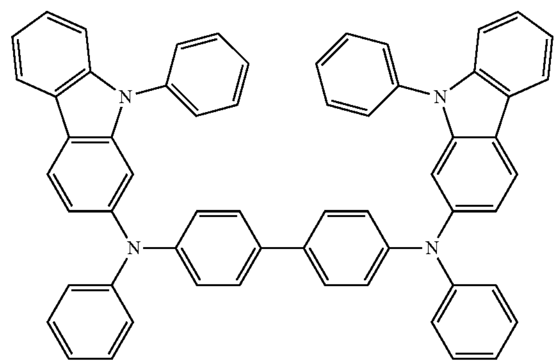
HT35
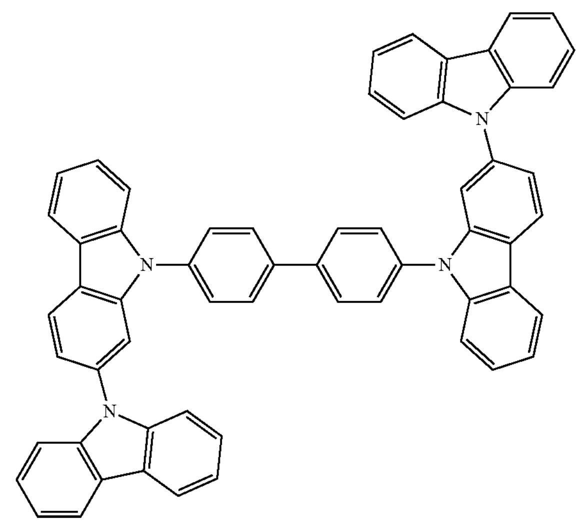

-continued
HT36
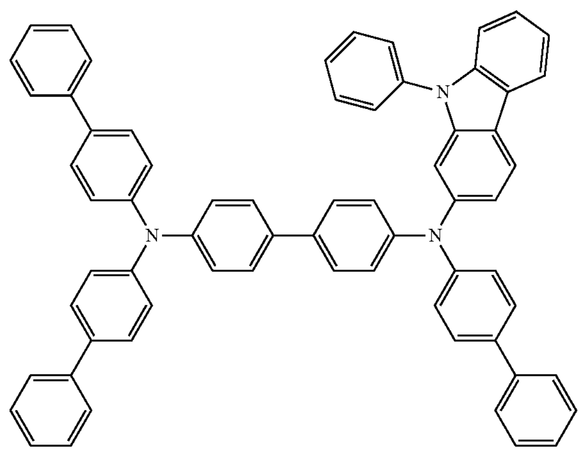
HT37
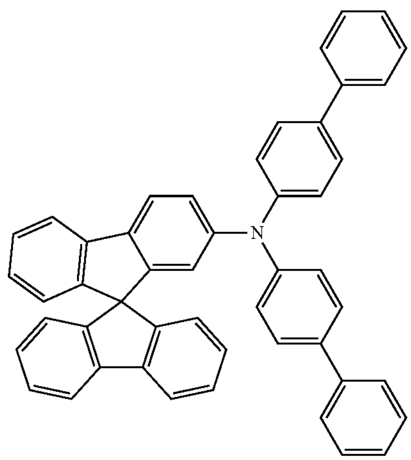
HT38
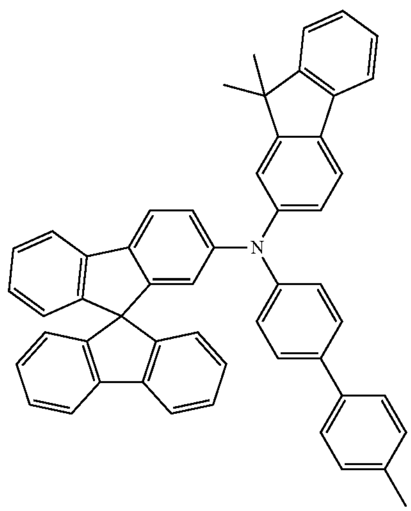
-continued
HT39
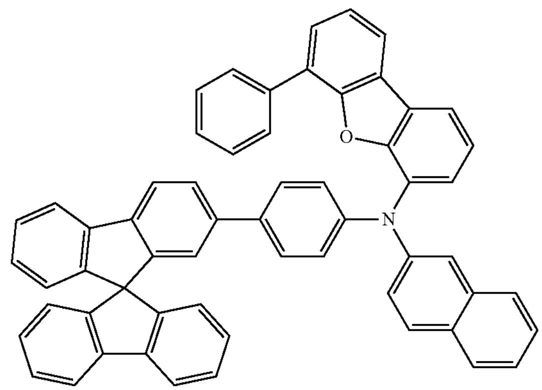
HT40
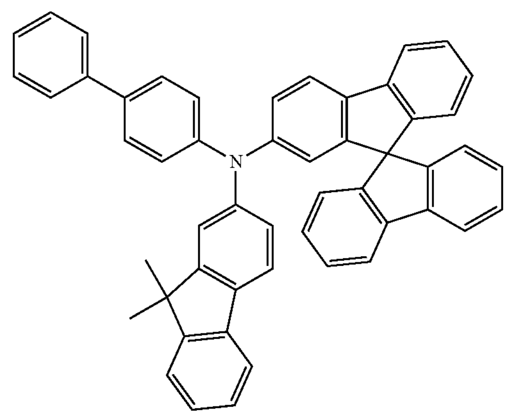
HT41
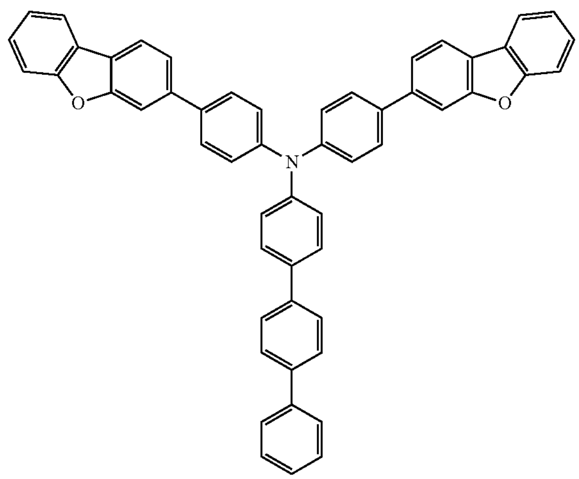
HT42
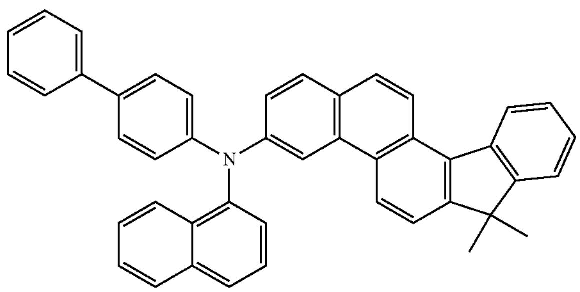

-continued
HT43
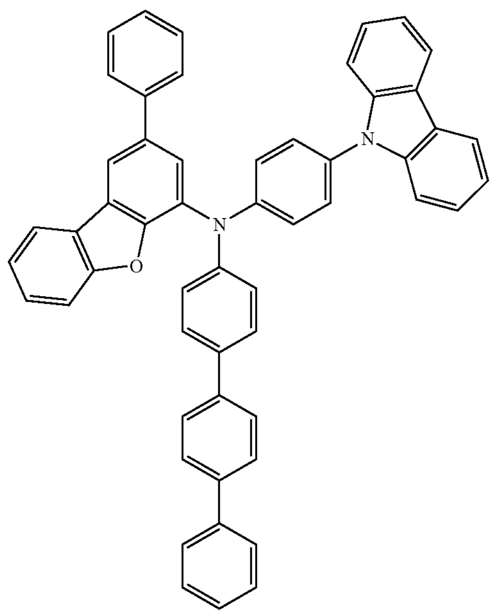
HT44
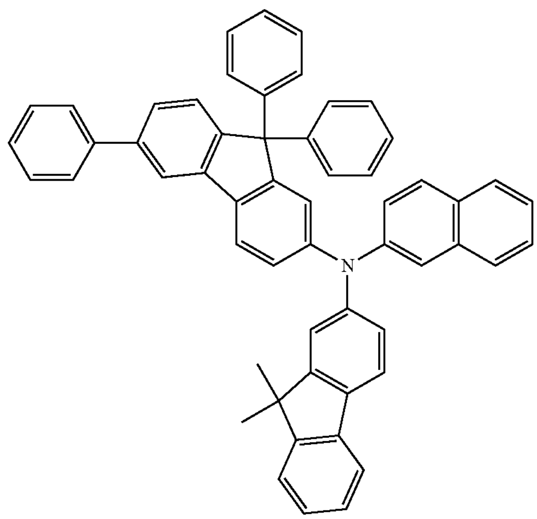
HT45
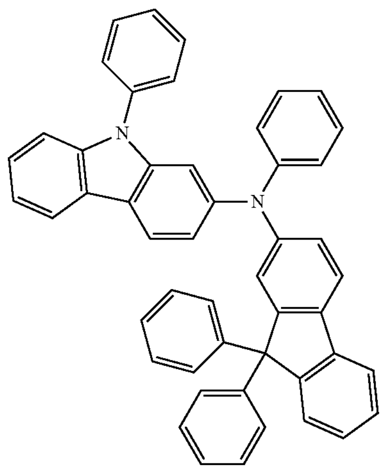
-continued
HT46
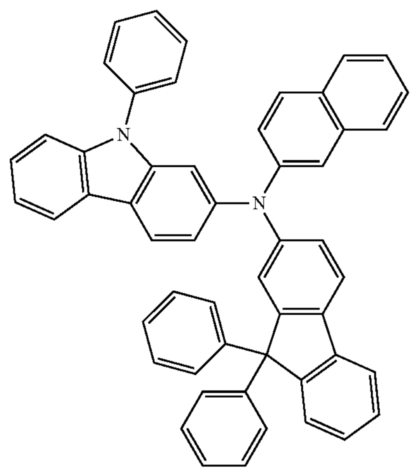
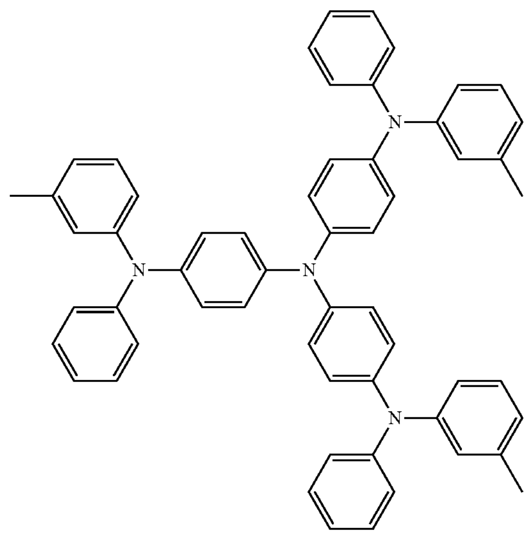
m-MTDATA
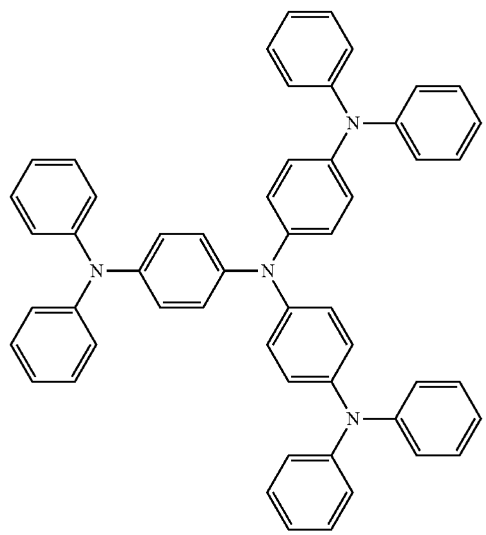
TDATA -continued
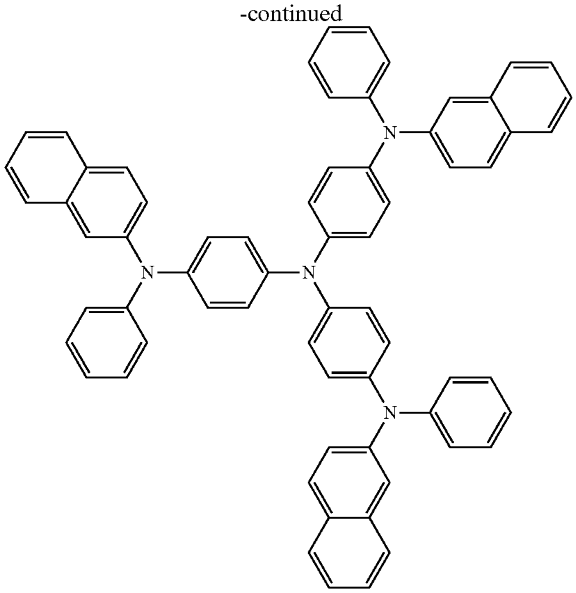
2-TNATA
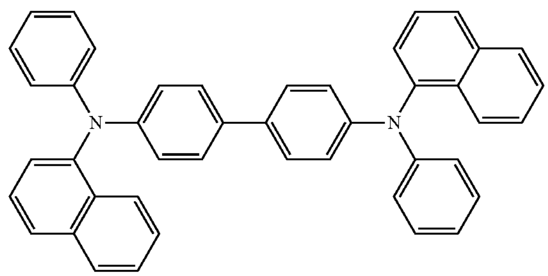
NPB
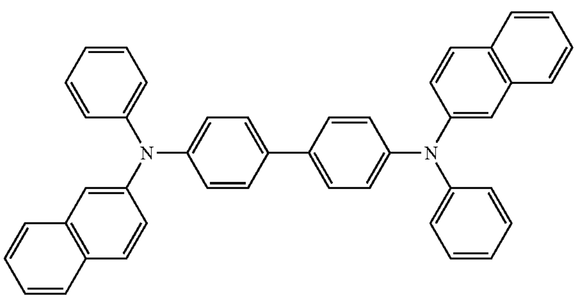
β-NPB
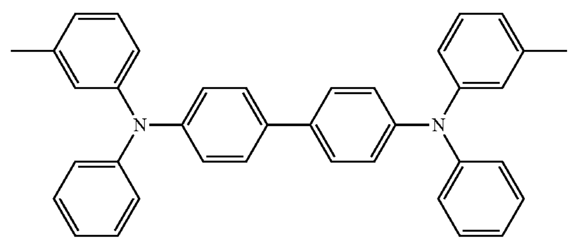
TPD
-continued
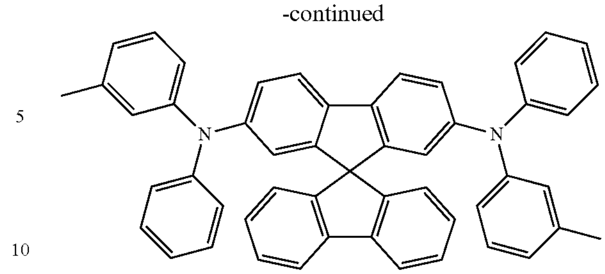
Spiro-TPD
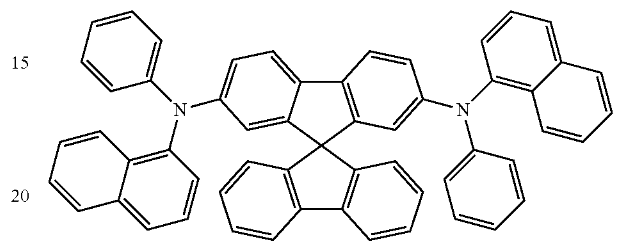
Spiro-NPB
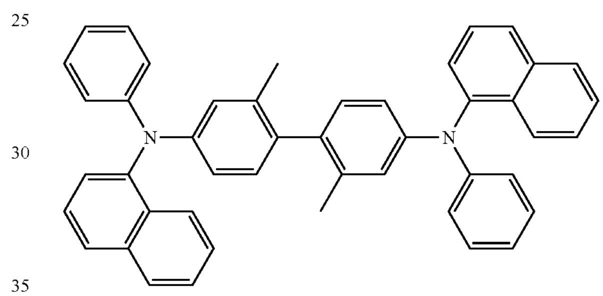
methylated-NPB
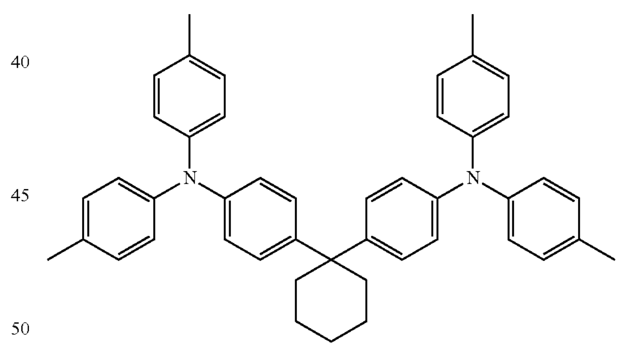
TAPC
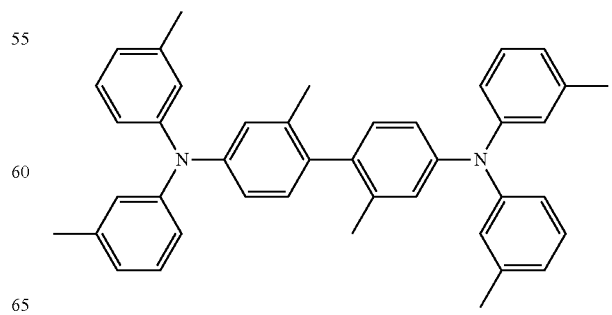
HMTPD -continued

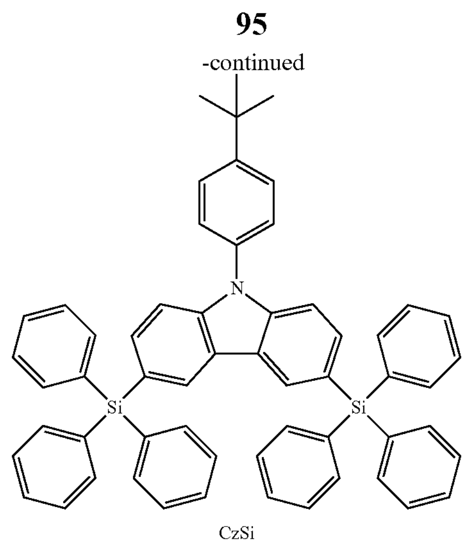

CzSi

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase the light-emission efficiency of the device by compensating for an optical resonance distance according to the wavelength of light emitted by an emission layer, and the electron blocking layer may block or reduce leakage of electrons from an emission layer to a hole transport region. Materials that may be included in the hole transport region may be included in the emission auxiliary layer and/or the electron blocking layer.

p-dopant

The hole transport region may further include, in addition to these materials, a charge-generation material for the improvement of conductive properties. The charge-generation material may be substantially uniformly or non-uniformly dispersed in the hole transport region (for example, in the form of a single layer consisting of a charge-generation material).

The charge-generation material may be, for example, a p-dopant.

In one or more embodiments, the lowest unoccupied molecular orbital (LUMO) energy level of the p-dopant may be −3.5 eV or less.

In one or more embodiments, the p-dopant may include a quinone derivative, a cyano group-containing compound, a compound containing an element EL1 and an element EL2, or any combination thereof.

Examples of the quinone derivative may include TCNQ, F4-TCNQ, etc.

Examples of the cyano group-containing compound may include HAT-CN and/or a compound represented by Formula 221:

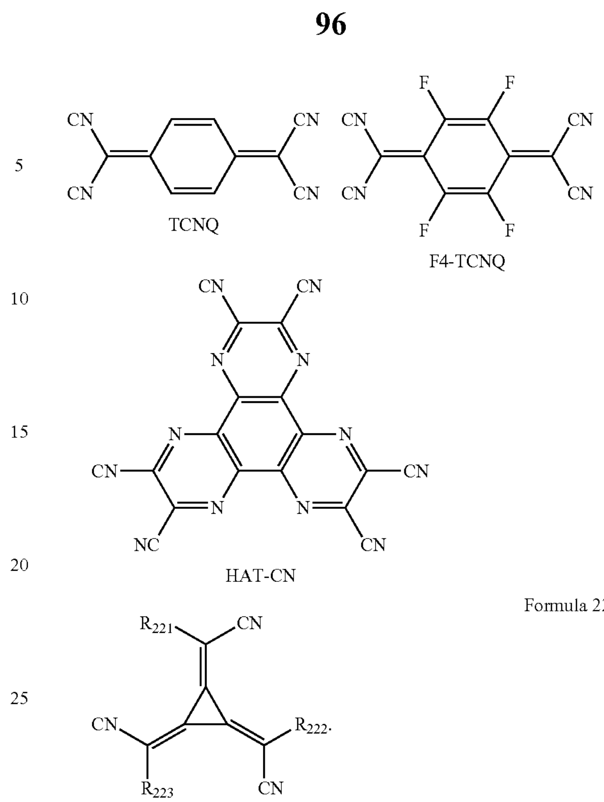

TCNQ

F4-TCNQ

HAT-CN

Formula 221

In Formula 221, $R_{221}$ to $R_{223}$ may each independently be a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing the element EL1 and the element EL2, the element EL1 may be a metal, a metalloid, or any combination thereof, and the element EL2 may be a non-metal, a metalloid, or any combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and/or a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and/or tellurium (Te).

Examples of the non-metal may include oxygen (O) and/or halogen (for example, F, Cl, Br, I, etc.).

In one or more embodiments, examples of the compound containing the element EL1 and the element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), and a rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $COCl_2$, $CoBr_2$, $COI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and/or a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and/or $SmI_3$.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and/or a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers may contact each other or may be separated from each other. In one or more embodiments, the emission layer may include two or more materials selected from a red light-emitting material, a green light-emitting material, and a blue light-emitting material, in which the two or more materials may be mixed with each other in a single layer to emit white light. In an embodiment, the emission layer may be to emit blue light.

In an embodiment, the emission layer may include the heterocyclic compound represented by Formula 1 as described herein.

The emission layer may include a host and a dopant.

In an embodiment, the dopant may include the heterocyclic compound represented by Formula 1 as described herein. In this regard, the dopant may further include, in addition to the heterocyclic compound represented by Formula 1, a phosphorescent dopant, a fluorescent dopant, or any combination thereof. The phosphorescent dopant and the fluorescent dopant further included in the emission layer in addition to the heterocyclic compound represented by Formula 1 may each independently be the same as described later.

The amount of the dopant in the emission layer may be about 0.01 to about 15 parts by weight based on 100 parts by weight of the host.

In one or more embodiments, the emission layer may include a quantum dot.

In some embodiments, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

The host may include, for example, a carbazole-containing compound, an anthracene-containing compound, or any combination thereof.

In one or more embodiments, the host may include a compound represented by Formula 301:

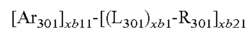

$$[Ar_{301}]_{xb11}-[(L_{301})_{xb1}-R_{301}]_{xb21}$$ Formula 301 wherein, in Formula 301, $Ar_{301}$ and $L_{301}$ may each independently be a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), or —P(═O)($Q_{301}$)($Q_{302}$), xb21 may be an integer from 1 to 5, and $Q_{301}$ to $Q_{303}$ may each independently be the same as described in connection with $Q_1$.

In an embodiment, when xb11 in Formula 301 is 2 or more, two or more $Ar_{301}$(s) may be linked to each other via a single bond.

In one or more embodiments, the host may include a compound represented by Formula 301-1, a compound represented by Formula 301-2, or any combination thereof:

Formula 301-1

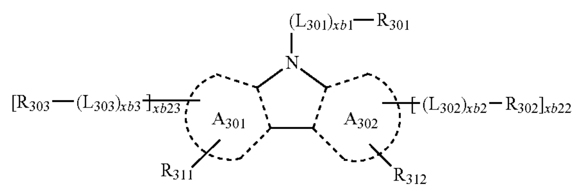

Formula 301-2

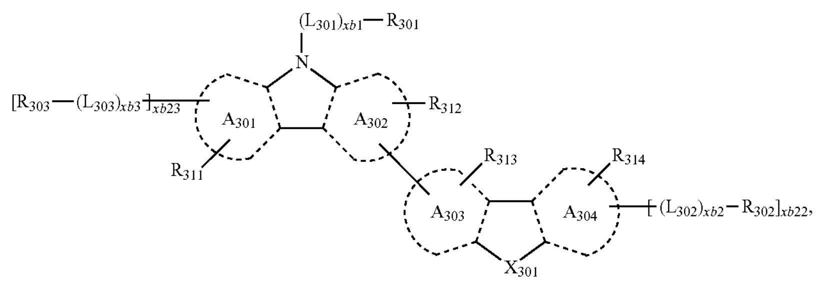

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each independently be the same as described above, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In one or more embodiments, the host may include an alkali earth metal complex, a post-transition metal complex, or any combination thereof. In an embodiment, the host may include a Be complex (for example, Compound H55), an Mg complex, a Zn complex, or any combination thereof.

In one or more embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

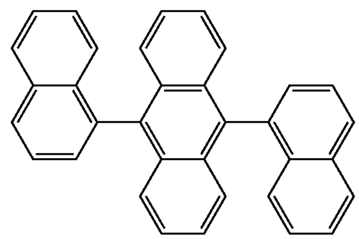

-continued

H2

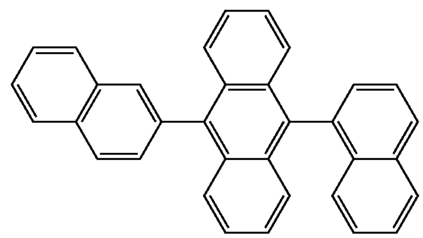

H3

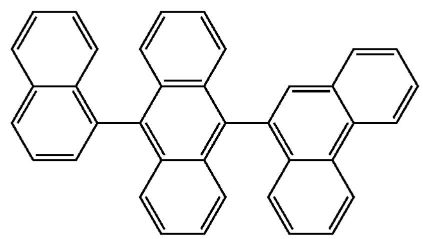

-continued
H4
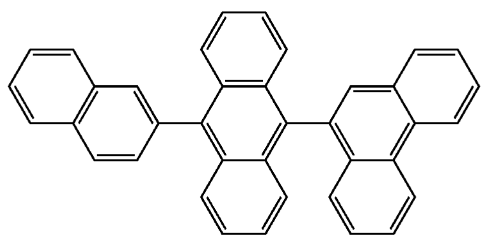
H5
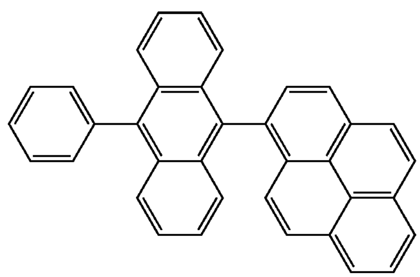
H6
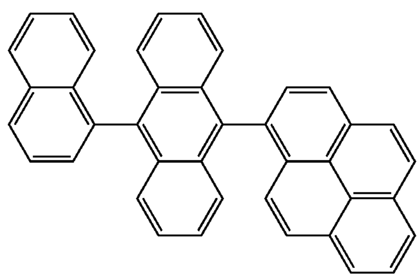
H7
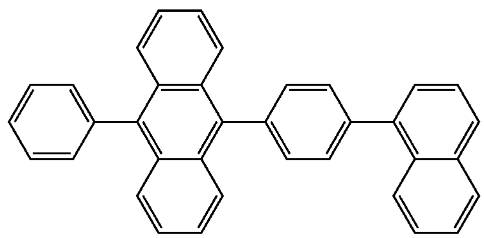
H8
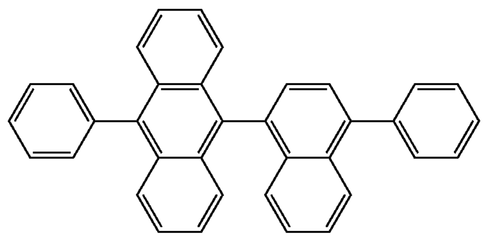
H9
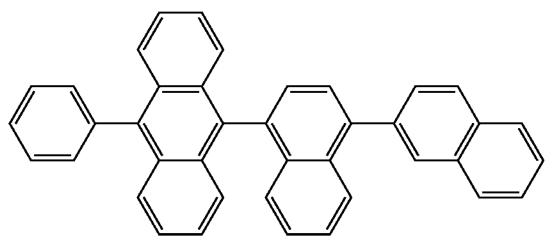
-continued
H10
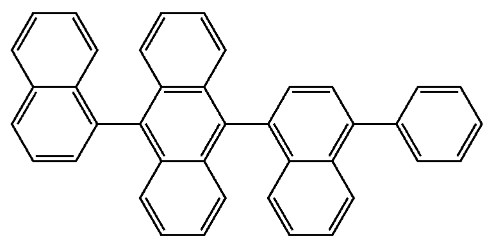
H11
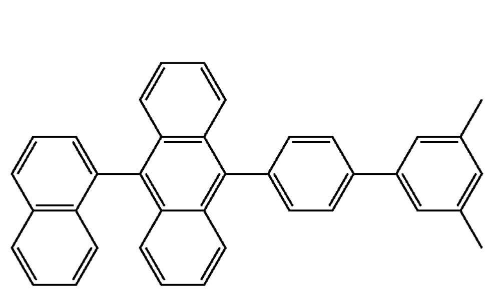
H12
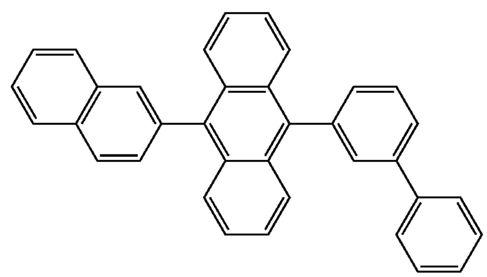
H13
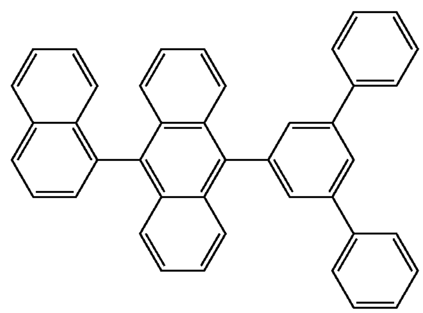
H14
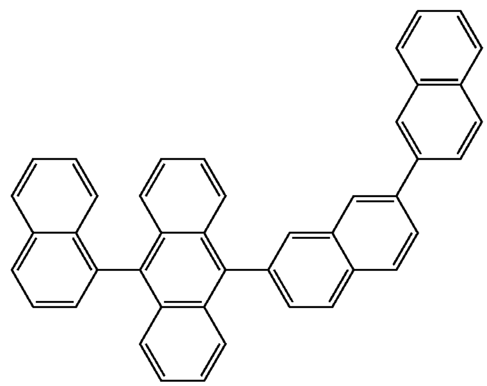

-continued
H15
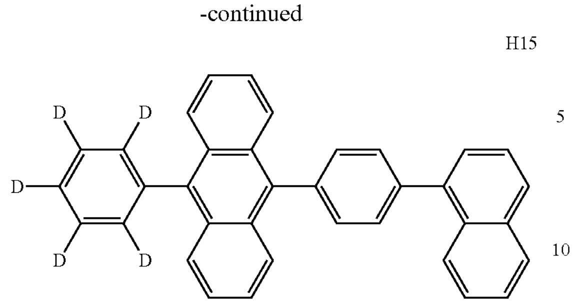
H16
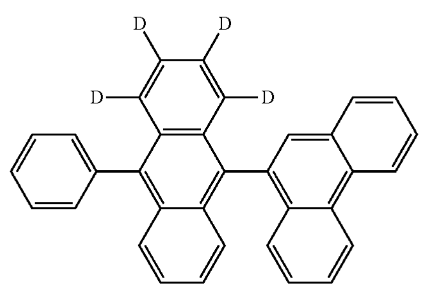
H17
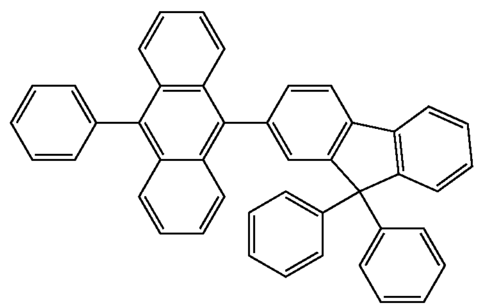
H18
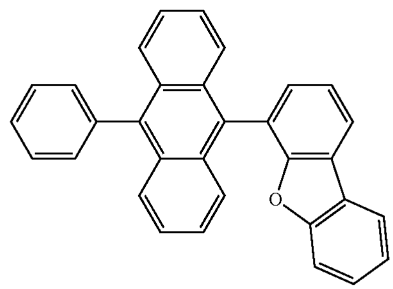
H19
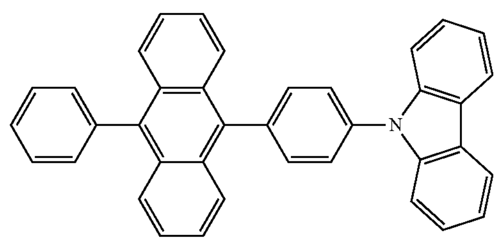
-continued
H20
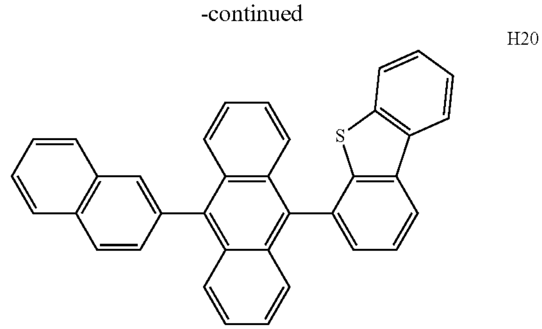
H21
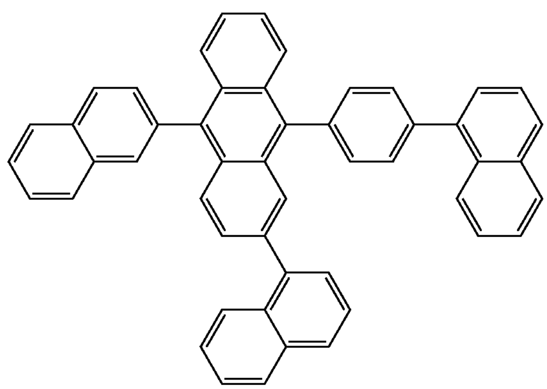
H22
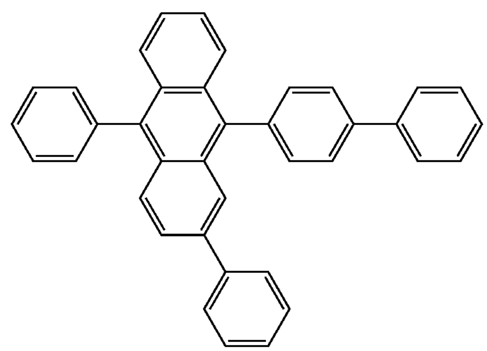
H23
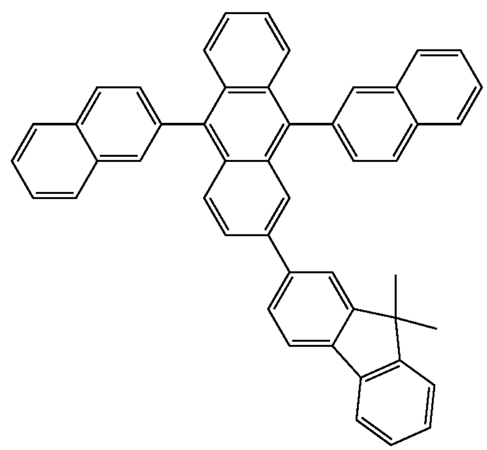

-continued
H24
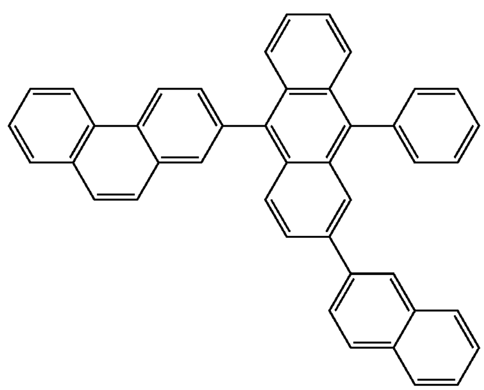
H25
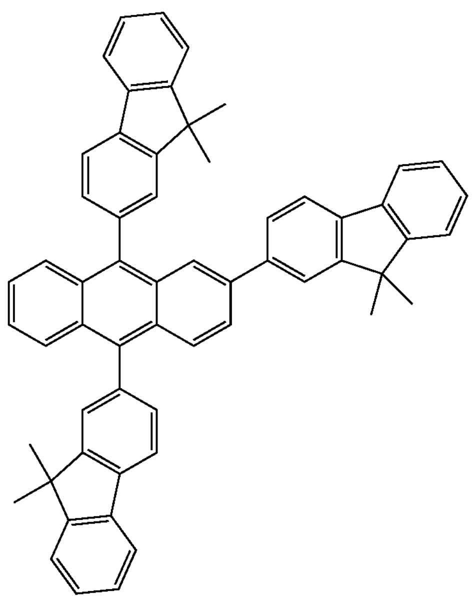
H26
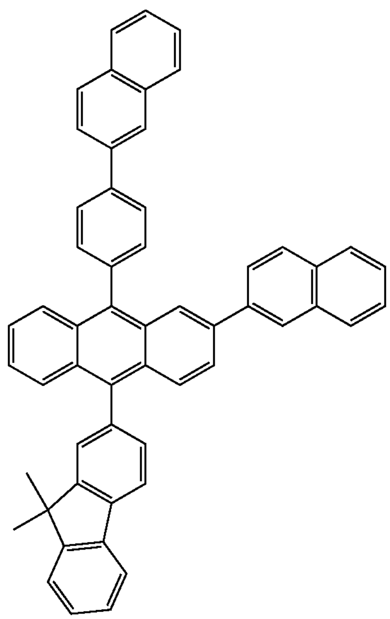
-continued
H27
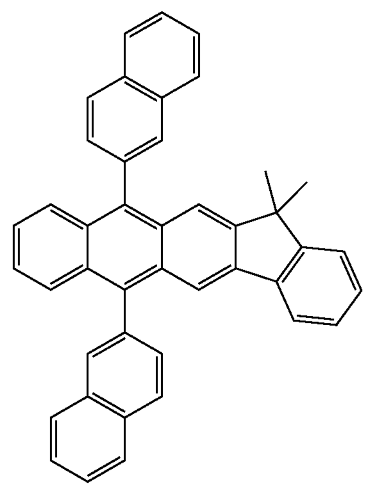
H28
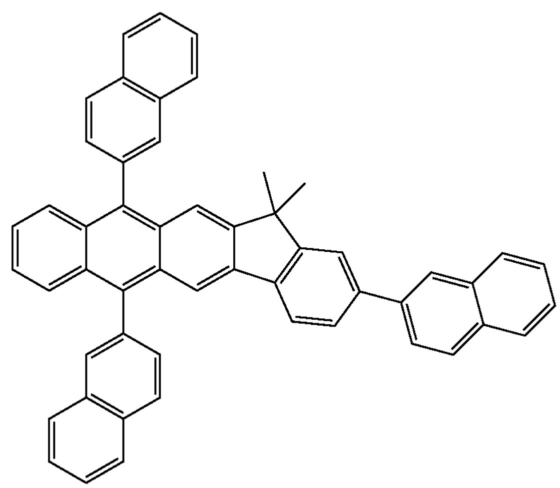
H29
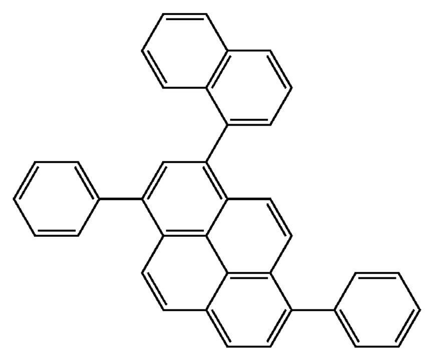

-continued
H30
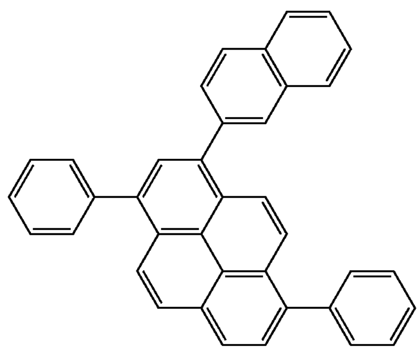
H31
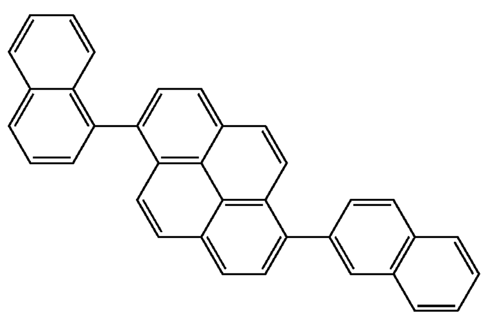
H32
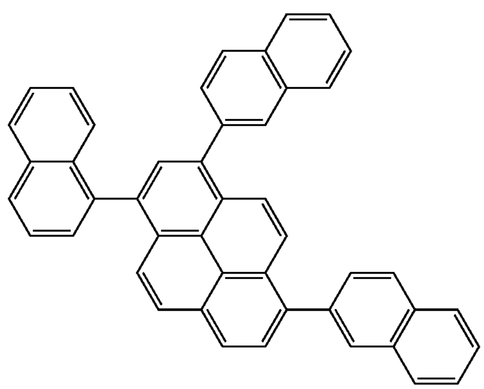
H33
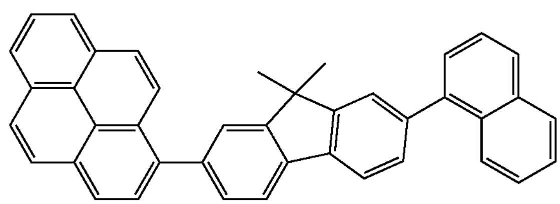
H34
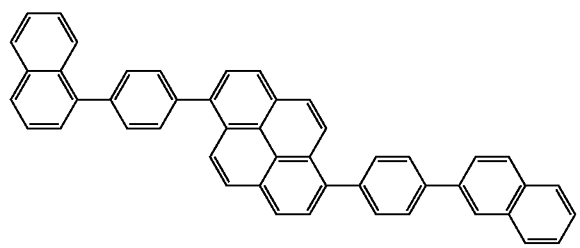
-continued
H35
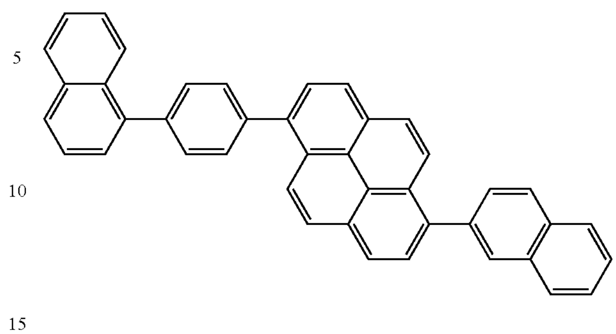
H36
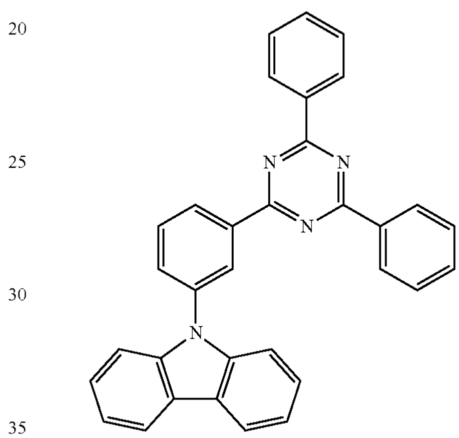
H37
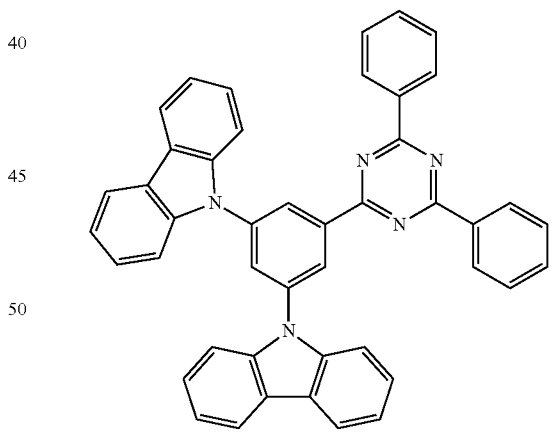
H38
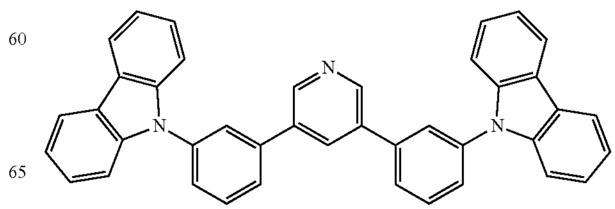

H39
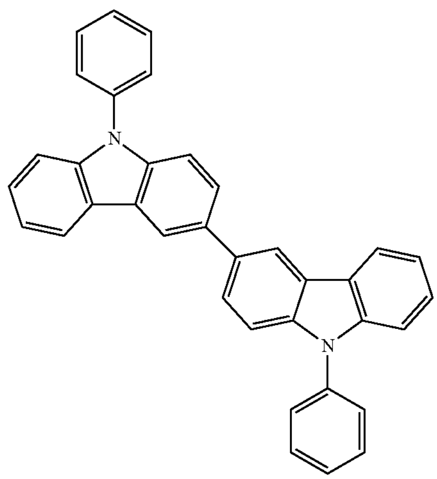
H40
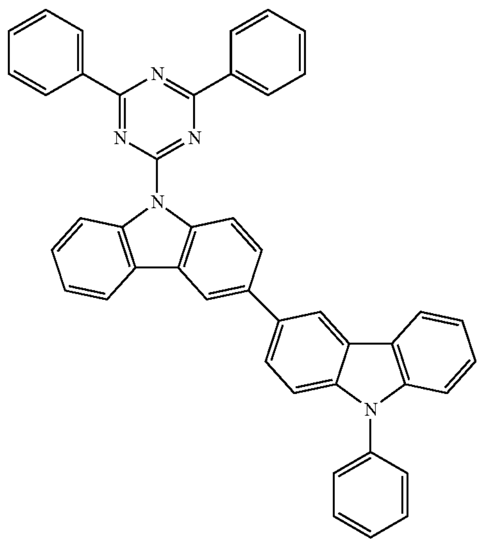
H41
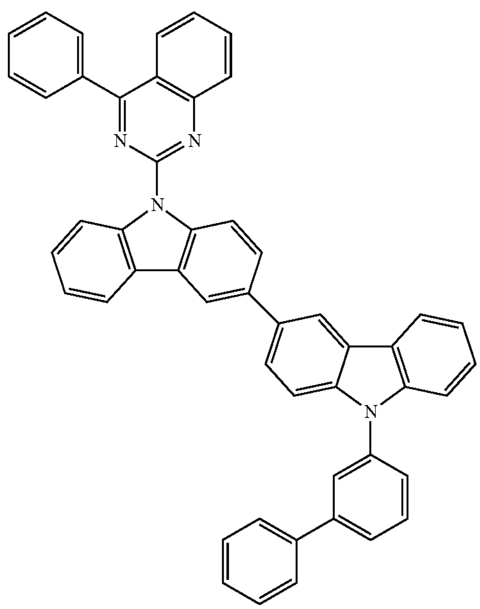
H42
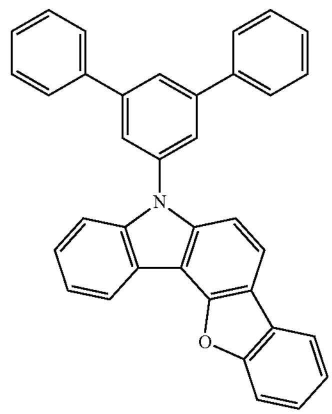
H43
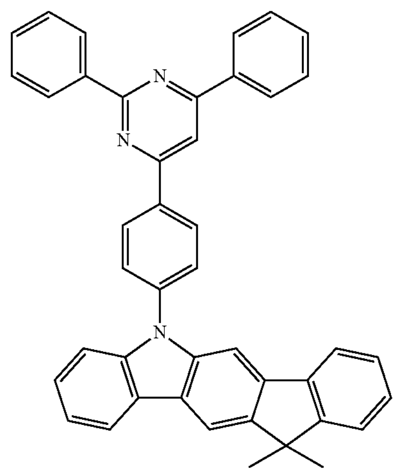
H44
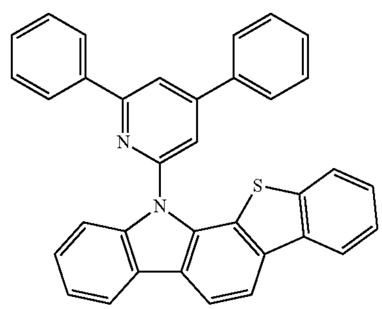
H45
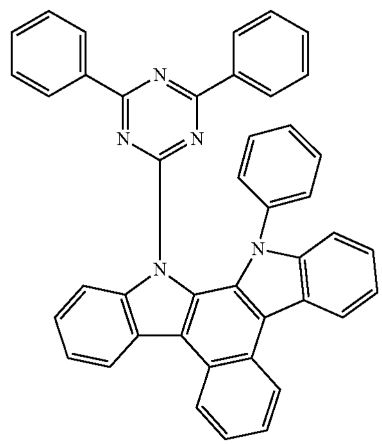

-continued
H46
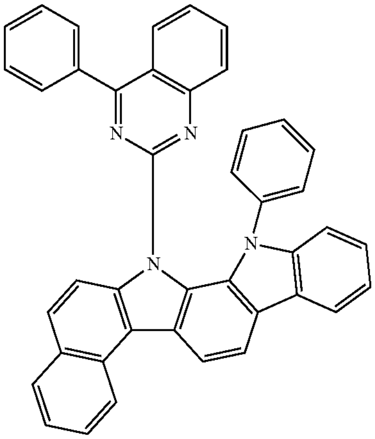
H47
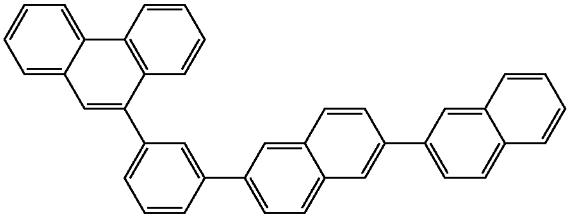
H48
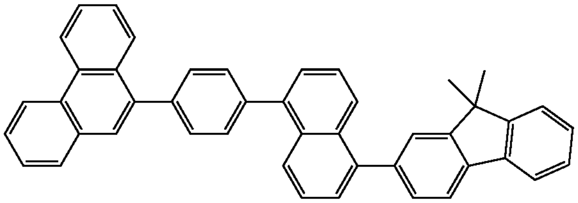
H49
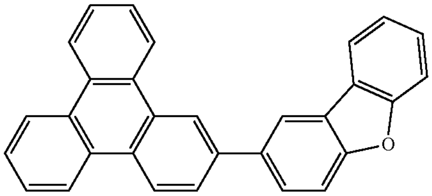
H50
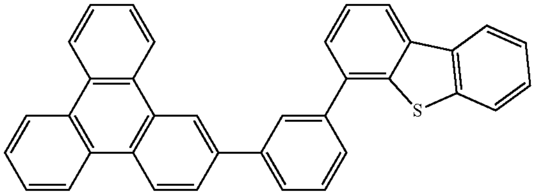
H51
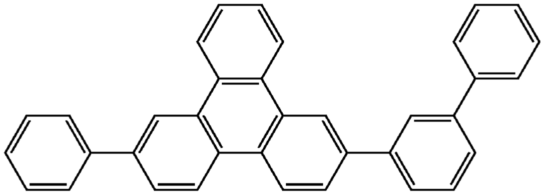
-continued
H52
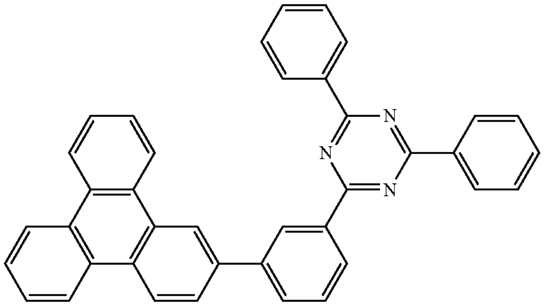
H53
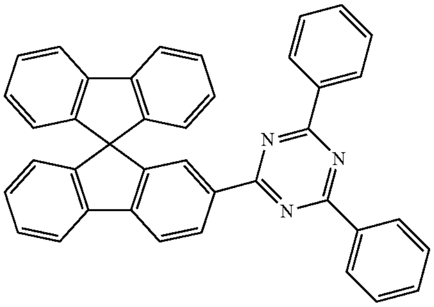
H54
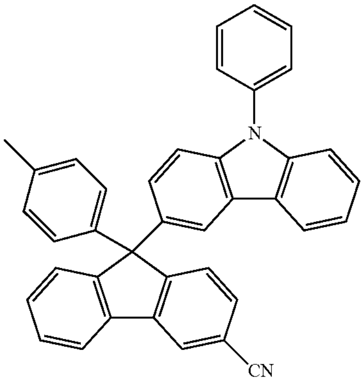
H55
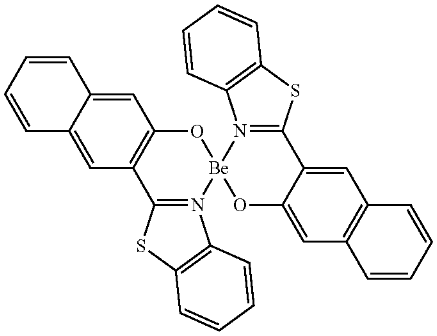

-continued
H56
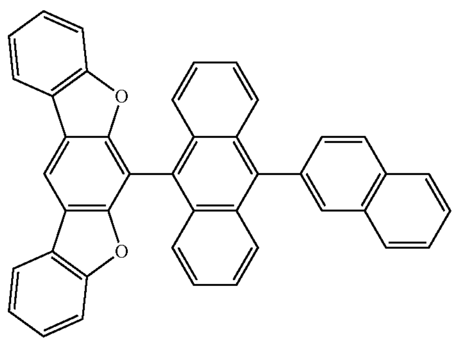
H57
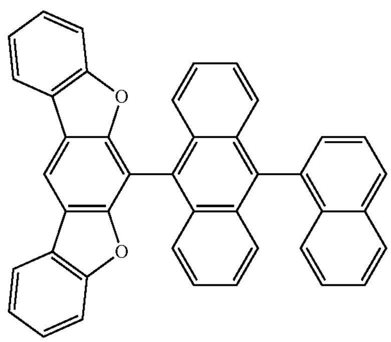
H58
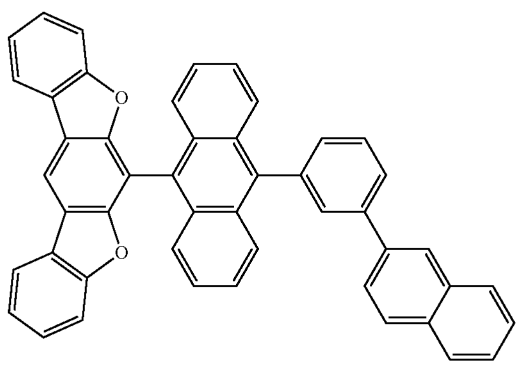
H59
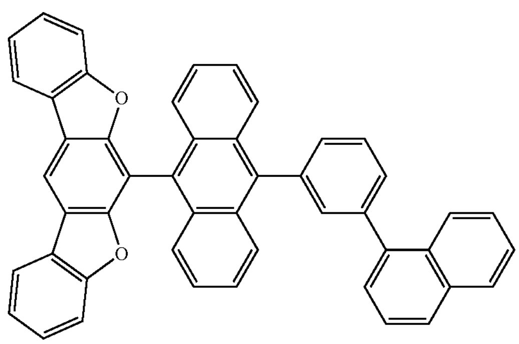
-continued
H60
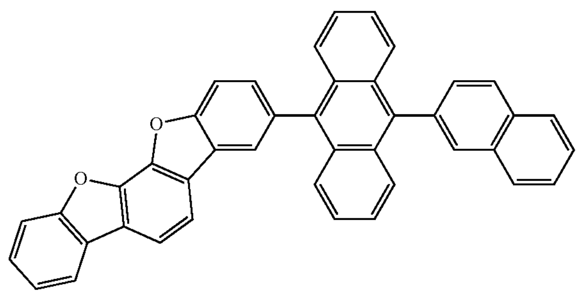
H61
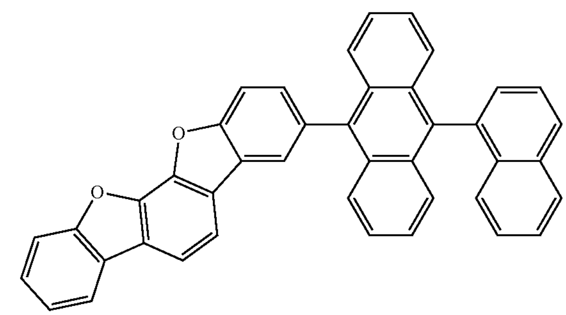
H62
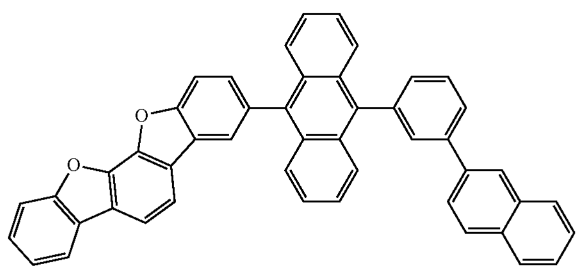
H63
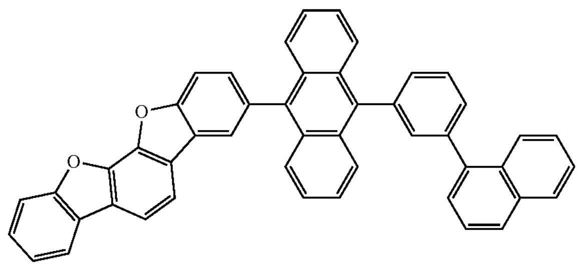
H64
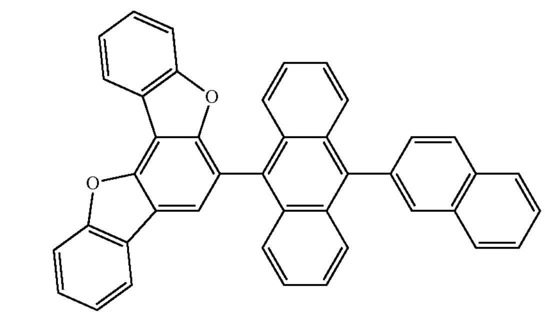

-continued
H65
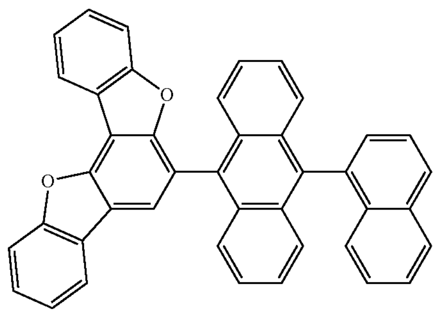
H66
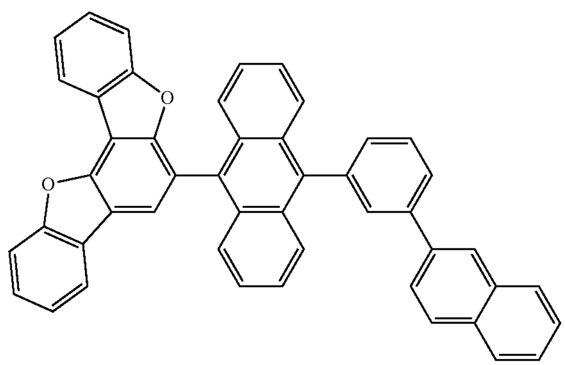
H67
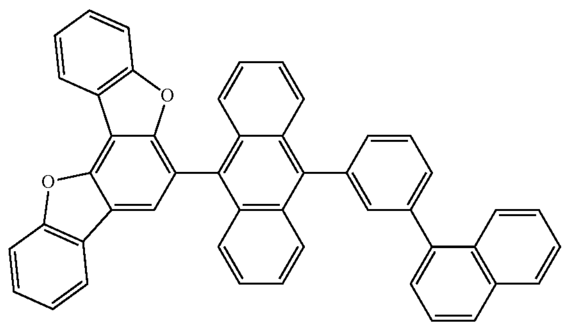
H68
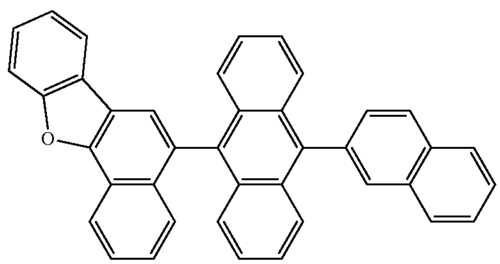
H69
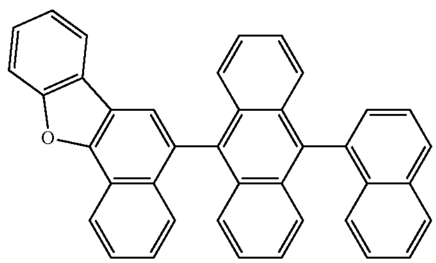
-continued
H70
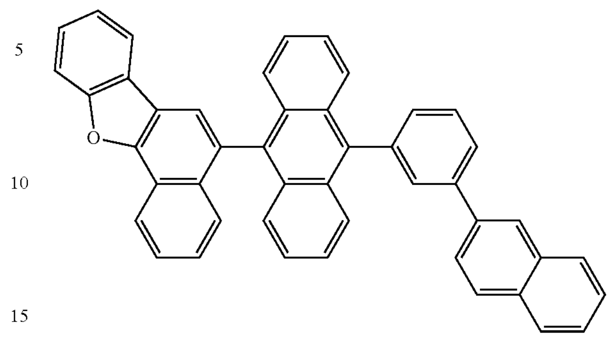
H71
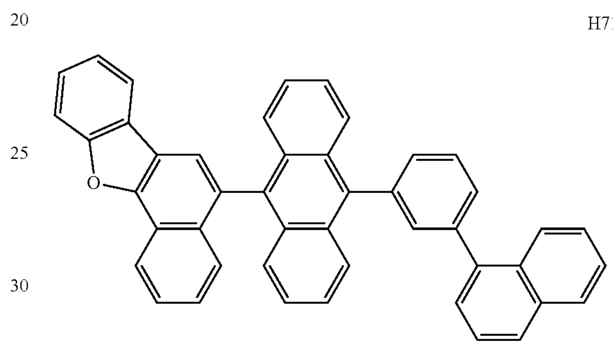
H72
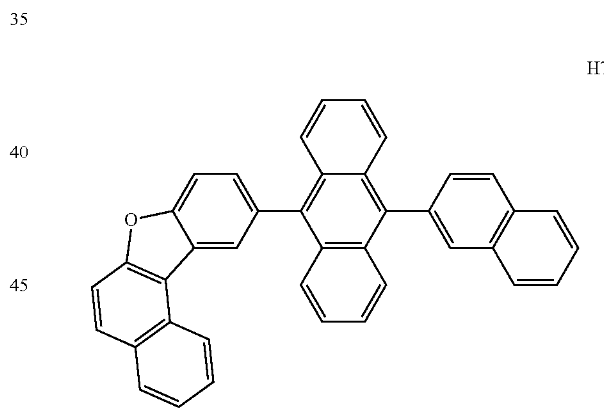
H73
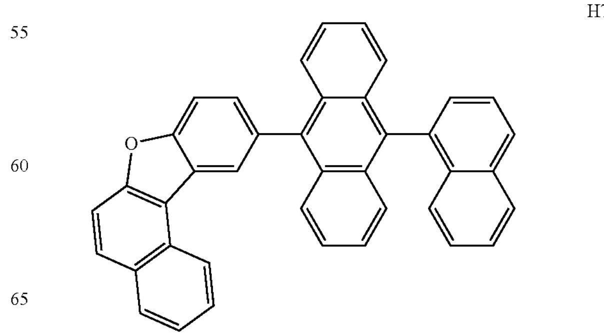

-continued
H74
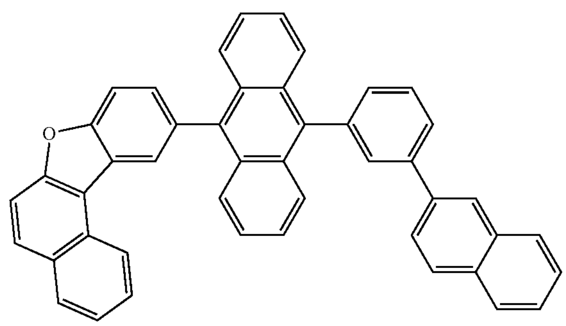
H75
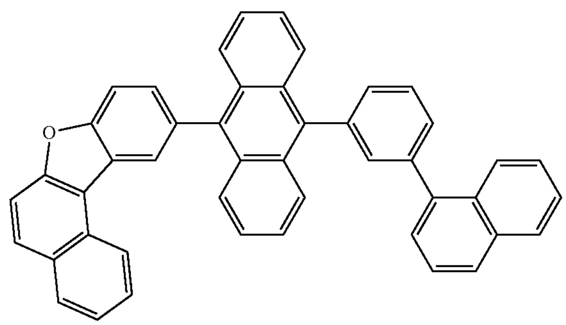
H76
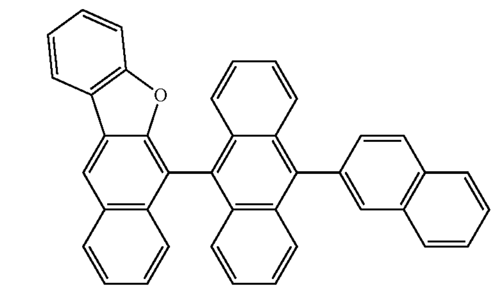
H77
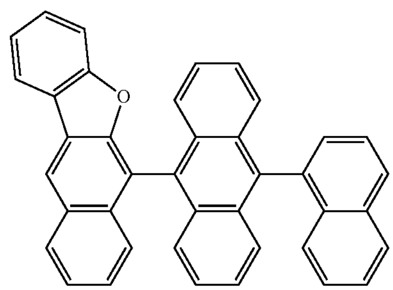
H78
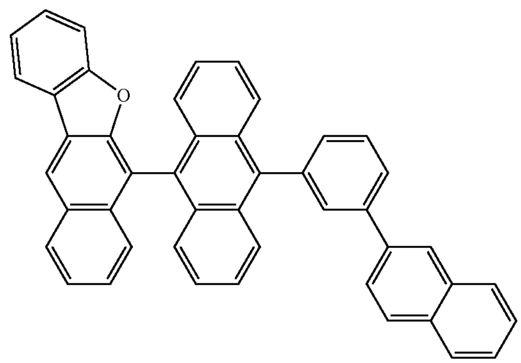
-continued
H79
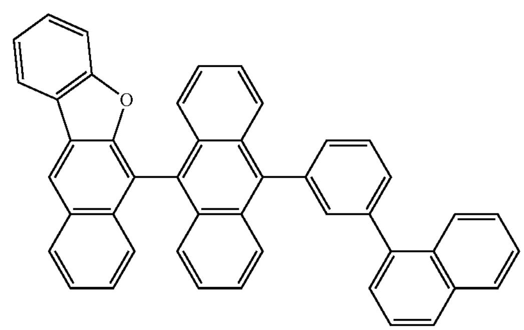
H80
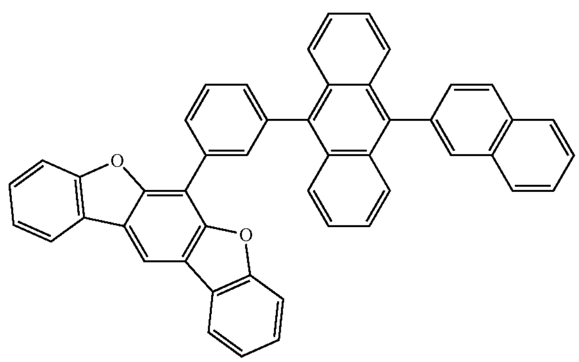
H81
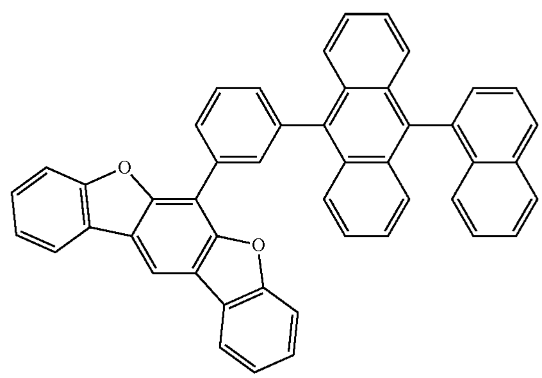
H82
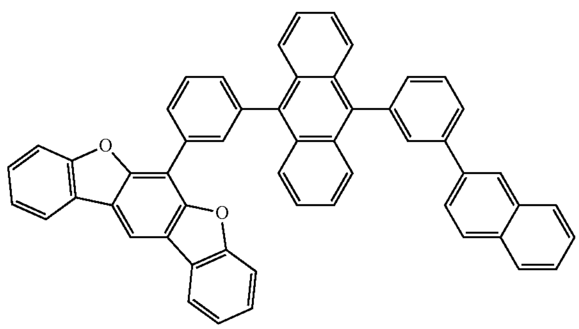

-continued
H83
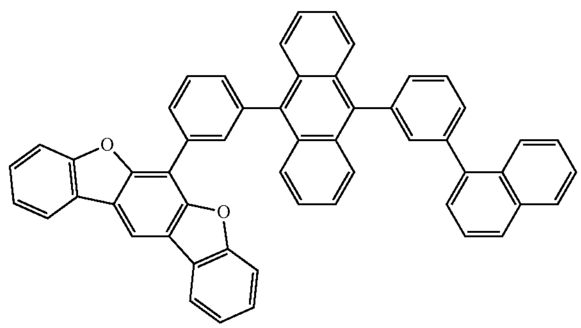
H84
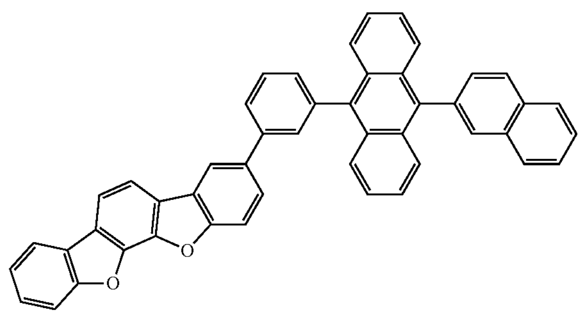
H85
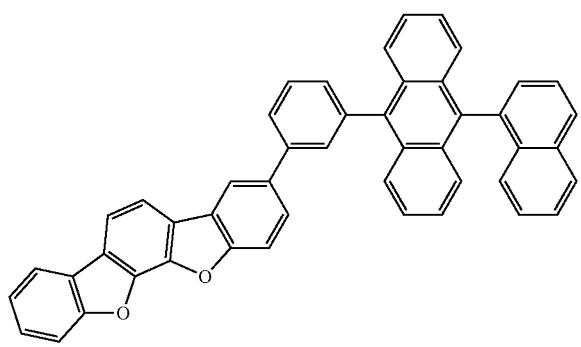
H86
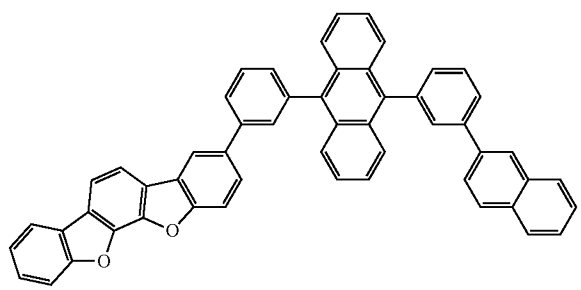
-continued
H87
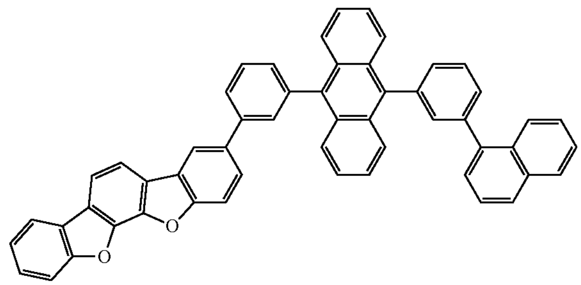
H88
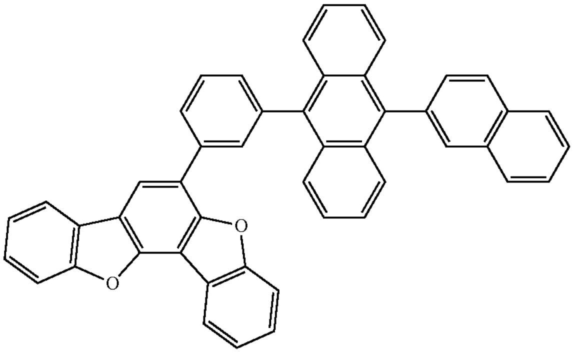
H89
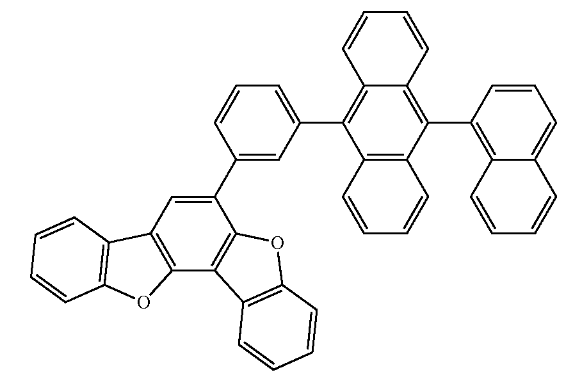
H90
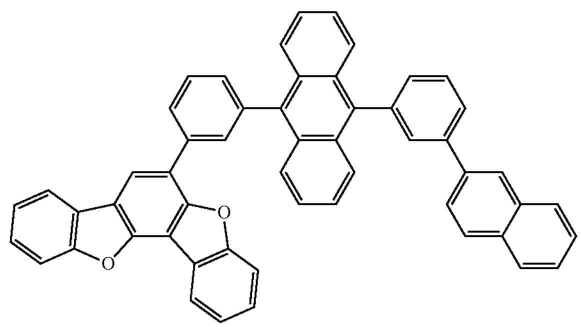

-continued
H91
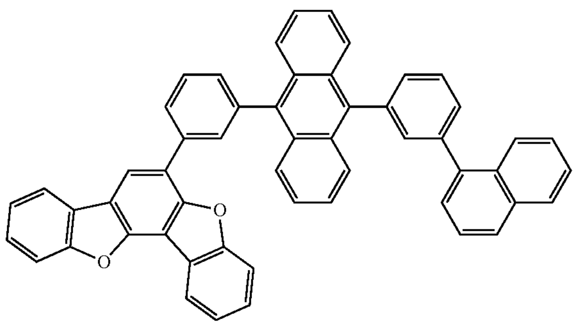
H92
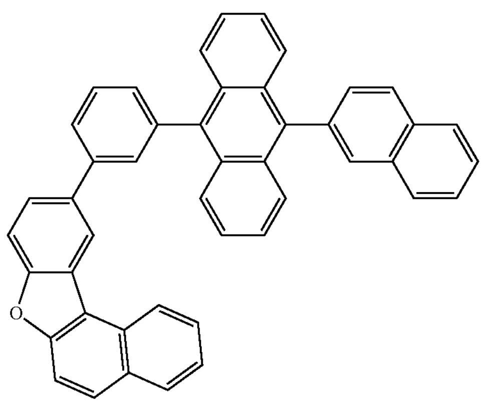
H93
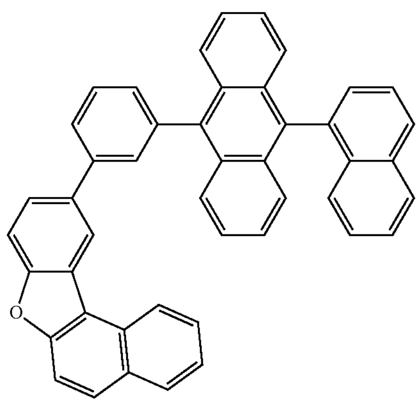
H94
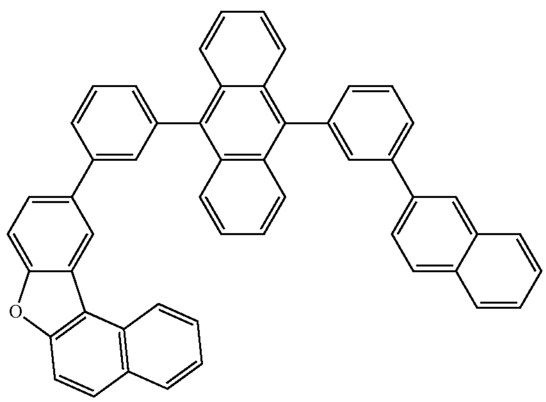
-continued
H95
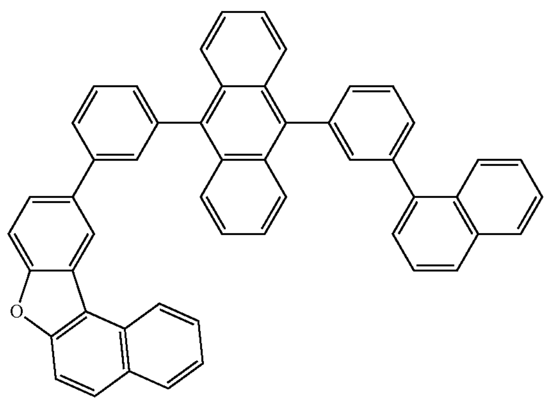
H96
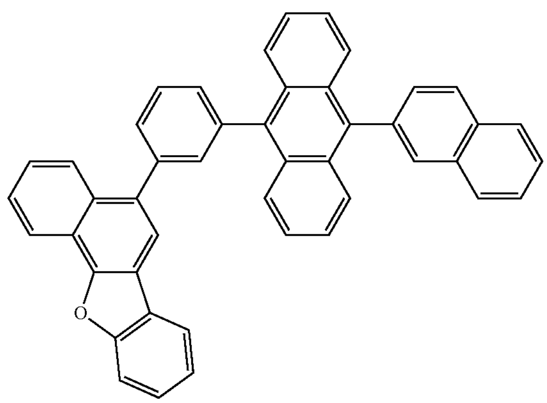
H97
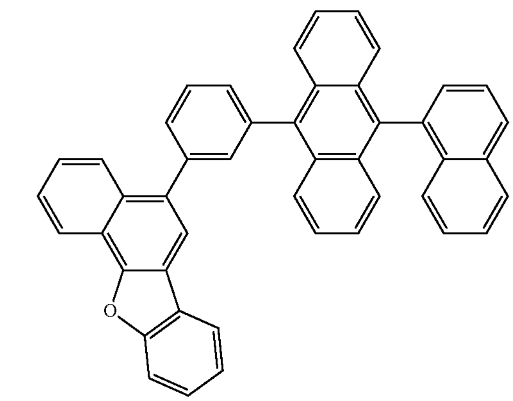
H98
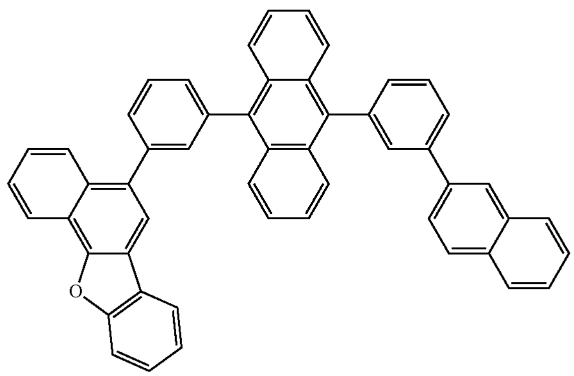

-continued
H99
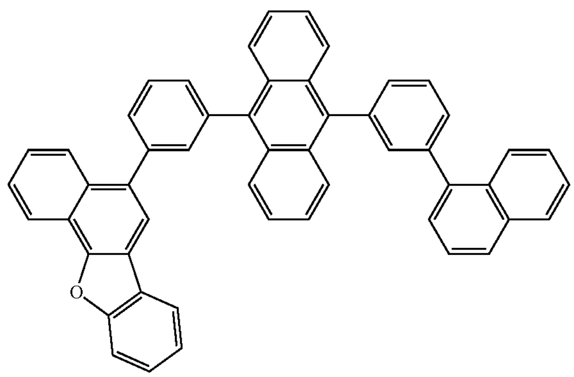
H100
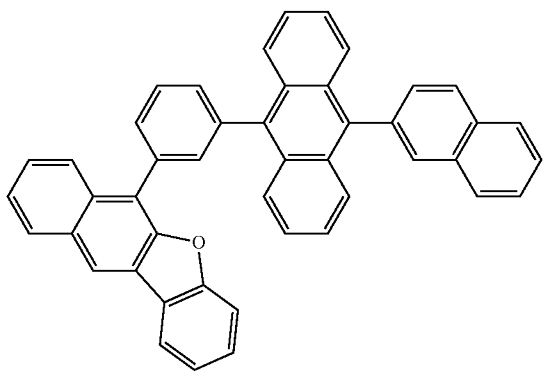
H101
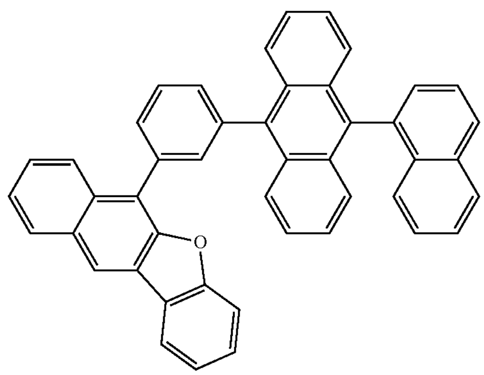
H102
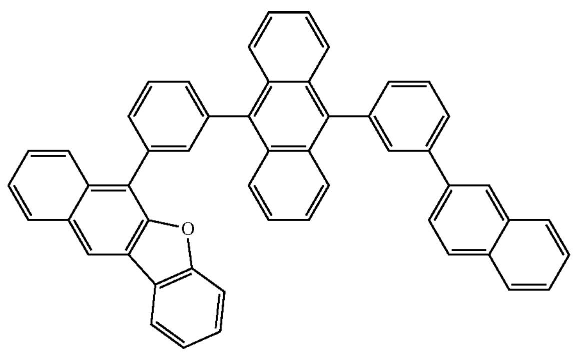
-continued
H103
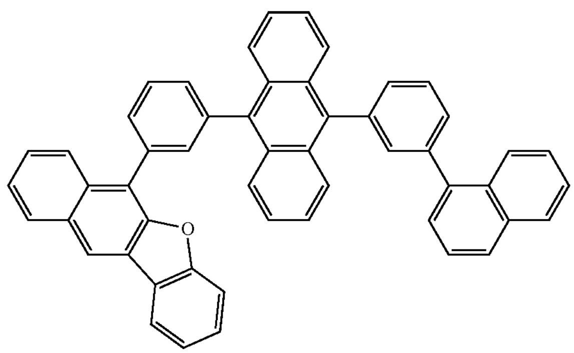
H104
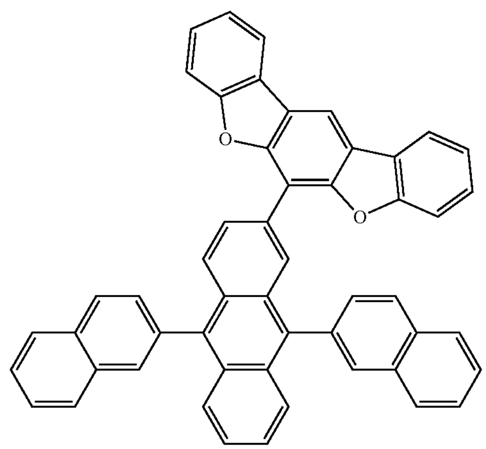
H105
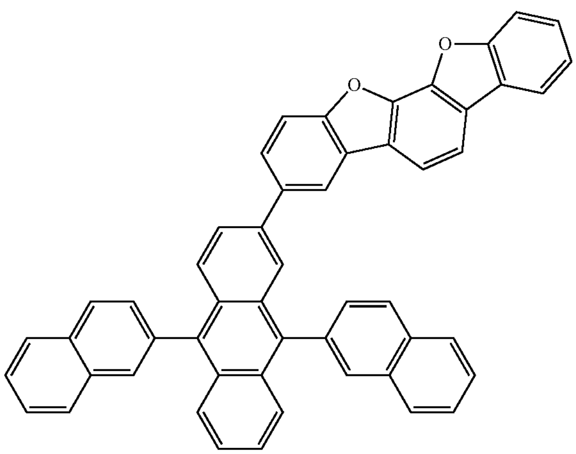

-continued
H106
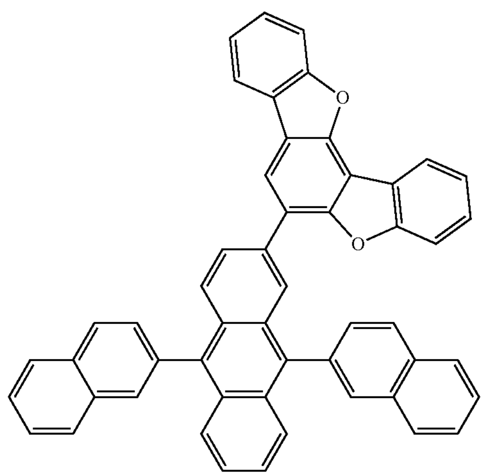
H107
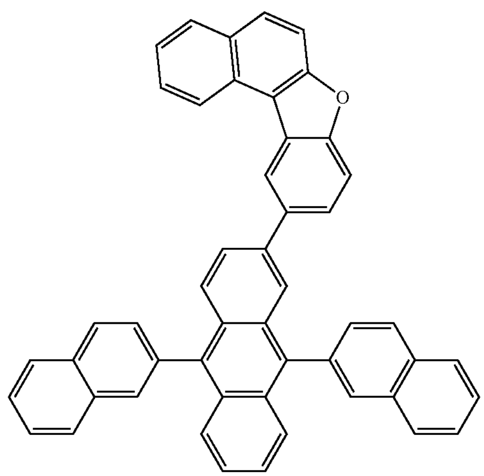
H108
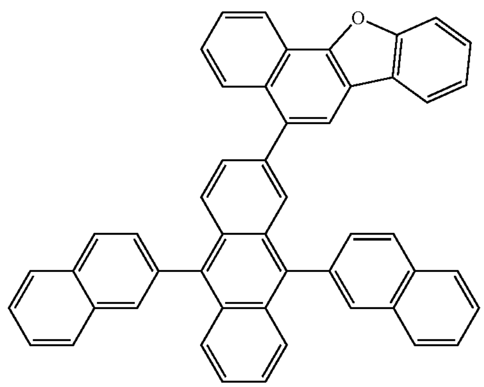
-continued
H109
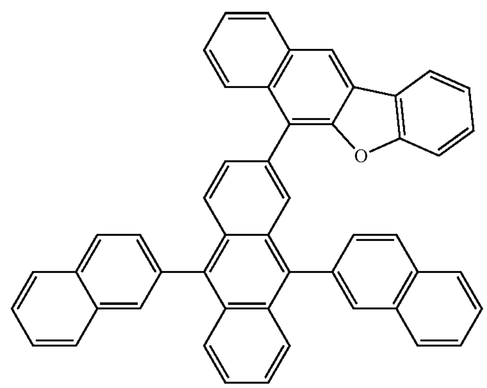
H110
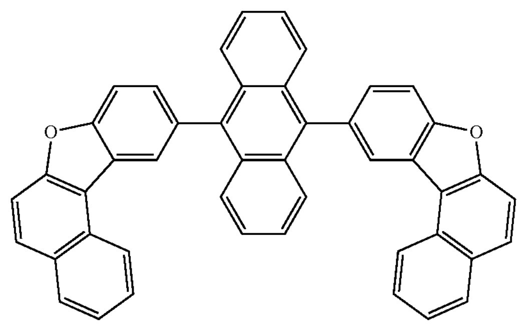
H111
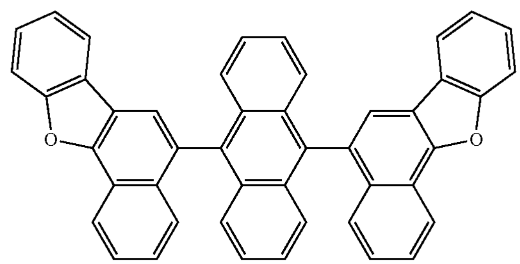
H112
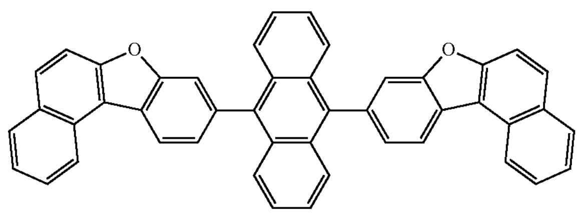
H113
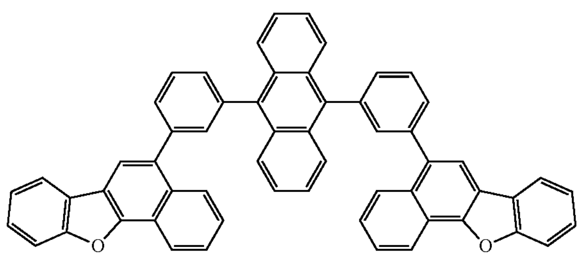

-continued
H114
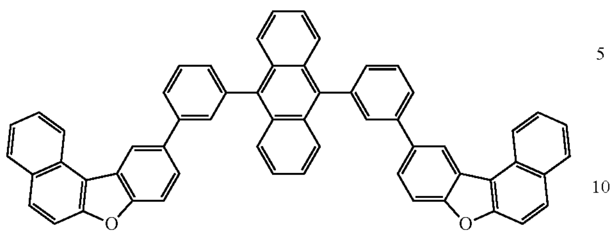
H115
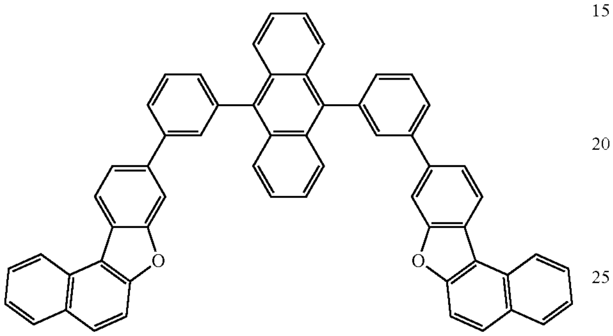
H116
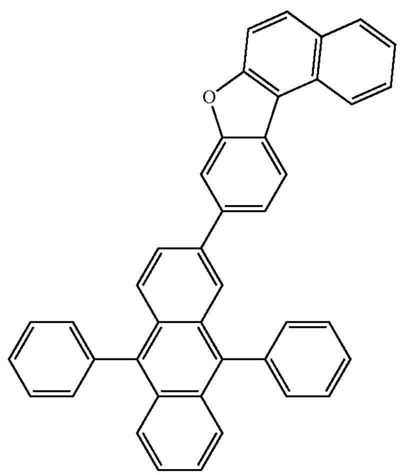
H117
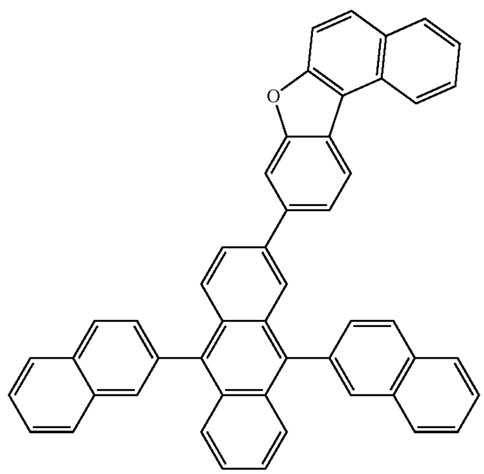
-continued
H118
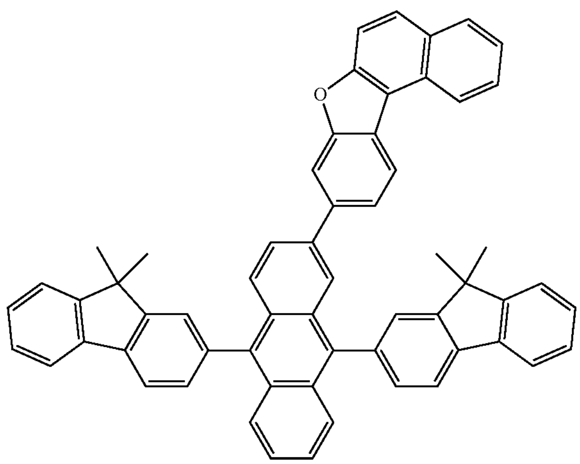
H119
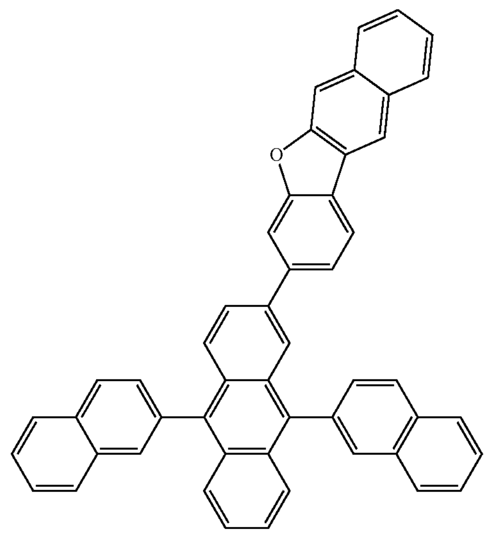
H120
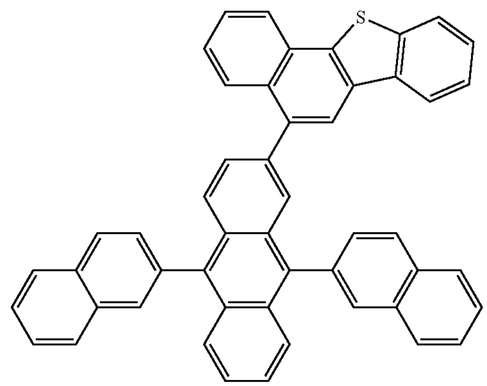

-continued

H121

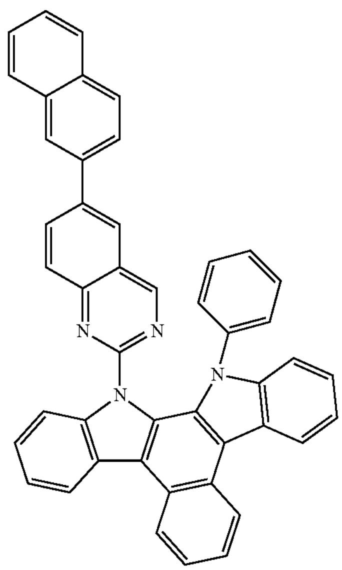

H122

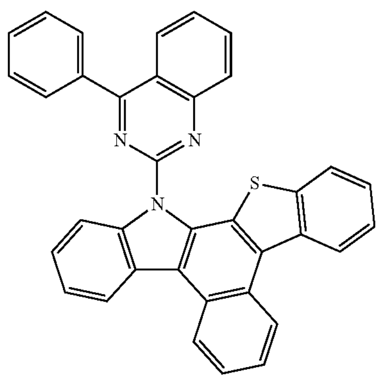

H123

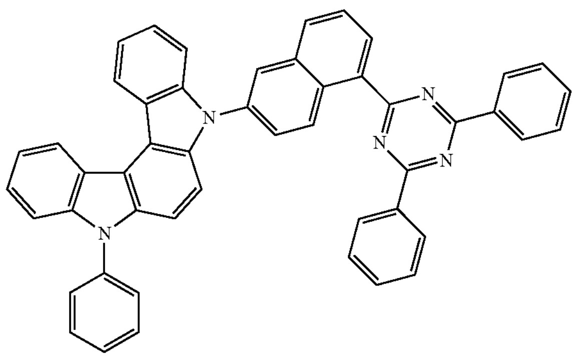

-continued

H124

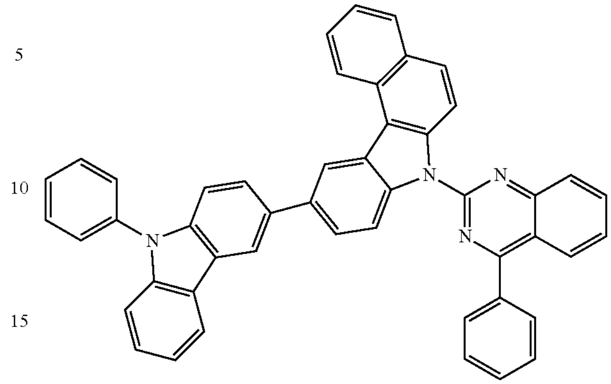

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

Formula 401

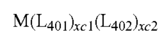

$M(L_{401})_{xc1}(L_{402})_{xc2}$

Formula 402

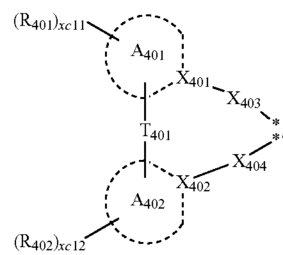

wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), and/or thulium (Tm)), $L_{401}$ may be a ligand represented by Formula 402, and xc1 may be 1, 2, or 3, wherein when xc1 is 2 or more, two or more of $L_{401}$ (s) may be identical to or different from each other, $L_{402}$ may be an organic ligand, and xc2 may be 0, 1, 2, 3, or 4, wherein when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(═O)—*', *—N($Q_{411}$)-*', *—C($Q_{411}$)($Q_{412}$)-*', *—C($Q_{411}$)═C($Q_{412}$)-*', *—C($Q_{411}$)═*', or *═C($Q_{411}$)=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}$(s) in two or more $L_{401}$(s) may optionally be linked to each other via $T_{402}$, which is a linking group, or two ring $A_{402}$(s) may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of Compounds PD1 to PD25, or any combination thereof:

PD1

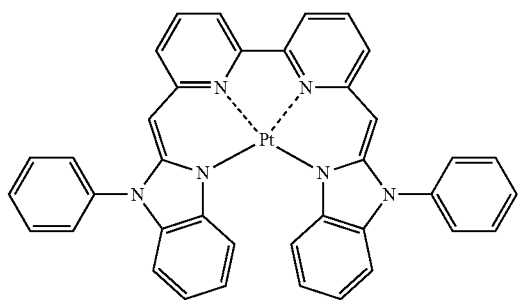

PD2

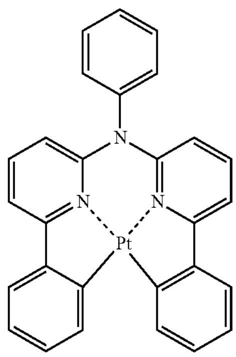

-continued

PD3

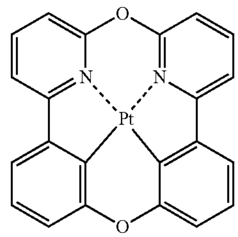

PD4

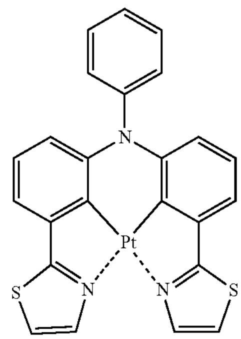

PD5

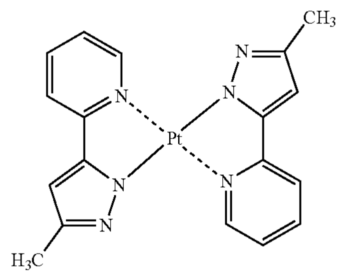

PD6

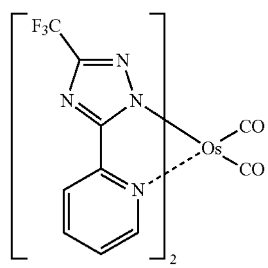

PD7

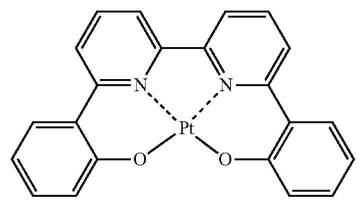

PD8

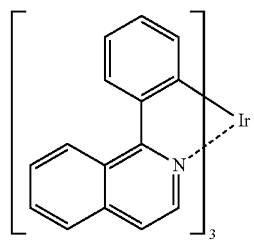

PD9
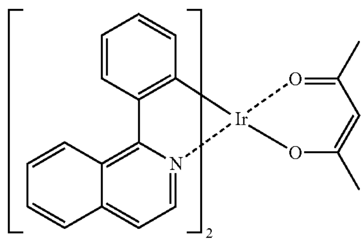
PD10
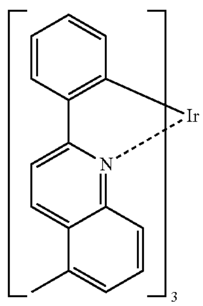
PD11
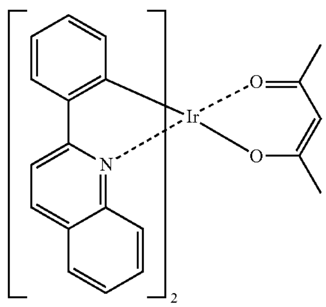
PD12
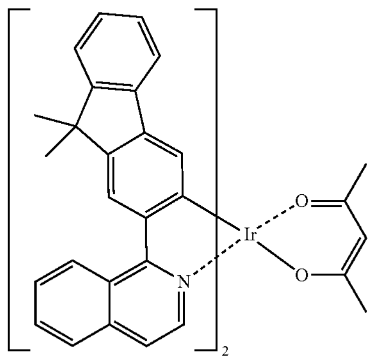
PD13
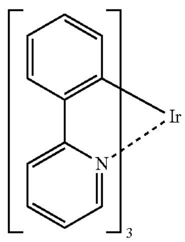
PD14
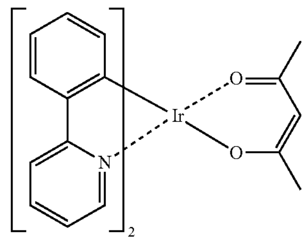
PD15
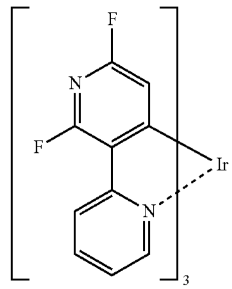
PD16
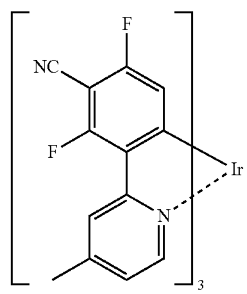
PD17
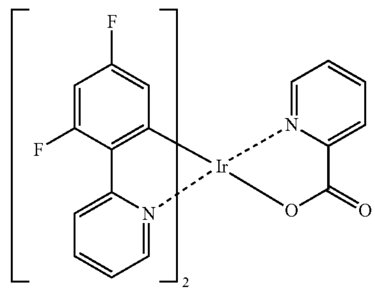
PD18
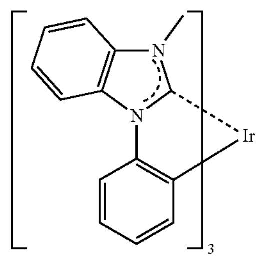

-continued

PD19

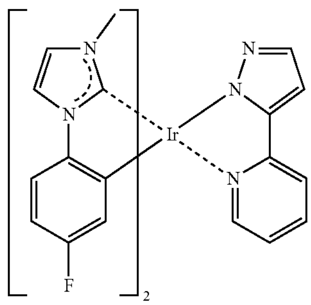

PD20

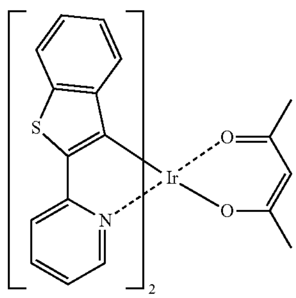

PD21

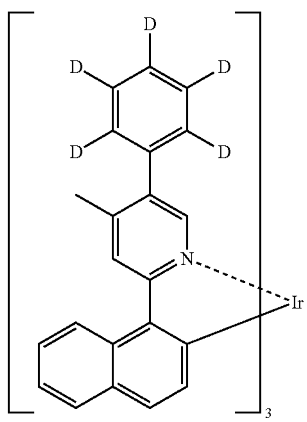

PD22

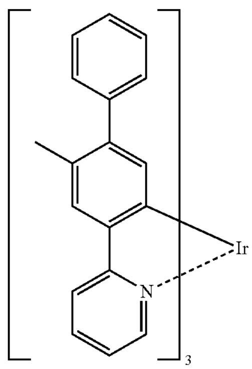

-continued

PD23

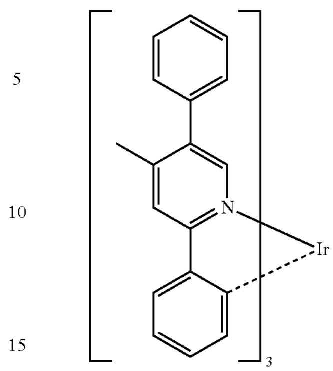

PD24

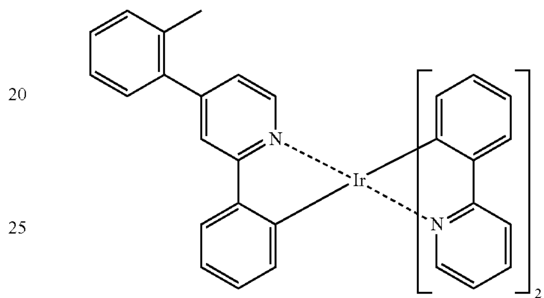

PD25

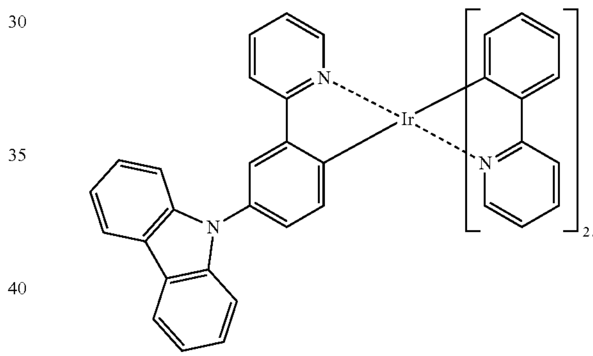

Fluorescent Dopant

The fluorescent dopant may include an amine group-containing compound, a styryl group-containing compound, or any combination thereof.

In an embodiment, the fluorescent dopant may include a compound represented by Formula 501:

Formula 501

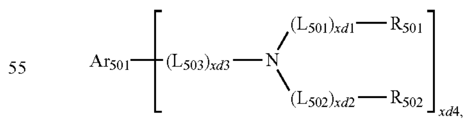

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.
In one or more embodiments, xd4 in Formula 501 may be 2.
In an embodiment, the fluorescent dopant may include: one of Compounds FD1 to FD36; DPVBi; DPAVBi; or any combination thereof:
FD1
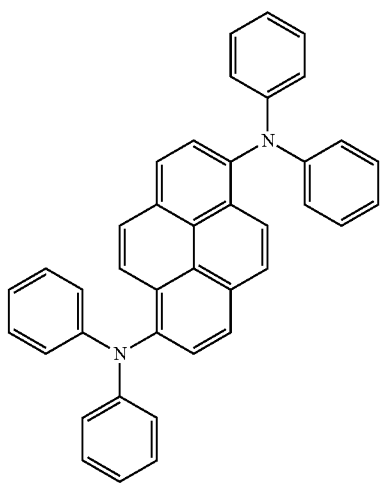
FD2
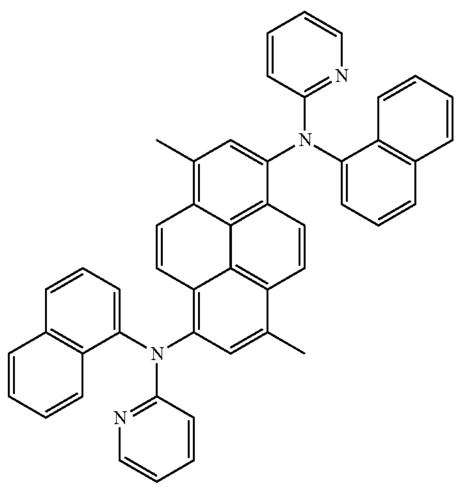
-continued
FD3
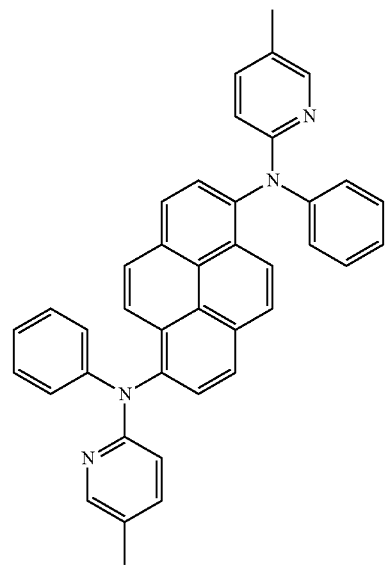
FD4
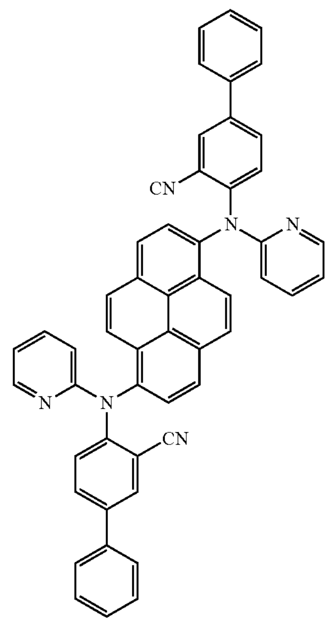

-continued
FD5
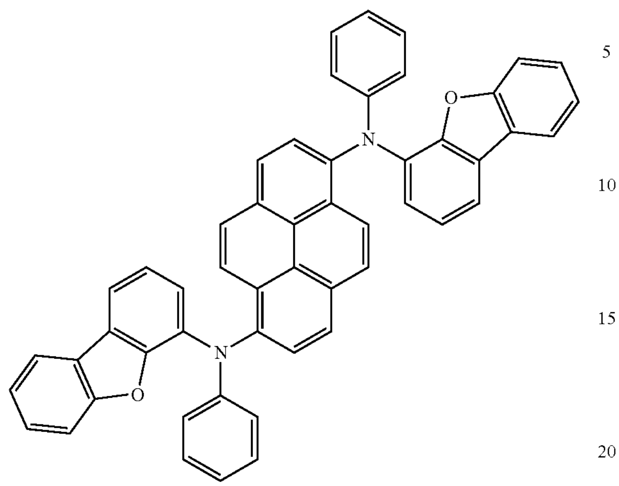
FD6
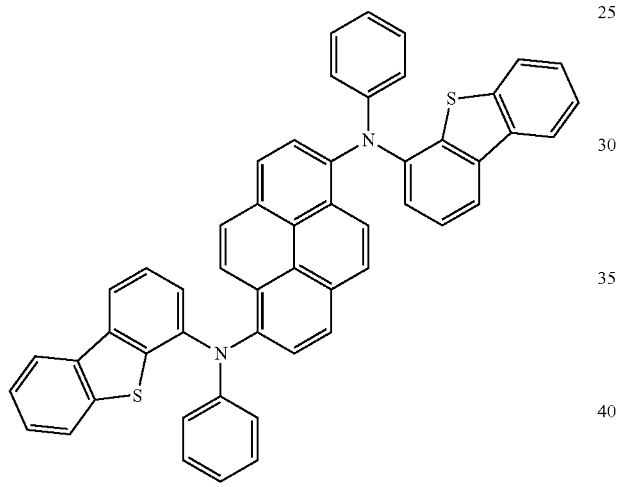
FD7
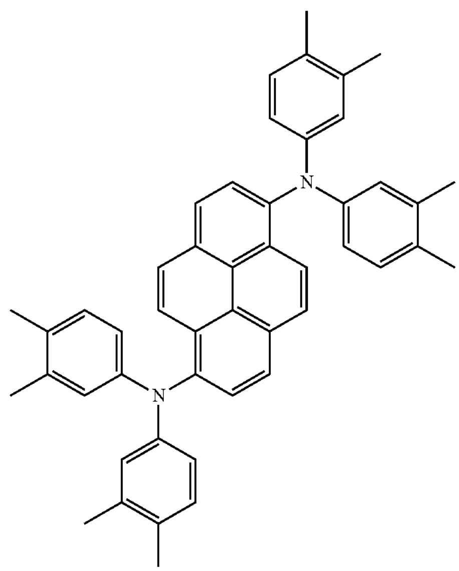
-continued
FD8
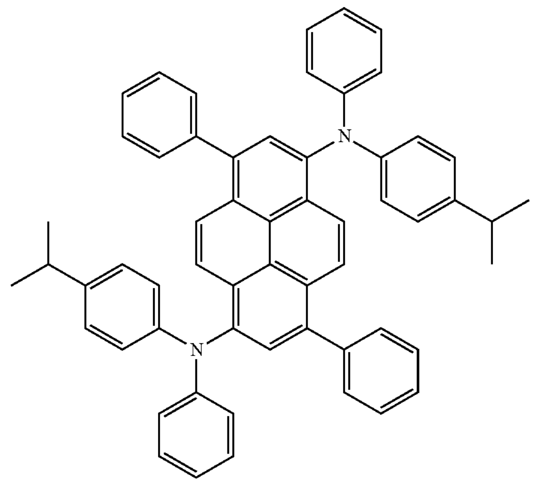
FD9
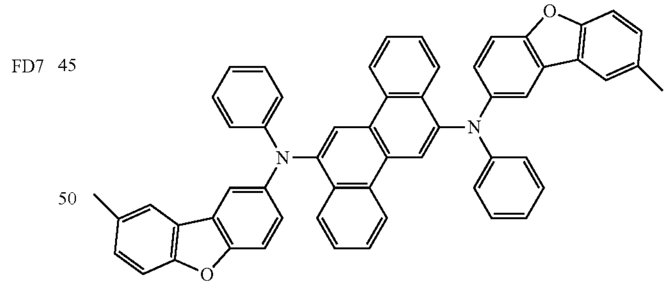
FD10
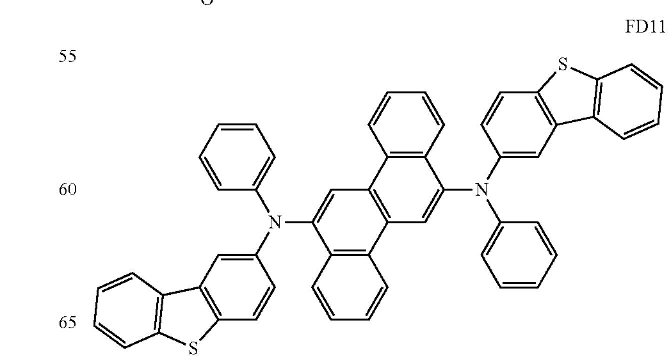
FD11

-continued
FD12
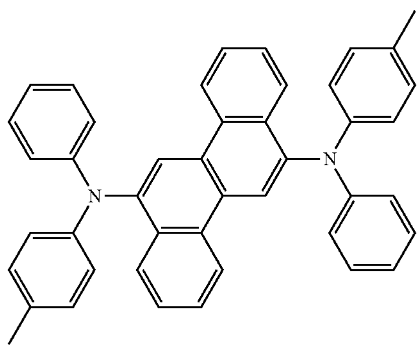
FD13
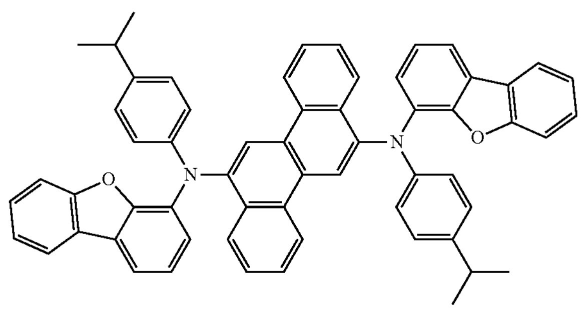
FD14
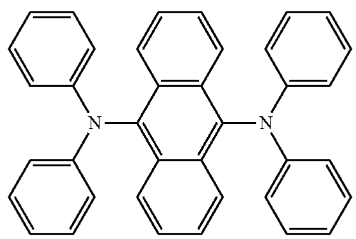
FD15
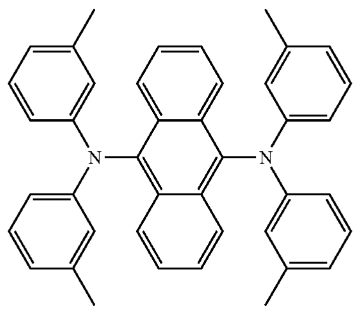
FD16
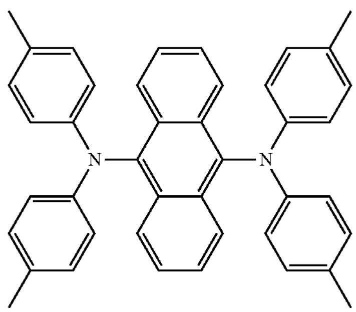
-continued
FD17
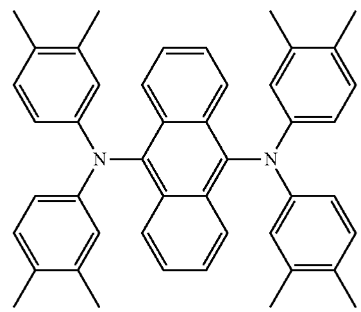
FD18
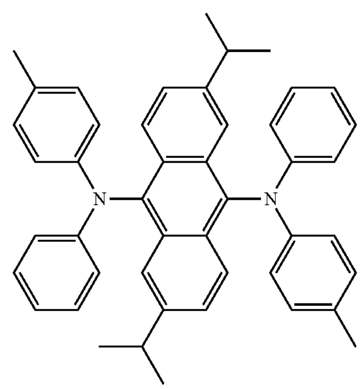
FD19
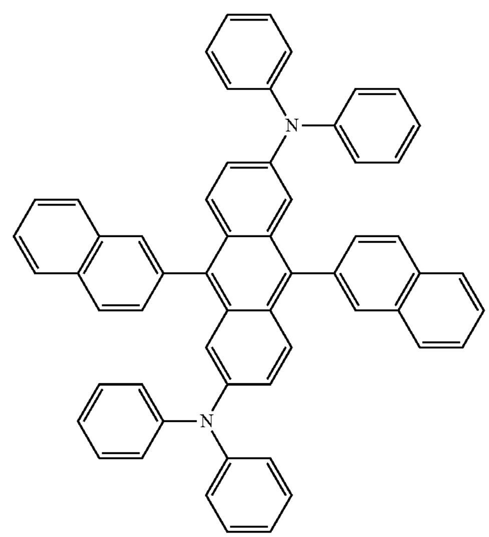
FD20
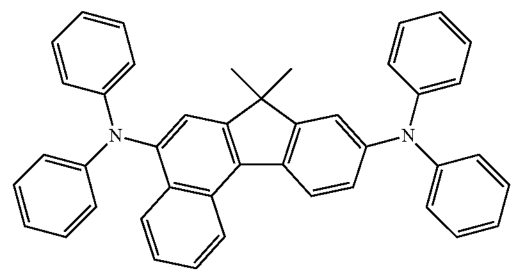

-continued
FD21
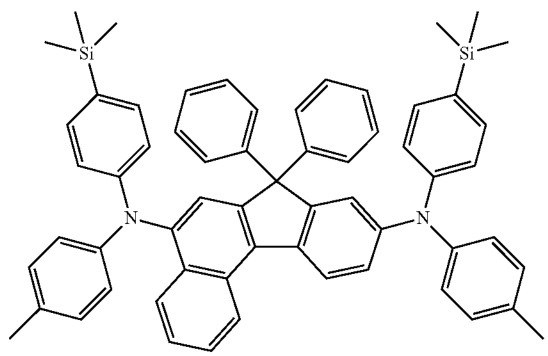
FD22
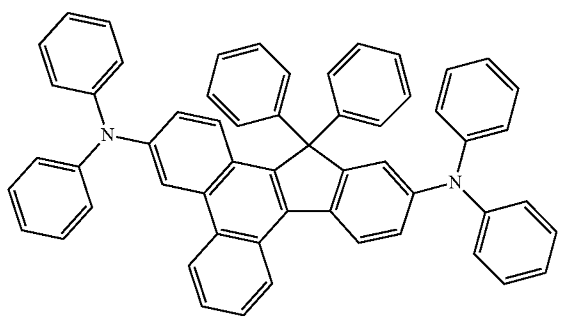
FD23
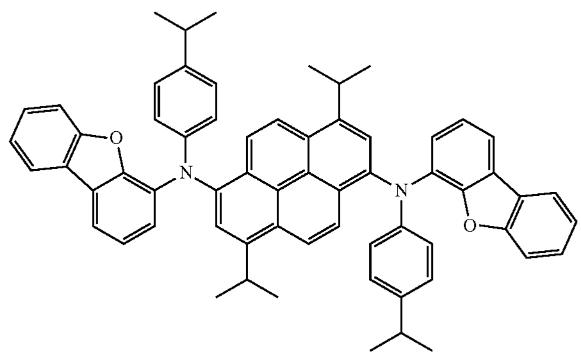
FD24
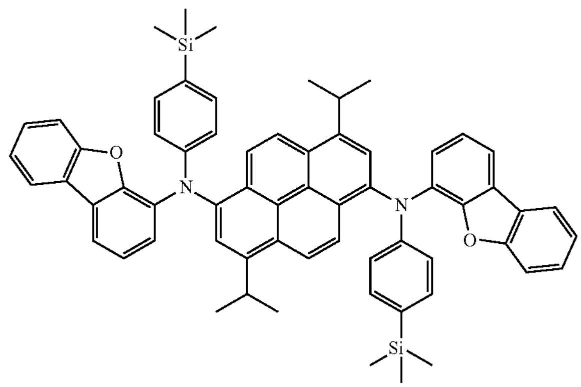
-continued
FD25
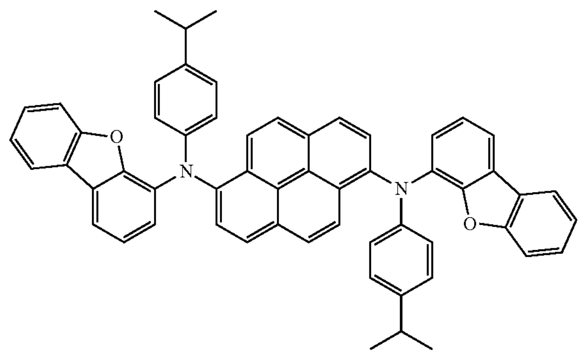
FD26
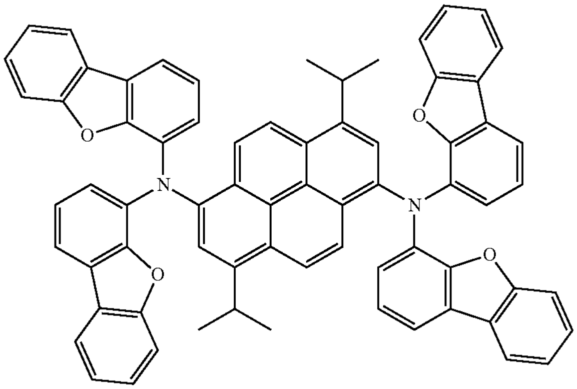
FD27
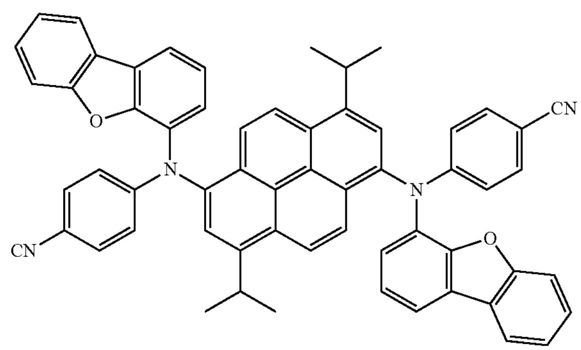
FD28
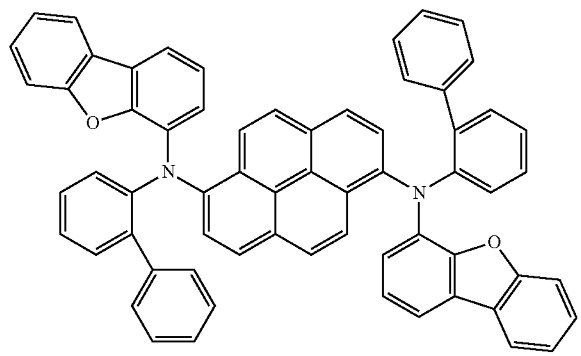

-continued
FD29
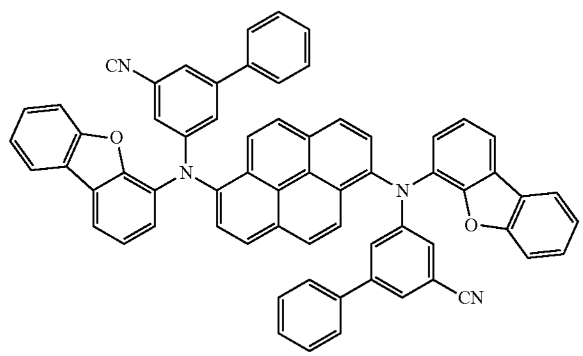
FD30
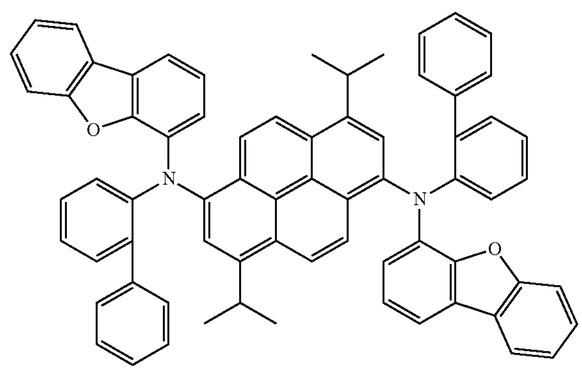
FD31
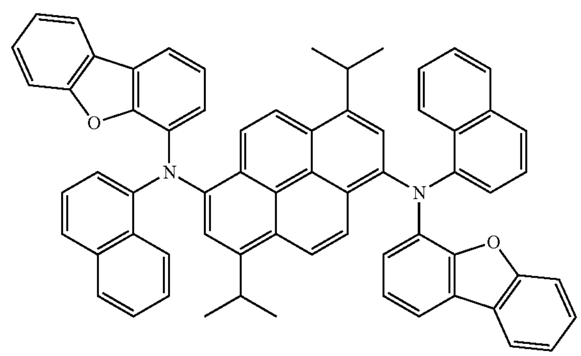
FD32
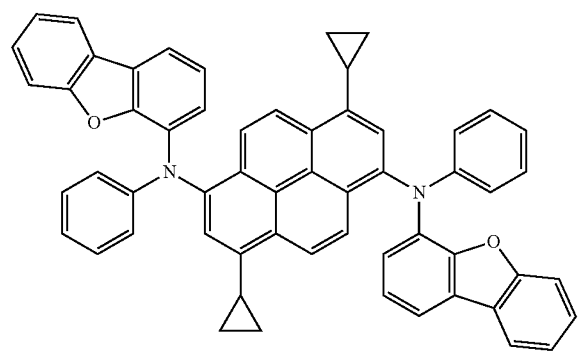
-continued
FD33
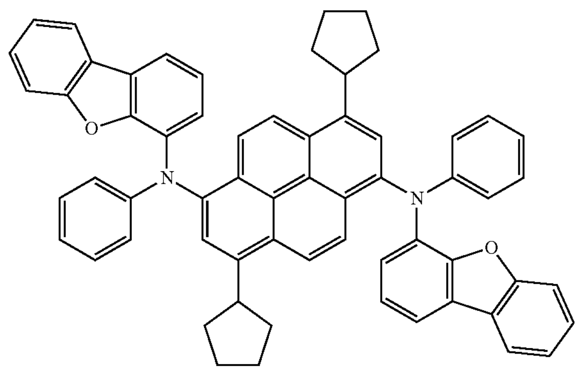
FD34
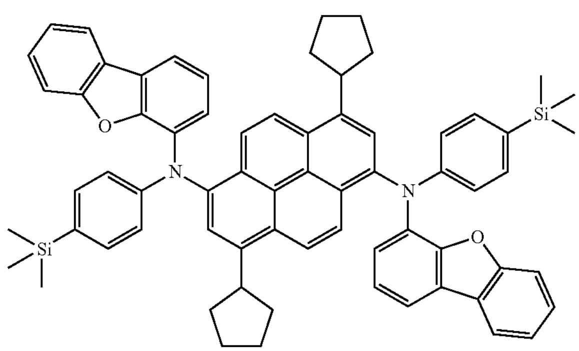
FD35
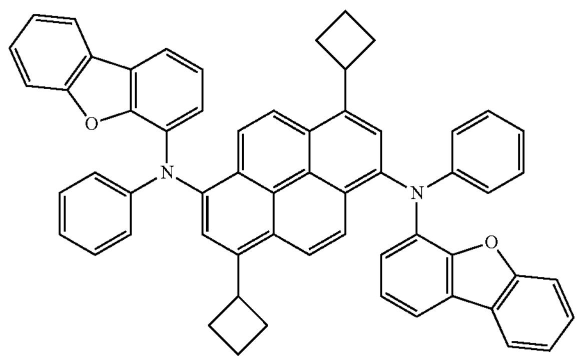
FD36
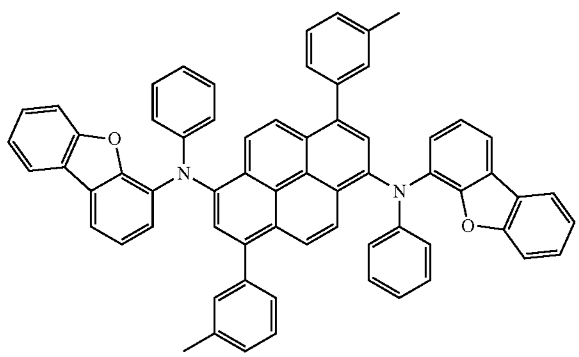

-continued

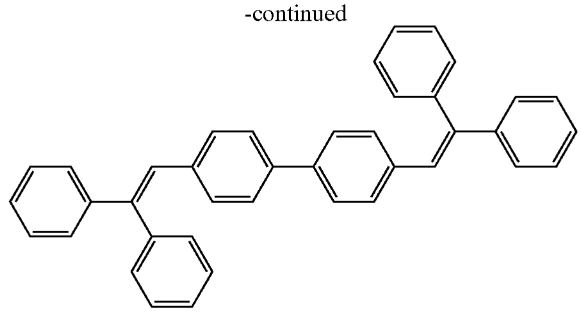

DPVBi

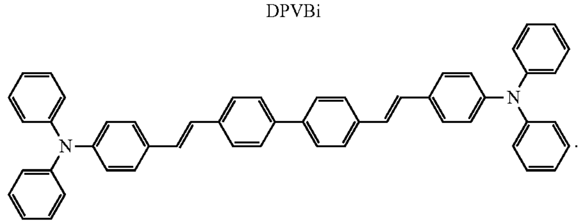

DPAVBi

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the constituting layers of each structure are sequentially stacked from an emission layer.

The electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group that is unsubstituted or substituted with at least one $R_{10a}$.

In an embodiment, when xe11 in Formula 601 is 2 or more, two or more $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

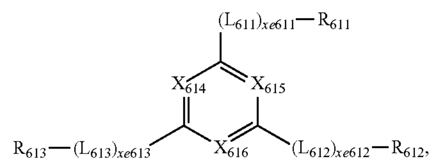

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, TSPO1, TPBI, or any combination thereof:

ET1

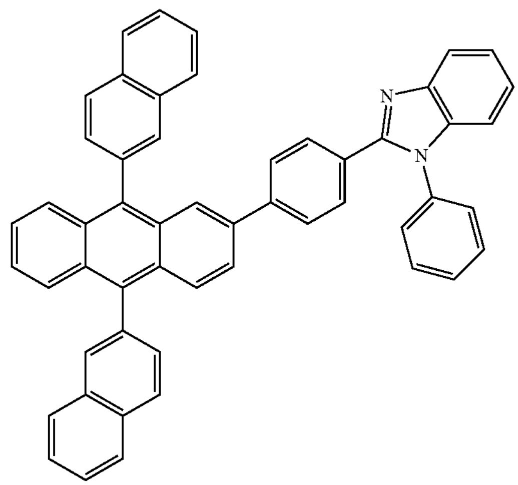

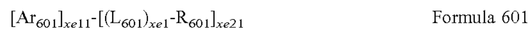

-continued
ET2
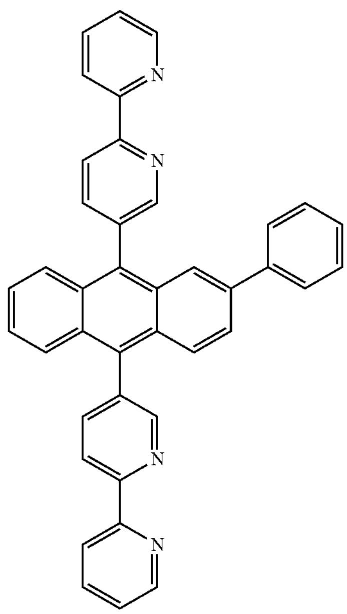
ET3
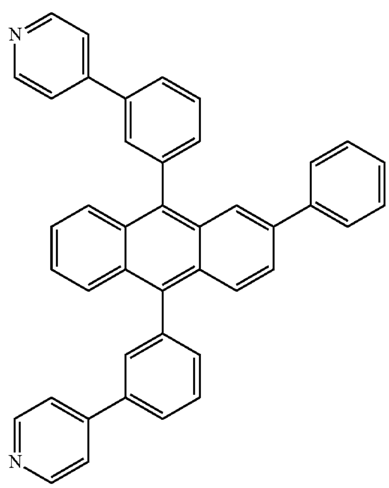
ET4
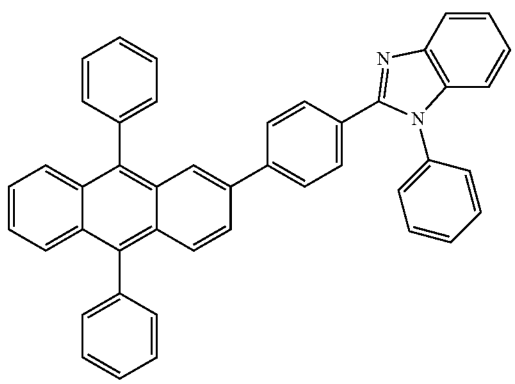
-continued
ET5
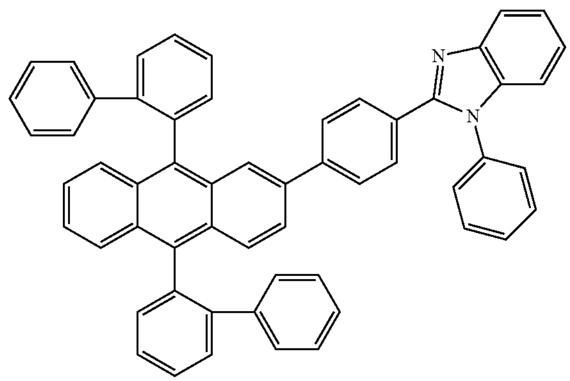
ET6
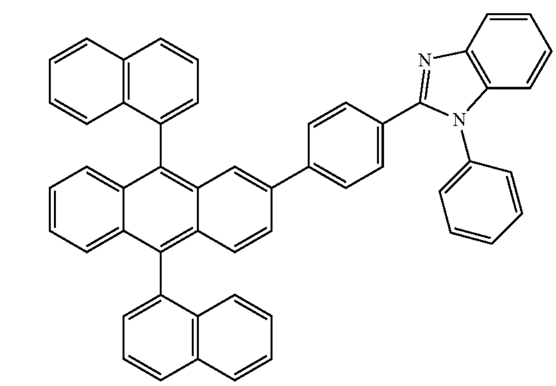
ET7
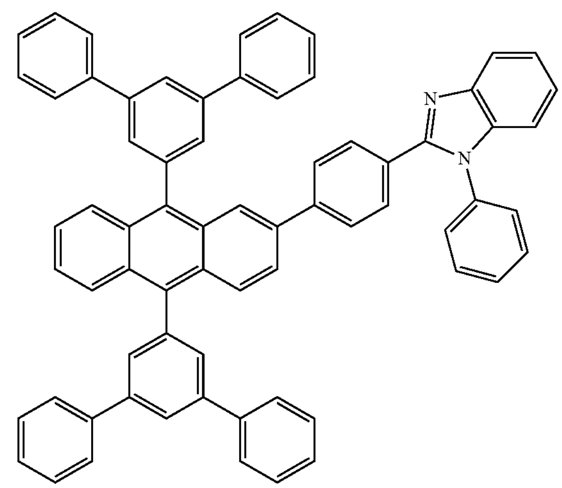

-continued
ET8
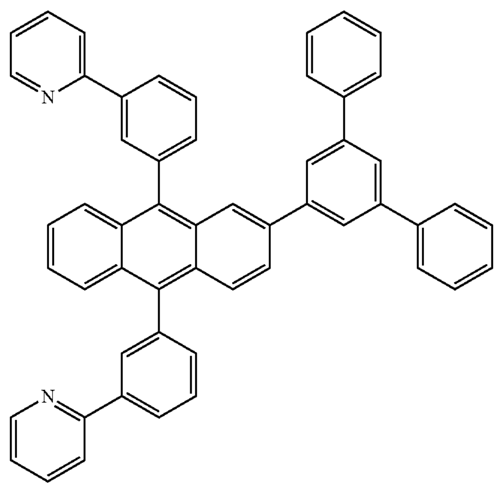
ET9
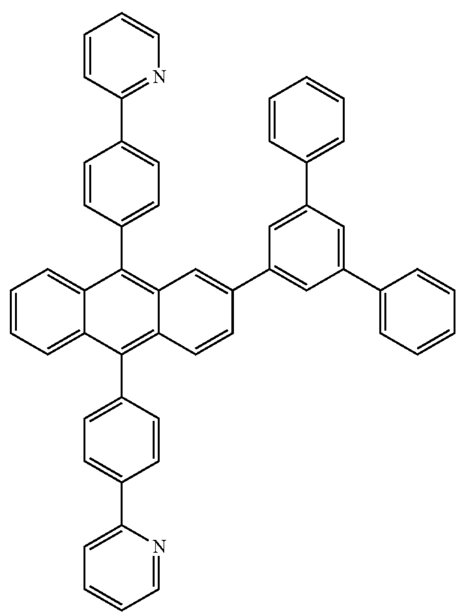
-continued
ET10
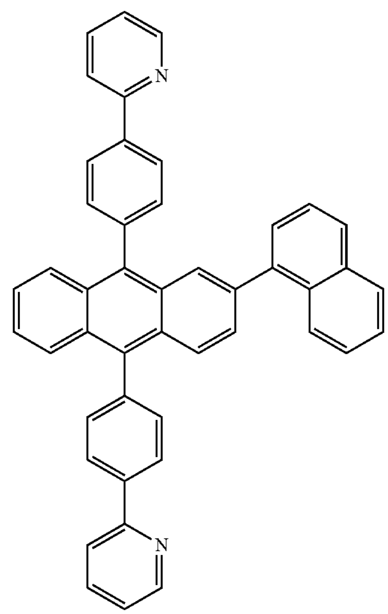
ET11
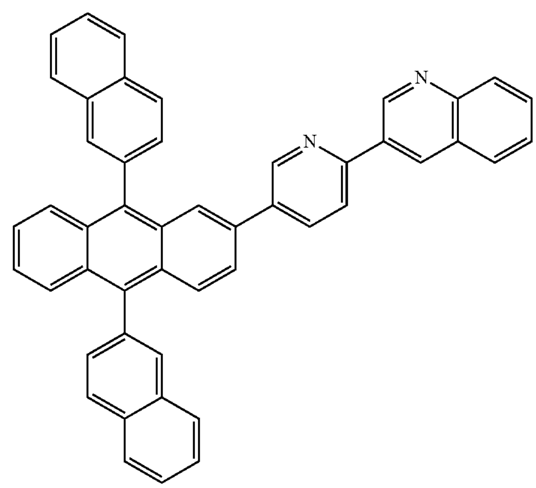
ET12
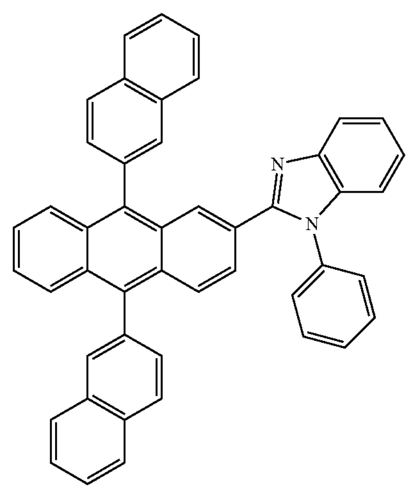

-continued
ET13
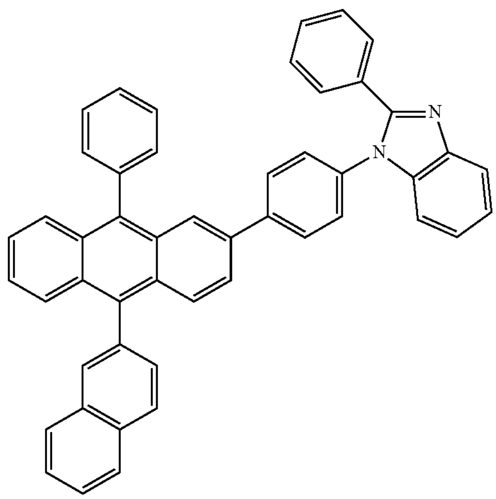
ET14
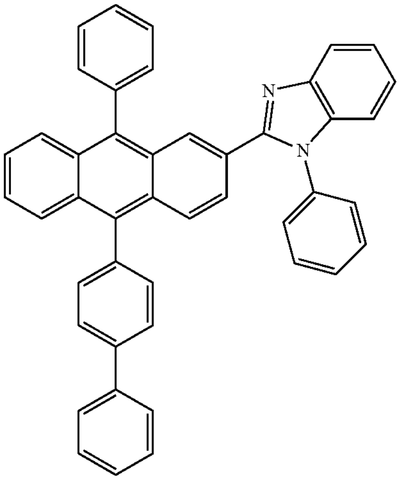
ET15
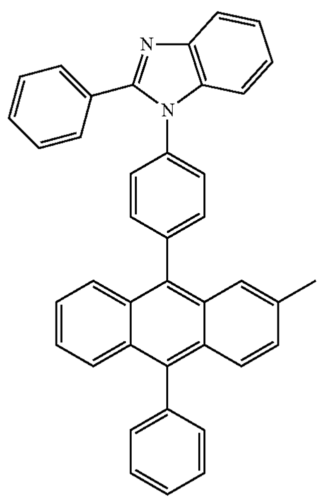
-continued
ET16
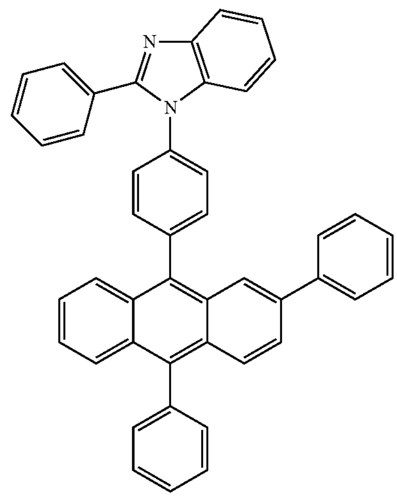
ET17
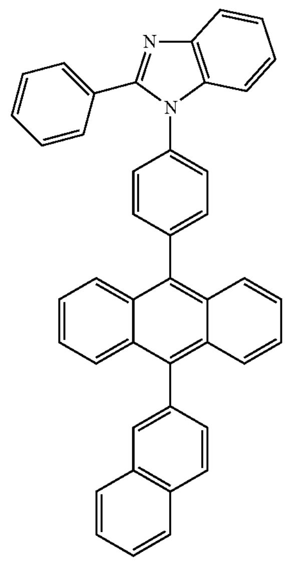
ET18
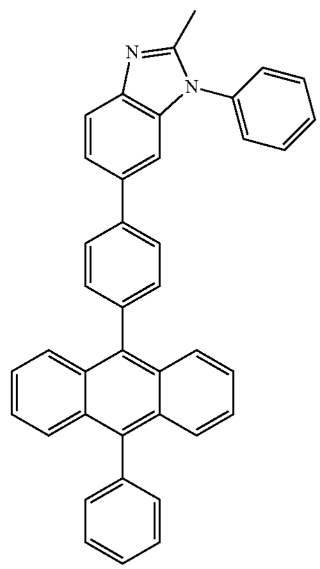

-continued
ET19
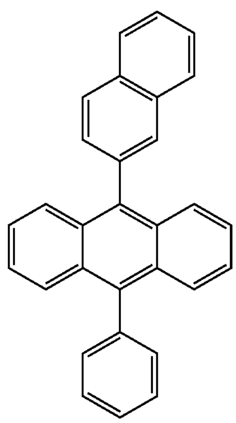
ET20
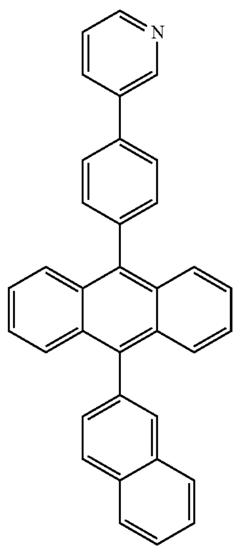
ET21
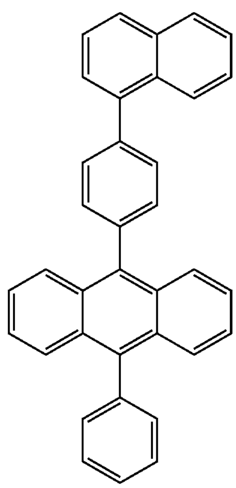
-continued
ET22
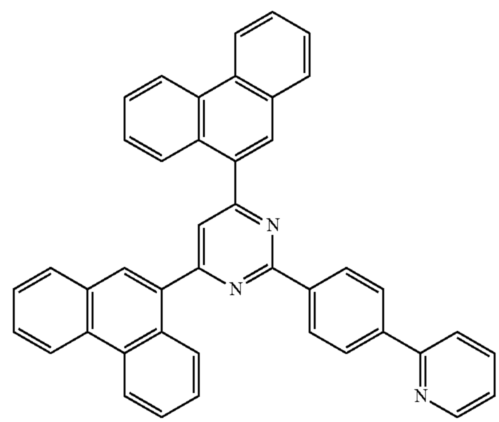
ET23
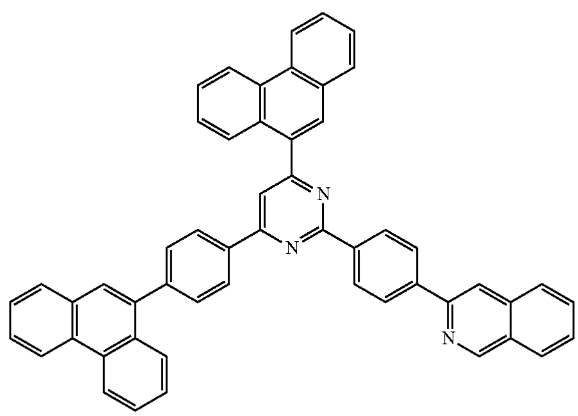
ET24
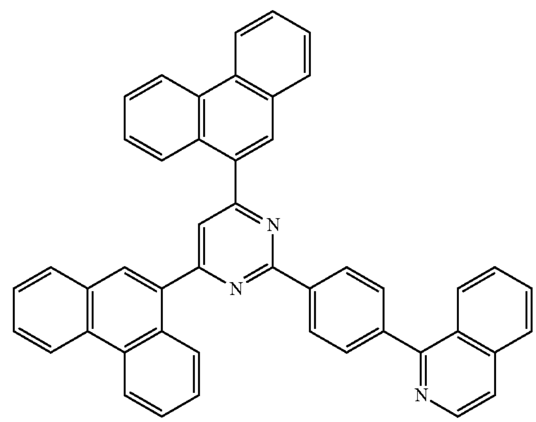

-continued
ET25
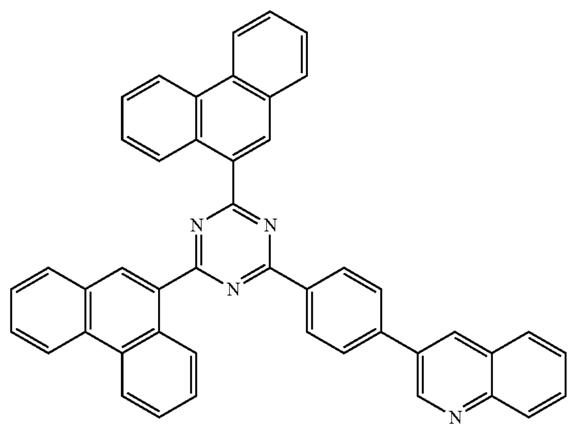
ET26
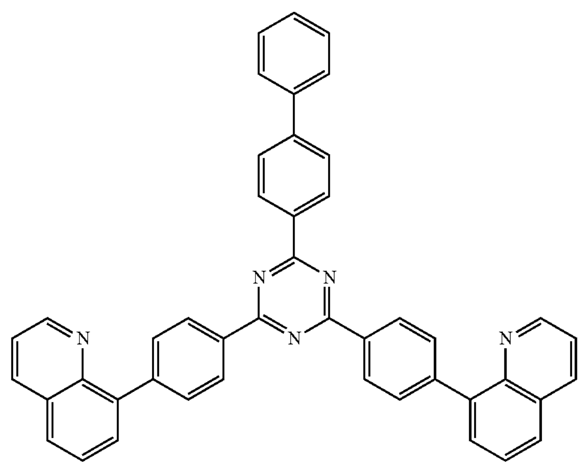
ET27
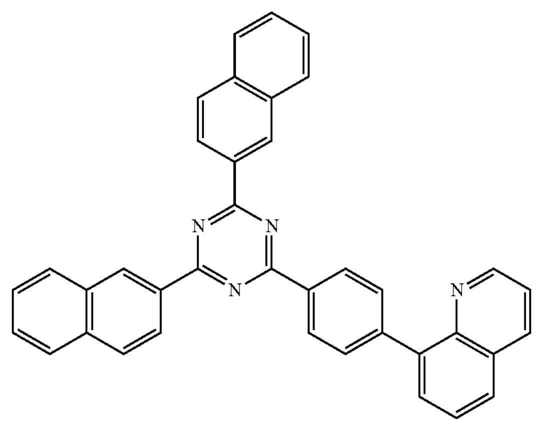
-continued
ET28
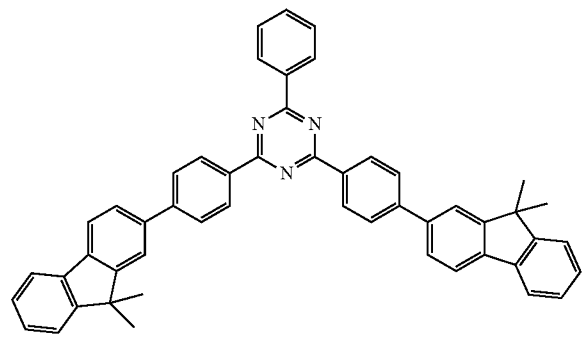
ET29
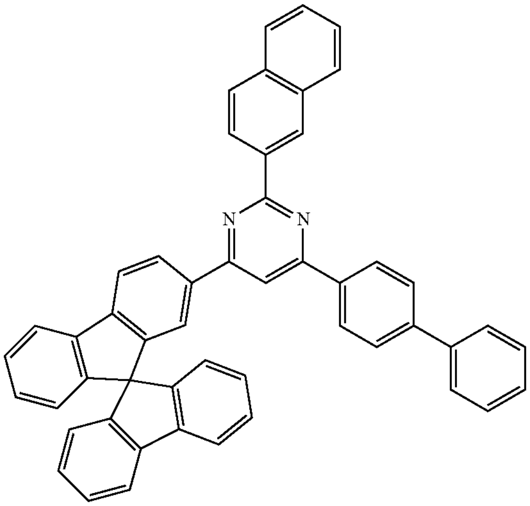
ET30
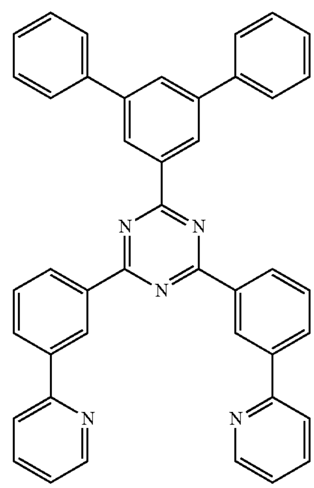

-continued
ET31
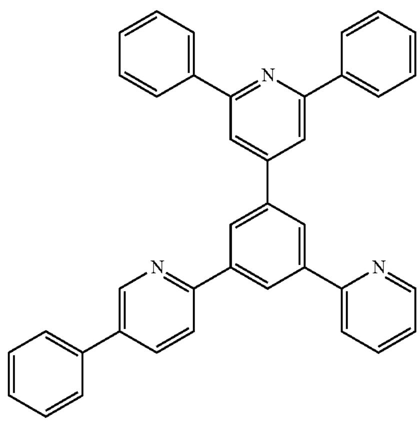
ET32
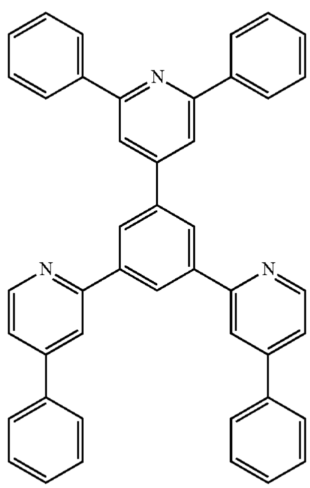
ET33
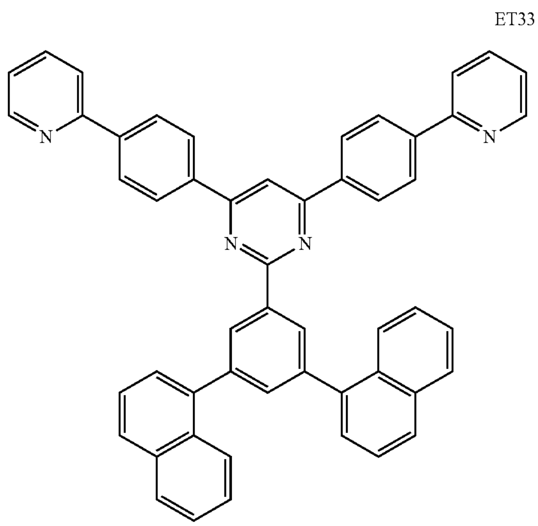
ET34
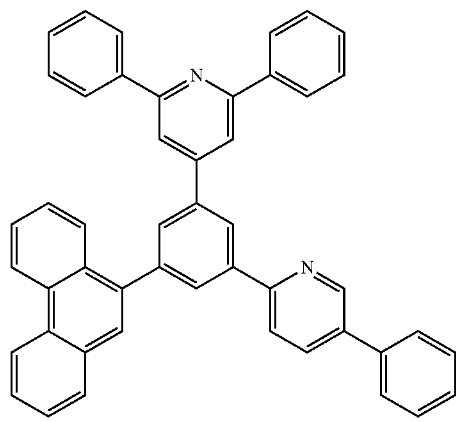
ET35
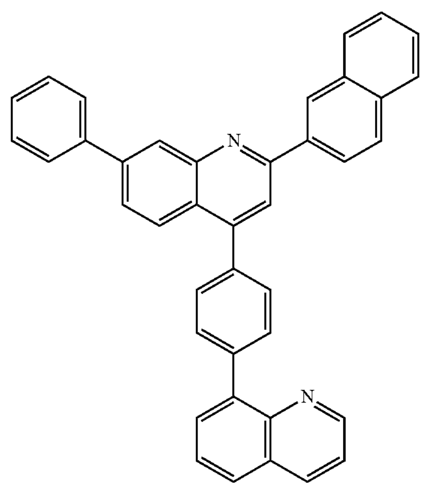
ET36
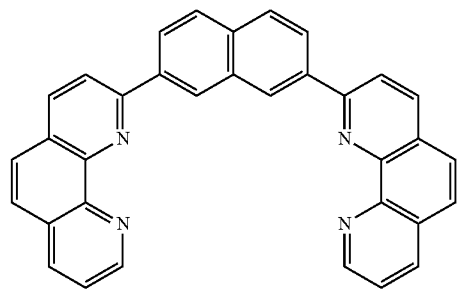
ET37
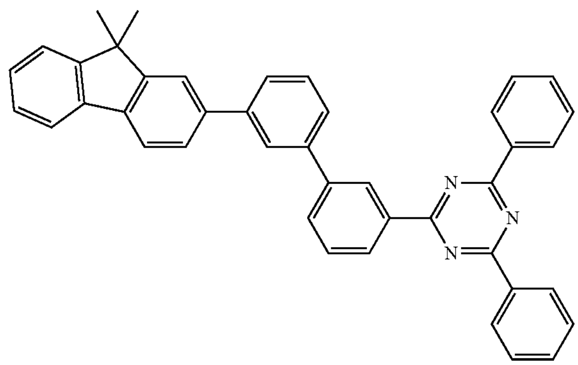

-continued
ET38
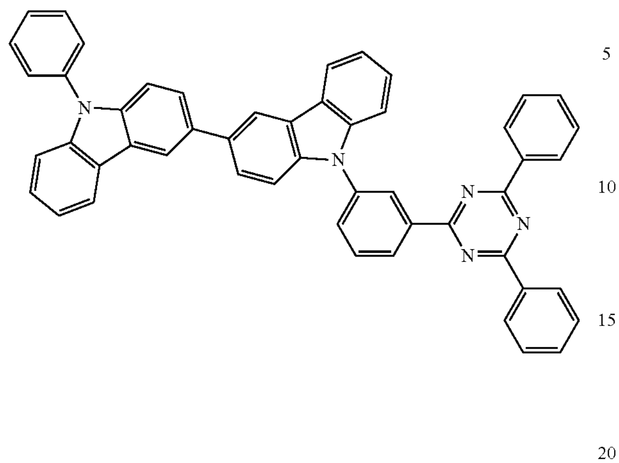
ET39
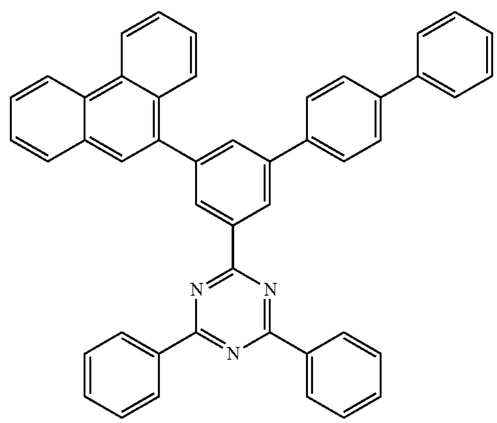
ET40
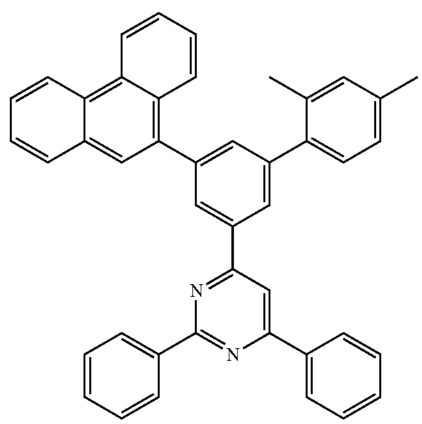
-continued
ET41
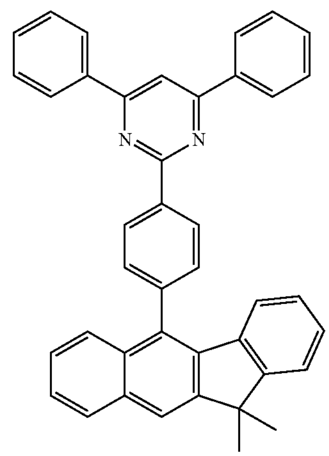
ET42
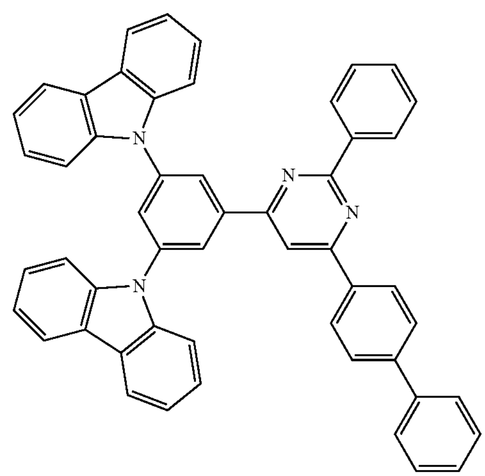
ET43
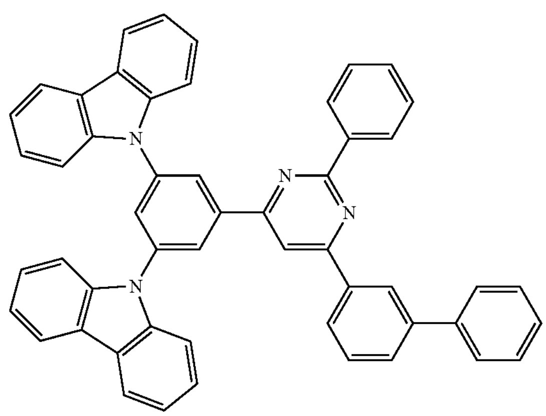

-continued

ET44

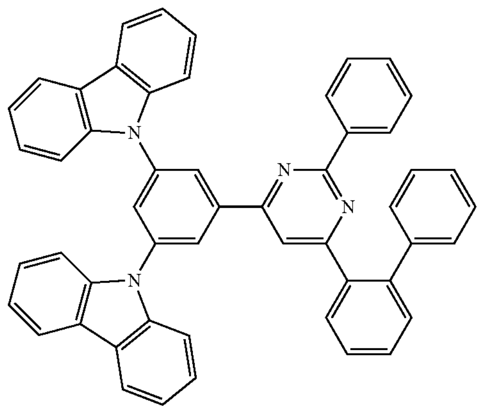

ET45

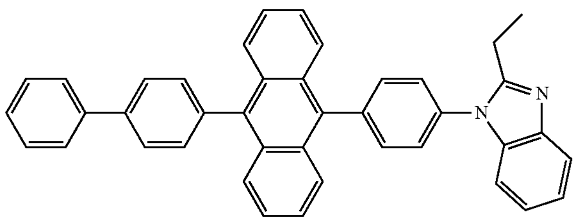

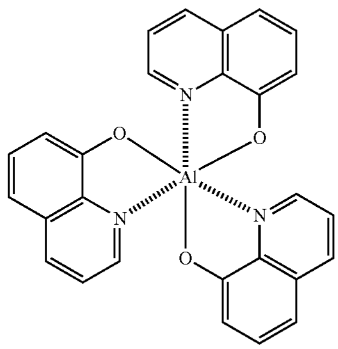

Alq3

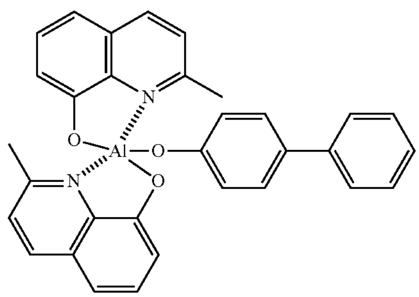

BAlq

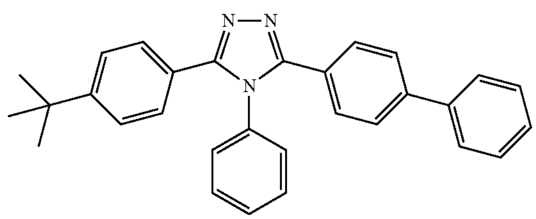

TAZ

-continued

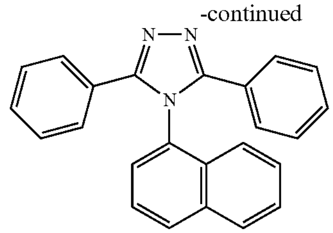

NTAZ

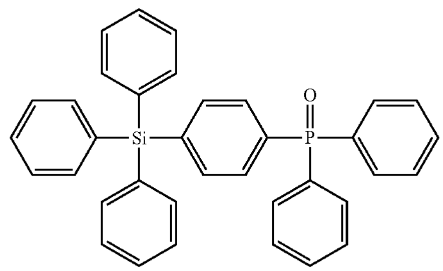

TSPO1

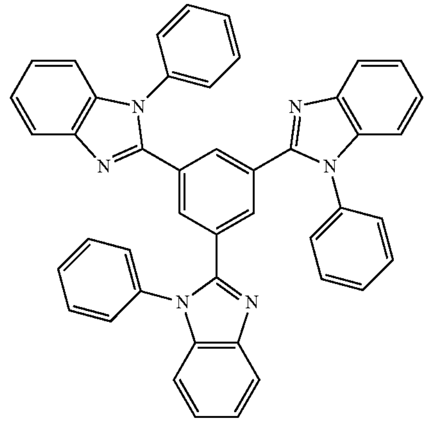

TPBI

A thickness of the electron transport region may be in a range of about 100 Å to about 5,000 Å, for example, about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be about 20 Å to about 1,000 Å, for example, about 30 Å to about 300 Å, and a thickness of the electron transport layer may be about 100 Å to about 1,000 Å, for example, about 150 Å to about 500 Å. When the thicknesses of the buffer layer, the hole blocking layer, the electron control layer, the electron transport layer, and/or the electron transport layer are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion, and a metal ion of the alkaline earth metal complex may be a beryllium (Be) ion, a magnesium (Mg) ion, a calcium (Ca)

ion, a strontium (Sr) ion, or a barium (Ba) ion. A ligand coordinated with the metal ion of the alkali metal complex or the alkaline earth metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example Compound FT-D1 (LiQ) and/or ET-D2:

ET-D1

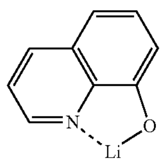

ET-D2

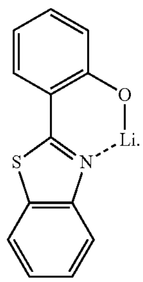

The electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include scandium (Sc), yttrium (Y), cerium (Ce), terbium (Tb), ytterbium (Yb), gadolinium (Gd), or any combination thereof.

The alkali metal-containing compound, the alkaline earth metal-containing compound, and the rare earth metal-containing compound may each independently be an oxide, a halide (for example, a fluoride, a chloride, a bromide, and/or an iodide), and/or a telluride of the alkali metal, the alkaline earth metal, and the rare earth metal, respectively.

The alkali metal-containing compound may include alkali metal oxides (such as $Li_2O$, $Cs_2O$, or $K_2O$), alkali metal halides (such as LiF, NaF, CsF, KF, LiI, NaI, CsI, or KI), or any combination thereof. The alkaline earth metal-containing compound may include an alkaline earth metal oxide, (such as BaO, SrO, CaO, $Ba_xSr_{1-x}O$ where x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may be LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and/or $Lu_2Te_3$.

The alkali metal complex, the alkaline earth-metal complex, and the rare earth metal complex may each independently include i) an ion of the alkali metal, the alkaline earth metal, and the rare earth metal, respectively, and ii), as a ligand bonded to the metal ion, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or combination thereof may be substantially homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer of the interlayer 130 of the light-emitting device 10 may be extracted toward the outside through the first electrode 110 (which may be a semi-transmissive electrode or a transmissive electrode) and the first capping layer, and/or light generated in the emission layer of the interlayer 130 of the light-emitting device 10 may be extracted toward the outside through the second electrode 150 (which is a semi-transmissive electrode or a transmissive electrode) and the second capping layer.

The first capping layer and/or the second capping layer may increase the external emission efficiency of the device according to the principle of constructive interference. Accordingly, the light extraction efficiency of the light-emitting device 10 is increased, so that the luminescence efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing oxygen (O), nitrogen (N), sulfur (S), selenium (Se), silicon (Si), fluorine (F), chlorine (Cl), bromine (Br), iodine (I), or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of compounds CP1 to CP6, β-NPR, or any combination thereof:

CP1

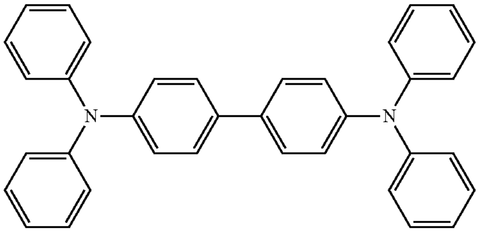

CP2

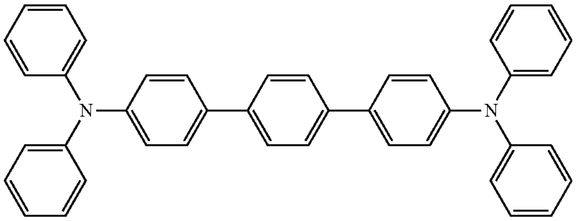

CP3

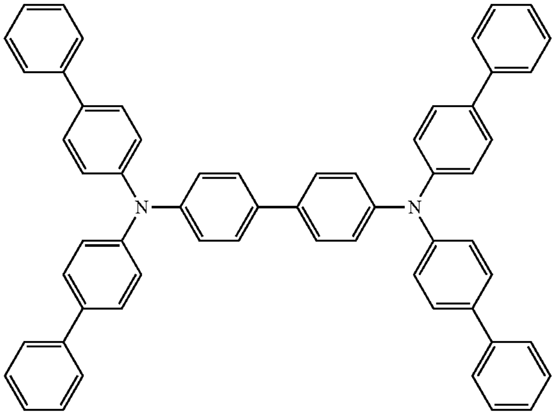

CP4

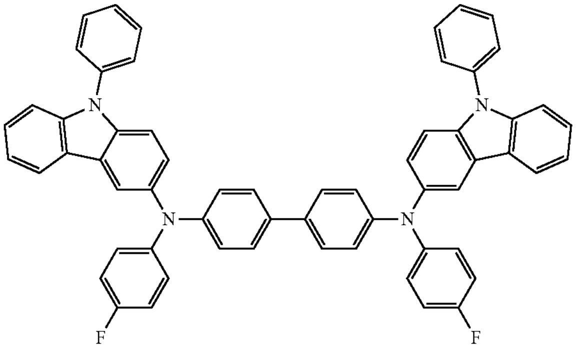

-continued

CP5

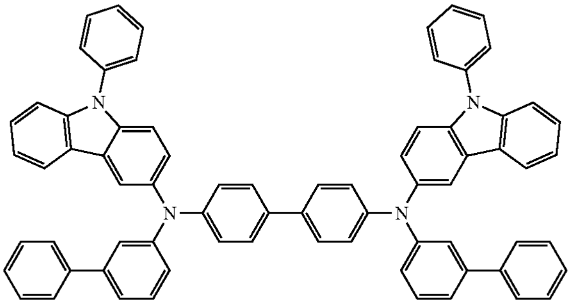

CP6

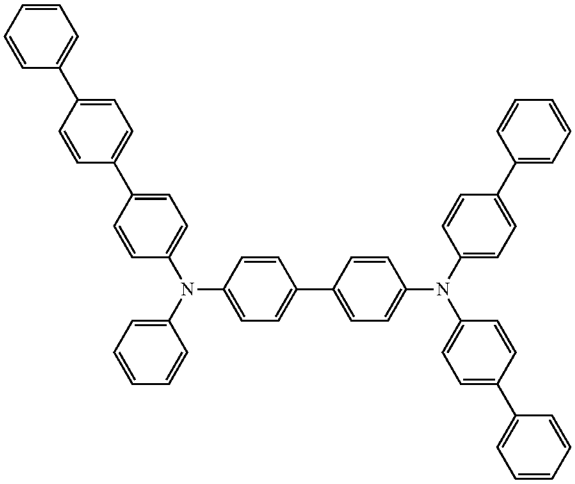

β-NPB

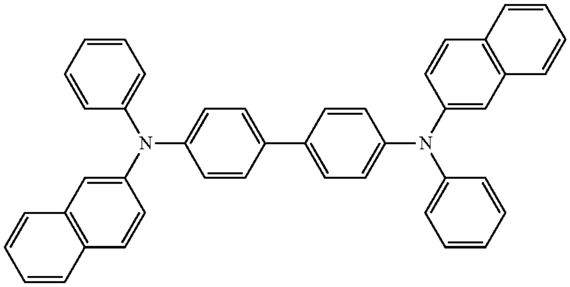

.

Electronic Apparatus

The light-emitting device may be included in one or more suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, the light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may include a plurality of color conversion areas and light-shielding patterns located among the color conversion areas.

The color filter areas (and/or the color conversion areas) may include a first area to emit first-color light, a second area to emit second-color light, and/or a third area to emit third-color light, and the first-color light, the second-color light, and/or the third-color light may have different maximum emission wavelengths from one another. In an embodiment, the first-color light may be red light, the second-color light may be green light, and the third-color light may be blue light. In an embodiment, the color filter areas (and/or the color conversion areas) may include quantum dots. For example, the first area may include a red quantum dot, the second area may include a green quantum dot, and the third area may not include a quantum dot. The quantum dot is the same as described in the present specification. The first area, the second area, and/or the third area may each include a scatterer.

In an embodiment, the light-emitting device may be to emit first light, the first area may be to absorb the first light to emit first first-color light, the second area may be to absorb the first light to emit second first-color light, and the third area may be to absorb the first light to emit third first-color light (for example, to transmit the first light as third first-color light). In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one of the source electrode or the drain electrode may be electrically connected to any one of the first electrode or the second electrode of the light-emitting device.

The thin-film transistor may further include a gate electrode, a gate insulating film, etc.

The activation layer may include crystalline silicon, amorphous silicon, organic semiconductor, oxide semiconductor, and/or the like.

The electronic apparatus may further include a sealing portion for sealing the light-emitting device. The sealing portion and/or the color conversion layer may be placed between the color filter and the light-emitting device. The sealing portion allows light from the light-emitting device to be extracted to the outside, while concurrently (e.g., simultaneously) preventing or reducing ambient air and/or moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the use of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various suitable measuring instruments, meters (for example, meters for a vehicle, an aircraft, and/or a vessel), projectors, and/or the like.

Figure 2:
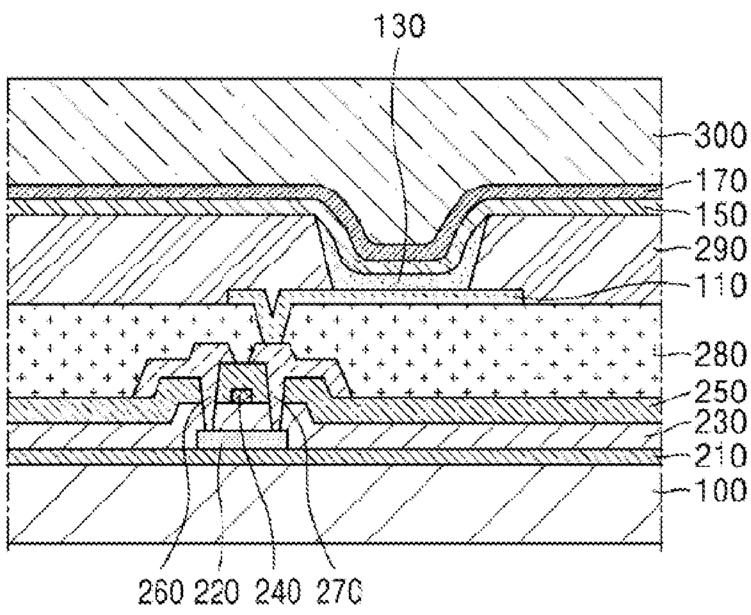
FIG. 2 is a schematic view of an electronic apparatus according to an embodiment.
Figure 3:
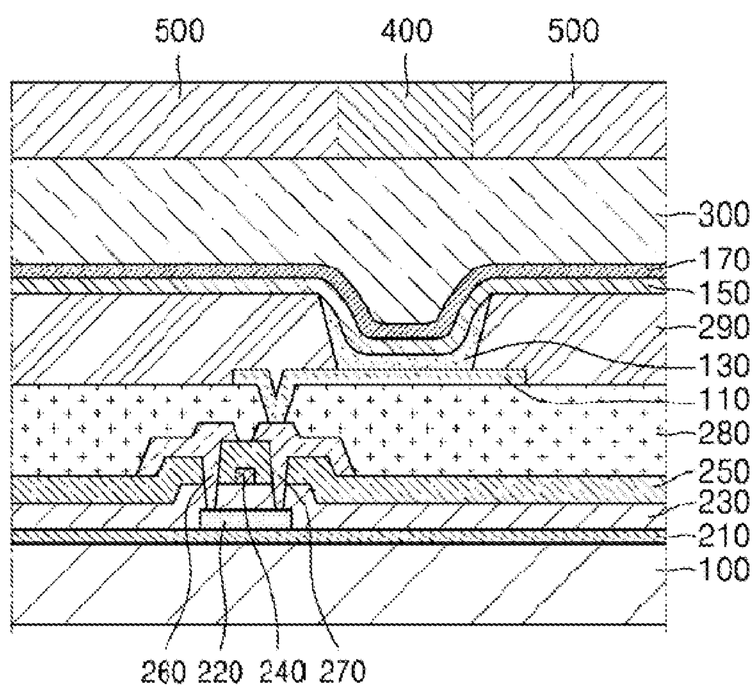
FIG. 3 is a schematic view of an electronic apparatus according to another embodiment.

Description of FIGS. 2 and 3

FIG. 2 is a cross-sectional view of a light-emitting apparatus according to an embodiment of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be formed on the substrate 100. The buffer layer 210 may prevent or reduce penetration of impurities through the substrate 100, and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor (such as silicon or polysilicon), an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel defining layer 290 including an insulating material may be located on the first electrode 110. The pixel defining layer 290 exposes a region of the first electrode 110, and an interlayer 130 may be formed in the exposed region of the first electrode 110. The pixel defining layer 290 may be a polyimide or polyacrylic organic film. In some embodiments, at least some layers of the interlayer 130 may extend beyond the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or any combination of the inorganic film and the organic film.

FIG. 3 is a cross-sectional view of a light-emitting apparatus according to another embodiment of the present disclosure.

The light-emitting apparatus of FIG. 3 is substantially the same as the light-emitting apparatus of FIG. 2, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacture Method

Respective layers included in the hole transport region, the emission layer, and respective layers included in the electron transport region may be formed in a set or predetermined region by utilizing one or more suitable methods selected from vacuum deposition, spin coating, casting, Langmuir-Blodgett (LB) deposition, ink-jet printing, laser-printing, and laser-induced thermal imaging.

When the respective layers included in the hole transport region, the emission layer, and the respective layers included in the electron transport region are formed by vacuum deposition, the deposition may be performed at a deposition temperature of about 100° C. to about 500° C., a vacuum degree of about 10-8 torr to about 10-3 torr, and a deposition speed of about 0.01 Å/sec to about 100 Å/sec, depending on a material to be included in a layer to be formed and the structure of a layer to be formed.

DEFINITION OF TERMS

The term "$C_3$-$C_{60}$ carbocyclic group" as used herein refers to a cyclic group consisting of three to sixty carbon atoms as ring-forming atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group has 3 to 61 ring-forming atoms.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as utilized herein refers to a cyclic group that has three to sixty carbon atoms and does not include *—N=*' as a ring-forming moiety, and the term "π electron-deficient nitrogen-containing $C_1$-$C_{60}$ cyclic group" as utilized herein refers to a heterocyclic group that has one to sixty carbon atoms and includes *—N=*' as a ring-forming moiety.

For example, the $C_3$-$C_{60}$ carbocyclic group may be i) a group T1 (defined below) or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2 (defined below), ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group T1, ii) a condensed cyclic group in which two or more groups T1 are condensed with each other, iii) a group T3 (defined below), iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a group T4 (defined below), ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), where group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo [2.2.1]heptane) group, a norbornene group, a bicyclo[1.1.1] pentane group, a bicyclo[2.1.1]hexane group, a bicyclo [2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group" as used herein may in some embodiments additionally refer to a group condensed to any cyclic group or a polyvalent group (for example, a divalent group, a trivalent group, a tetravalent group, etc.), depending on the structure of a formula in connection with which the terms are used. In one or more embodiments, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_1$ cycloalkyl group, a $C_1$-$C_{10}$ heterocycloalkyl group, a $C_3$-$C_1$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and/or a monovalent non-aromatic condensed heteropolycyclic group, and examples of the divalent $C_3$-$C_{60}$ carbocyclic group and the monovalent $C_1$-$C_{60}$ heterocyclic group may include a $C_3$-$C_1$ cycloalkylene group, a $C_1$-$C_{10}$ heterocycloalkylene group, a $C_3$-$C_1$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and/or a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and/or a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof may include an ethenyl group, a propenyl group, and/or a butenyl group. The term "$C_2$-$C_{60}$ alkenylene group" as utilized herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof may include an ethynyl group and/or a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by -$OA_{101}$ (wherein $A_{101}$ is a $C_1$-$C_{60}$ alkyl group), and examples thereof may include a methoxy group, an ethoxy group, and/or an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo [2.2.1]heptyl group), a bicyclo[1.1.1]pentyl group, a bicyclo [2.1.1]hexyl group, and/or a bicyclo[2.2.2]octyl group. The term "$C_3$-$C_{10}$ cycloalkylene group" as utilized herein refers to a divalent group having substantially the same structure as the $C_3$-$C_1$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and/or a tetrahydrothienyl group. The term "$C_1$-$C_{10}$ heterocycloalkylene group" as utilized herein refers to a divalent group having substantially the same structure as the $C_1$-$C_{10}$ heterocycloalkyl group.

The term $C_3$-$C_{10}$ cycloalkenyl group used herein refers to a monovalent cyclic group that has three to ten carbon atoms, at least one carbon-carbon double bond in the ring thereof, and no aromaticity, and examples thereof may include a cyclopentenyl group, a cyclohexenyl group, and/or a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and/or a 2,3-dihydrothienyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having substantially the same structure as a monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom other than carbon atoms, as a ring-forming atom, and non-aromaticity in its entire molecular structure. Examples of the monovalent non-aromatic condensed heteropolycyclic group may include a pyrrolyl group, a thienyl group, a furanyl group, an indolyl group, a benzoindolyl group, a naphthoindolyl group, an isoindolyl group, a benzoisoindolyl group, a naphthoisoindolyl group, a benzosilolyl group, a benzothienyl group, a benzofuranyl group, a carbazolyl group, a dibenzosilolyl group, a dibenzothienyl group, a dibenzofuranyl group, an azacarbazolyl group, an azafluorenyl group, an azadibenzosilolyl group, an azadibenzothienyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothienyl group, a benzonaphthosilolyl group, a benzofurodibenzofuranyl group, a benzofurodibenzothienyl group, and a benzothienodibenzothienyl group. The term "divalent non-aromatic heterocondensed polycyclic group" as used herein refers to a divalent group having substantially the same structure as a monovalent non-aromatic heterocondensed polycyclic group.

The term "$C_6$-$C_{60}$ aryloxy group" as used herein indicates $-OA_{102}$ (wherein $A_{102}$ is a $C_6$-$C_{60}$ aryl group), and the term "$C_6$-$C_{60}$ arylthio group" as used herein indicates $-SA_{103}$ (wherein $A_{103}$ is a $C_6$-$C_{60}$ aryl group).

The term "$C_7$-$C_{60}$ aryl alkyl group" used herein refers to $-A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroaryl alkyl group" used herein refers to $-A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$.

$Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include O, S, N, P, Si, B, Ge, Se, and any combination thereof.

The term "the third-row transition metal" used herein includes hafnium (Hf), tantalum (Ta), tungsten (W), rhenium (Re), osmium (Os), iridium (Ir), platinum (Pt), gold (Au), etc.

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, a compound according to embodiments and a light-emitting device according to embodiments will be described in more detail with reference to Synthesis Examples and Examples. The wording "B was utilized instead of A" utilized in describing Synthesis Examples refers to that an identical molar equivalent of B was utilized in place of A.

EXAMPLES

Synthesis Example 1 (Compound 21)

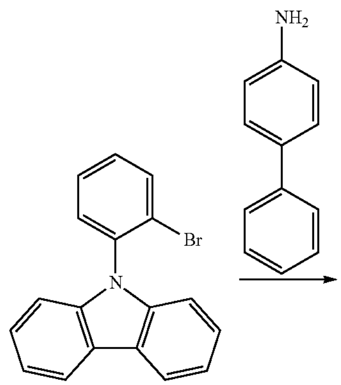

-continued

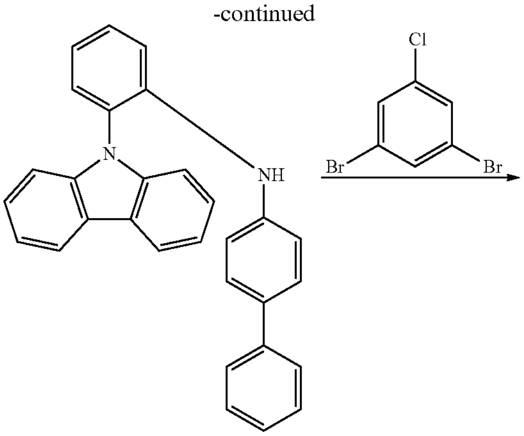

21-1

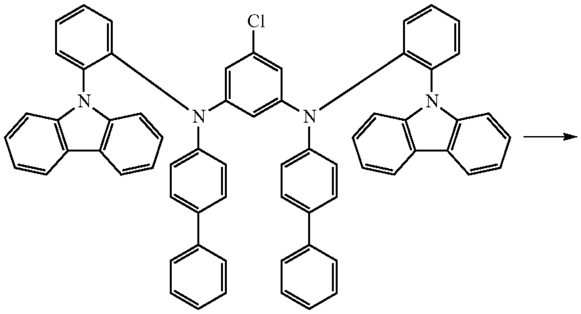

21-2

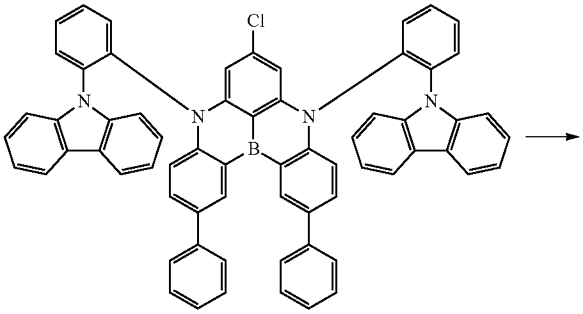

21-3

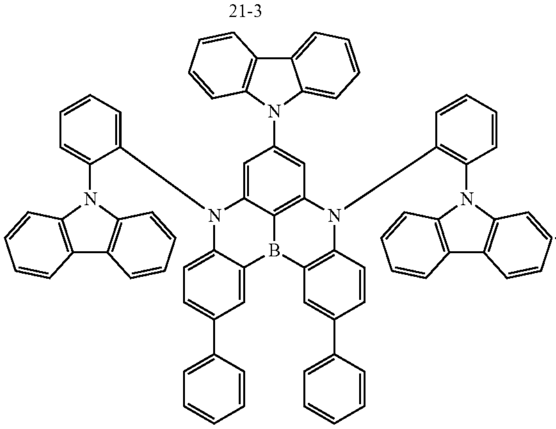

21

Synthesis of Intermediate 21-1

9-(2-bromophenyl)-9H-carbazole (1 eq), [1,1'-biphenyl]-4-amine (1.2 eq), tris(dibenzylideneacetone)dipalladium (0) (0.05 eq), tri-tert-butylphosphine (0.1 eq), and sodium tert-butoxide (3 eq) were mixed with toluene, and then stirred at a temperature of 90° C. for 3 hours. The resulting product was cooled to room temperature and washed three times with ethyl acetate and water, and the organic layer obtained therefrom was dried utilizing $MgSO_4$ and dried under reduced pressure, and then purified by column chromatography utilizing methylene chloride (MC) and n-Hexane to synthesize Intermediate 21-1. (Yield: 73%)

Synthesis of Intermediate 21-2

1,3-dibromo-5-chlorobenzene (1 eq), Intermediate 21-1 (2 eq), tris(dibenzylideneacetone) dipalladium (0) (0.05 eq), BINAP (2,2'-bis(diphenylphosphino)-1,1'-binaphthyl) (0.1 eq), and sodium tert-butoxide (3 eq) were mixed with toluene, and then stirred at a temperature of 90° C. for 6 hours. The resulting product was cooled to room temperature and washed three times with ethyl acetate and water, and the organic layer obtained therefrom was dried utilizing $MgSO_4$ and dried under reduced pressure, and then purified by column chromatography utilizing MC and n-Hexane to synthesize Intermediate 21-2. (Yield: 66%)

Synthesis of Intermediate 21-3

In a nitrogen atmosphere, Intermediate 21-2 (1 eq) and boron triiodide (2 eq) were mixed and injected with ortho-dichlorobenzene, and then heated to a temperature of 150° C. and stirred for 24 hours. The resulting product was cooled to room temperature, triethylamine was slowly added dropwise thereto to terminate the reaction, and then, the product precipitated by adding ethyl alcohol was filtered. The resulting solid was purified by column chromatography utilizing MC and n-Hexane, and then recrystallized utilizing toluene and acetone to synthesize Intermediate 21-3. (Yield: 39%)

Synthesis of Compound 21

Intermediate 21-3 (1 eq), carbazole (2 eq), tris(dibenzylideneacetone)dipalladium (0) (0.05 eq), tri-tert-butylphosphine (0.1 eq), and sodium tert-butoxide (3 eq) were mixed with toluene, and then stirred at a temperature of 100° C. for 12 hours. The resulting product was cooled to room temperature and washed three times with ethyl acetate and water, and the organic layer obtained therefrom was dried utilizing $MgSO_4$ and dried under reduced pressure, and then purified by column chromatography utilizing MC and n-Hexane to synthesize Compound 21. (Yield: 45%)

Synthesis Example 2 (Compound 38)

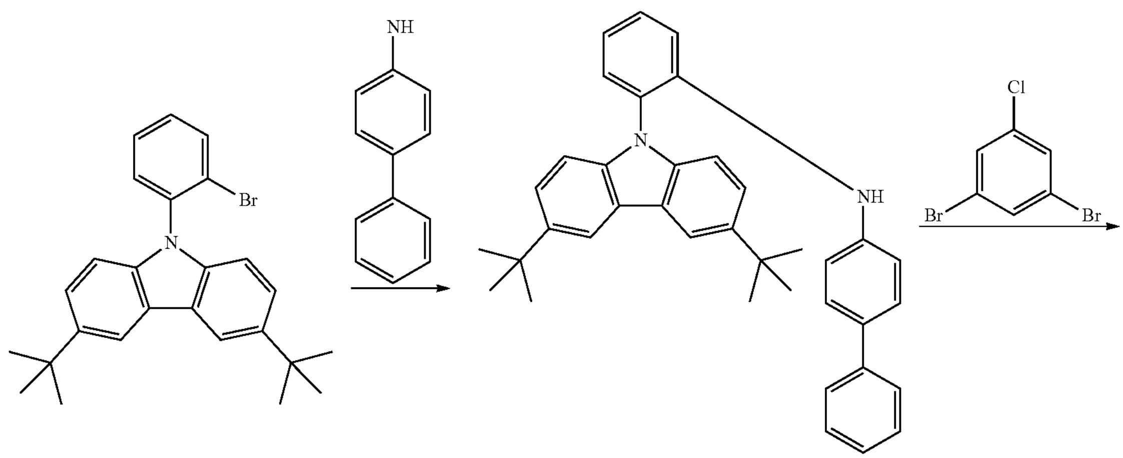

38-1

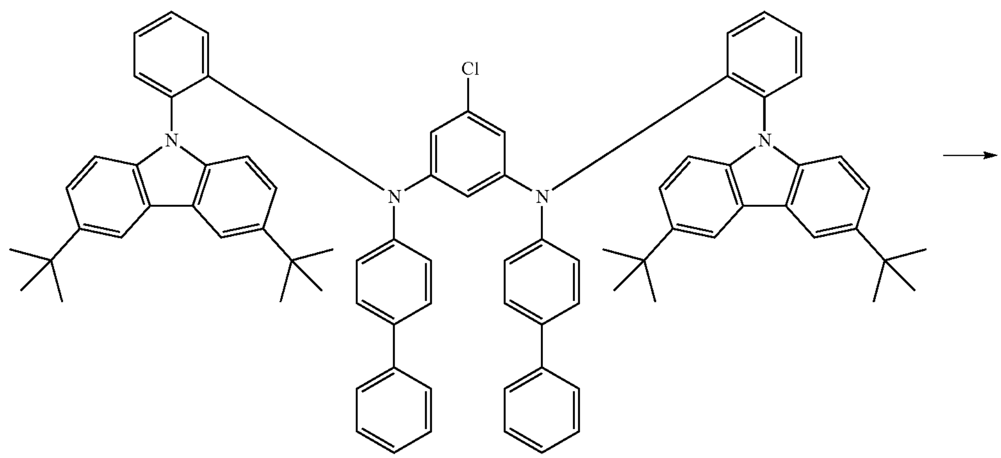

38-2

-continued

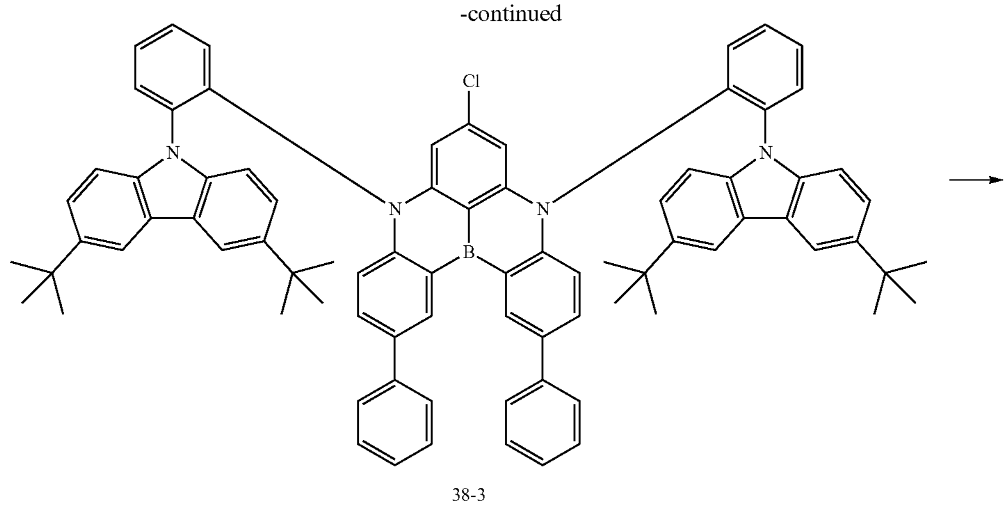

38-3

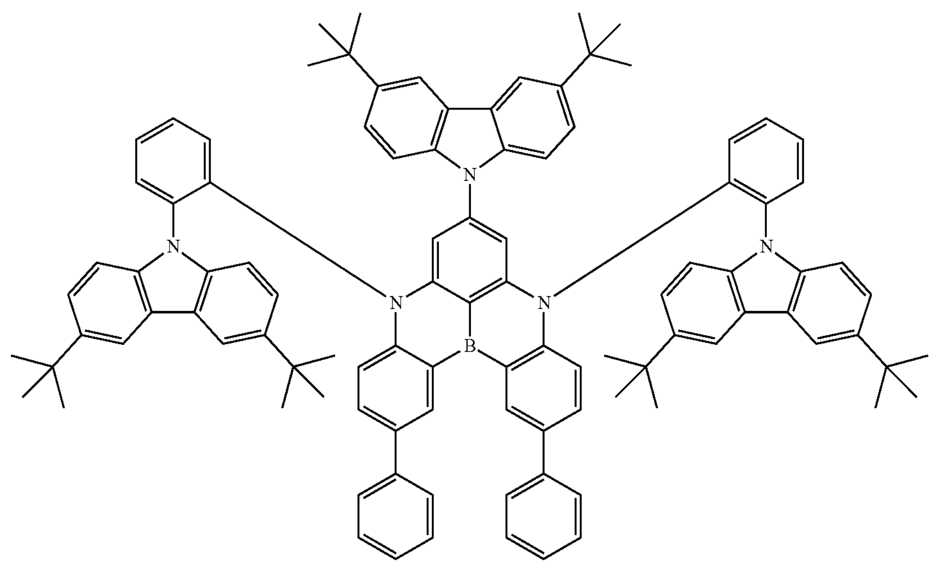

38

Synthesis of Intermediate 38-1

Intermediate 38-1 was synthesized in substantially the same manner as utilized to synthesize Intermediate 21-1 of Synthesis Example 1, except that 9-(2-bromophenyl)-3,6-di-tert-butyl-9H-carbazole was utilized instead of 9-(2-bromophenyl)-9H-carbazole. (Yield: 70%)

Synthesis of Intermediate 38-2

Intermediate 38-2 was synthesized in substantially the same manner as utilized to synthesize Intermediate 21-2 of Synthesis Example of 1, except that Intermediate 38-1 was utilized instead of Intermediate 21-1. (Yield: 61%) Intermediate 38-3

Intermediate 38-3 was synthesized in substantially the same manner as utilized to synthesize Intermediate 21-3 of Synthesis Example of 1, except that Intermediate 38-2 was utilized instead of Intermediate 21-2. (Yield: 35%)

Synthesis of Compound 38

Compound 38 was synthesized in substantially the same manner as utilized to synthesize Compound 21 of Synthesis Example of 1, except that Intermediate 38-3 was utilized instead of Intermediate 21-3. (Yield: 58%)

Synthesis Example 3 (Compound 59)
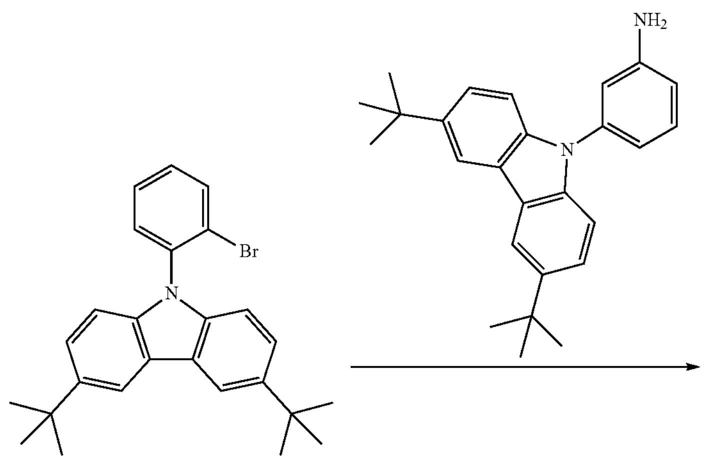
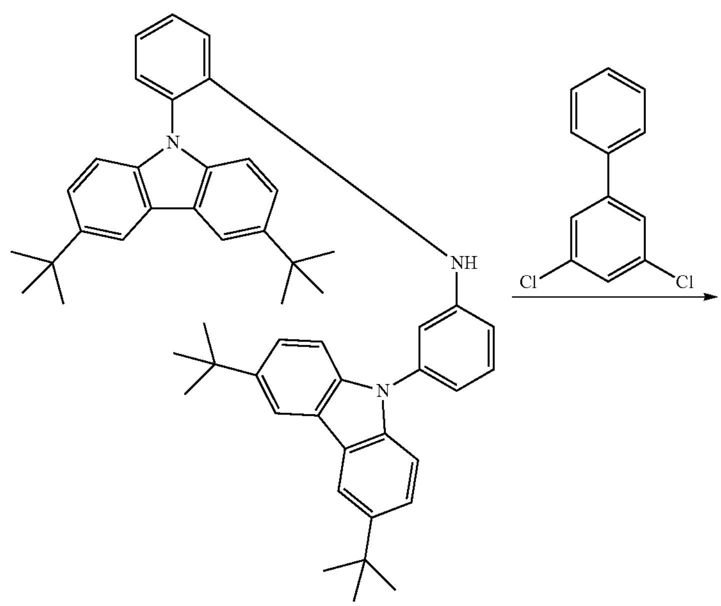
59-1

-continued

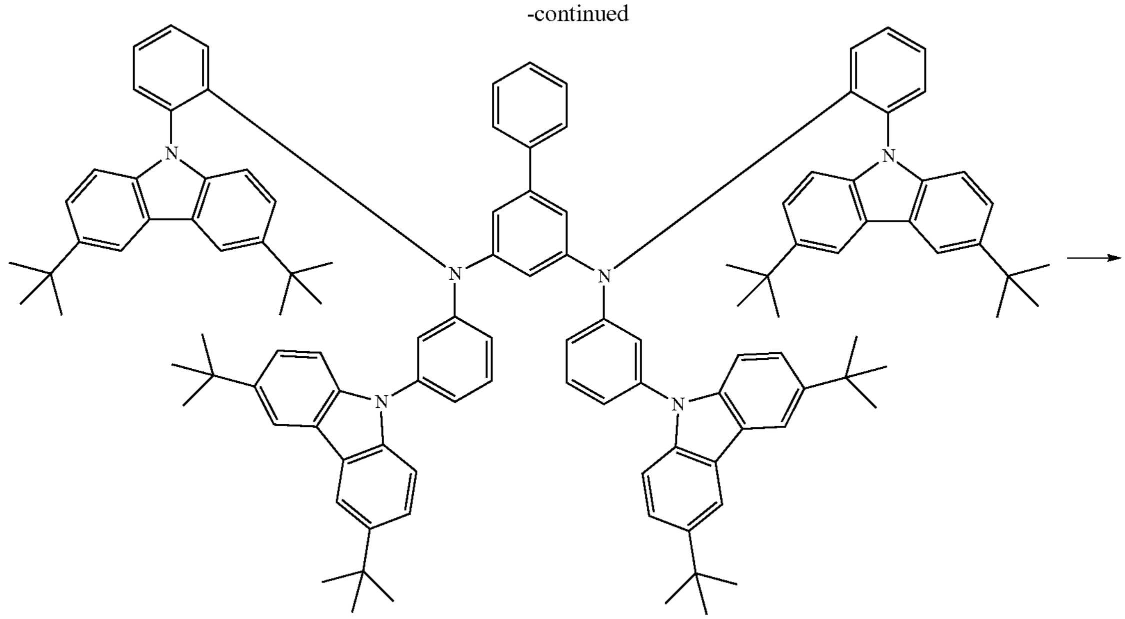

59-2

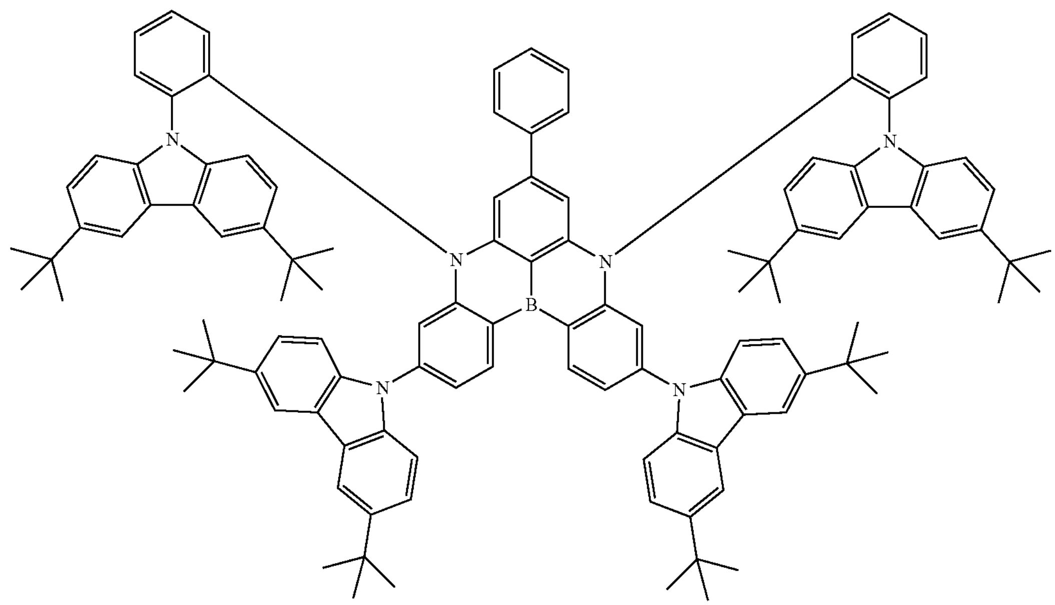

59

Synthesis of Intermediate 59-1

Intermediate 59-1 was synthesized in substantially the same manner as utilized to synthesize Intermediate 21-1 of Synthesis Example 1, except that 9-(2-bromophenyl)-3,6-di-tert-butyl-9H-carbazole and 3-(3,6-di-tert-butyl-9H-carbazol-9-yl)aniline were utilized instead of 9-(2-bromophenyl)-9H-carbazole and [1,1'-biphenyl]-4-amine, respectively. (Yield: 65%)

Synthesis of Intermediate 59-2

Intermediate 59-2 was synthesized in substantially the same manner as utilized to synthesize Intermediate 21-2 of Synthesis Example 1, except that Intermediate 59-1 and 3,5-dichloro-1,1'-biphenyl were utilized instead of Intermediate 21-1 and 1,3-dibromo-5-chlorobenzene, respectively. (Yield: 52%)

Synthesis of Compound 59

Compound 59 was synthesized in substantially the same manner as utilized to synthesize Intermediate 21-3 of Synthesis Example of 1, except that Intermediate 59-2 was utilized instead of Intermediate 21-2. (Yield: 23%)

Synthesis Example 4 (Compound 64)
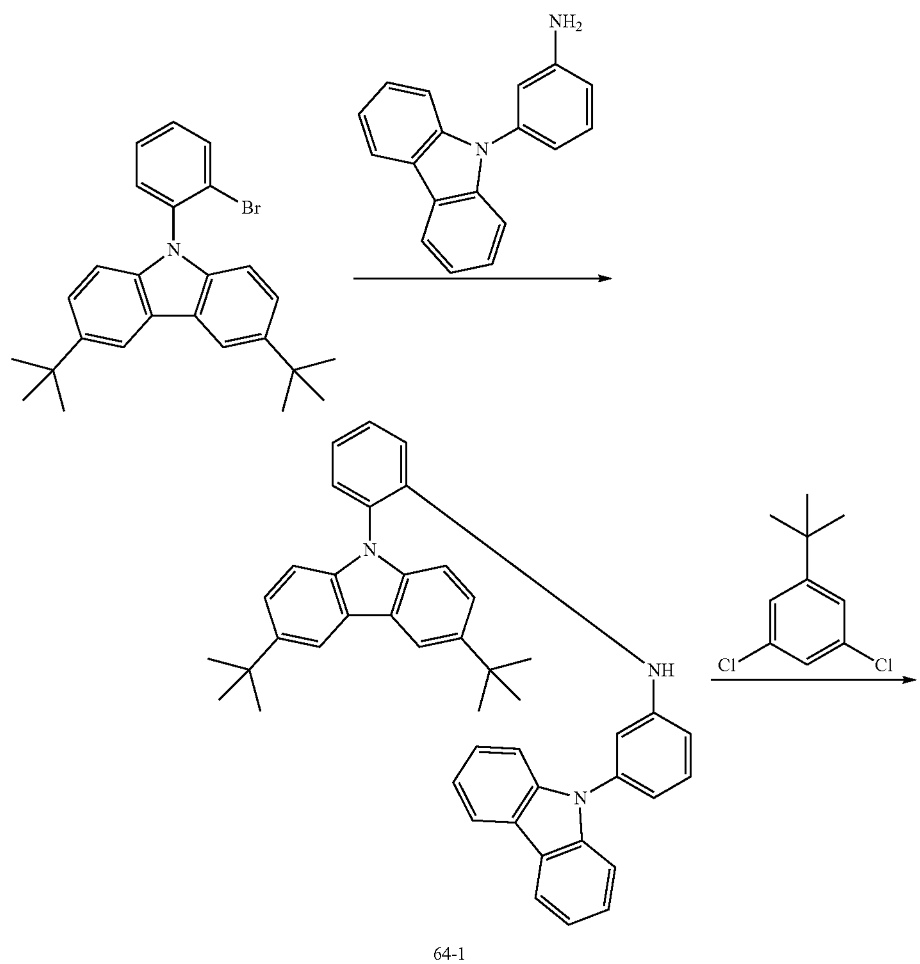
64-1
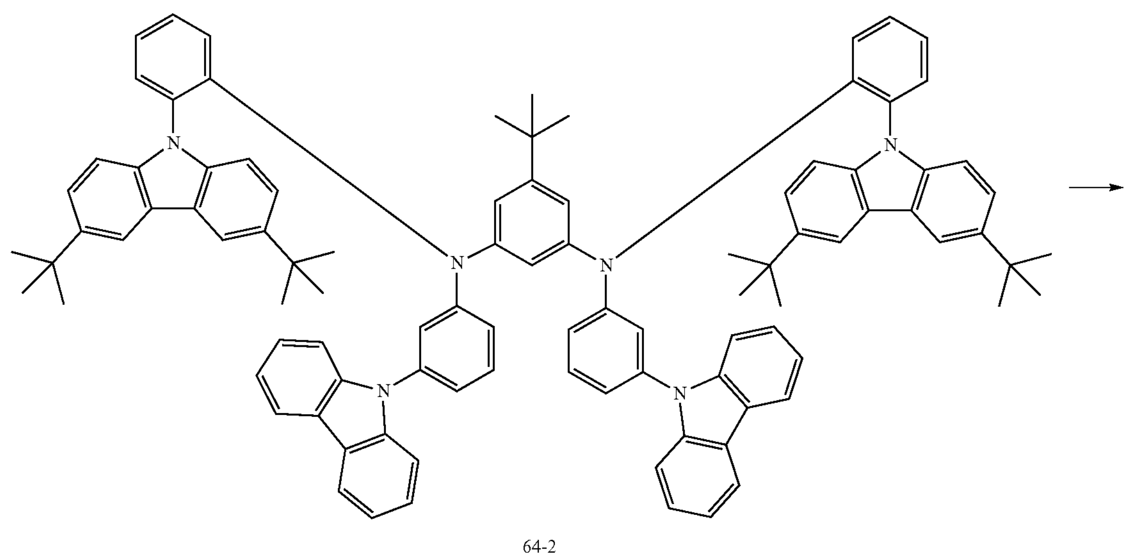
64-2

-continued

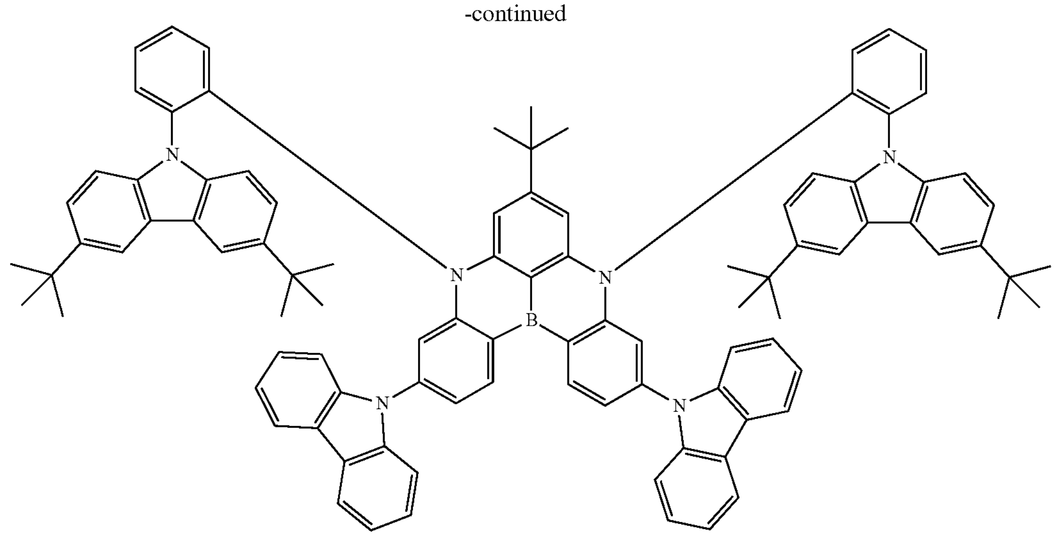

64

Synthesis of Intermediate 64-1

Intermediate 64-1 was synthesized in substantially the same manner as utilized to synthesize Intermediate 21-1 of Synthesis Example 1, except that 9-(2-bromophenyl)-3,6-di-tert-butyl-9H-carbazole and 3-(9H-carbazol-9-yl)aniline were utilized instead of 9-(2-bromophenyl)-9H-carbazole and [1,1'-biphenyl]-4-amine, respectively. (Yield: 58%)

Synthesis of Intermediate 64-2

Intermediate 64-2 was synthesized in substantially the same manner as utilized to synthesize Intermediate 21-2 of Synthesis Example 1, except that Intermediate 64-1 and 1-(tert-butyl)-3,5-dichlorobenzene were utilized instead of Intermediate 21-1 and 1,3-dibromo-5-chlorobenzene, respectively. (Yield: 72%)

Synthesis of Compound 64

Compound 64 was synthesized in substantially the same manner as utilized to synthesize Intermediate 21-3 of Synthesis Example of 1, except that Intermediate 64-2 was utilized instead of Intermediate 21-2. (Yield: 34%) Synthesis Example 5 (Compound 65)

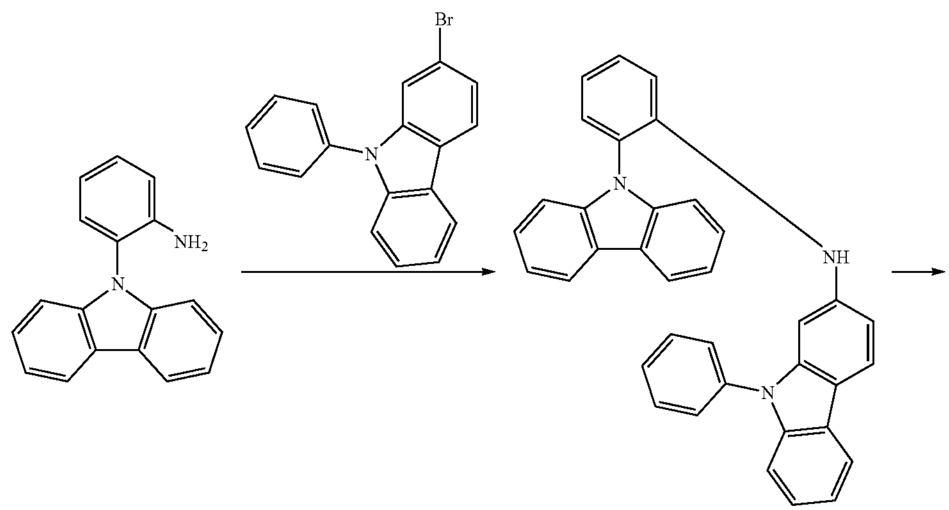

65-1

-continued
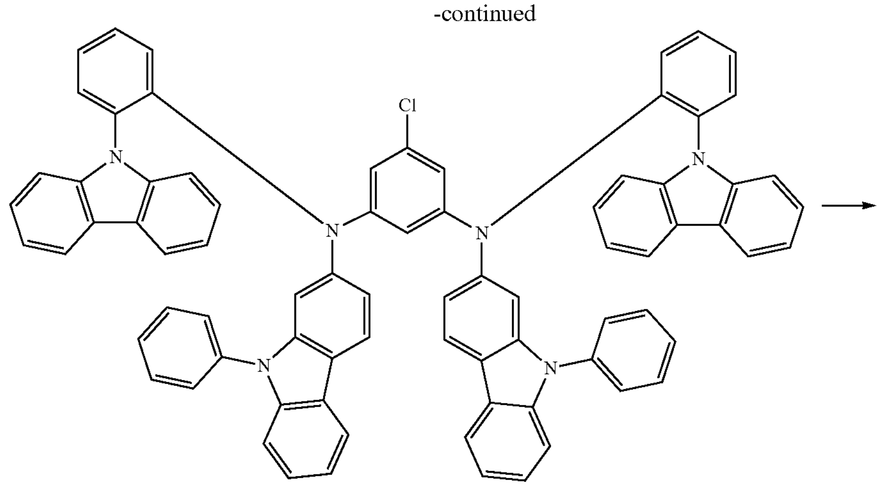
65-2
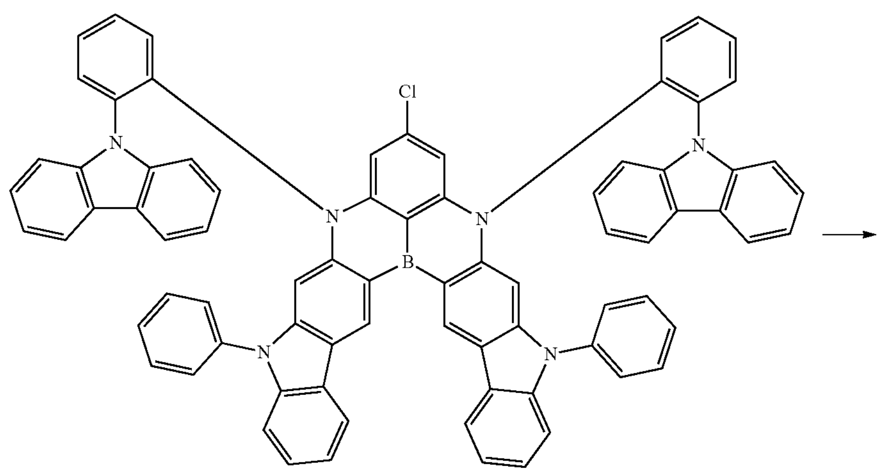
65-3
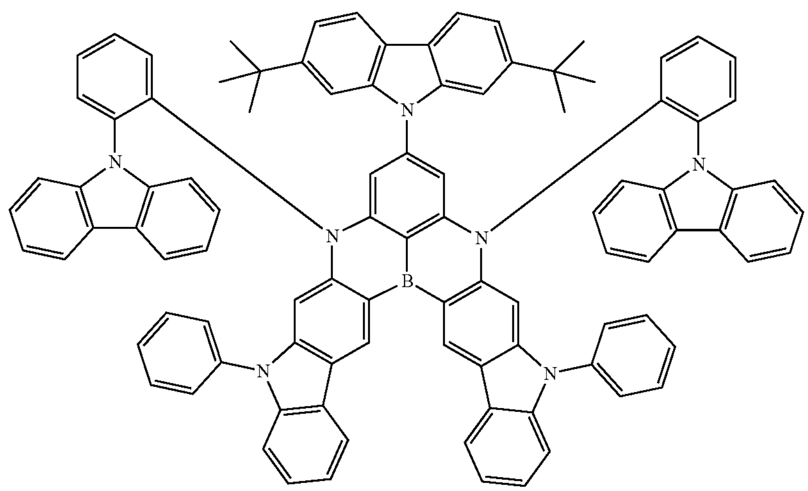
65

Synthesis of Intermediate 65-1

Intermediate 65-1 was synthesized in substantially the same manner as utilized to synthesize Intermediate 21-1 of Synthesis Example 1, except that 2-(9H-carbazol-9-yl)aniline and 2-bromo-9-phenyl-9H-carbazole were utilized instead of 9-(2-bromophenyl)-9H-carbazole and [1,1'-biphenyl]-4-amine, respectively. (Yield: 75%)

Synthesis of Intermediate 65-2

Intermediate 65-2 was synthesized in substantially the same manner as utilized to synthesize Intermediate 21-2 of Synthesis Example of 1, except that Intermediate 65-1 was utilized instead of Intermediate 21-1. (Yield: 57%)

Intermediate 65-3

Intermediate 65-3 was synthesized in substantially the same manner as utilized to synthesize Intermediate 21-3 of Synthesis Example of 1, except that Intermediate 65-2 was utilized instead of Intermediate 21-2. (Yield: 27%)

Synthesis of Compound 65

Compound 65 was synthesized in substantially the same manner as utilized to synthesize Compound 21 of Synthesis Example 1, except that Intermediate 65-3 and 2,7-di-tert-butyl-9H-carbazole were utilized instead of Intermediate 21-3 and carbazole, respectively. (Yield: 66%)

Synthesis Example 6 (Compound 66)

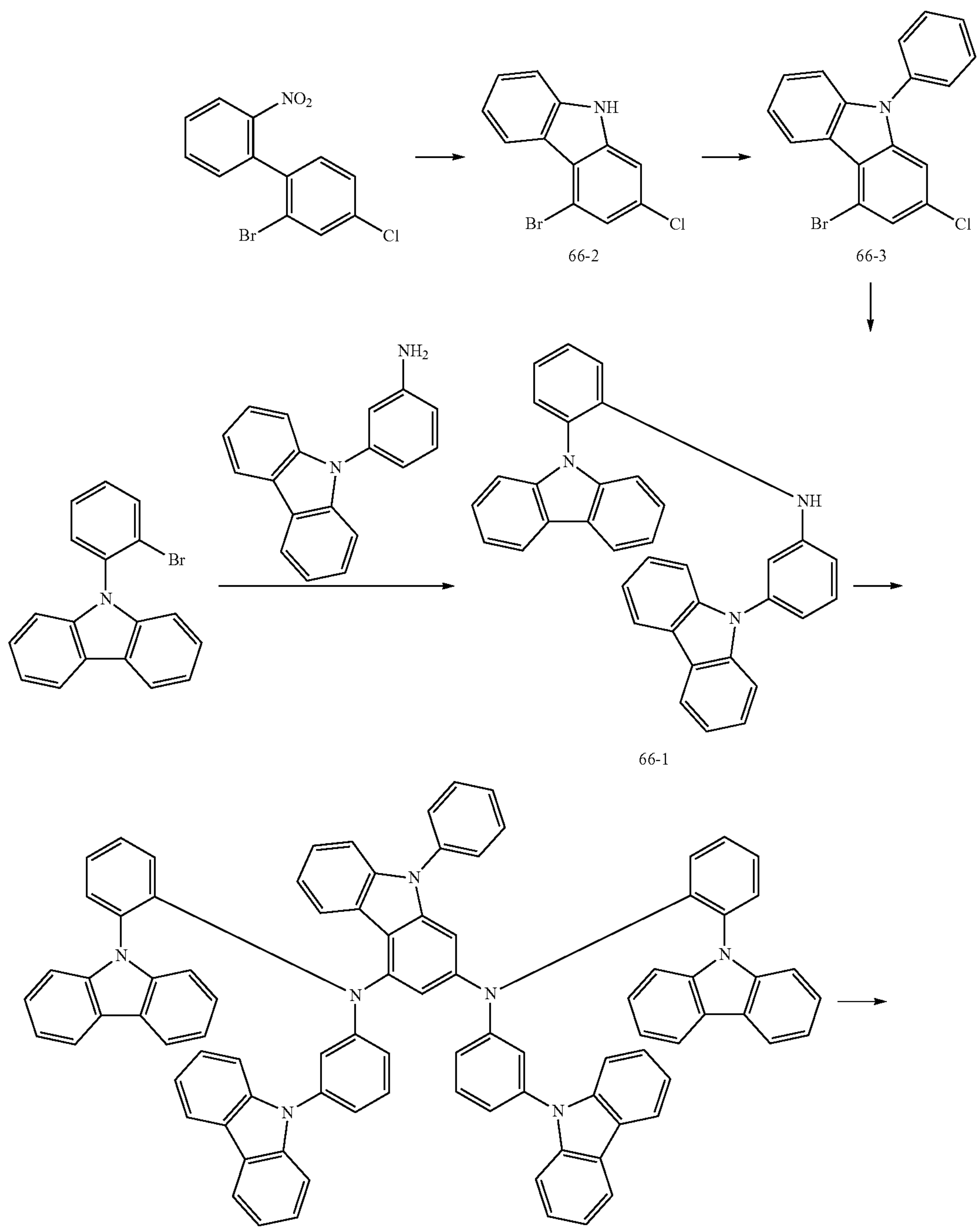

66-2

66-3

66-1

66-4

-continued

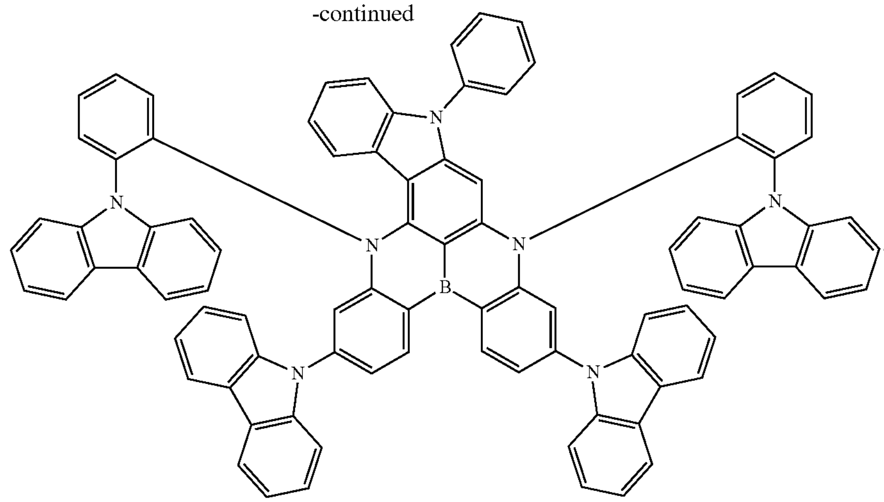

66

Synthesis of Intermediate 66-1

Intermediate 66-1 was synthesized in substantially the same manner as utilized to synthesize Intermediate 21-1 of Synthesis Example 1, except that 3-(9H-carbazol-9-yl)aniline was utilized instead of [1,1'-biphenyl]-4-amine. (Yield: 81%)

Synthesis of Intermediate 66-2

2-bromo-4-chloro-2'-nitro-1,1'-biphenyl (1 eq) and triphenylphosphine (2.5 eq) were mixed with 1,2-dichlorobenzene (o-DCB), and then stirred at a temperature of 200° C. for 24 hours. The resulting product was cooled to room temperature, o-DCB was removed therefrom under reduced pressure, and then, purification by column chromatography was performed thereon utilizing MC and n-Hexane to synthesize Intermediate 66-2. (Yield: 62%)

Synthesis of Intermediate 66-3

Intermediate 66-2 (1 eq), iodobenzene (1.5 eq), CuI (0.1 eq), 1,10-phenanthroline (0.1 eq), and $K_2CO_3$ (3 eq) were mixed with dimethyl formamide (DMF), and then stirred at a temperature of 160° C. for 12 hours. The resulting product was cooled to room temperature, the solvent was removed therefrom under reduced pressure, and the product was washed three times with ethyl acetate and water. The organic layer obtained therefrom was dried utilizing $MgSO_4$ and dried under reduced pressure, and then purified by column chromatography utilizing MC and n-Hexane to synthesize Intermediate 66-3. (Yield: 61%)

Synthesis of Intermediate 66-4

Intermediate 66-4 was synthesized in substantially the same manner as utilized to synthesize Intermediate 21-2 of Synthesis Example 1, except that Intermediate 66-1 and Intermediate 66-3 were utilized instead of Intermediate 21-1 and 1,3-dibromo-5-chlorobenzene, respectively. (Yield: 49%)

Synthesis of Compound 66

Intermediate 66-4 (1 eq) was mixed with ortho dichlorobenzene and cooled to 0° C., and then, $BBr_3$ (5 eq) was slowly added dropwise thereto in a nitrogen atmosphere. After completion of the dropwise addition, the mixture was heated to a temperature of 150° C. and stirred for 24 hours. The resulting product was cooled to room temperature, triethylamine was slowly added dropwise thereto to terminate the reaction, and then, the product precipitated by adding ethyl alcohol was filtered. The resulting solid was purified by column chromatography utilizing MC and n-Hexane, and then recrystallized utilizing toluene and acetone to synthesize Compound 66. (Yield: 9%)

Synthesis Example 7 (Compound 67)

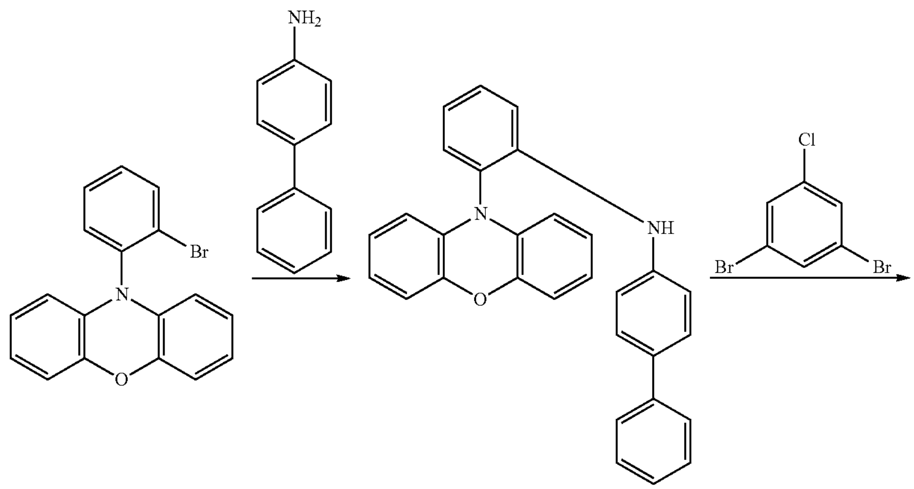

67-1

-continued

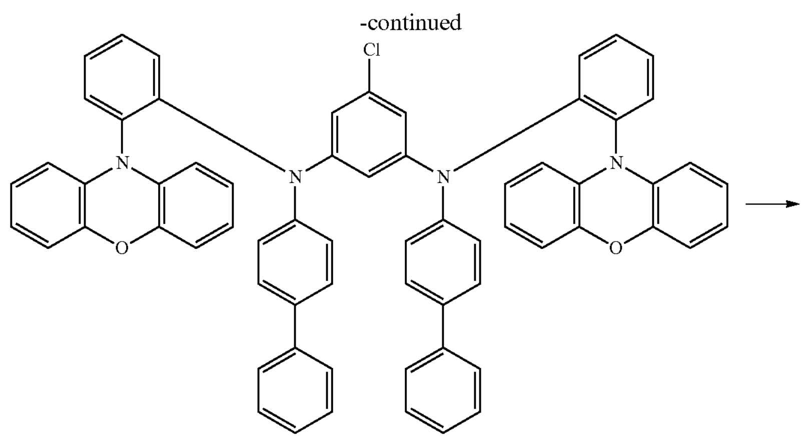

67-2

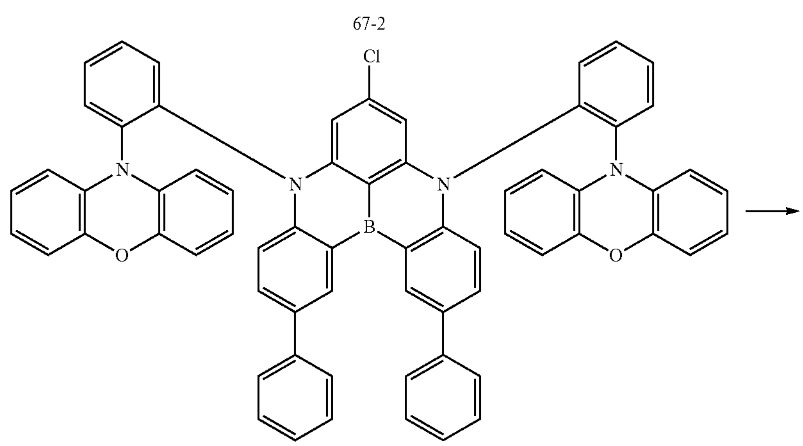

67-3

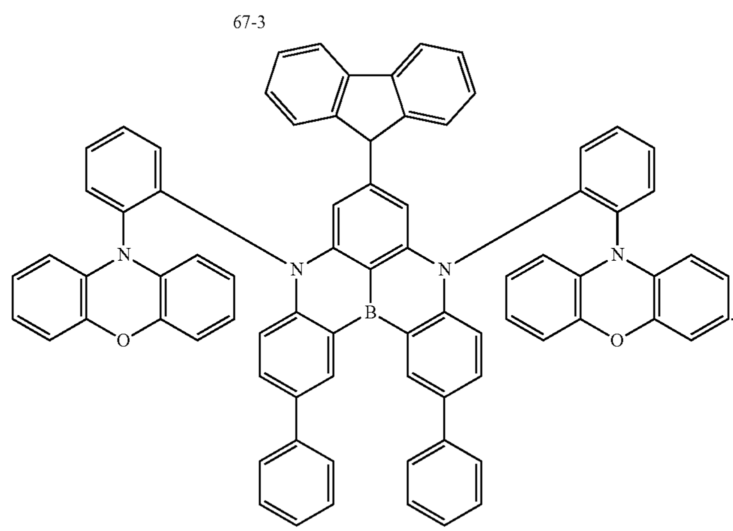

67

Synthesis of Intermediate 67-1

Intermediate 67-1 was synthesized in substantially the same manner as utilized to synthesize Intermediate 21-1 of Synthesis Example 1, except that 10-(2-bromophenyl)-10H-phenoxazine was utilized instead of 9-(2-bromophenyl)-9H-carbazole. (Yield:63%)

Synthesis of Intermediate 67-2

Intermediate 67-2 was synthesized in substantially the same manner as utilized to synthesize Intermediate 21-2 of Synthesis Example of 1, except that Intermediate 67-1 was utilized instead of Intermediate 21-1. (Yield:50%)

Synthesis of Intermediate 67-3

Intermediate 67-3 was synthesized in substantially the same manner as utilized to synthesize Intermediate 21-3 of Synthesis Example of 1, except that Intermediate 67-2 was utilized instead of Intermediate 21-2. (Yield:44%)

Synthesis of Compound 67

Compound 67 was synthesized in substantially the same manner as utilized to synthesize Compound 21 of Synthesis Example of 1, except that Intermediate 67-3 was utilized instead of Intermediate 21-3. (Yield: 81%)

Synthesis Example 8 (Compound 72)

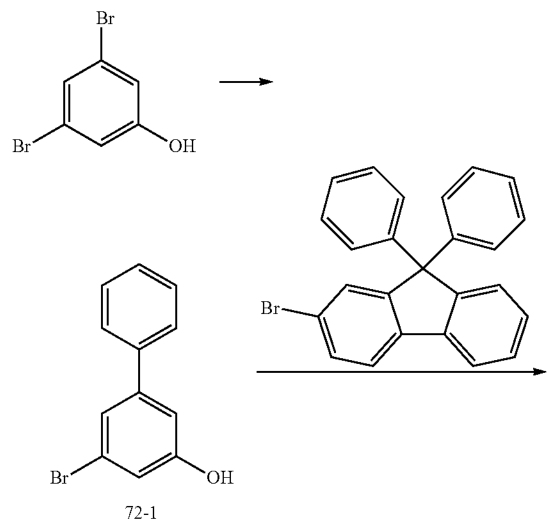

72-1

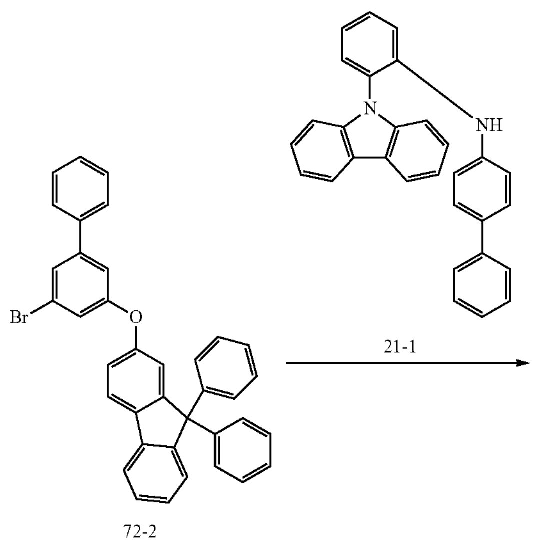

72-2

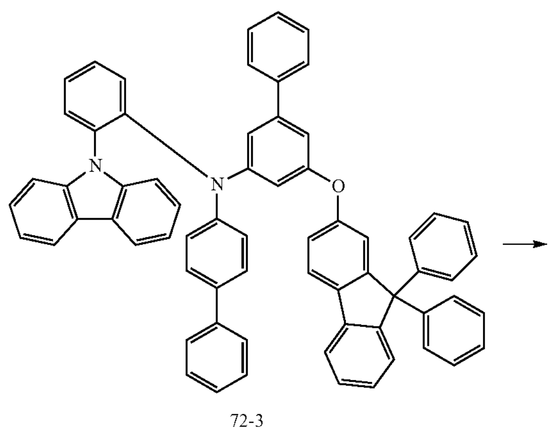

72-3

-continued

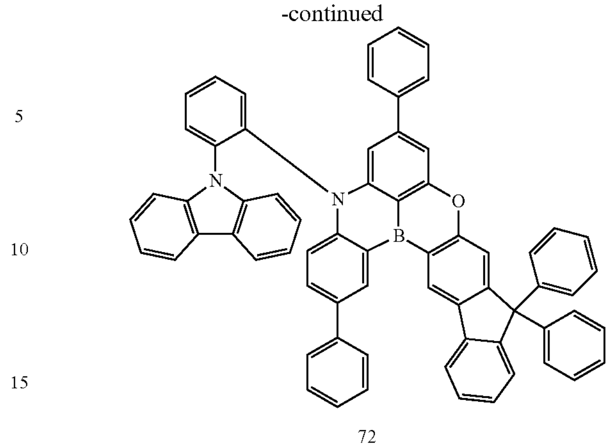

72

Synthesis of Intermediate 72-1

3,5-dibromophenol (1 eq), phenylboronic acid (0.9 eq), $Pd(PPh_3)_4$ (0.05 eq), and $K_2CO_3$ (3 eq) were mixed with a mixture in which THF and $H_2O$ were mixed at a ratio of 2:1 parts by volume, and then stirred at a temperature of 80° C. for 12 hours. The resulting product was cooled to room temperature and washed three times with ethyl acetate and water, and the organic layer obtained therefrom was dried utilizing $MgSO_4$ and dried under reduced pressure, and then purified by column chromatography utilizing EA and n-Hexane to synthesize Intermediate 72-1. (Yield: 42%)

Synthesis of Intermediate 72-2

Intermediate 72-1 (1 eq), 2-bromo-9,9-diphenyl-9H-fluorene (1 eq), CuI (0.1 eq), 1,10-phenanthroline (0.1 eq), and $K_2CO_3$ (3 eq) were mixed with DMF, and then stirred at a temperature of 160° C. for 12 hours. The resulting product was cooled to room temperature, the solvent was removed therefrom under reduced pressure, and the product was washed three times with ethyl acetate and water. The organic layer obtained therefrom was dried utilizing $MgSO_4$ and dried under reduced pressure, and then purified by column chromatography utilizing MC and n-Hexane to synthesize Intermediate 72-2. (Yield: 40%)

Synthesis of Intermediate 72-3

Intermediate 72-2 (1 eq), Intermediate 21-1 (1 eq), tris (dibenzylideneacetone)dipalladium (0) (0.05 eq), tri-tert-butylphosphine (0.1 eq), and sodium tert-butoxide (3 eq) were mixed with toluene, and then stirred at a temperature of 100° C. for 6 hours. The resulting product was cooled to room temperature and washed three times with ethyl acetate and water, and the organic layer obtained therefrom was dried utilizing $MgSO_4$ and dried under reduced pressure, and then purified by column chromatography utilizing MC and n-Hexane to synthesize Intermediate 72-3. (Yield: 71%)

Synthesis of Compound 72

Compound 72 was synthesized in substantially the same manner as utilized to synthesize Intermediate 21-3 of Synthesis Example of 1, except that Intermediate 72-3 was utilized instead of Intermediate 21-2. (Yield: 32%)

Synthesis Example 9 (Compound 1)

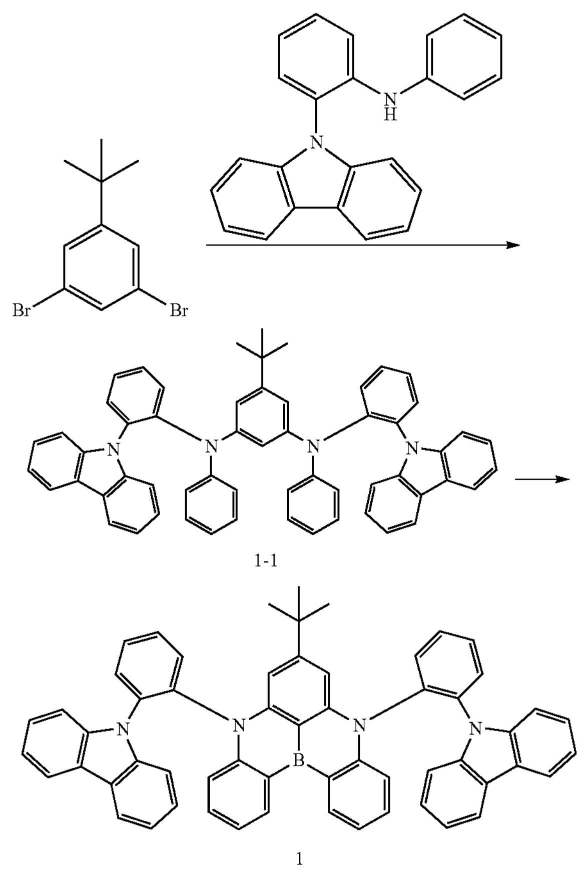

1-1

1

Synthesis of Intermediate 1-1

1,3-dibromo-5-(tert-butyl)benzene (1 eq), 2-(9H-carbazol-9-yl)-N-phenylaniline (2 eq), tris(dibenzylideneacetone) dipalladium (0) (0.05 eq), tri-tert-butylphosphine (0.1 eq), and sodium tert-butoxide (3 eq) were mixed with toluene, and then stirred at a temperature of 100° C. for 6 hours. The resulting product was cooled to room temperature and washed three times with ethyl acetate and water, and the organic layer obtained therefrom was dried utilizing $MgSO_4$ and dried under reduced pressure, and then purified by column chromatography utilizing MC and n-Hexane to synthesize Intermediate 1-1. (Yield: 73%)

Synthesis of Compound 1

In a nitrogen atmosphere, Intermediate 1-1 (1 eq) and boron triiodide (1.5 eq) were mixed and injected with ortho-dichlorobenzene, and then heated to a temperature of 150° C. and stirred for 6 hours. The resulting product was cooled to room temperature, triethylamine was slowly added dropwise thereto to terminate the reaction, and then, the product precipitated by adding ethyl alcohol was filtered. The resulting solid was purified by column chromatography utilizing MC and n-Hexane, and then recrystallized utilizing toluene and acetone to synthesize Compound 1. (Yield:31%)

NMR data of Compounds 21, 38, 59, 64, 65, 66, 67, 72, and 1 synthesized according to Synthesis Examples 1 to 9 is shown in Table 1.

TABLE 1

| Compound | H NMR (δ) | MS/FAB Calc | MS/FAB Found |
|---|---|---|---|
| 21 | 9.34-9.30 (2H, s), 8.18-8.12 (6H, m), 7.83-7.71 (12H, m), 7.6-7.55 (2H, m), 7.51-7.42 (16H, m), 7.36-7.33 (2H, m) 7.25-7.22 (6H, m), 7.04-7.01 (2H, m), 6.55-6.51 (2H, s) | 1068.08 | 1068.03 |
| 38 | 9.34-9.30 (2H, s), 8.11-8.09 (6H, m), 7.83-7.71 (12H, m) 7.54-7.45 (14H, m), 7.41-7.32 (8H, m), 7.04-7.01 (2H, m), 6.55-6.51 (2H, s), 1.50-1.38 (54H, d) | 1404.71 | 1403.62 |
| 59 | 8.94-8.86 (2H, d), 8.18-8.12 (8H, m), 7.6-7.56 (2H, m) 7.53-7.39 (25H, m), 7.36-7.33 (2H, m), 7.11-7.04 (2H, d) 6.64-6.57 (2H, m), 6.44-6.39 (2H, s), 1.5-1.35 (72H, d) | 1606.02 | 1605.95 |
| 64 | 8.92-8.85 (2H, d), 8.18-8.12 (8H, m), 7.63-7.58 (2H, m) 7.54-7.41 (20H, m), 7.36-7.33 (2H, m), 7.24-7.20 (4H, m) 7.10-7.04 (2H, d), 6.34-6.31 (2H, m), 6.15-6.10 (2H, s) 1.53-1.32 (45H, d) | 1361.61 | 1361.61 |
| 65 | 9.11-9.04 (2H, s), 8.38-8.33 (2H, d), 8.12-8.07 (4H, d), 8.05-8.01 (2H, d), 7.69-7.55 (12H, m), 7.53-7.41 (18H, m), 7.36-7.33 (2H, m), 7.23-7.15 (8H, m), 6.93-6.88 (2H, m), 6.60-6.54 (2H, s), 1.53-1.45 (18H, s) | 1358.48 | 1357.68 |
| 66 | 8.88-8.78 (2H, d), 8.16-8.10 (9H, m), 7.49-7.44 (18H, m), 7.69-7.55 (5H, m), 7.6-7.55 (2H, m), 7.51-7.47 (4H, m), 7.36-7.33 (2H, m), 7.24-7.20 (9H, m), 7.10-7.04 (2H, d), 6.34-6.31 (2H, s), 6.13-6.10 (1H, s) | 1246.27 | 1245.5 |
| 67 | 9.34-9.30 (2H, s), 8.18-8.12 (2H, m), 7.83-7.71 (12H, m) 7.6-7.55 (2H, m), 7.51-7.40 (8H, m), 7.36-7.33 (2H, m) 7.25-7.22 (2H, m), 7.04-7.01 (2H, m), 6.73-6.51 (18H, m) | 1100.07 | 1100.01 |
| 72 | 9.31-9.28 (1H, s), 9.25-9.22 (1H, s), 8.18-8.05 (4H, m), 7.83-7.71 (6H, m), 7.6-7.55 (1H, m), 7.52-7.41 (11H, m), 7.36-7.28 (10H, m), 7.25-7.08 (6H, m), 7.04-7.01 (1H, s), 6.81-6.69 (2H, s) | 902.9 | 908.88 |
| 1 | 8.96-8.93 (2H, d), 8.13-8.08 (4H, d), 7.73-7.68 (4H, m), 7.60-7.57 (2H, m), 7.48-7.35 (12H, m), 7.29-7.21 (6H, m), 6.76-6.71 (2H, m), 6.15-6.13 (2H, s), 1.35-1.33 (9H, s) | 806.82 | 806.73 |

Example 1

As an anode, a glass substrate (product of Corning Inc.) with a 15 $\Omega/cm^2$ (1,200 Å) ITO electrode formed thereon was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

NPD was deposited on the anode to form a hole injection layer having a thickness of 300 Å, HT3 was deposited on the hole injection layer to form a hole transport layer having a thickness of 200 Å, and CzSi was deposited on the hole transport layer to form an emission auxiliary layer having a thickness of 100 Å.

mCP (host) and Compound 21 (dopant) were co-deposited at a weight ratio of 99:1 on the emission auxiliary layer to form an emission layer having a thickness of 200 Å.

Subsequently, TSPO1 was deposited on the emission layer to form a hole blocking layer having a thickness of 200 Å, TPBI was deposited on the hole blocking layer to form an electron transport layer having a thickness of 300 Å, LiF was deposited on the electron transport layer to form an electron injection layer having a thickness of 10 Å, and Al was deposited on the electron injection layer to form a cathode having a thickness of 3,000 Å, thereby completing the manufacture of an organic light-emitting device having a structure of ITO (1,200 Å)/NPD (300 Å)/HT3 (200 Å)/CzSi (100 Å)/mCP+Compound 21 (1 wt %) (200 Å)/TSPO1 (200 Å) /TPBI (300 Å)/LiF (10 Å)/Al (3,000 Å).

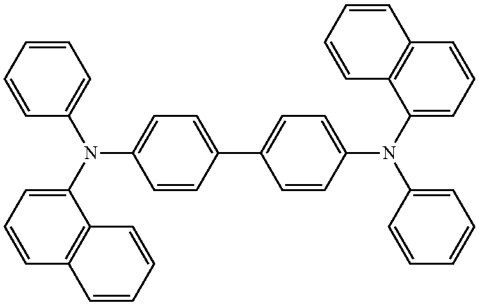

NPD

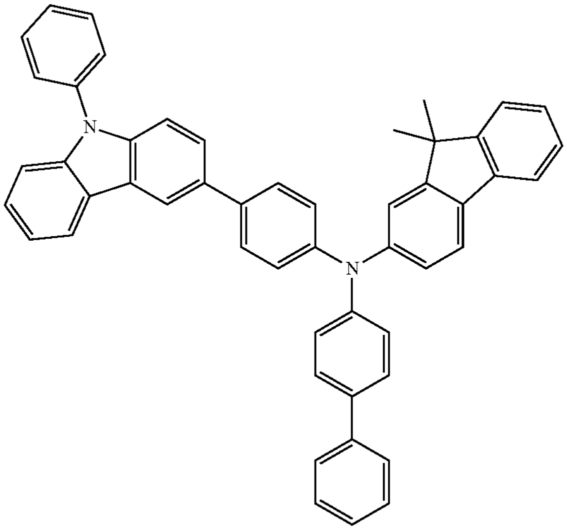

HT3

-continued

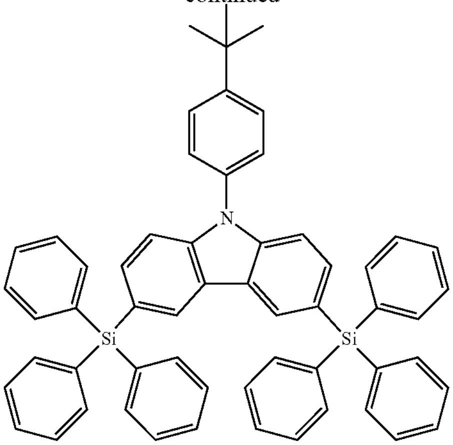

CzSi

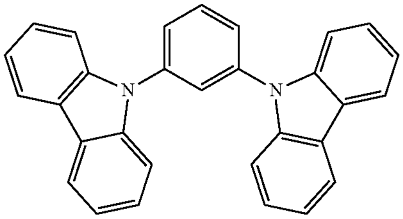

mCP

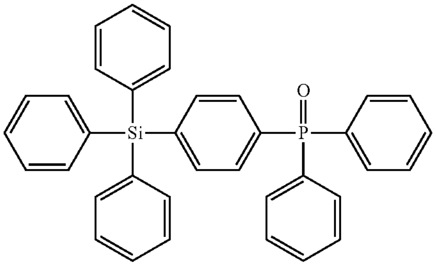

TSPO1

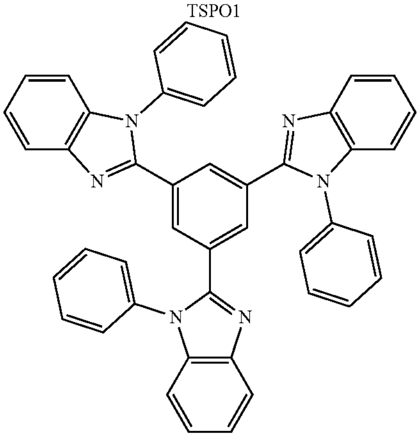

TPBI

Examples 2 to 9 and Comparative Examples A, B1, and B2

Additional organic light-emitting devices were manufactured in substantially the same manner as in Example 1, except that the corresponding compounds shown in Table 2 were utilized instead of Compound 21 as the dopant in the emission layer.

Evaluation Example 2

The driving voltage (V) at 1,000 cd/$m^2$, luminescence efficiency (Cd/A), maximum external quantum efficiency (EQE) (%), and emission color of the organic light-emitting devices manufactured according to Examples 1 to 9 and Comparative Examples A, B1, and B2 were measured by utilizing a Keithley MU 236 and luminance meter PR650, and the results are shown in Table 2.

TABLE 2

| No. | Dopant | Driving voltage (V) | Luminescence efficiency (cd/A) | Maximum external quantum efficiency (%) | Emission color |
|---|---|---|---|---|---|
| Example 1 | 21 | 4.9 | 21.3 | 20.1 | Blue |
| Example 2 | 38 | 5.0 | 23.0 | 21.1 | Blue |
| Example 3 | 59 | 5.1 | 22.8 | 20.8 | Blue |
| Example 4 | 64 | 5.1 | 22.4 | 21.3 | Blue |
| Example 5 | 65 | 4.8 | 20.9 | 20.4 | Blue |
| Example 6 | 66 | 4.9 | 21.6 | 20.6 | Blue |
| Example 7 | 67 | 4.9 | 20.7 | 20.4 | Blue |
| Example 8 | 72 | 5.2 | 19.2 | 18.9 | Dark blue |
| Example 9 | 1 | 5.3 | 18.5 | 17.8 | Dark blue |
| Comparative Example A | A | 5.4 | 17.1 | 15.5 | Blue |
| Comparative Example B1 | B1 | 5.7 | 16.3 | 16.0 | Blue |
| Comparative Example B2 | B2 | 5.6 | 16.8 | 15.2 | Blue |

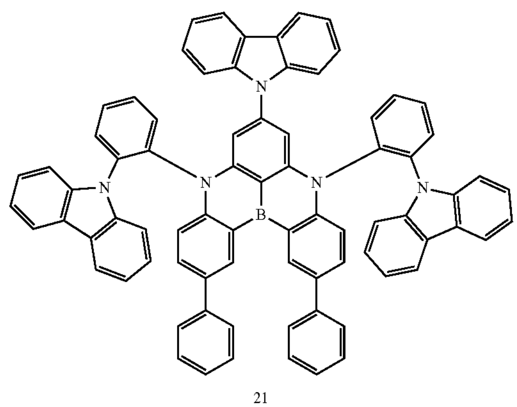 [SMILES: c1ccc(-c2ccc3c(c2)B2c4cc(-c5ccccc5)ccc4N(c4ccccc4-n4c5ccccc5c5ccccc54)c4cc(-n5c6ccccc6c6ccccc65)cc(c42)N3c2ccccc2-n2c3ccccc3c3ccccc32)cc1]

21

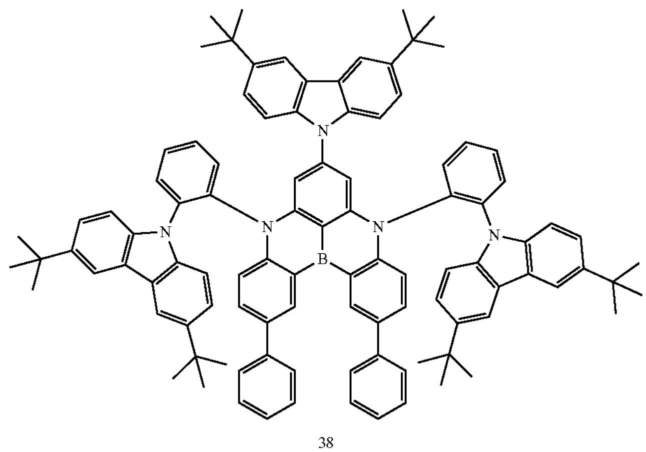 [SMILES: CC(C)(C)c1ccc2c(c1)c1cc(C(C)(C)C)ccc1n2-c1cc2c3c(c1)N(c1ccccc1-n1c4ccc(C(C)(C)C)cc4c4cc(C(C)(C)C)ccc41)c1ccc(-c4ccccc4)cc1B3c1cc(-c3ccccc3)ccc1N2c1ccccc1-n1c2ccc(C(C)(C)C)cc2c2cc(C(C)(C)C)ccc21]

38

TABLE 2-continued
| No. | Dopant | Driving voltage (V) | Luminescence efficiency (cd/A) | Maximum external quantum efficiency (%) | Emission color |
|---|---|---|---|---|---|
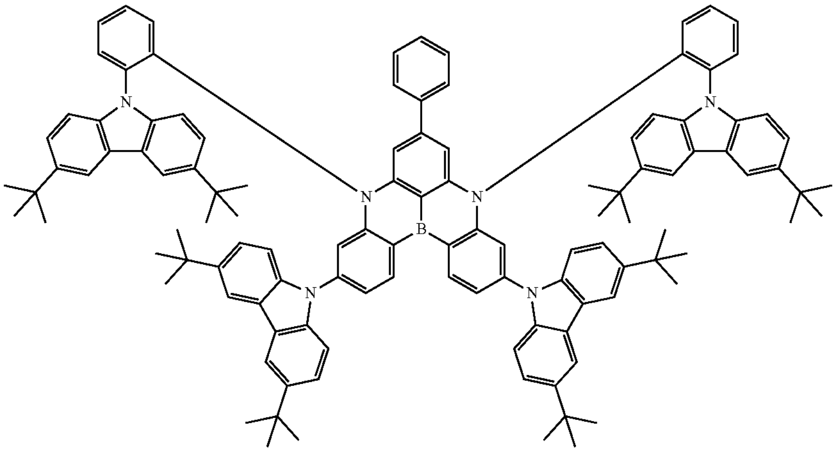
59
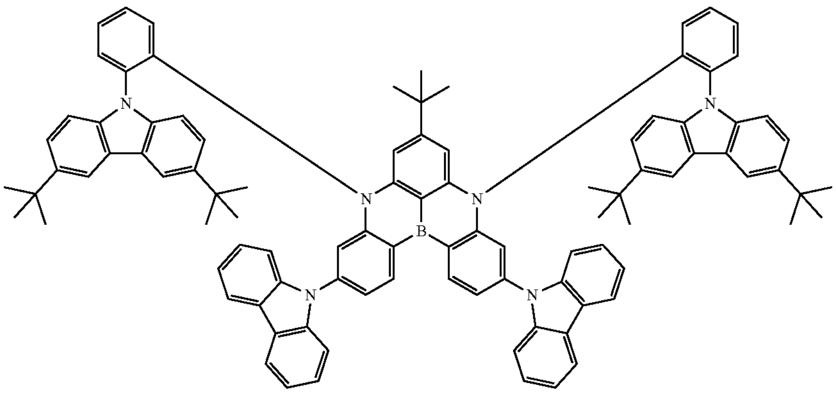
64
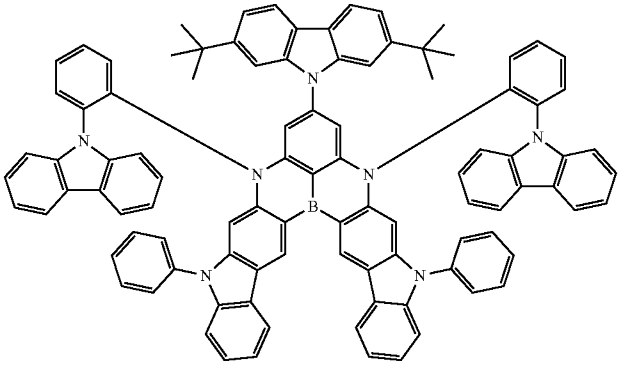
65

TABLE 2-continued
| No. | Dopant | Driving voltage (V) | Luminescence efficiency (cd/A) | Maximum external quantum efficiency (%) | Emission color |
|---|---|---|---|---|---|
| 66 | 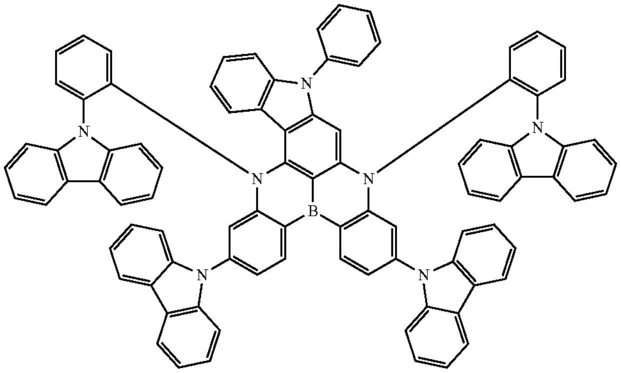 | | | | |
| 67 | 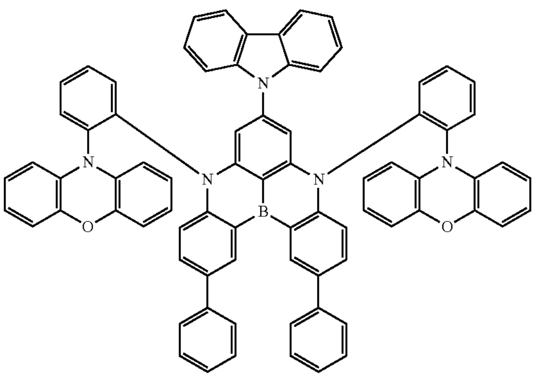 | | | | |
| 72 | 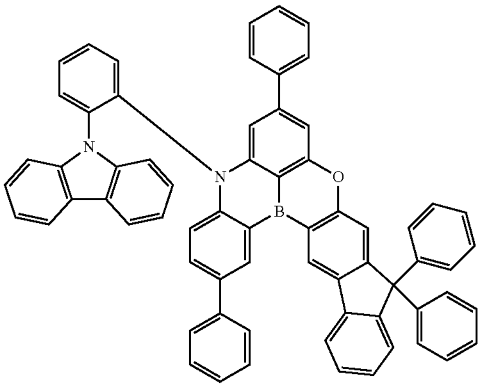 | | | | |
| 1 | 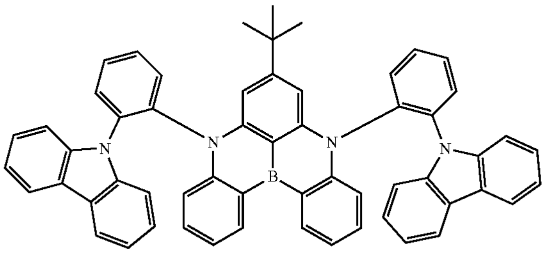 | | | | |

TABLE 2-continued

| No. | Dopant | Driving voltage (V) | Luminescence efficiency (cd/A) | Maximum external quantum efficiency (%) | Emission color |
|---|---|---|---|---|---|

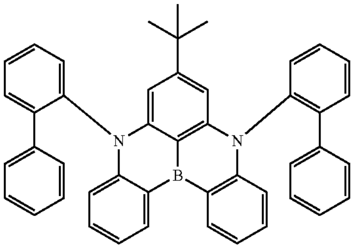

A

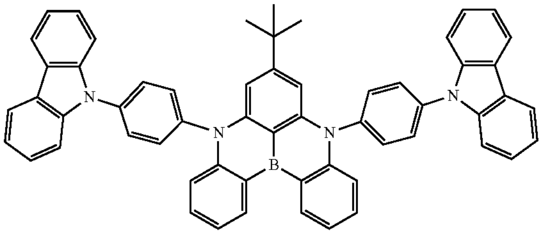

B1

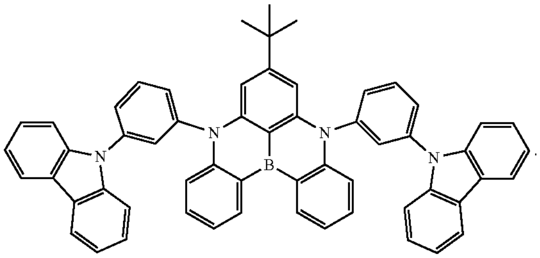

B2

From Table 2, it can be seen that the organic light-emitting devices of Examples 1 to 9 each emit blue light and have lower driving voltage, improved luminescence efficiency, and improved external quantum efficiency, as compared with the organic light-emitting devices of Comparative Examples A, B1, and B2.

Due to the inclusion of the heterocyclic compound represented by Formula 1, the light-emitting device may have excellent or suitable driving voltage, excellent or suitable luminescence efficiency, and excellent or suitable external quantum efficiency, and thus may be utilized to manufacture high-quality electronic apparatuses.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that various changes in form and details may be made therein without departing from the spirit and scope as defined by the following claims and equivalents thereof.

What is claimed is:

1. A light-emitting device comprising:

a first electrode;

a second electrode facing the first electrode;

an interlayer between the first electrode and the second electrode and comprising an emission layer; and a heterocyclic compound represented by Formula 1:

Formula 1

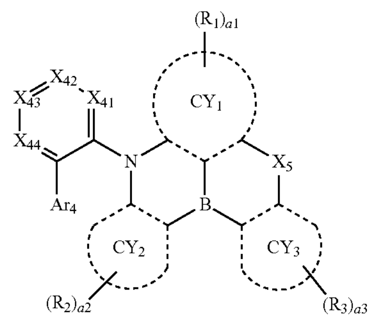

Formula 2B

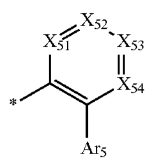

Formula 3

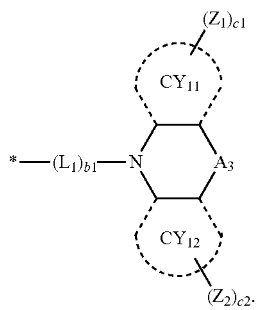

CY1-2

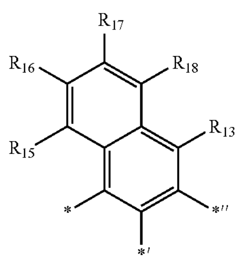

CY1-3

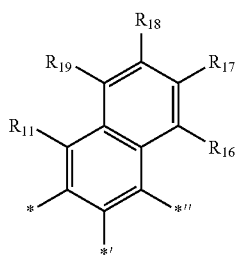

-continued

CY1-4

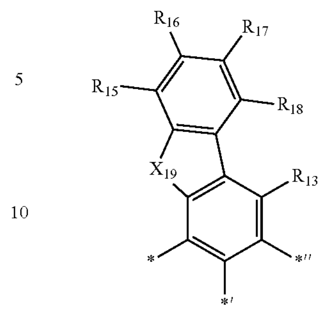

CY1-5

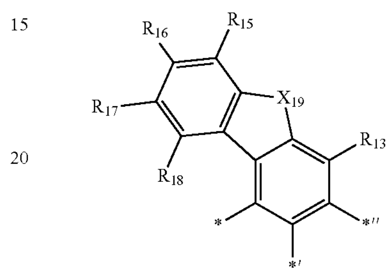

CY1-6

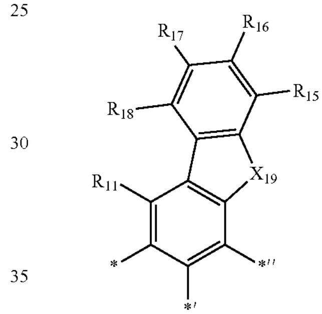

CY1-7

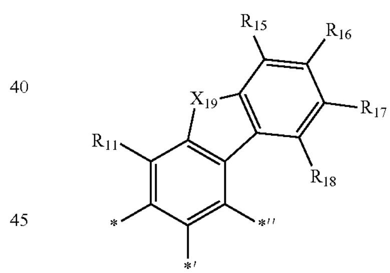

wherein, in Formulae 1, 2B, 3, and CY1-2 to CY1-7, $X_5$ is O, S, $N(R_{55})$, or $N(T_{55})$, $T_{55}$ is a group represented by Formula 2B, and * in Formula 2B indicates a binding site to N, $Ar_4$ and $Ar_5$ are each a group represented by Formula 3, and when $X_5$ is $N(T_{55})$, $Ar_4$ and $Ar_5$ are identical to or different from each other, the group represented by

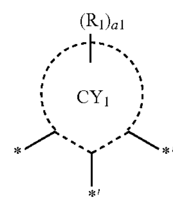

in Formula 1 is represented by one of Formulae CY1-2 to CY1-7.

$X_{19}$ is O, S, N ($R_{19a}$), C($R_{19a}$)($R_{19b}$), or Si($R_{19a}$)($R_{19b}$),

* in Formulae CY1-2 to CY1-7 indicates a binding site to N in Formula 1,

*' in Formulae CY1-2 to CY1-7 indicates a binding site to B in Formula 1,

*" in Formulae CY1-2 to CY1-7 indicates a binding site to X5 in Formula 1, $CY_2$, $CY_3$, $CY_{11}$, and $CY_{12}$ are each independently a $C_3$-$C_{60}$ carbocyclic group or a $C_1$-$C_{60}$ heterocyclic group, $X_{41}$ is N or C($R_{41}$), $X_{42}$ is N or C($R_{42}$), $X_{43}$ is N or C($R_{43}$), $X_{44}$ is N or C($R_{44}$), $X_{51}$ is N or C($R_{51}$), $X_{52}$ is N or C($R_{52}$), $X_{53}$ is N or C($R_{53}$), and $X_{54}$ is N or C($R_{54}$), $L_1$ is a single bond, a $C_3$-$C_{60}$ carbocyclic group unsubstituted or substituted with at least one $R_{1a}$, or a $C_1$-$C_{60}$ heterocyclic group unsubstituted or substituted with at least one $R_{1a}$, b1 is an integer from 1 to 5, $A_3$ is a single bond, O, S, N($Z_3$), C($Z_3$)($Z_4$), or Si($Z_3$)($Z_4$), $R_{11}$, $R_{13}$, $R_{15}$ to $R_{18}$, $R_{19a}$, $R_{19b}$, $R_2$, $R_2$, $R_{51}$ to $R_{55}$, and $Z_1$ to $Z_4$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, —Si($Q_1$)($Q_2$)($Q_3$), —N[$(L_{11})_{b11}$-$Q_1$][$(L_{12})_{b12}$-$Q_2$], —B[$(L_{11})_{b11}$-$Q_1$][$(L_{12})_{b12}$-$Q_2$], —C(=O)($Q_1$), —S(=O)$_2$($Q_1$), or —P(=O)($Q_1$)($Q_2$), $R_{41}$ to $R_{44}$ are each independently hydrogen or deuterium, a2, a3, c1, and c2 are each independently an integer from 0 to 10, $L_{11}$ and $L_{12}$ are each independently the same as described in connection with $L_1$, b11 and b12 are each independently the same as described in connection with b1,

* in Formula 3 indicates a binding site to a neighboring atom, $R_1a$ is the same as described in connection with $R_1$, two or more of the a2 $R_2$(s) are optionally linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the a3 $R_3$(s) are optionally linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the c1 $Z_1$(s) are optionally linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the c2 $Z_2$(s) are optionally linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, and $R_{10}a$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

2. The light-emitting device of claim 1, wherein the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron control layer, an electron transport layer, an electron injection layer, or any combination thereof.

3. The light-emitting device of claim 1, wherein the interlayer comprises the heterocyclic compound represented by Formula 1.

4. The light-emitting device of claim 1, wherein the emission layer comprises the heterocyclic compound represented by Formula 1.

5. The light-emitting device of claim 4, wherein the emission layer is to emit blue light.

6. The light-emitting device of claim 5, wherein the emission layer further comprises a host, and an amount of the host is greater than an amount of the heterocyclic compound represented by Formula 1.

7. The light-emitting device of claim 1, further comprising a capping layer outside the first electrode and/or outside the second electrode, wherein the capping layer comprises the heterocyclic compound represented by Formula 1.

8. An electronic apparatus comprising the light-emitting device of claim 1.

9. The electronic apparatus of claim 8, further comprising a thin-film transistor, wherein:

the thin-film transistor comprises a source electrode and a drain electrode, and the first electrode of the light-emitting device is electrically connected to at least one of the source electrode or the drain electrode.

10. The electronic apparatus of claim 8, further comprising a color filter, a color conversion layer, a touch screen layer, a polarizing layer, or any combination thereof.

11. A heterocyclic compound represented by Formula 1:

Formula 1

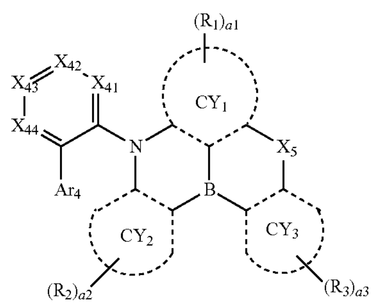

Formula 2B

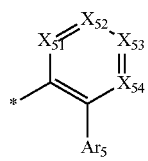

Formula 3

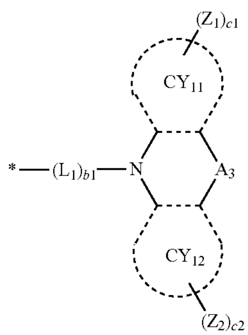

CY1-2

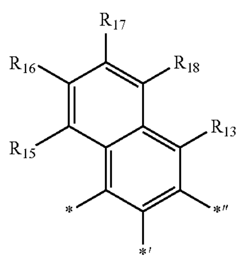

-continued

CY1-3

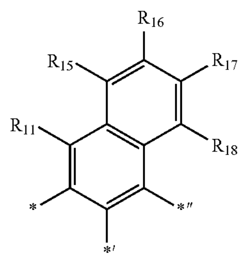

CY1-4

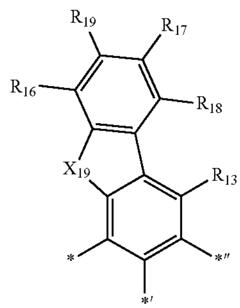

CY1-5

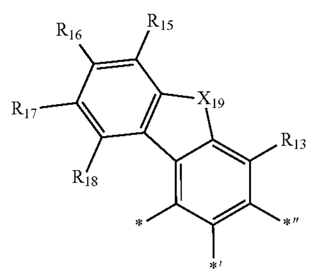

CY1-6

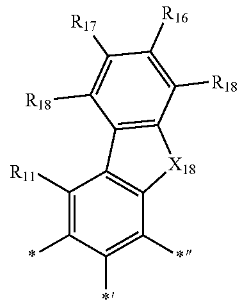

CY1-7

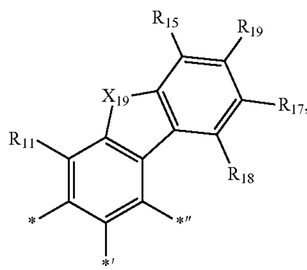

wherein, in Formulae 1, 2B, 3, and CY1-2 to CY1-7, $X_5$ is O, S, $N(R_{55})$, or $N(T_{55})$, $T_{55}$ is a group represented by Formula 2B, and * in Formula 2B indicates a binding site to N, $Ar_4$ and $Ar_5$ are each a group represented by Formula 3, and when $X_5$ is $N(T_{55})$, $Ar_4$ and $Ar_5$ are identical to or different from each other, the group represented by

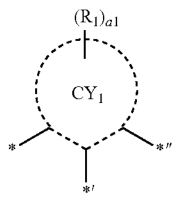

in Formula 1 is represented by one of Formulae CY1-2 to CY1-7, $X_{19}$ is O, S, $N(R_{19a})$, $C(R_{19a})(R_{19b})$, or $Si(R_{19a})(R_{19b})$,

* in Formulae CY1-2 to CY1-7 indicates a binding site to N in Formula 1,

*' in Formulae CY1-2 to CY1-7 indicates a binding site to B in Formula 1,

*'' in Formulae CY1-2 to CY1-7 indicates a binding site to X5 in Formula 1, $CY_2$, $CY_3$, $CY_{11}$, and $CY_{12}$ are each independently a $C_3$-$C_{60}$ carbocyclic group or a $C_1$-$C_{60}$ heterocyclic group, $X_{41}$ is N or $C(R_{41})$, $X_{42}$ is N or $C(R_{42})$, $X_{43}$ is N or $C(R_{43})$, $X_{44}$ is N or $C(R_{44})$, $X_{51}$ is N or $C(R_{51})$, $X_{52}$ is N or $C(R_{52})$, $X_{53}$ is N or $C(R_{53})$, and $X_{54}$ is N or $C(R_{54})$, $L_1$ is a single bond, a $C_3$-$C_{60}$ carbocyclic group unsubstituted or substituted with at least one $R_{1a}$, or a $C_1$-$C_{60}$ heterocyclic group unsubstituted or substituted with at least one $R_{1a}$, b1 is an integer from 1 to 5, $A_3$ is a single bond, O, S, $N(Z_3)$, $C(Z_3)(Z_4)$, or $Si(Z_3)(Z_4)$, $R_{11}$, $R_{13}$, $R_{15}$ to $R_{18}$, $R_{19a}$, $R_{19b}$, $R_2$, $R_3$, $R_{51}$ to $R_{55}$, and $Z_1$ to $Z_4$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, $—Si(Q_1)(Q_2)(Q_3)$, $—N[(L_{11})_{b11}-Q_1][(L_{12})_{b12}-Q_2]$, $—B[(L_{11})_{b11}-Q_1][(L_{12})_{b12}-Q_2]$, $—C(=O)(Q_1)$, $—S(=O)_2(Q_1)$, or $—P(=O)(Q_1)(Q_2)$, $R_{41}$ to $R_{44}$ are each independently hydrogen or deuterium, a2, a3, c1, and c2 are each independently an integer from 0 to 10, $L_{11}$ and $L_{12}$ are each independently the same as described in connection with $L_1$, b11 and b12 are each independently the same as described in connection with b1,

* in Formula 3 indicates a binding site to a neighboring atom, $R_1a$ is the same as described in connection with $R_1$, two or more of the a2 $R_2$(s) are optionally linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the a3 $R_3$(s) are optionally linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the c1 $Z_1$(s) are optionally linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, two or more of the c2 $Z_2$(s) are optionally linked to each other to form a $C_3$-$C_{60}$ carbocyclic group unsubstituted or substituted with at least one $R_{10}a$ or a $C_1$-$C_{60}$ heterocyclic group unsubstituted or substituted with at least one $R_{10a}$, and $R_{10}a$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

12. The heterocyclic compound of claim 11, wherein $X_5$ is $N(T_{55})$, and $Ar_4$ and $Ar_5$ are identical to each other.

13. The heterocyclic compound of claim 11, wherein $CY_1$ to $CY_3$, $CY_{11}$, and $CY_{12}$ in Formulae 1 and 3 are each independently a benzene group, a naphthalene group, an anthracene group, a dibenzofuran group, a dibenzothiophene group, a carbazole group, a fluorene group, or a dibenzosilole group.

14. The heterocyclic compound of claim 11, wherein $CY_2$ and $CY_3$ in Formula 1 are identical to each other.

15. The heterocyclic compound of claim 11, wherein $R_2$, $R_3$, $R_{41}$ to $R_{44}$, $R_{51}$ to $R_{55}$, and $Z_1$ to $Z_4$ are each independently:

hydrogen, deuterium, —F, a cyano group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —$CD_3$, —$CD_2H$, —$CDH_2$, —$CF_3$, —$CF_2H$, —$CFH_2$, a cyano group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a thienyl group, a furanyl group, an indenyl group, an isoindolyl group, an indolyl group, a carbazolyl group, a benzofuranyl group, a benzothienyl group, a benzosilolyl group, a dibenzofuranyl group, a dibenzothienyl group, a dibenzosilolyl group, a benzofluorenyl group, a benzocarbazolyl group, a naphthobenzofuranyl group, a naphthobenzothienyl group, a naphthobenzosilolyl group, a dibenzofluorenyl group, a dibenzocarbazolyl group, a dinaphthofuranyl group, a dinaphthothienyl group, a dinaphthosilolyl group, an indenocarbazolyl group, an indolocarbazolyl group, a benzofuranocarbazolyl group, a benzothienocarbazolyl group, or a benzosilolocarbazolyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a thienyl group, a furanyl group, an indenyl group, an isoindolyl group, an indolyl group, a carbazolyl group, a benzofuranyl group, a benzothienyl group, a benzosilolyl group, a dibenzofuranyl group, a dibenzothienyl group, a dibenzosilolyl group, a benzofluorenyl group, a benzocarbazolyl group, a naphthobenzofuranyl group, a naphthobenzothienyl group, a naphthobenzosilolyl group, a dibenzofluorenyl group, a dibenzocarbazolyl group, a dinaphthofuranyl group, a dinaphthothienyl group, a dinaphthosilolyl group, an indenocarbazolyl group, an indolocarbazolyl group, a benzofuranocarbazolyl group, a benzothienocarbazolyl group, a benzosilolocarbazolyl group, —$N(Q_{31})(Q_{32})$, —$B(Q_{31})(Q_{32})$, or any combination thereof; or —$N[(L_{11})_{b11}$-$Q_1][(L_{12})_{b12}$-$Q_2]$ or —$B[(L_{11})_{b11}$-$Q_1][(L_{12})_{b12}$-$Q_2]$.

16. The heterocyclic compound of claim 11, wherein the group represented by

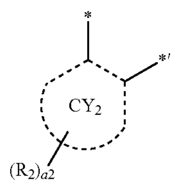

in Formula 1 is represented by one of Formulae CY2-1 to CY2-10:

CY2-1

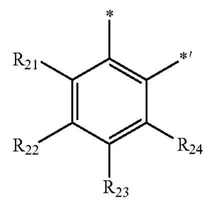

CY2-2

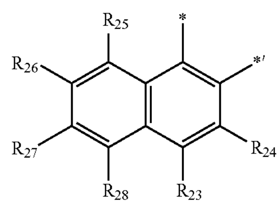

CY2-3

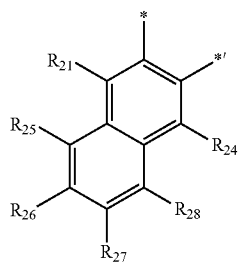

CY2-4

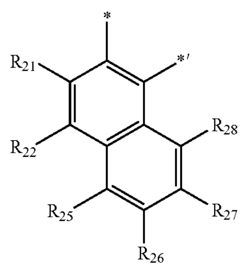

CY2-5

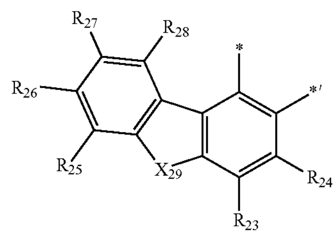

CY2-6

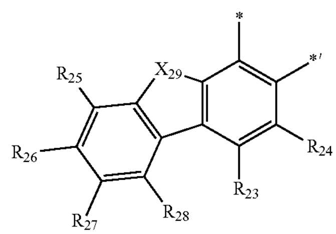

-continued

CY2-7

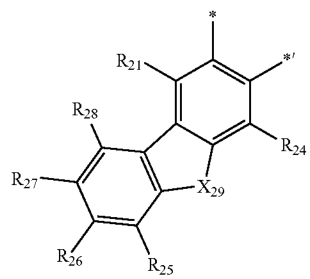

CY2-8

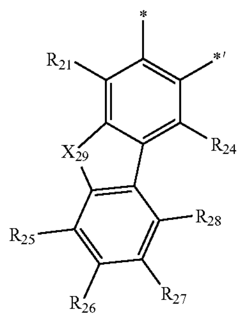

CY2-9

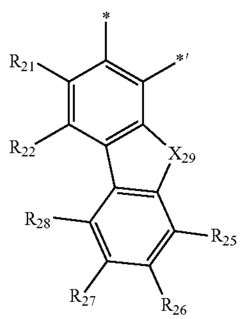

CY2-10

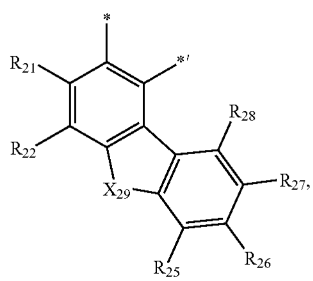

wherein, in Formulae CY2-1 to CY2-10, $X_{29}$ is O, S, $N(R_{29a})$, $C(R_{29a})(R_{29b})$, or $Si(R_{29a})(R_{29b})$, $R_{21}$ to $R_{28}$, $R_{29a}$, and $R_{29b}$ are each independently the same as described in connection with $R_2$,

*indicates a binding site to N in Formula 1, and

*' indicates a binding site to B in Formula 1.

17. The heterocyclic compound of claim 11, wherein the group represented by

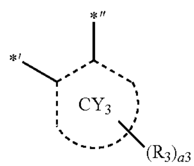

in Formula 1 is represented by one of Formulae CY3-1 to CY3-10:

CY3-1

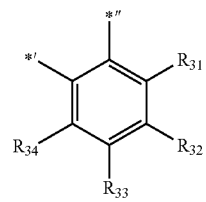

CY3-2

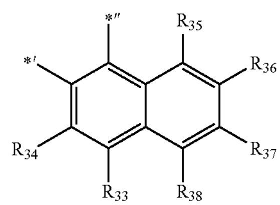

CY3-3

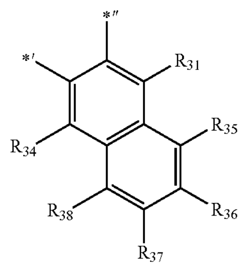

CY3-4

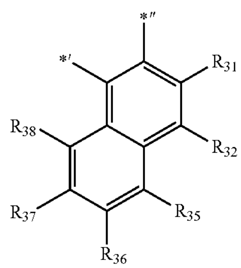

CY3-5

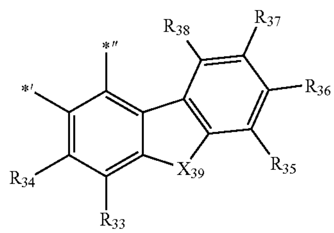

CY3-6

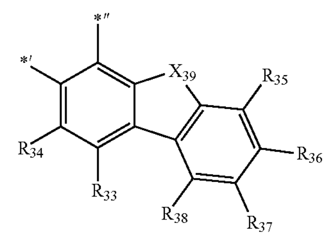

-continued

CY3-7

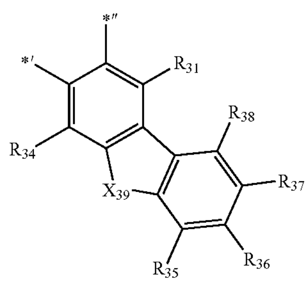

CY3-8

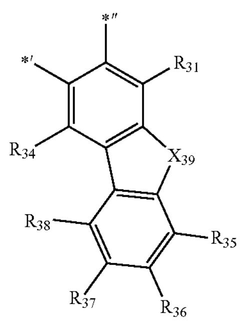

CY3-9

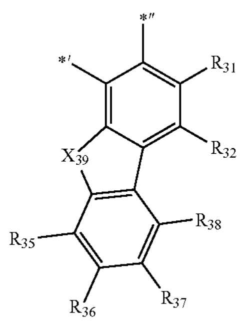

CY3-10

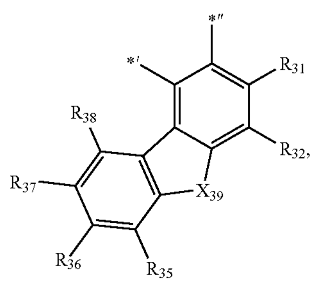

wherein, in Formulae CY3-1 to CY3-10, $X_{39}$ is O, S, $N(R_{39a})$, $C(R_{39a})(R_{39b})$, or $Si(R_{39a})(R_{39b})$, $R_{31}$ to $R_{38}$, $R_{39a}$, and $R_{39b}$ are each independently the same as described in connection with $R_3$,

*' indicates a binding site to B in Formula 1, and

*" indicates a binding site to $X_5$ in Formula 1.

18. The heterocyclic compound of claim 11, wherein, in Formula 1, the group represented by

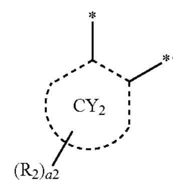

and the group represented by

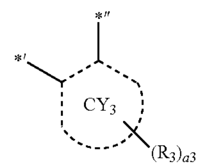

are identical to each other.

19. The heterocyclic compound of claim 11, wherein $Ar_4$ and $Ar_5$ are each a group represented by one of Formulae 3-1 to 3-8:

3-1

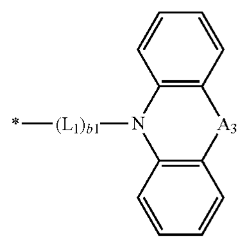

3-2

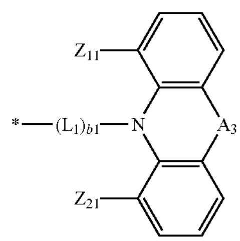

3-3

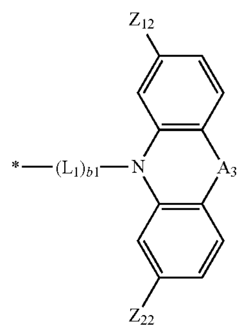

-continued 3-4

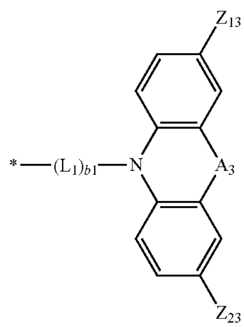

3-5

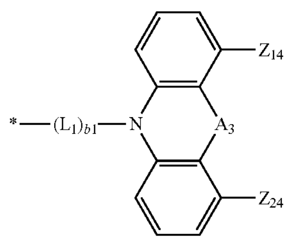

3-6

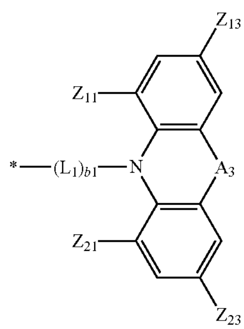

-continued 3-7

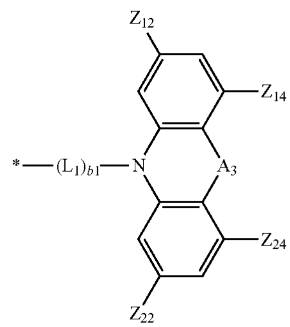

3-8

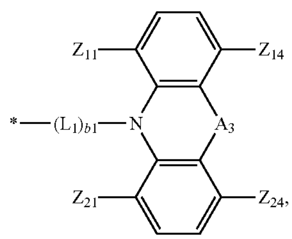

wherein, in Formulae 3-1 to 3-8, $L_1$, b1, and $A_3$ are each independently the same as described above, $Z_{11}$ to $Z_{14}$ are each independently the same as described in connection with $Z_1$, and each of $Z_{11}$ to $Z_{14}$ is not hydrogen, $Z_{21}$ to $Z_{24}$ are each independently the same as described in connection with $Z_2$, and each of $Z_{21}$ to $Z_{24}$ is not hydrogen, and

* indicates a binding site to a neighboring atom.

* * * * *